ns(12) United States Patent
Stratakos et al.

(10) Patent No.: US 9,312,769 B2
(45) Date of Patent: Apr. 12, 2016

(54) SWITCHING CIRCUITS FOR EXTRACTING POWER FROM AN ELECTRIC POWER SOURCE AND ASSOCIATED METHODS

(71) Applicant: Volterra Semiconductor LLC, San Jose, CA (US)

(72) Inventors: Anthony J. Stratakos, Kentfield, CA (US); Michael D. McJimsey, Danville, CA (US); Ilija Jergovic, Palo Alto, CA (US); Alexandr Ikriannikov, Castro Valley, CA (US); Artin Der Minassians, Oakland, CA (US); Kaiwei Yao, San Jose, CA (US); David B. Lidsky, Oakland, CA (US); Marco A. Zuniga, Berkeley, CA (US); Ana Borisavljevic, Pleasanton, CA (US)

(73) Assignee: Volterra Semiconductor LLC, San Jose, CA (US)

( * ) Notice: Subject to any disclaimer, the term of this patent is extended or adjusted under 35 U.S.C. 154(b) by 0 days.

(21) Appl. No.: 14/483,011

(22) Filed: Sep. 10, 2014

(65) Prior Publication Data
US 2014/0375134 A1    Dec. 25, 2014

Related U.S. Application Data

(62) Division of application No. 13/212,013, filed on Aug. 17, 2011, now Pat. No. 8,872,384.

(60) Provisional application No. 61/375,012, filed on Aug. 18, 2010.

(51) Int. Cl.
*H02M 3/158* (2006.01)
*H02J 3/38* (2006.01)
(Continued)

(52) U.S. Cl.
CPC ............ *H02M 3/158* (2013.01); *H02J 1/102* (2013.01); *H02J 3/383* (2013.01); *H03K 17/102* (2013.01);
(Continued)

(58) Field of Classification Search
USPC .......................................................... 307/43
See application file for complete search history.

(56) References Cited

U.S. PATENT DOCUMENTS

| 4,649,334 A | 3/1987 | Nakajima |
| 6,020,729 A | 2/2000 | Stratakos et al. |

(Continued)

FOREIGN PATENT DOCUMENTS

| DE | 10 2006 023 563 | 11/2007 |
| EP | 2 280 469 | 2/2011 |

(Continued)

OTHER PUBLICATIONS

Chinese Patent Application No. 201180049983.2, Office Action issued Nov. 24, 2014 and English-language summary thereof, 9 pages.

(Continued)

*Primary Examiner* — Robert Deberadinis
(74) *Attorney, Agent, or Firm* — Lathrop & Gage LLP

(57) ABSTRACT

An electric power system includes N electric power sources and N switching circuits, where N is an integer greater than one. Each switching circuit includes an input port electrically coupled to a respective one of the N electric power sources, an output port, and a first switching device adapted to switch between its conductive and non-conductive states to transfer power from the input port to the output port. The output ports of the N switching circuits are electrically coupled in series and to a load to establish an output circuit. Each of the N switching circuits uses an interconnection inductance of the output circuit as a primary energy storage inductance of the switching circuit.

14 Claims, 55 Drawing Sheets

(51) Int. Cl.
*H02J 1/10* (2006.01)
*H03K 17/10* (2006.01)
*H03K 17/12* (2006.01)
*H03K 17/14* (2006.01)
*H03K 17/693* (2006.01)
*H02M 1/00* (2007.01)

(52) U.S. Cl.
CPC .......... *H03K 17/122* (2013.01); *H03K 17/145* (2013.01); *H03K 17/693* (2013.01); *H02J 2001/106* (2013.01); *H03K 2217/0036* (2013.01); *H03K 2217/0054* (2013.01); *Y02E 10/563* (2013.01); *Y10T 307/685* (2015.04); *Y10T 307/696* (2015.04); *Y10T 307/707* (2015.04)

(56) References Cited

U.S. PATENT DOCUMENTS

| | | |
|---|---|---|
| 6,064,178 A | 5/2000 | Miller |
| 6,160,441 A | 12/2000 | Stratakos et al. |
| 6,225,795 B1 | 5/2001 | Stratakos et al. |
| 6,262,558 B1 | 7/2001 | Weinberg |
| 6,268,716 B1 | 7/2001 | Burstein et al. |
| 6,278,264 B1 | 8/2001 | Burstein et al. |
| 6,362,986 B1 | 3/2002 | Schultz et al. |
| 6,395,972 B1 | 5/2002 | Tran et al. |
| 6,445,244 B1 | 9/2002 | Stratakos et al. |
| 6,462,522 B2 | 10/2002 | Burstein et al. |
| 6,844,739 B2 | 1/2005 | Kasai et al. |
| 6,984,970 B2 | 1/2006 | Capel |
| 7,068,017 B2 | 6/2006 | Willner et al. |
| 7,126,053 B2 | 10/2006 | Kurokami et al. |
| 7,514,900 B2 | 4/2009 | Sander et al. |
| 7,989,953 B1 | 8/2011 | Jergovic et al. |
| 8,158,877 B2 | 4/2012 | Klein et al. |
| 2003/0094931 A1 | 5/2003 | Reynolds |
| 2004/0113586 A1 | 6/2004 | Chen |
| 2005/0057214 A1 | 3/2005 | Matan |
| 2005/0057215 A1 | 3/2005 | Matan |
| 2005/0121067 A1 | 6/2005 | Toyomura et al. |
| 2005/0139258 A1 | 6/2005 | Liu et al. |
| 2005/0172995 A1 | 8/2005 | Rohrig et al. |
| 2006/0001406 A1 | 1/2006 | Matan |
| 2006/0174939 A1 | 8/2006 | Matan |
| 2006/0185727 A1 | 8/2006 | Matan |
| 2007/0228838 A1 | 10/2007 | Delmerico et al. |
| 2007/0273351 A1 | 11/2007 | Matan |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0143188 A1 | 6/2008 | Adest et al. |
| 2008/0164766 A1 | 7/2008 | Adest et al. |
| 2008/0179949 A1 | 7/2008 | Besser et al. |
| 2008/0191560 A1 | 8/2008 | Besser et al. |
| 2008/0191675 A1 | 8/2008 | Besser et al. |
| 2008/0236648 A1 | 10/2008 | Klein et al. |
| 2008/0278985 A1 | 11/2008 | Ribarich |
| 2008/0303503 A1 | 12/2008 | Wolfs |
| 2009/0020151 A1 | 1/2009 | Fornage |
| 2009/0206666 A1* | 8/2009 | Sella .................. H01L 31/02021 307/43 |
| 2009/0283128 A1 | 11/2009 | Zhang et al. |
| 2009/0284078 A1 | 11/2009 | Zhang et al. |
| 2009/0284232 A1 | 11/2009 | Zhang et al. |
| 2009/0284240 A1 | 11/2009 | Zhang et al. |
| 2009/0284998 A1 | 11/2009 | Zhang et al. |
| 2010/0002349 A1 | 1/2010 | LaScala et al. |
| 2010/0195361 A1 | 8/2010 | Stem |
| 2010/0207455 A1 | 8/2010 | Erickson, Jr. et al. |
| 2010/0213897 A1 | 8/2010 | Tse |
| 2010/0253150 A1 | 10/2010 | Porter et al. |
| 2010/0265747 A1 | 10/2010 | Egiziano et al. |
| 2010/0288327 A1 | 11/2010 | Lisi et al. |
| 2010/0305770 A1 | 12/2010 | Bhowmik et al. |
| 2010/0320983 A1 | 12/2010 | Wu |
| 2010/0326492 A1 | 12/2010 | Tan et al. |
| 2010/0327659 A1* | 12/2010 | Lisi .................. H01L 31/02021 307/82 |
| 2011/0062784 A1 | 3/2011 | Wolfs |
| 2011/0082600 A1 | 4/2011 | Capel |
| 2011/0115436 A1 | 5/2011 | Zhang et al. |
| 2011/0140680 A1 | 6/2011 | Heo et al. |
| 2011/0285375 A1 | 11/2011 | Deboy |
| 2012/0119746 A1 | 5/2012 | Macris |
| 2012/0212064 A1 | 8/2012 | Spanoche et al. |

FOREIGN PATENT DOCUMENTS

| | | |
|---|---|---|
| JP | 11103538 | 4/1999 |
| JP | 2000112545 | 4/2000 |
| KR | 2012-0075970 | 7/2012 |
| WO | WO 96/18937 | 6/1996 |
| WO | WO 2004/079257 | 9/2004 |
| WO | WO 2005/112551 | 12/2005 |
| WO | WO 2006/005125 | 1/2006 |
| WO | WO 2007/084196 | 7/2007 |
| WO | WO 2008/097591 | 8/2008 |
| WO | WO 2009/035995 | 3/2009 |
| WO | WO 2010/130273 | 11/2010 |

OTHER PUBLICATIONS

Extended European Search Report issued in related European Patent Application No. 11 818 808.5, Aug. 11, 2014, 6 pages.
Related Taiwanese Patent Application No. 100129635, Office Action issued Jun. 3, 2014 and English-language summary thereof, 16 pages.
ABS Alaskan, Inc., "Diodes in Solar Arrays," copyright 2001, 2 pages.
Al-Atrash, H., "Analysis and Design of a Modular Solar-Fed Fault-Tolerant Power System with Maximum Power Point Tracking," 2005, 144 pages.
Alonso et al., "Cascaded H-Bridge Multilevel Converter for Grid Connected Photovoltaic Generators with Independent Maximum Power Point Tracking of each Solar Array," PESC 2003, Jun. 15-19, 2003, pp. 731-735.
Barchowsky et al., "A Comparative Study of MPPT Methods for Distributed Photovoltaic Generation," PES 2012, Jan. 16-20, 2012, pp. 1-7.
Dondi et al., Modeling and Optimization of a Solar Energy Harvester System for Self-Powered Wireless Sensor Networks, IEEE Trans. on Industrial Electronics, Jul. 2008, pp. 2759-2766.
Ghaisari et al., "An MPPT Controller Design for Photovoltaic (PV) Systems Based on the Optimal Voltage Factor Tracking," 2007 IEEE Canada Electrical Power Conference, Oct. 25-26, 2007, pp. 359-362.
Kjaer, et al. "A Review of Single-Phase Grid-Connected Inverters for Photovoltaic Modules," IEEE Trans. on Industry Applications, Sep. 19, 2005, pp. 1292-1306.
Koutroulis et al., Development of a Microcontroller-Based Photovoltaic Maximum Power Point Tracking Control System, IEEE Trans. on Power Electronics, Jan. 2001, pp. 46-54.
Lindgren, B., "A Power Converter for Photovoltaic Applications," 2000, 69 pages.
Martin et al., "Renewable Energy Storage Analysis for Irrigation and Residential Applications in Colorado's San Luis Valley," Aug. 30, 2006, 20 pages.
Noguchi et al., "Short-Current Pulse-Based Maximum-Power-Point Tracking Method for Multiple Photovoltaic-and-Converter Module System," IEEE Transactions on Industrial Electronics, Feb. 2002, pp. 217-223.
Pongratananukul, N., "Analysis and Simulation Tools for Solar Array Power Systems," 2005, 125 pages.
Shmilovitz et al., "Distributed Maximum Power Point Tracking in Photovoltaic Systems—Emerging Architectures and Control Methods," Automatika vol. 53-1012 No. 2, Jun. 2012, pp. 142-155.
Shannon, J., Shrink Solar Panel Size by Increasing Performance, copyright 2006, 2 pages.

(56) References Cited

OTHER PUBLICATIONS

Tan, Y. T., "Impact on the Power System With a Large Penetration of Photovoltaic Generation," 2004, 160 pages.
Walker et al., "Cascaded DC-DC Converter Connection of Photovoltaic Modules," IEEE Trans. on Power Electronics, Jul. 2004, pp. 1130-1139.
PCT/US11/48320 International Search Report & Written Opinion mailed Apr. 9, 2012, 12 pages.
PCT/US11/48324 International Search Report & Written Opinion mailed Apr. 9, 2012, 11 pages.
PCTUS1148321 International Search Report & Written Opinion mailed Apr. 9, 2012, 11 pages.
PCTUS1148322 International Search Report & Written Opinion mailed Apr. 9, 2012, 10 pages.
Algora et al., "III-V Multijunction Solar Cells for Ultra-High Concentration Photovoltaics," PVSC 2009, pp. 1571-1575.
Barsukov, Yevgen, "Battery Cell Balancing: What to Balance and How," date unkown, 8 pages.
Baughman et al., "Double-Tiered Capacitive Shuttling Method for Balancing Series-Connected Batteries," Vehicle Power and Propulsion, 2005 IEEE Conference, Sep. 2005, 5 pages.
Cornfeld et al., "The 3J-IMM Solar Cell: Pathways for Insertion into Space Power Systems," PVSC 2009, Jun. 2009, pp. 954-959.
Erickson, Robert W., "Future of Power Electronics for Photovoltaics," Applied Power Electronics Conference and Exposition, Feb. 18, 2009, 23 pages.
Fahrenbruch, S., "Active Bypass Diodes," Intersolar 2010, Jul. 14, 2010, 26 pages.
Griggs et al., "p-n Junction Heterostructure Device Physics Model of a Four Junction Solar Cell," Proc. SPIE 6339, Sep. 2006, 8 pages.
Hopkins et al., "The Use of Equalizing Converters for Serial Charging of Long Battery Strings," APEC 1991, pp. 493-498, Mar. 1991.
McDonald, M., "Spectral Efficiency Scaling of Performance Ratio for Multijunction Cells," 34 IEEE photovoltaic Specialist Conference, 2009, pp. 1215-1220.
Moore et al., "A Review of Cell Equalization Methods for Lithium Ion and Lithium Polymer Battery Systems," SAE Publication 2001-01-0959, 2001, 5 pages.
Pulvirenti et al., "DC-DC Converters with MPPT control for Photovoltaic Panels," 25th EU PVSEC/WCPEC-5, Sep. 7, 2010, 8 pages.
Pulvirenti et al., poster, "DC-DC Converters with MPPT control for Photovoltaic Panels," 25th EU PVSEC/WCPEC-5, Sep. 7, 2010, 1 page.
Saha et al., "ST and Solar Photovoltaic," date unknown, but Applicant notes that www.archive.org suggests that this document was posted at least as of Jan. 19, 2010, 22 pages.
Seyrling et al., "Development of Multijunction Thin Film Solar Cells," PVSC 2009, Jun. 2009, pp. 622-625.
Shvarts et al., "Nonlinearity Effects in III-V Multi-Junction Solar Cells," PVSC 2009, Jun. 2009, pp. 1412-1417.
ST SPV1020 datasheet, Interleaved DC-DC boost converter with built-in MPPT algorithm, Copyright 2010, 18 pages.
Stratakos, A., "High-Efficiency Low-Voltage DC-Dc Conversion for Portable Applications," 1998, 245 pages.
Texas Instruments by76PL102 datasheet, "PowerLAN Dual-Cell Li-Ion Battery Monitor with PowerPump Cell Balancing," Copyright 2008, 16 pages.
TIGO Energy Module Maximizer-EP (MM-EP) Data Sheet, Copyright 2009, 2 pages.
Varonides et al., "III-V Triple Junctions and MQW-Fine Turing at 1 EV in Synergy for High Efficiency Solar Cells," PVSC 2009, pp. 282-286.
Wang, M. W., "Novel CdSe-based PV Structure for High Efficiency CdSe/CIGS Tandem Solar Cells," PVSC 2009, pp. 489-493.
Web page, "National Semi SolarMagic Technology—greenpowerZone," retrieved from www.en-genius.net/site/zones/greenpowerZone/product_reviews/grnpowp_071408 on Jun. 29, 2009, 3 pages.
Web page, "SolarMagic Power Optimizers and Blocking Diodes Maximize Solar PV Panel Energy," retrieved from www.solarmagic.com/products on Jun. 29, 2009, 2 pages.
Wilcox et al., "A Case Study of System Power Efficiency Loss Mechanisms in a Multijunction, Spectral Splitting, Concentrator Solar Cell System," PVSC 2009, pp. 616-621.
Wolfs et al., "Distributed Maximum Power Tracking for High Performance Vehicle Solar Arrays," AUPEC 2004, Sep. 2004, 6 pages.
Wolfs et al., Abstract, "A Single Cell Maximum Power Point Tracking Converter without a Current Sensor for High Performance Vehicle Solar Arrays," PESC "05, Jun. 2005, 1 page.
Zhao et al., Development of Ultra-Thin One-Side Contacted GaAs Solar Cells for Mechanically Stacked Multi-Junction Solar Cells, PVSC 2009, Jun. 2009, pp. 202-205.
Sullivan, C.R. et al., "A high-efficiency maximum power point tracker for photovoltaic arrays in a solar-powered race vehicle" Abstract, Power Electronics Specialists Conference, 1993. PESC '93 Record., 24th Annual IEEE, 1 page.

* cited by examiner

SWITCHING CIRCUITS FOR EXTRACTING POWER FROM AN ELECTRIC POWER SOURCE AND ASSOCIATED METHODS

RELATED APPLICATIONS

This application is a divisional of U.S. patent application Ser. No. 13/212,013 filed Aug. 17, 2011, which claims benefit of priority to U.S. Provisional Patent Application Ser. No. 61/375,012 filed Aug. 18, 2010. Each of the above-mentioned applications is incorporated herein by reference.

BACKGROUND

Photovoltaic cells produce a voltage that varies with current, cell operating condition, cell physics, cell defects, and cell illumination. One mathematical model for a photovoltaic cell, as illustrated in FIG. 1, models output current as:

$$I = I_L - I_0 \left\{ \exp\left[\frac{q(V + IR_S)}{nkT}\right] - 1 \right\} - \frac{V + IR_S}{R_{SH}}. \qquad \text{Equation 1}$$

Where
$I_L$=photogenerated current
$R_S$=series resistance
$R_{SH}$=shunt resistance
$I_0$=reverse saturation current
n=diode ideality factor (1 for an ideal diode)
q=elementary charge
k=Boltzmann's constant
T=absolute temperature
I=output current at cell terminals
V=voltage at cell terminals
For silicon at 25° C., kT/q=0.0259 Volts.

Typical cell output voltages are low and depend on the band gap of the material used to manufacture the cell. Cell output voltages may be merely half a volt for silicon cells, far below the voltage needed to charge batteries or drive most other loads. Because of these low voltages, cells are typically connected together in series to form a module, or an array, having an output voltage much higher than that produced by a single cell.

Real-world photovoltaic cells often have one or more microscopic defects. These cell defects may cause mismatches of series resistance $R_S$, shunt resistance $R_{SH}$, and photogenerated current $I_L$ from cell to cell in a module. Further, cell illumination may vary from cell to cell in a system of photovoltaic cells, and may vary even from cell to cell in a module, for reasons including shadows cast by trees, bird droppings shadowing portions of a cell or module, dust, dirt, and other effects. These mismatches in illumination may vary from day to day and with time of day—a shadow may shift across a module during a day, and rain may wash away dust or dirt shadowing a cell.

From equation 1, output voltage is greatest at zero output current, and output voltage V falls off nonlinearly with increasing output current I. FIG. 2 illustrates the effect of increasing current drawn from a photovoltaic device at constant illumination. As current I is increased under constant illumination, voltage V falls off slowly, but as current I is increased to an output current near the photocurrent $I_L$, output voltage V falls off sharply. Similarly, cell power, the product of current and voltage, increases as current I increases, until falling voltage V overcomes the effect of increasing current, whereupon further increases in current I drawn from the cell cause power P to decrease rapidly. For a given illumination, each cell, module, and array of cells and modules therefore has a maximum power point (MPP) representing the voltage and current combination at which output power from the device is maximized. The MPP of a cell, module, or array will change as temperature and illumination, and hence photo-generated current $I_L$, changes. The MPP of a cell, module, or array may also be affected by factors such as shadowing and/or aging of the cell, module, or array.

A photovoltaic cell can be operated at or near its maximum power point by use of a Maximum Power Point Tracking (MPPT) controller. MPPT controllers are devices that determine an MPP voltage and current for a photovoltaic device connected to their input, and adjust their effective impedance to maintain the photovoltaic device at the MPP. MPPT controllers typically measure photovoltaic device voltage and current at a number of operating points, calculate power at each operating point from the voltage and current measurements, and determine which operating point is closest to the MPP.

It can be difficult to operate a number of photovoltaic cells at their MPP when the cells are electrically coupled together. For example, FIG. 3 illustrates four photovoltaic cells electrically coupled in a series string. Without diodes D1-D3 or other added circuitry, each of the cells must carry the same current. Variations in parameters such as photo-generated current $I_L$, effective shunt resistance $R_{SH}$, series resistance, and/or temperature between cells of a module or of an array described above may cause the maximum power point output current for one cell Cstrong in a string to be at a current well above the maximum power point output current Iweak for another cell Cweak in the string. In some arrays under some conditions, if Cstrong is operating at its MPP current, Cweak is subjected to a current above its MPP current, possibly resulting in damage to Cweak. Cweak may even reverse-bias—thereby consuming power instead of generating power, or blocking current flow from the better producing cells in the same string. The net effect is that power output from a panel or a series string of panels is limited by the performances of the poorer-producing cells in the series string.

Some prior solar panels have bypass diodes D1, D2, D3 at the module, at the cell, or at a group of cells, level, as illustrated in FIG. 3. The bypass diodes prevent possible damage to the weak cell Cweak resulting from excessive forward current. The bypass diodes also prevent Cweak from reverse-biasing and blocking current flow from better producing cells in the string, but, as the low producing cell and any other cells in the same group with the same bypass diode is bypassed, any power produced by Cweak and cells in its group is lost. Additionally, some power from the better producing cells is dissipated in the diode due to its forward voltage drop. As illustrated in FIG. 3, while some modules may provide bypass diodes such as D2 across individual cells, other modules or systems may provide diodes such as D1 across groups of cells, or even across entire modules, instead of across individual cells. Many crystalline silicon modules on the market today provide bypass diodes across "6-volt" sections of around a dozen cells.

Other systems are known, as illustrated in FIG. 40, that use distributed, per-panel, DC-DC converters 4002 or DC-AC microinverters to drive a common power-summing high-voltage bus 4004 as illustrated in FIG. 40. Each converter 4002 receives power from a solar module 4006, each module having many photovoltaic cells 4008, at whatever voltage and current that module 4006 is capable of generating and potentially at the MPP of that module, and converts and outputs the power onto the high-voltage power-summing bus 4004. Since modules are no longer connected in series, low production by one module does not interfere with production by high-performing modules. Further, potential power production by low-performing modules is summed on the bus and not wasted.

An issue with distributed, per-panel voltage converter architectures is that such architectures help to achieve MPP only at the panel level, but do not work at the individual cell level. For example, when even a single cell of a panel is cracked or partially shaded—the entire panel may not deliver the full potential power from the rest of the cells. Cells may also be mismatched through manufacturing variations, differential soiling, and aging as well as damage and shade. U.S. patent application publication number 2009/0020151 proposes variations on using local converters to drive DC or AC power-summing buses in parallel.

Yet another alternative is disclosed in U.S. patent application publication number 2008/0236648, in which power from groups of photovoltaic cells is fed into respective MPPT DC-DC converters to produce a current constant throughout all DC-DC converters of the array at a voltage at each converter that depends on power available from the attached photovoltaic device. The outputs of the DC-DC converters are connected in series.

It may also be difficult to operate multiple junctions in a multi-junction photovoltaic cell at their respective maximum power points. Multi-junction photovoltaic cells have two or more junctions of different types stacked vertically, and each junction is intended to respond to light of a different wavelength. For example, two junction photovoltaic cells typically have a top junction made of materials with large bandgap and thus having a relatively short favored wavelength and a maximum power point at relatively high voltage, and a bottom junction having a lower bandgap and thus having a relatively long favored wavelength and a maximum power point at relatively low voltage.

Cells of multi-junction photovoltaic devices are often coupled electrically in series as they are formed, without bringing out a conductor from between the cells. While this construction simplifies connections to the cells, inefficiencies result for the same reasons that output of mismatched series-connected photovoltaic devices may be restricted; effective output current is determined by the lowest-current output of the stacked cells. This situation is aggravated by variations in color, or wavelength distribution, of received light, and by differences in types and efficiencies of the stacked cells. A given junction of a multi-junction cell may also be damaged by excessive forward current unless a bypass device, such as a diode, is provided.

Multi-junction photovoltaic devices have been studied, including those having stacked cells with a low-resistance electrical contact to a boundary between junctions, and those having junctions brought out separately. For example, see McDonald, Spectral Efficiency Scaling of Performance Ratio for Multijunction Cells, 34 IEEE Photovoltaic Specialist Conference, 2009, pg. 1215-1220.

SUMMARY

In an embodiment, an electric power system includes N electric power sources and N switching circuits, where N in an integer greater than one. Each switching circuit includes an input port electrically coupled to a respective one of the N electric power sources, an output port, and a first switching device adapted to switch between its conductive and non-conductive states to transfer power from the input port to the output port. The output ports of the N switching circuits are electrically coupled in series and to a load to establish an output circuit. Each of the N switching circuits uses an interconnection inductance of the output circuit as a primary energy storage inductance of the switching circuit.

In an embodiment, an electric power system includes N electric power sources and N switching circuits, where N is an integer greater than one. Each switching circuit includes an input port electrically coupled to a respective one of the N electric power sources, an output port, and a first switching device adapted to switch between its conductive and non-conductive states to transfer power from the input port to the output port. Each of the N switching circuits uses an interconnection inductance of a respective input circuit formed from a series connection of at least its input port and its respective one of the N electric power sources as a primary energy storage inductance of the switching circuit.

In an embodiment, an electric power system includes N photovoltaic devices and N switching circuits, where N is an integer greater than one. Each switching circuit includes an input port electrically coupled to a respective one of the N photovoltaic devices, an output port, and a first switching device adapted to switch between its conductive and non-conductive states to transfer power from the input port to the output port. The output ports of the N switching circuits are electrically coupled in series and to a load to establish an output circuit. The system further includes a system control device including (1) a transistor electrically coupled in series with the output circuit, (2) a current sense subsystem configured to generate a current sense signal representing a magnitude of current flowing through the output circuit, and (3) a control subsystem in communication with the transistor and the current sense subsystem. The control subsystem is configured to control the transistor based at least in part on the current sense signal to control current through the output circuit.

In an embodiment, an electric power system includes first and second electric power sources electrically coupled in series. The first electric power source is capable of generating a maximum current having a first value, and the second electric power source is capable of generating a maximum current having a second value that is smaller than the first value. The system further includes first and second switching circuits operable to perform maximum power point tracking. The first and second electric power sources and the first and second switching circuits are electrically coupled such that the first and second switching circuits are collectively operable to at least substantially maximize an amount of electric power extracted from both of the first and second electric power sources.

In an embodiment, an electric power system includes N photovoltaic strings, where N is an integer greater than one. Each photovoltaic string includes a plurality of photovoltaic devices and a plurality of DC-to-DC converters with output ports electrically coupled in series with a string optimizer. Each DC-to-DC converter is adapted to at least substantially maximize power extracted from a respective one of the plurality of photovoltaic devices, and each string optimizer is adapted to interface its respective string with a common bus.

In an embodiment, an electric power system includes N photovoltaic strings, where N is an integer greater than one. Each photovoltaic string includes a plurality of photovoltaic devices and a plurality of DC-to-DC converters with output ports electrically coupled in series with a string inverter. Each DC-to-DC converter is adapted to at least substantially maximize power extracted from a respective one of the plurality of photovoltaic devices, and each string inverter is adapted to interface its respective string with a common alternating current bus.

In an embodiment, an electric power system includes N switching circuits, where N is an integer greater than one. Each switching circuit includes an input port, an output port including a first and second output terminal, and a first switching device adapted to switch between its conductive and non-conductive states. The output ports of the N switching circuits are electrically coupled in series with a load to establish an output circuit. Each switching circuit is adapted to cause its first switching device to switch between its conductive and non-conductive states to transfer power from the input port to the output port in a first operating mode of the switching circuit, and each switching circuit is adapted to shunt its first and second output terminals in a second operating mode of the switching circuit.

In an embodiment, an electric power system includes a photovoltaic device and a switching circuit. The switching circuit includes (1) an input port electrically coupled to the photovoltaic device, (2) an output port for electrically coupling to a load, (3) a first switching device adapted to switch between its conductive and non-conductive states to transfer power from the input port to the output port, and (4) a controller adapted to cause the first switching device to switch between its conductive and non-conductive states at a frequency greater than 200 kilohertz that at least substantially maximizes an amount of electric power delivered to the load.

In an embodiment, a system for extracting power from N electric power sources includes N switching circuits, where N is an integer greater than one. Each switching circuit includes (1) an input port for electrically coupling to a respective one of the N electric power sources, (2) an output port for electrically coupling to a load, (3) a first switching device configured to switch between its conductive state and its non-conductive state to transfer power from the input port to the output port, and (4) a controller configured to control switching of the first switching device to at least substantially maximize an amount of power extracted from the respective one of the N electric power sources electrically coupled to the input port of the switching circuit. The system further includes at least one additional switching device configured to electrically couple output ports of at least two of the N switching circuits either in series or in parallel.

In an embodiment, an electric power system includes N photovoltaic strings electrically coupled in parallel, where N is an integer greater than one. Each string includes a plurality of photovoltaic devices and a plurality of switching circuits. Each switching circuit includes (1) an input port electrically coupled to a respective one of the plurality of photovoltaic devices, (2) an output port, and (3) first and second switching devices electrically coupled in series across the input port, where the second switching device is also electrically coupled across the output port and adapted to provide a path for current through the output port when the first switching device is in its non-conductive state. The output ports are electrically coupled in series in each of the N photovoltaic strings. Each of the switching circuits uses an interconnection inductance of a circuit including its output port as a primary energy storage inductance of the switching circuit.

DETAILED DESCRIPTION OF THE EMBODIMENTS

Figure 1:
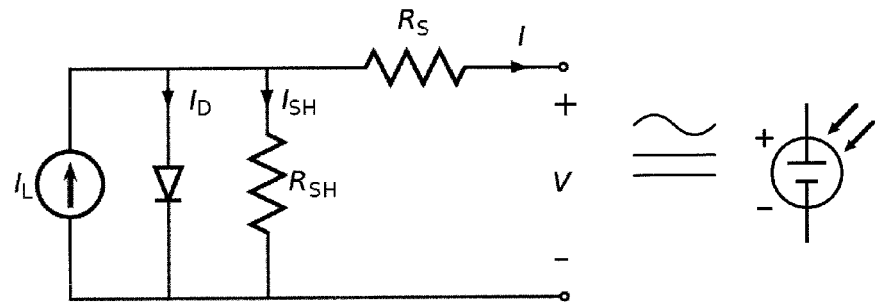
FIG. 1 shows one model of a photovoltaic cell.
Figure 2:
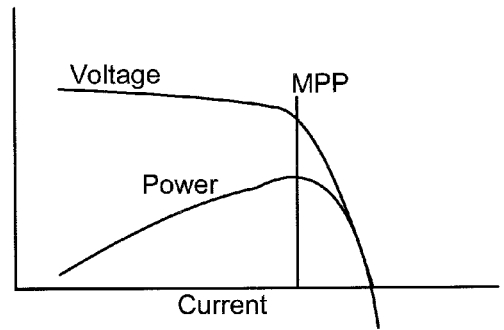
FIG. 2 shows a graph of voltage and power as a function of current for one photovoltaic cell.
Figure 3:
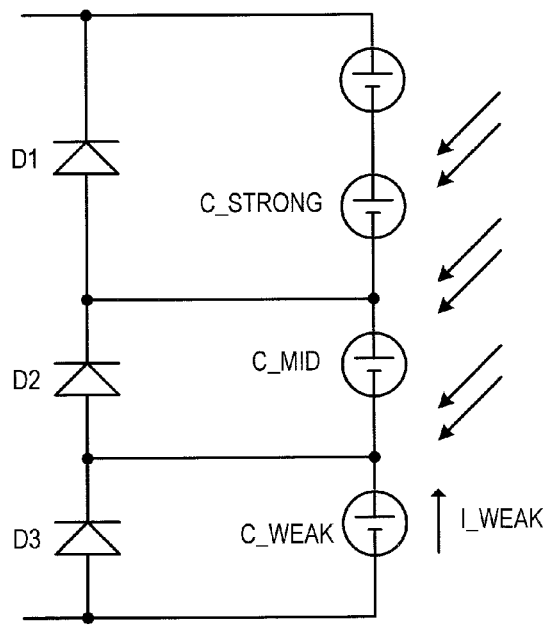
FIG. 3 shows one series string of photovoltaic cells.

Disclosed herein are systems and methods that may be used to help maximize an amount of electric power extracted from an electric power source with a non-linear power curve, such as a photovoltaic device, a battery, or a fuel cell. Such systems and methods, for example, are simpler and/or lower cost than typical prior solutions, thereby potentially enabling MPPT on a per cell basis, which was generally not practical with prior MPPT solutions due to their cost and complexity. It is noted that, for purposes of illustrative clarity, certain elements in the drawings may not be drawn to scale. Specific instances of an item may be referred to by use of a numeral in parentheses (e.g., electric power source 402(1)) while numerals without parentheses refer to any such item (e.g., electric power sources 402).

Figure 4:
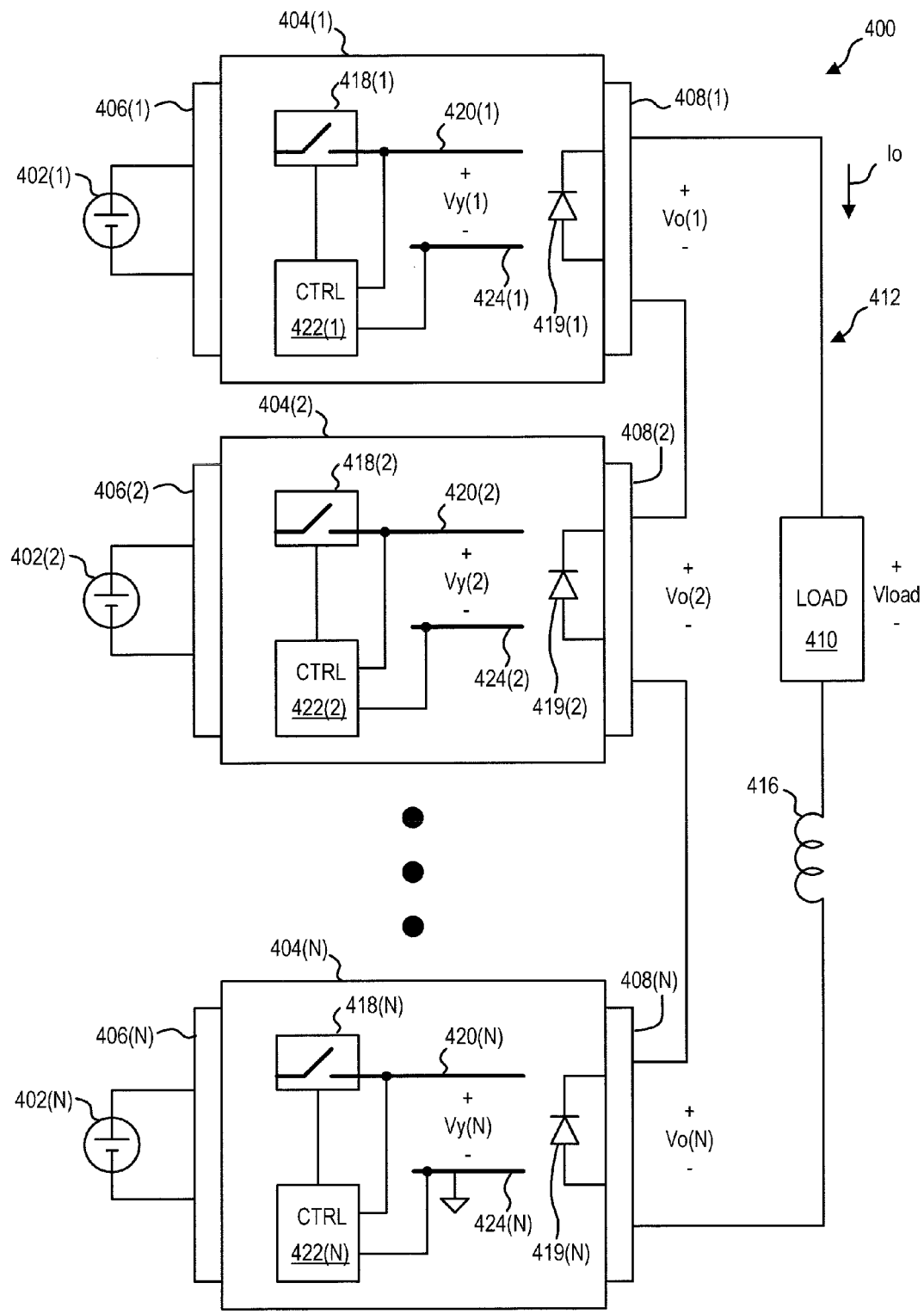
FIG. 4 shows one electric power system including switching circuits for extracting power from electric power sources, according to an embodiment.

FIG. 4 shows one electric power system 400, which includes N electric power sources 402, where N is an integer greater than one. Electric power sources 402, for example, are photovoltaic devices with or without light concentrating optics, such as individual photovoltaic cells, individual junctions of one or more multi-junction photovoltaic cells, or groups including a number of electrically coupled photovoltaic cells (e.g., multiple photovoltaic cells electrically coupled in series and/or in parallel). In some embodiments, electric power sources 402 are photovoltaic devices of one or more photovoltaic panels or sub-modules of a photovoltaic panel, where each sub-module is a subset of a photovoltaic panel including a number of photovoltaic cells electrically coupled in series and/or parallel. For example, in some embodiments, each electric power source 402 is a series combination of one or more rows and/or columns of photovoltaic cells in a photovoltaic panel. Other examples of electric power sources 402 include fuel cells and batteries.

System 400 further includes N switching circuits 404. Each switching circuit 404 includes an input port 406 coupled to a respective electric power source 402, and an output port 408 electrically coupled to a load. As discussed further below, each switching circuit 404 is configured to at least substantially maximize an amount of power extracted from its respective electric power source 402 and delivered to a load.

Thus, switching circuits 404 are configured to operate their respective electric power sources 402 at least substantially at their maximum power points.

Figure 41:
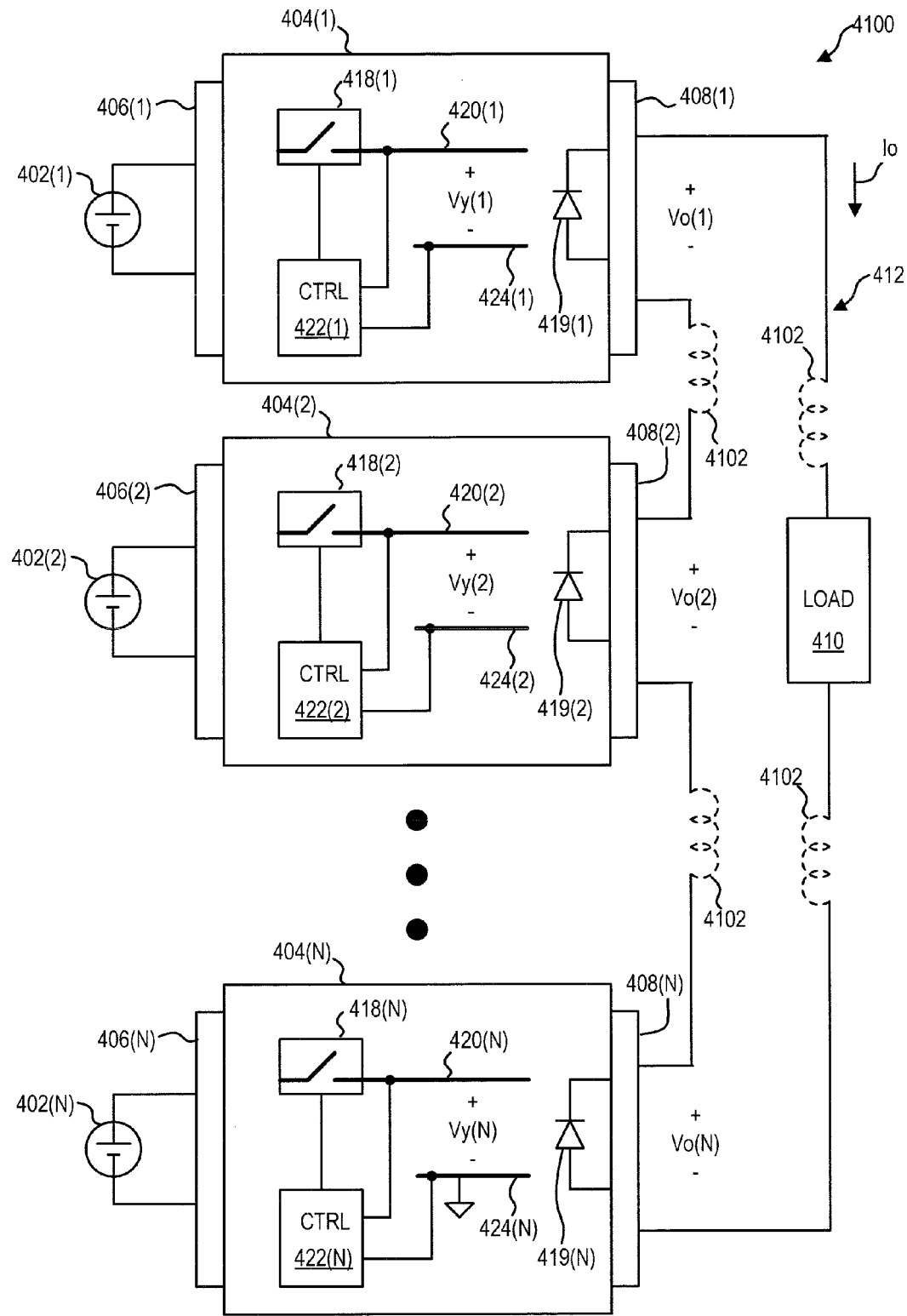
FIG. 41 shows an embodiment of the electric power system of FIG. 4 including interconnection inductance.

Output ports 408 are electrically coupled in series with a load 410, such as an inverter, to form a closed circuit, hereinafter referred to as output circuit 412. Each output port 408, as well as load 410, carries the same output circuit current Io due to their series connection. Output circuit 412 has an inductance, symbolically shown as a single inductor 416, which results, for example, from one or more discrete inductors internal and/or external to switching circuits 404 and electrically coupled in series with output circuit 412. Alternately, output circuit inductance 416 is composed primarily or completely of interconnection inductance, which is inductance of wiring or other conductors such as bus bars connecting components (e.g., output ports 408, load 410) to form output circuit 412. For example, FIG. 41 shows an electric power system 4100, which is an embodiment of system 400 where output circuit 412 inductance includes interconnection inductance 4102.

Each switching circuit 404 includes a respective first switching device 418 configured to switch between its conductive state and its non-conductive state to transfer power from input port 406 to output port 408. Thus, first switching device 418 may be considered a "control switch" because its operation is varied to control transfer of power from input port 406 to output port 408. A ratio of a switching device's conduction time to its non-conduction time is often referred to as the switching device's duty cycle (D). In this document, a switching device includes, but is not limited to, a bipolar junction transistor, a field effect transistor (e.g., an N-channel or P-channel metal oxide semiconductor field effect transistor (MOSFET) such as a laterally diffused metal oxide semiconductor transistor (LDMOS), a junction field effect transistor, a metal semiconductor field effect transistor), an insulated gate bipolar junction transistor, a thyristor, or a silicon controlled rectifier.

First switching devices 418 typically switch at a frequency of at least 20 kHz such that sound resulting from component movement due to switching currents is above a frequency range perceivable by humans. Operating switching devices 418 at a high switching frequency (e.g., at least 20 kHz) instead of at a lower switching frequency may also facilitate (1) use of smaller energy storage components (e.g., output circuit 412 inductance and filter capacitors at the inputs and at the load), and/or (2) a reduction in ripple current and ripple voltage magnitude.

Additionally, it may be advantageous to operate switching devices 418 at a significantly higher frequency than 20 kHz to maximize power delivered to load 410. In particular, the input current into each switching circuit 404 has a ripple component which reduces efficiency of its respective electric power source 402. Specifically, the greater the ripple current magnitude, the further that the electric power source 402 is from providing RMS current with magnitude corresponding to its maximum power point. Thus, electric power source 402 efficiency may be increased by increasing switching frequency because ripple current magnitude generally decreases with increasing switching frequency. However, increasing switching frequency typically increases switching losses in switching circuits 404. Thus, there is typically an optimal switching frequency range that maximizes total power delivered to load 410. In certain embodiments of switching circuit 404 and electric power source 402, maximum power transfer occurs when switching frequency of first switching devices 418 ranges from about 500 kHz to 800 kHz. Operating switching devices 418 at a high frequency, such as at least 200 kHz, may also enable use of relatively small, inexpensive, and/or reliable input and/or output capacitors, such as multi-layer ceramic capacitors. For example, in certain embodiments, switching frequency is sufficiently high such that ripple current generated from switching device switching is filtered primarily by multi-layer ceramic capacitors. Conventional MPPT systems, in contrast, typically operate at significantly lower switching frequencies, thereby necessitating use of relatively large, expensive, and unreliable input and output capacitors, such as electrolytic capacitors.

In certain embodiments, first switching devices 418 each switch at a respective fixed frequency, and power transfer between ports 406, 408 is controlled by pulse width modulation (PWM). In PWM, duty cycle of first switching device 418 is varied to control power transfer between input port 406 and output port 408. However, in some embodiments, first switching device 418's switching frequency is varied to control power transfer, such as during low power operating conditions, where operating at a varying frequency may be more efficient than operating at a fixed frequency. One exemplary variable frequency operating mode is pulse frequency modulation (PFM), where switching frequency is varied to control power transfer from port 406 to port 408.

In certain embodiments where switching circuits 404 are controlled by PWM, switching transitions of each first switching device 418 are displaced in phase from those of each other switching device 418 such that ripple current generated by each switching circuit 404 at least partially cancels ripple current generated by each other switching circuit 404. For example, in certain embodiment including three switching circuits 404 each controlled by PWM, turn-on of each first switching device 418 is displaced by 120 degrees from turn-on of each other first switching device 418. Alternately, in some embodiments, switching frequency is purposefully loosely controlled such that switching frequency will likely vary among instances of switching circuits 404, thereby helping to reduce ripple and transients resulting from multiple switching circuits 404 simultaneously switching. For example, if output ports 408 of N switching circuits 404 are electrically coupled in series, the magnitude of output current Io ripple is reduced by a factor of the square root of N when each switching circuit 404's switching frequency is randomized compared to when they synchronously switch. In some embodiments, switching frequency is allowed to vary by at least ten percent among instances of switching circuit 404 to help achieve effective randomization of switching frequency among many instances. Such loose control of switching frequency is achieved, for example, by using components with loose tolerance specifications, such as 20% tolerance resistors instead of 1% tolerance resistors.

Each switching circuit 404 further includes an additional switching device or a diode that provides a bypass path for output current Io to bypass first switching device 418 during times when first switching device 418 is in its non-conductive state. For example, in the FIG. 4 embodiment, a diode 419 is electrically coupled in parallel with each output port 408 to provide a bypass path. Diode 419 is, for example, a schottky diode to minimize forward voltage drop. In some embodiments, diode 419 is replaced by or supplemented with a second switching device to reduce losses in the bypass path compared to when using diode 419 alone. For example, diode 419 could be a body diode of the transistor electrically coupled in parallel with output port 408. As another example, a discrete second switching device could be electrically coupled in parallel with diode 419.

Each switching circuit 404 further includes an intermediate switching node 420 that transitions between at least two different voltage levels at least in part due to first switching device 418 switching between its conductive and non-conductive states. In some embodiments, intermediate switching node 420 is directly electrically coupled to its respective first switching device 418, as shown in FIG. 4. In other embodiments, one or more components, such as a transformer (not shown), separate intermediate switching node 420 from its respective first switching device 418. An example of a transformer coupled switching circuit is discussed below with respect to FIG. 7.

Each switching circuit 404 additionally includes a controller 422 that controls switching of first switching device 418 to at least substantially maximize an amount of power extracted from its respective electric power source 402, such as by adjusting duty cycle of first switching device 418. In particular, although output circuit current Io may vary over time due to a variety of factors, such as a change in load 410, controller 422 operates much faster than current Io can change. Therefore, output circuit current Io can be considered nearly constant between successive changes in duty cycle of first switching device 418, and any change in switching circuit output power results primarily from a change in the average value of switching circuit output voltage Vo (Vo_avg), as output power is the product of current Io and Vo_avg. Power extracted from electric power source 402 will be the same as switching circuit output power, minus losses in switching circuit 404. Thus, controller 422 adjusts duty cycle of first switching device 418 to at least substantially maximize Vo_avg. By maximizing Vo_avg, switching circuit output power, as well as power extracted from respective electric power source 402, is at least substantially maximized.

In some embodiments, output voltage Vo is essentially a DC voltage, and controller 422 determines Vo_avg by directly monitoring Vo. However, many embodiments of switching circuits 404 do not include an output filter, and their output voltage is the same as a switching voltage Vy, which is a voltage between intermediate switching node 420 and a power rail 424. In such embodiments, controller 422 maximizes Vo_avg by maximizing an average value of a switching node voltage Vy (Vy_avg), which is representative of Vo_avg. Power rail 424 may be a positive or a negative power rail, depending on the configuration of switching circuit 404. In embodiments where power rail 424 is a negative power rail, such as in the embodiment of FIG. 6 below, Vy is the voltage from the intermediate switching node to the power rail, as shown in FIG. 4. However, in embodiments where the reference node is a positive power rail, such as in the embodiment of FIG. 5 below, Vy is the voltage from the power rail to the intermediate switching node.

Thus, each switching circuit 402 at least substantially maximizes an amount of electric power extracted from its respective electric power source 402 by maximizing Vo_avg (e.g., by maximizing Vy_avg which represents Vo_avg), assuming Io remains essentially unchanged between successive changes in duty cycle of first switching device 418. It should be appreciated that no power calculations are required for such MPPT function, thereby potentially freeing switching circuits 404 from requiring power calculating hardware, firmware and/or software to determine the product of voltage and current, as typically required in prior MPPT systems. Certain embodiments of switching circuits 404 may therefore be simpler and/or lower cost than typical prior MPPT controllers, thereby potentially enabling MPPT on a per cell basis, which was generally not practical with prior MPPT controllers due to their cost and complexity.

It should be realized, however, that although switching circuits 404 do not require current measurement or power calculating functionality to realize MPPT, switching circuits 404 are not precluded from including such functionality. For example, alternate embodiments of switching circuits 404 may utilize both voltage and current measurements to achieve a more accurate MPPT and/or to realize MPPT in applications where load 410 causes output circuit current Io to rapidly change. As another example, some embodiments of switching circuits 404 may include current measurement circuitry to achieve over-current protection and/or diode emulation by reverse current blocking.

As discussed above, controller 422 operates much faster than output circuit current Io changes. In particular, as duty cycle changes by a given percentage, Io changes relative to the magnitude of its normal operating range by a smaller percentage, ideally by a much smaller percentage. Such relationship is promoted by use of a relatively large value of output circuit 412 inductance and/or by changing duty cycle at a relatively fast rate so that Io has limited opportunity to change between successive changes in duty cycle. However, to most accurately track the MPP of electric power source 402, duty cycle should not be changed more quickly than transients settle after a change in duty cycle. In particular, a change in duty cycle results in ringing with a time constant dependent on effective resistance of electric power source 402 and bypass capacitance (not shown) of electric power source 402. It should also be noted that in embodiments where load 410 is at least approximately a constant current load, output circuit 412 need not have a large inductance value.

Certain embodiments of switching circuit 404 have two or more operating modes. Such embodiments include a maximum power point tracking switching mode (MPPT switching mode), where switching circuits 404 operate as described above to at least substantially maximize an amount of power extracted from their respective electric power sources 402. However, such embodiments have one or more additional operating modes, such as a tri-state mode, which is typically utilized by a switching circuit 404 when its respective electric power source 402's output power is too low for proper switching circuit 404 operation (e.g., when output of electric power source 402 is too low to turn on a bypass transistor across diode 419). A switching circuit 404 operating in its tri-state mode is turned off (i.e., its first switching device 418 is not turned on), but the switching circuit nevertheless provides a path for Io to bypass the switching circuit, so that other switching circuits 404 can continue to power load 410. Such bypass path can be provided by diode 419 in the switching circuit 404. For example, in certain embodiments, first switching device 418 includes a field effect transistor, and the transistor's body diode provides a bypass path for Io when the switching circuit is turned off. In some embodiments, diode 419 is schottky diode to provide a low voltage drop bypass path.

Some embodiments of switching circuit 404 include a bypass mode, which is typically utilized by the switching circuit when output power of its respective electric power source 402 is too low to provide meaningful power to load 410, but when sufficient power is available to operate controller 422. In the bypass mode, controller 422 causes a switching device in parallel with diode 419 to provide a bypass path for Io. Alternately, a switching device that is nominally on with zero voltage, such as a depletion mode transistor, can be placed in parallel with or replace diode 419 to provide a low voltage drop bypass path and thereby enable the bypass mode, even in situations where output of power source 402 is too low to operate controller 422, thus rendering a tri-state mode unnecessary. The bypass mode, when available, is generally preferred to the tri-state mode because voltage drop across the switching device when turned on is typically lower than a diode's forward voltage drop. Other examples of when a switching circuit 404 may operate in a bypass mode include (1) when power transferred between input and output ports 406, 408 is below a threshold value, (2) when a magnitude of current into input port 406 is below a threshold value, (3) when current flowing out of output port 408 exceeds a threshold value, (4) when a temperature of switching circuit 404 exceeds a threshold value, (5) when magnitude of voltage across input port 406 drops below a threshold value, and/or (6) when magnitude of voltage across input port 406 exceeds a threshold value. Additional examples of switching circuit operating modes are discussed below with respect to FIG. 17.

In some embodiments of system 400, load 410 requires that a voltage Vload across the load be a minimum value for the load to conduct output current Io. Examples of such loads include battery charging systems and some grid tie inverters. In such embodiments, a number of switching circuits 404 are optionally synchronized such that their first switching devices 418 initially turn on at the same time so that Vload rises to a threshold value required by load 410 to conduct output current Io.

Certain embodiments of switching circuit 404 include additional features, such as over-temperature protection, over-voltage protection, and/or over-current protection. For example, in certain embodiments, controller 422 is adapted to monitor temperature of switching circuit 404 and shut down the switching circuit, or operate the switching circuit in a bypass mode, in response to an over-temperature condition. As another example, in some embodiments, controller 422 is operable to monitor input voltage magnitude across input port 406 and shut down the switching circuit if input voltage magnitude exceeds a threshold value. As another example, in some embodiments, controller 422 is adapted to control operation of first switching device 418 to limit magnitude of current provided by switching circuit 404.

Specific examples of switching circuits 404 and their applications are discussed below. However, it should be appreciated that switching circuits 404 could have configurations other than those discussed below.

Figure 5:
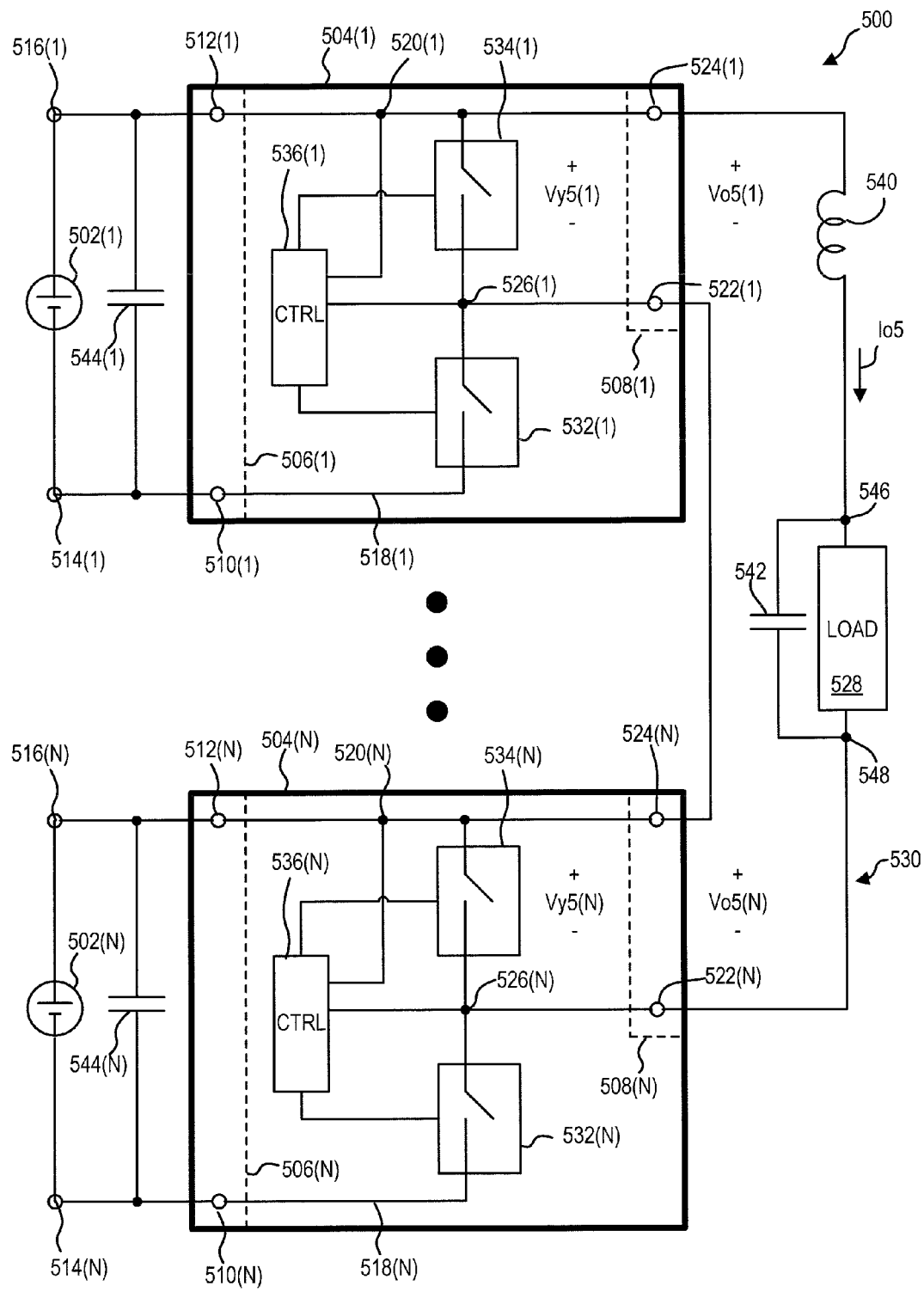
FIG. 5 shows one electric power system including buck-type switching circuits for extracting power from electric power sources, according to an embodiment.

FIG. 5 shows one electric power system 500, which includes N electric power sources 502, such as photovoltaic devices or fuel cells, and N electric switching circuits 504, where N is an integer greater than one. Switching circuits 504 are an embodiment of switching circuits 404 of FIG. 4, and each switching circuit 504 includes an input port 506 and an output port 508. Each input port 506 includes a first and second input terminal 510, 512 respectively electrically coupled to negative and positive terminals 514, 516 of a respective electric power source 502. First input terminal 510 and negative terminal 514 form part of a negative input node 518, and second input terminal 512 and positive terminal 516 form part of a positive input node 520. Each output port 508 includes a first and second output terminal 522, 524. First output terminal 522 is electrically coupled to an intermediate switching node 526 (analogous to intermediate switching node 420 of FIG. 4), and each second output terminal 524 is electrically coupled to positive input node 520. Each output port 508 is electrically coupled in series with a load 528 (e.g., an inverter) to form a closed circuit, hereinafter referred to as output circuit 530.

Switching circuits 504 have a buck-type topology. In particular, each switching circuit 504 includes a first switching device 532, which is analogous to first switching device 418 of FIG. 4, electrically coupled between first input terminal 510 and intermediate switching node 526. Each switching circuit 504 further includes a second switching device 534 and a controller 536 configured to control operation of first and second switching devices 532, 534. Second switching device 534 is electrically coupled between second input terminal 512 and intermediate switching node 526. In alternate embodiments, second switching device 534 is replaced with a diode (e.g., a schottky diode) connected such that when forward biased, current flows through the diode from intermediate switching node 526 to positive input node 520.

Switching circuit 504 is inverted relative to a traditional buck-type topology in that its output (terminals 522, 524) is electrically coupled between positive input node 520 and intermediate switching node 526, instead of between intermediate switching node 526 and negative input node 518 as in a traditional buck-type topology. Consequentially, first switching device 532, instead of second switching device 534, acts as a control switch. Switching circuit 504 has a switching node voltage Vy5, which is analogous to switching node voltage Vy of FIG. 4, between positive input node or positive power rail 520 and intermediate switching node 526. Switching circuit 504 also has an output voltage Vo5 across output terminals 524, 522. In embodiments that do not include an output filter for each switching circuit 504, such as shown in FIG. 5, Vy5 is the same as Vo5. Vo5_avg, which is the average value of Vo5, is proportional to duty cycle of first switching device 532. Second switching device 534 provides a path for output circuit current Io5 (analogous to Io of FIG. 4) when first switching device 532 is off. Specifically, current Io5 will ramp up when first switching device 532 is turned on due to presence of inductance 540 in output circuit 530. When controller 536 turns off first switching device 532, inductance 540 prevents current Io5 from instantaneously changing. Second switching device 534 therefore turns on to provide a path for current Io5 to ramp down until current Io5 either reaches zero or first switching device 532 turns back on. Thus, first and second switching devices 532, 534 cooperate to transfer power from input port 506 to output port 508.

The inverted buck-type topology of switching circuits 504 may be preferred over a non-inverted buck-type topology in some applications. In particular, it is anticipated that in many applications, Vo5_avg will be close to a voltage of electric power source 502, and duty cycle will therefore be large. In such situations and where the switching devices are complementary MOSFETs, it may be desired that first switching device 532, instead of second switching device 534, be the control switch, as it is typically simpler to implement first switching device 532 as an N-channel MOSFET than second switching device 534. N-channel MOSFETs are generally preferred over P-channel MOSFETS because N-channel MOSFETS generally have a lower channel resistance than otherwise similar P-channel MOSFETS.

Figure 42:
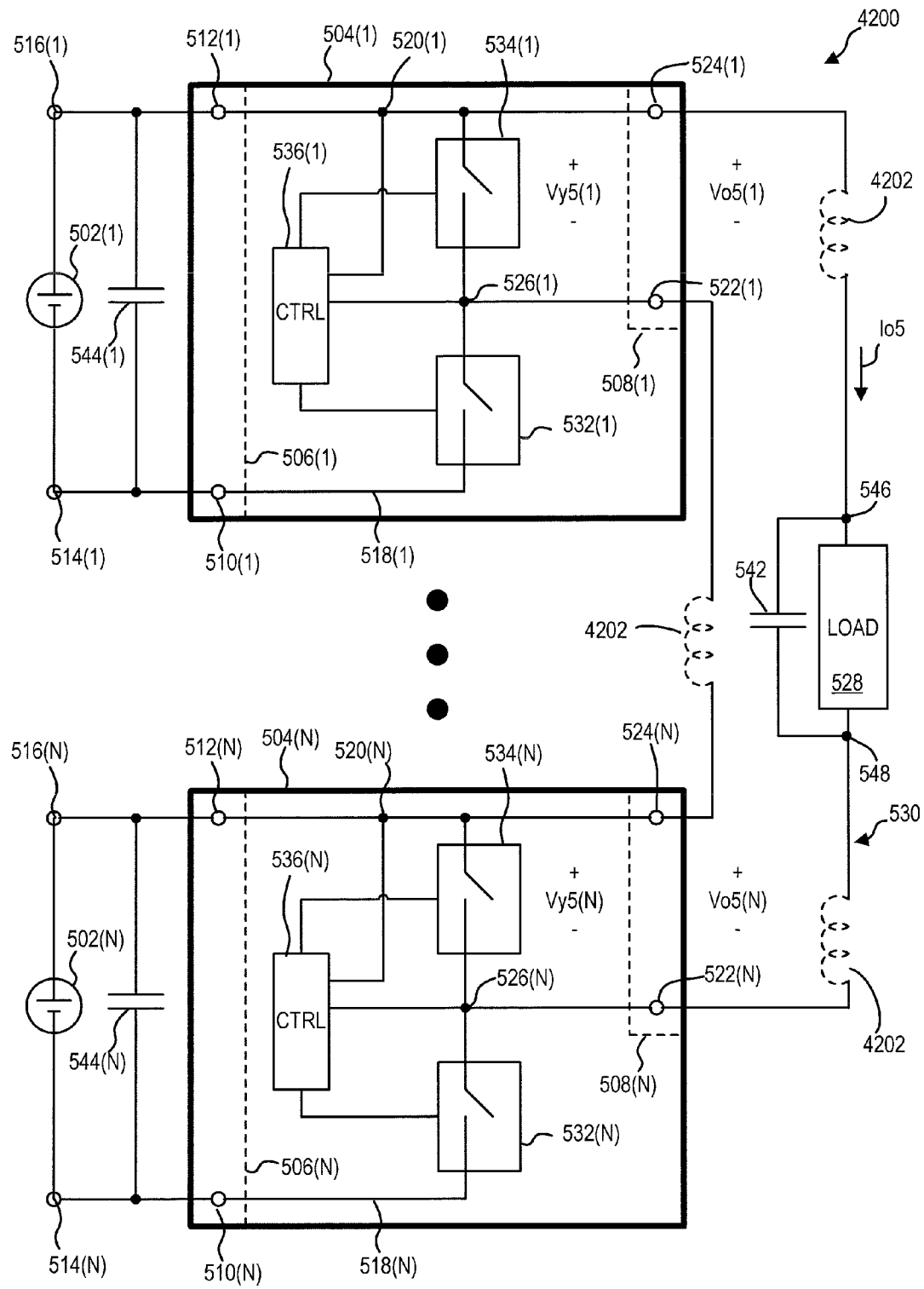
FIG. 42 shows an embodiment of the electric power system of FIG. 5 including interconnection inductance.

In the embodiment of FIG. 5, switching converters 504 do not include an individual energy storage inductor. Instead, switching converters 504 share energy storage inductance 540 in output circuit 530, and Vo5 has a large AC component. Inductance 540, while symbolically shown as a single inductor, may include one or more discrete inductors and/or interconnection inductance of wires or other conductors connecting components (e.g., output ports 508) forming output circuit 530. In some embodiments, inductance 540 includes primarily or completely interconnection inductance. Use of interconnection inductance instead of discrete inductors may reduce cost and/or size of electric power system 500. For example, FIG. 42 shows an electric power system 4200, which is an embodiment of system 500 where inductance 540 includes interconnection inductance 4202. First and second switching devices 532, 534, for example, are configured such that their switching frequency is sufficiently high to allow for use of interconnection inductance as a primary energy storage inductance 540. In alternate embodiments, one or more of switching circuits 504 includes one or more discrete inductors (not shown) electrically coupled in series with its output terminals 522, 524, such that switching node voltage Vy5 is different from Vo5.

In the embodiment of FIG. 5, switching circuits 504 also do not include an output filter capacitor across individual output terminals 524, 522. Instead, switching circuit circuits 504 share a common output filter capacitance 542, which represents one or more capacitors electrically coupled in parallel with load 528. However, switching circuits 504 are not precluded from including output filter capacitors of their own, and such capacitors may be included in addition to or in place of common output filter capacitor 542. If a switching circuit 504 does include its own output filter capacitor, the switching circuit must also include its own output inductor. For example, each switching circuit may include a respective output inductor and output filter capacitor, which typically has a small capacitance, in addition to common output filter capacitor 542.

A capacitor 544 across each electric power source 502 may be required, depending on the characteristics of electric power source 502. For example, if electric power source 502 is a photovoltaic device, capacitor 544 is generally required to prevent ripple current from switching circuit 504 from degrading photovoltaic device performance. In photovoltaic applications, determining a desired value of capacitor 544 will typically require a tradeoff between photovoltaic device efficiency and rapid adjustment of MPPT. Specifically, a large value of capacitor 544 promotes photovoltaic device performance, while a small value of capacitor 544 typically promotes faster operation of controller 536. A switching frequency of first and second switching devices 532, 534 could also be increased to reduce ripple current magnitude and thereby promote photovoltaic device performance. Although capacitor 544 is shown external to switching circuit 504, the capacitor could alternately be integrated in switching circuit 504.

Controller 536 varies duty cycle of first switching device 532 in response to a change in an average value of switching node voltage Vy5 to maximize Vo5_avg. As with electric power system 400 of FIG. 4, controller 536 operates much faster than an expected change in output current Io5. Therefore, output current Io5 remains essentially unchanged between successive changes in duty cycle, and controller 536 at least substantially maximizes power extracted from electric power source 502 by maximizing Vo5_avg. It should be noted, however, that if switching circuits 504 include an output inductor and capacitor such that Vo5 is essentially a DC voltage, controller 536 may alternately be configured to directly monitor and maximize Vo5.

As discussed further below, some embodiments of switching circuit 504 are configured such that second switching device 534 continuously conducts to shunt output terminals 522, 524, thereby shunting output port 508 and providing a shunt or bypass path for current Io5 around electric power source 502 when electric power source 502 is producing little or no electric power. For example, if electric power source 502 is a photovoltaic device producing little electric power due to shading, such embodiments of switching circuit 504 cause second switching device 534 to continuously conduct to prevent current from flowing through the photovoltaic device, thereby preventing power loss in the photovoltaic device and possible damage to the photovoltaic device. It should be noted that bypassing electric power source 502 with second switching device 534 instead of a diode may improve electric power system 500's efficiency as second switching device 534 typically has a smaller forward voltage drop than a diode.

Figure 6:
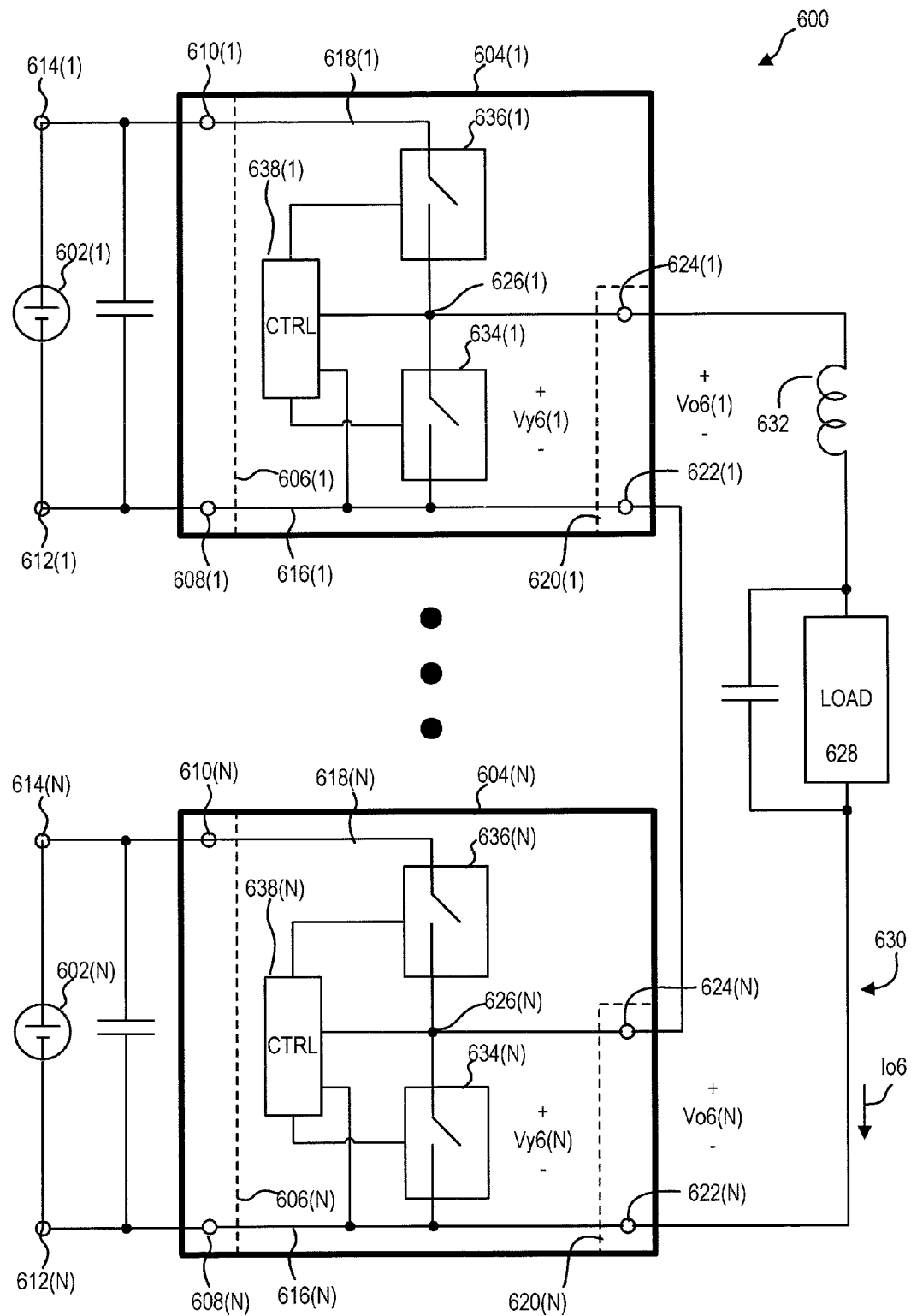
FIG. 6 shows another electric power system including buck-type switching circuits for extracting power from electric power sources, according to an embodiment.

FIG. 6 shows one electric power system 600, which is another embodiment of electric power system 400. System 600 is similar to system 500 of FIG. 5, but the switching circuits of system 600 have a standard (non-inverted) buck-type topology instead of an inverted buck-type topology. System 600 includes N electric power sources 602 and a respective switching circuit 604 electrically coupled to each electric power source 602, where N is an integer greater than one. Each switching circuit 604 includes an input port 606 including a first and second input terminal 610, 608 respectively electrically coupled to positive and negative terminals 614, 612 of electric power source 602. Second input terminal 608 and negative terminal 612 form part of a negative input node 616, and first input terminal 610 and positive terminal 614 form part of a positive input node 618. Each switching circuit 604 further includes an output port 620 including a first and second output terminal 622 and 624. First output terminal 622 is electrically coupled to negative input node 616, and second output terminal 624 is electrically coupled to an intermediate switching node 626. Output ports 620 are electrically coupled in series with a load 628 (e.g., an inverter) to form an output circuit 630.

Figure 43:
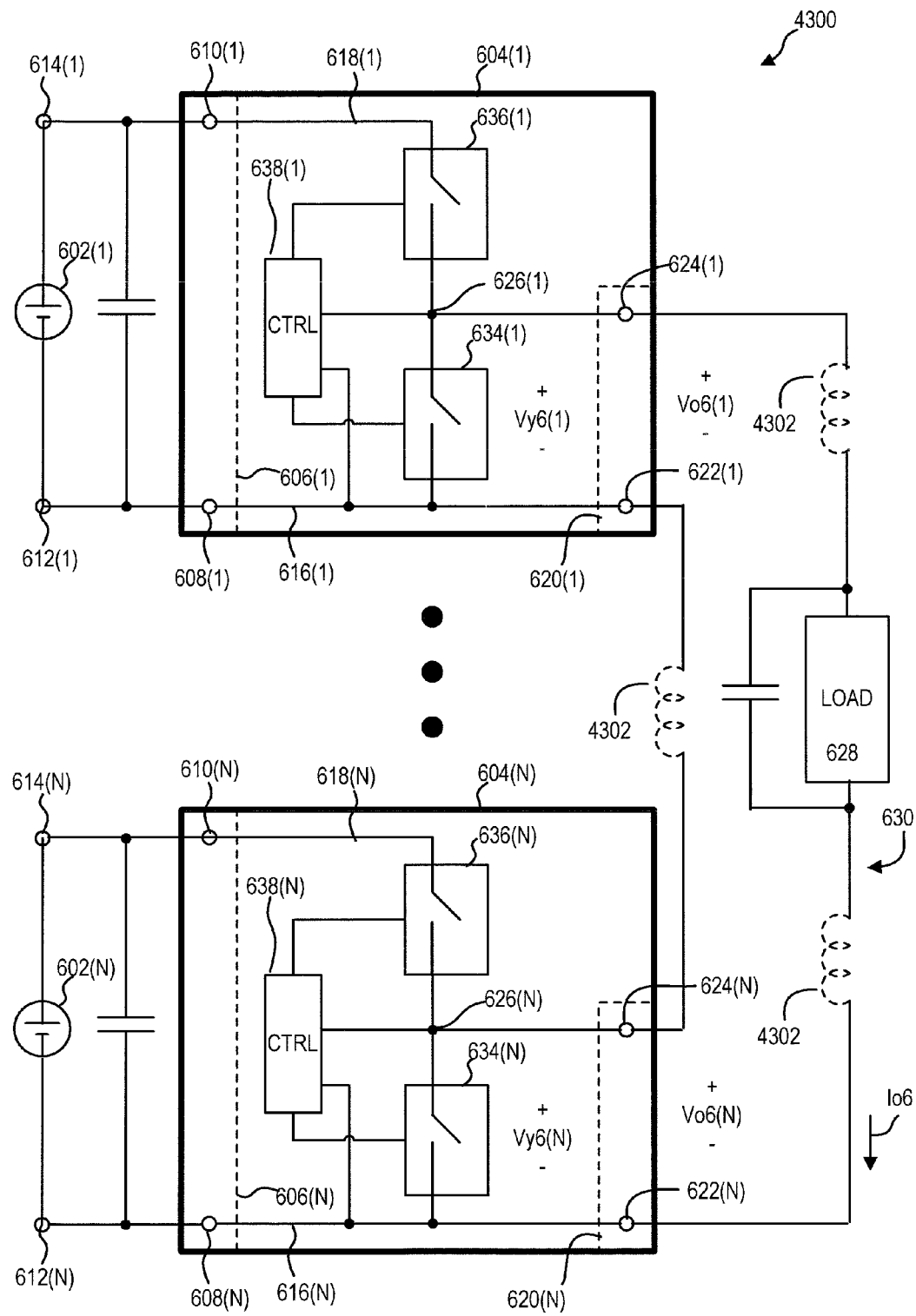
FIG. 43 shows an embodiment of the electric power system of FIG. 6 including interconnection inductance.

Output circuit 630 includes an inductance 632, which although symbolically shown as a single inductor, may represent one or more discrete inductors and/or interconnection inductance of wires or other conductors connecting components (e.g., output ports 620) to form output circuit 630. For example, FIG. 43 shows electric power system 4300, which is an embodiment of system 600 where inductance 632 includes interconnection inductance 4302. In certain embodiments, switching circuits 604 primarily or completely rely on interconnection inductance for their energy storage inductance.

Each switching circuit 604 includes a first switching device 634 electrically coupled between second input terminal 608 and intermediate switching node 626, and a second switching device 636 electrically coupled between intermediate switching node 626 and first input terminal 610. A controller 638 controls operation of first and second switching devices 634, 636, which cooperate to transfer power from input port 606 to output port 620. In contrast to switching circuits 504 of FIG. 5, second switching device 636 is a control switch in switching circuit 604, and controller 638 controls power transfer between input and output ports 606, 620 by varying duty cycle of second switching device 636. First switching device 634 provides a path for output circuit current Io6 when second switching device 636 is in its non-conductive state. First switching device 634 is optionally replaced with a diode connected such that current flows through the diode from negative input node 616 to intermediate switching node 626 when forward biased. Switching circuit 604 has a switching node voltage Vy6 between intermediate switching node 626 and negative input node or negative power rail 616. In embodiments where switching circuit 604 does not include an output filter, such as shown in FIG. 6, switching node voltage Vy6 is the same as switching circuit output voltage Vo6.

Switching circuits 604 operate similarly to switching circuits 504 of FIG. 5. In particular, controller 638 adjusts duty cycle of second switching device 636 to at least substantially maximize an average value of Vo6(1). Controller 638 changes duty cycle of second switching device 636 much faster than a current Io6 through output circuit 630 can change. Therefore, maximizing Vo6_avg at least substantially maximizes an output power of switching circuit 604 and power extracted from electric power source 602. In embodiments where switching circuit 604 does not include an output filter, controller 638 indirectly maximizes Vo6_avg by maximizing an average value of Vy6. In embodiments where switching circuit 604 does include an output filter and Vo6 is therefore essentially a DC voltage, controller 638 optionally alternately directly monitors and maximizes Vo6.

Figure 7:
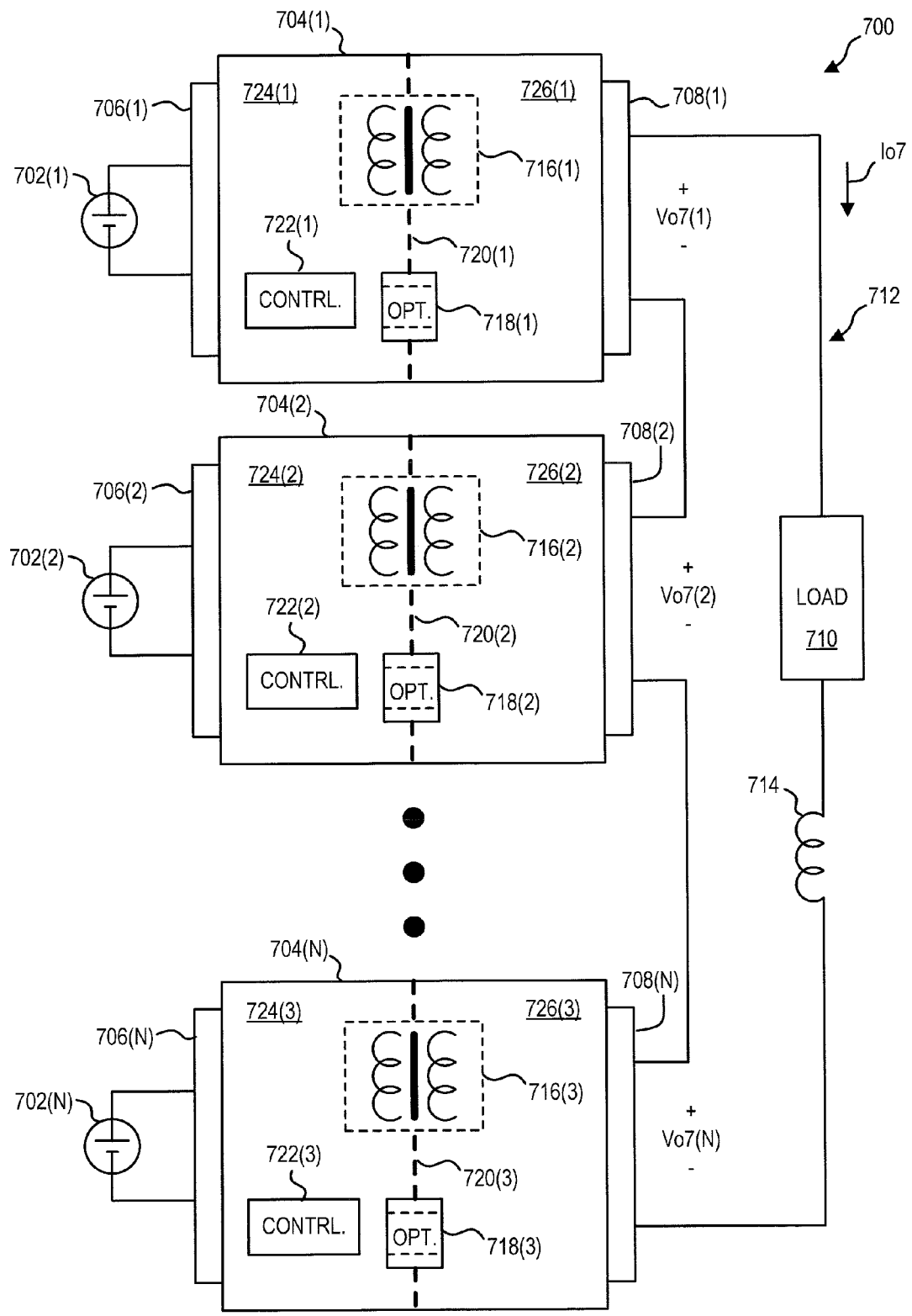
FIG. 7 shows another electric power system including transformer coupled switching circuits for extracting power from electric power sources, according to an embodiment.

As discussed above with respect to FIG. 4, some embodiments of switching circuits 404 include a transformer, such as to provide electrical isolation and/or to step up or step down voltage from their respective electric power sources. For example, FIG. 7 shows one electric power system 700, which is an embodiment of electric power system 400 where switching circuits have an isolated topology. System 700 includes N electric power sources 702 and switching circuits 704, where N is an integer greater than one. Each switching circuit 704 includes an input port 706 electrically coupled to a respective electric power source 702, and each switching circuit 704 includes an output port 708. Output ports 708 are electrically coupled in series with a load 710 (e.g., an inverter) to form a closed circuit, hereinafter referred to as output circuit 712. Each switching circuit 704 at least substantially maximizes an amount of electric power extracted from its respective electric power source 702 by maximizing an average value of its respective output voltage Vo7 (Vo7_avg). In some embodiments, Vo7_avg is maximized by maximizing an average value of a switching node voltage.

Each switching circuit 704 has an isolated topology with variable voltage gain. In particular, each switching circuit includes a respective power transformer 716 and a communication subsystem 718 that cross an isolation boundary 720. A controller 722 may be located on a primary side 724 of isolation boundary 720, as shown. Alternately, controller 722 may be located on a secondary side 726 of isolation boundary 720. Communication subsystem 718 is used by controller 722 to communicate across isolation boundary 720, such as to sense switching node voltage and/or to control one or more switching devices (not shown). Although communication subsystem 718 is shown as an optocoupler, communication subsystem 718 could take other forms, such as a pulse transformer, a network of switched capacitors, or a similar isolated communication device. In embodiments where electrical isolation is not required (e.g., where transformer 716 is used solely to provide voltage level transformation), communication subsystem 718 can be eliminated.

Figure 44:
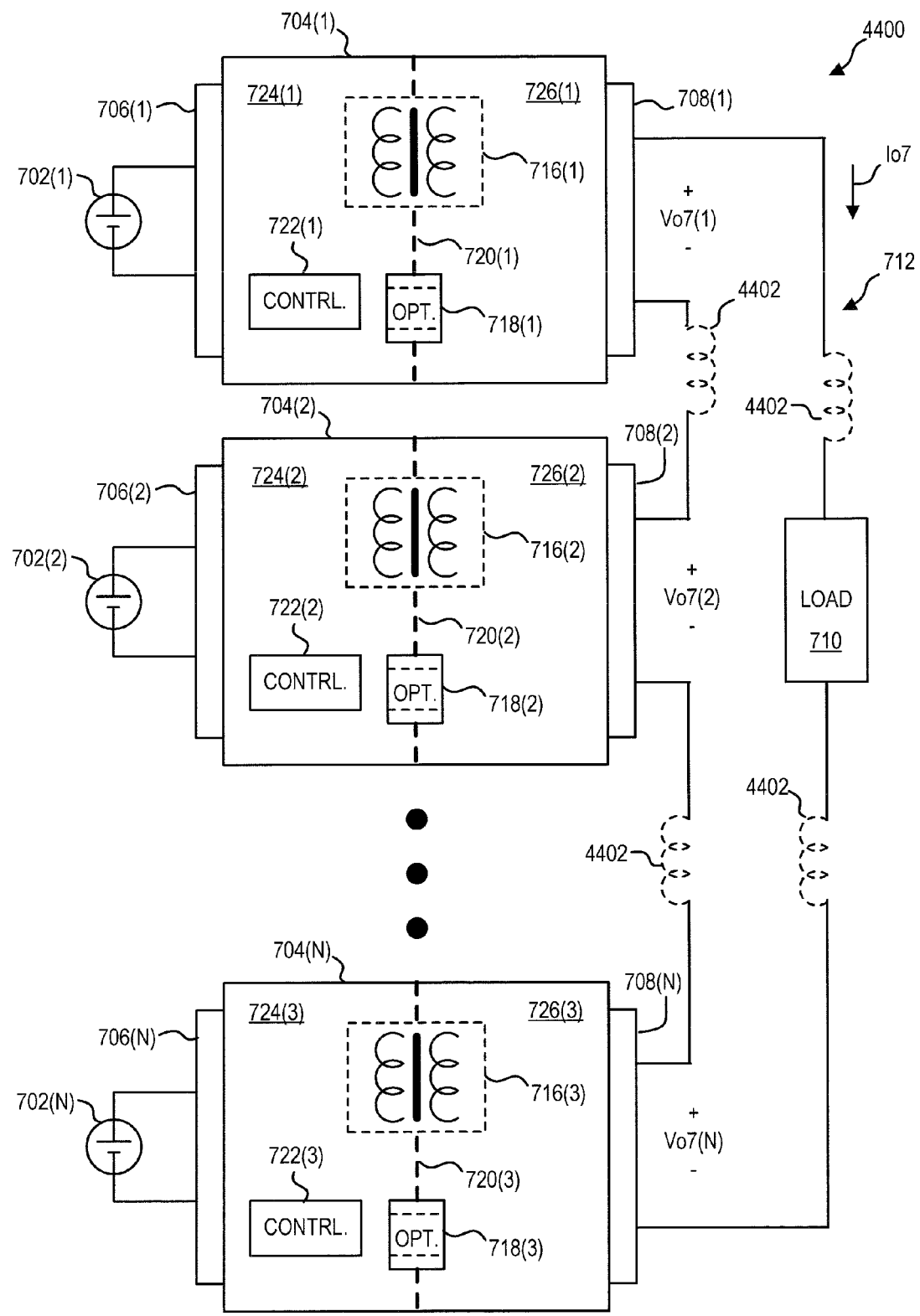
FIG. 44 shows an embodiment of the electric power system of FIG. 7 including interconnection inductance.

In some embodiments, switching circuits 704 have a topology that requires an inductor on their outputs. Examples of such topologies include, but are not limited to, a forward-type topology, a half-bridge-type topology, and a full-bridge-type topology. In such embodiments, inductance 714 of output circuit 712 can optionally be used in place of or in addition to output inductors in switching circuits 704. Although inductance 714 is symbolically shown as a single inductor, inductance 714 could include a number of discrete inductors and/or interconnection inductance of wires or other conductors connecting components (e.g., output ports 708) to form output circuit 712. For example, FIG. 44 shows electric power system 4400, which is an embodiment of system 700 where inductance 714 includes interconnection inductance 4402.

In alternate embodiments of system 700, switching circuits have a topology that does not require an output inductor, including, but not limited to, the flyback-type topology, the inverted half-bridge-type topology, the inverted full-bridge-type topology, and current fed topologies. In such topologies, if load 710 includes capacitance (e.g., input capacitance in the case load 710 is an inverter), interconnection inductance of output circuit 712 advantageously works with such capacitance to form an additional filter.

Figure 45:
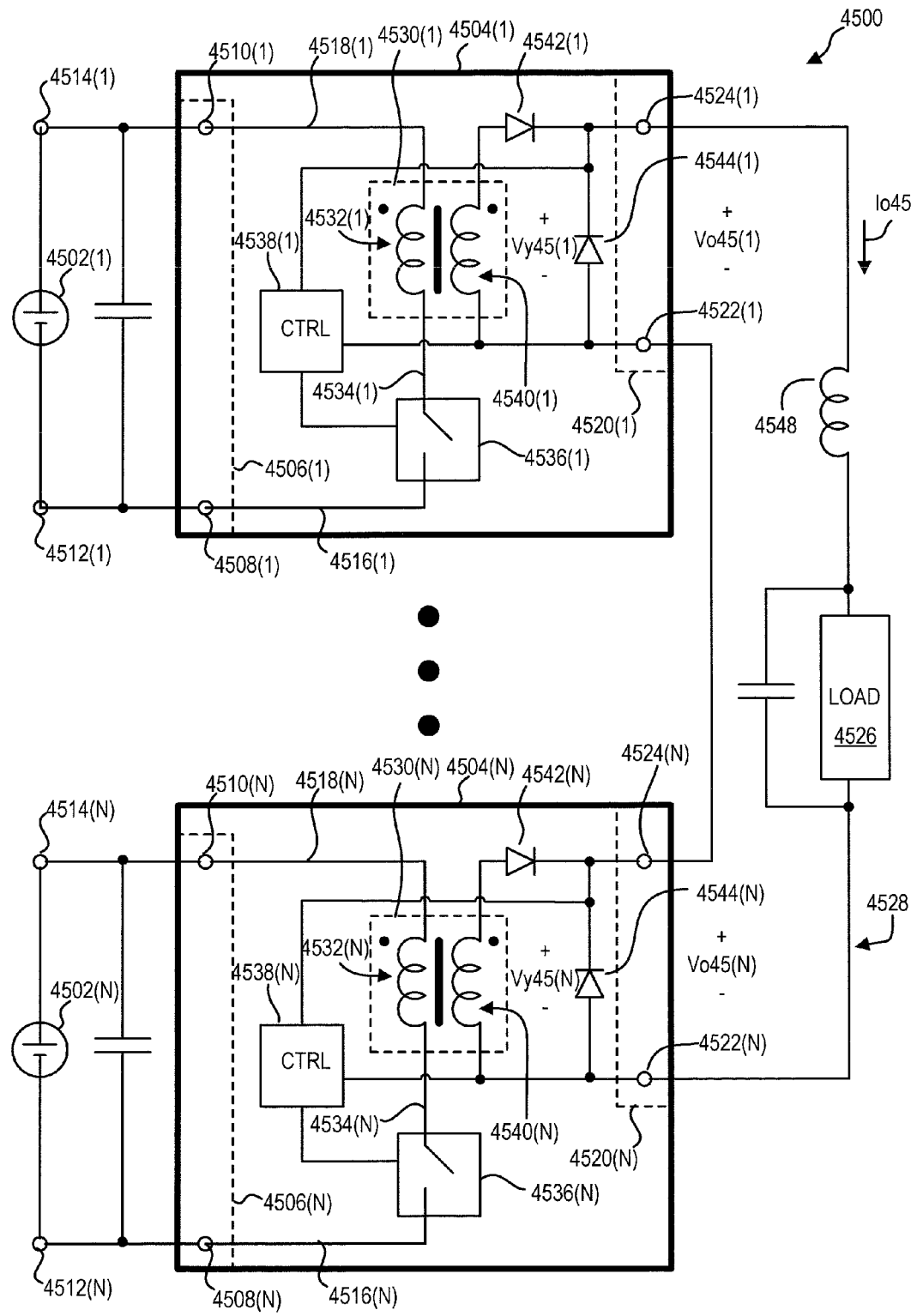
FIG. 45 shows an embodiment of the electric power system of FIG. 7 where the switching circuits have a forward-type topology.

FIG. 45 shows one electric power system 4500, which is an embodiment of electric power system 700 where switching circuits 704 have a forward-type topology. System 4500 includes N electric power sources 4502 and a respective switching circuit 4504 electrically coupled to each electric power source 4502, where N is an integer greater than one. Each switching circuit 4504 includes an input port 4506 including a first and second input terminal 4508, 4510 respectively electrically coupled to negative and positive terminals 4512, 4514 of electric power source 4502. First input terminal 4508 and negative terminal 4512 form part of a negative input node 4516, and second input terminal 4510 and positive terminal 4514 form part of a positive input node 4518. Each switching circuit 4504 further includes an output port 4520 including a first and a second output terminal 4522 and 4524. Output ports 4520 are electrically coupled in series with a load 4526 (e.g., an inverter) to form a closed circuit, hereinafter referred to as output circuit 4528.

Each switching circuit 4504 includes a transformer 4530, such as to provide electrical isolation between electric power source 4502 and load 4526, and/or to step down or step up a voltage of electric power source 4502. For example, transformer 4530 may be used to step up voltage at output port 4520 to reduce magnitude of current Io45 and associated current conduction losses. A primary winding 4532 of transformer 4530 is electrically coupled between second input terminal 4510 and a first switching node 4534. A first switching device 4536, which is analogous to first switching device 418 of FIG. 4, is electrically coupled between first switching node 4534 and first input terminal 4508. A controller 4538 controls operation of first switching device 4536.

A secondary winding 4540 of isolation transformer 4530 is electrically coupled between first output terminal 4522 and an anode of a first diode 4542. A cathode of first diode 4542 is electrically coupled to second output terminal 4524. A freewheeling diode 4544 is electrically coupled across first and second output terminals 4522, 4524. In alternate embodiments, one or more of diodes 4542, 4544 are replaced with respective switching devices to reduce conduction losses. When controller 4538 turns on first switching device 4536, current flows through secondary winding 4540 and first diode 4542. When controller 4538 turns off first switching device 4536, output circuit current Io45 flows through freewheeling diode 4544 until either first switching device 4536 turns back on or Io45 drops to zero.

Switching circuits 4504 operate similarly to switching circuits 504, 604 of FIGS. 5 and 6, respectively. In particular, controller 4538 adjusts duty cycle of first switching device 4536 to at least substantially maximize an average value of Vo45, which is a voltage across freewheeling diode 4544. Controller 4538 changes duty cycle of first switching device 4536 much faster than a current Io45 through output circuit 4528 can change. Therefore, maximizing Vo45_avg at least substantially maximizes an output power of switching circuit 4504 and power extracted from electric power source 4502. In embodiments where switching circuit 4504 does not include an output filter, controller 4538 maximizes Vo45_avg by maximizing an average value of switching node voltage Vy45, which is a rectified pulsing voltage from secondary winding 4540. In embodiments where switching circuit 4504 does include an output filter and Vo45 is therefore essentially a DC voltage, controller 4538 alternately directly monitors and maximizes Vo45.

In the embodiment of FIG. 45, each switching circuit 4504 utilizes an inductance 4548 of output circuit 4528 as its energy storage inductance. Although inductance 4548 is symbolically shown as a single inductor, it includes a number of discrete inductors and/or interconnection inductance resulting from inductance of wires or other conductors connecting components (e.g., output ports 4520) to form output circuit 4528.

In embodiments where electrical isolation is required between input port 4506 and output port 4520 (and therefore between electric power source 4502 and load 4526), controller 4538 is electrically referenced to one of input port 4506 or output port 4520 and electrically isolated from the other. For example, controller 4536 may be electrically referenced to input port 4506 and electrically isolated from output port 4520. In such embodiments, controller 4538 typically receives a feedback signal, such as to sense switching node voltage Vy45, via an optocoupler, a pulse transformer, a network of switched capacitors, or a similar isolated communication device. As another example, controller 4538 may be electrically referenced to output port 4520 and electrically isolated from input port 4506. In such embodiments, controller 4538 typically drives first switching device 4536 via a pulse transformer, an optocoupler, a network of switched capacitors, or a similar isolated communication device.

Figure 38:
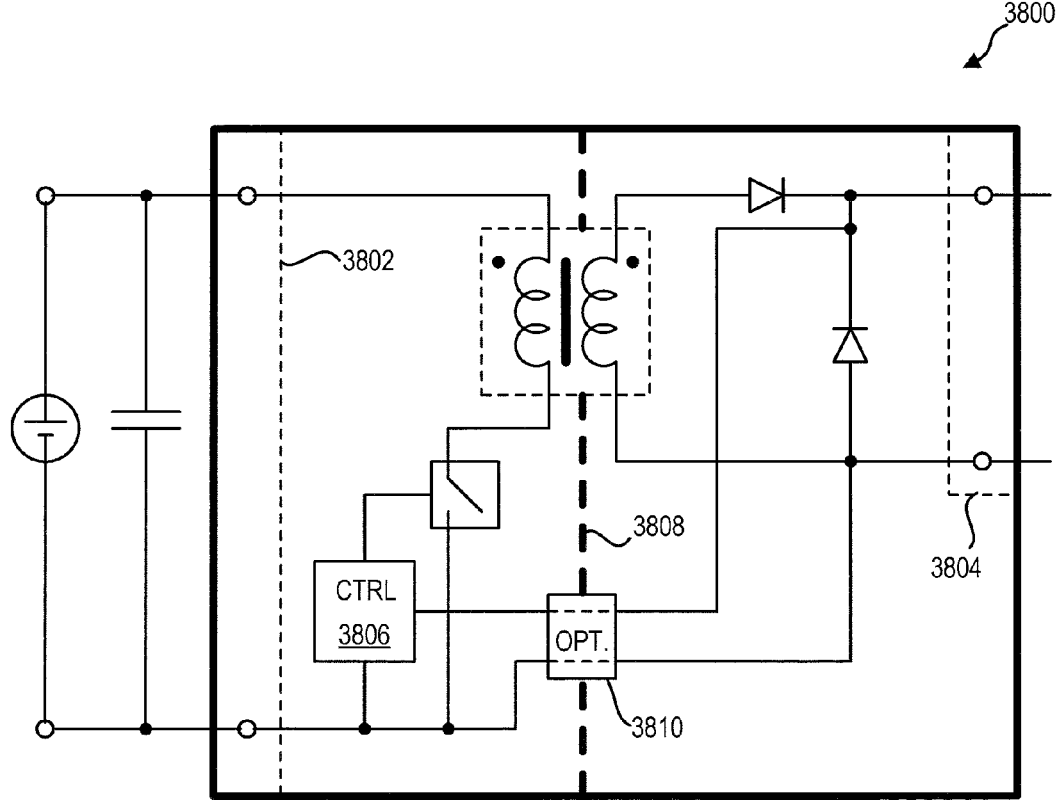
FIG. 38 shows an alternate embodiment of the switching circuits of FIG. 7.

FIG. 38 shows a switching circuit 3800, which is an embodiment of switching circuit 4504 with electric isolation between input and output ports 3802, 3804 (analogous to ports 4506, 4520 of FIG. 45). In switching circuit 3800, a controller 3806, which is analogous to controller 4538 of FIG. 45, is electrically referenced to input port 3802 and receives feedback information from across an isolation boundary 3808 via an optocoupler 3810.

Figure 8:
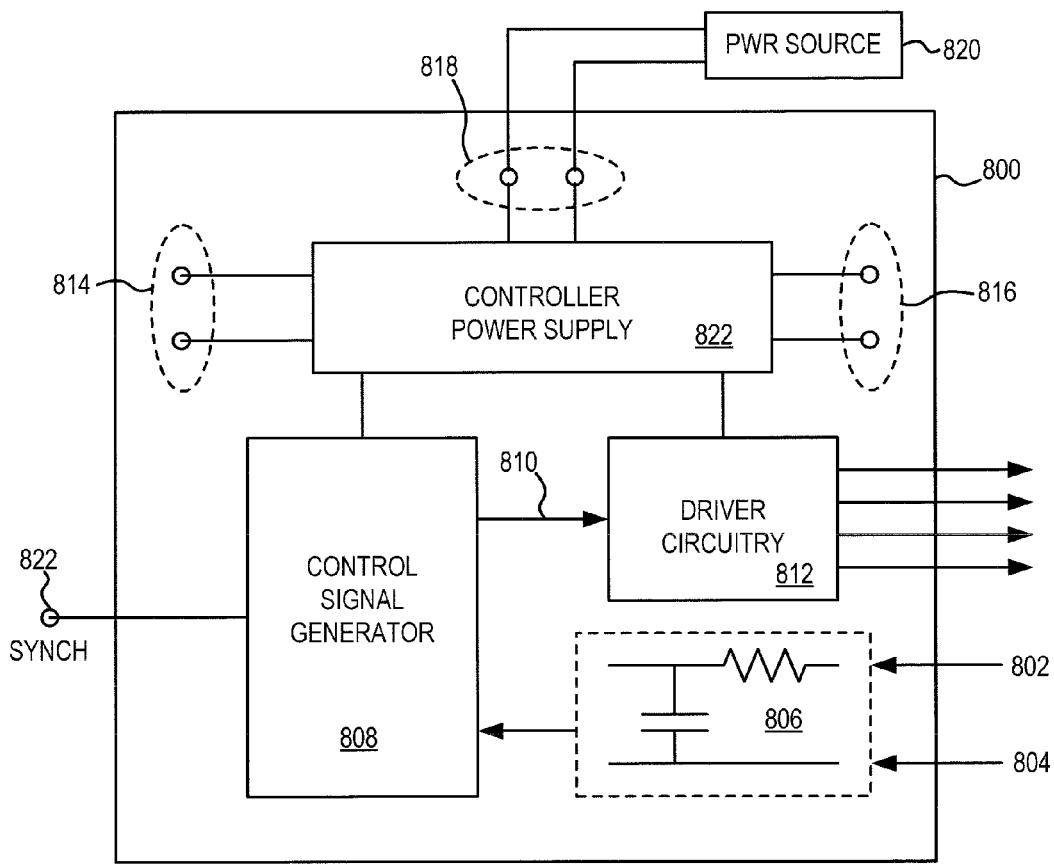
FIG. 8 shows one controller for a switching circuit, according to an embodiment.

FIG. 8 shows control circuitry or controller 800, which is one possible embodiment of controller 422, 536, 638, or 722 of FIGS. 4-7, respectively. For simplicity, controller 800 is discussed only in the context of electric power system 500 of FIG. 5. However, it should be understood that controller 800 could be adapted for use in other switching circuit embodiments.

Controller 800 includes inputs 802, 804 to receive a switching node voltage (e.g., Vy5), or alternately a switching circuit output voltage (e.g., Vo5) in the case the output voltage is a DC voltage. Controller 800 optionally includes a filter 806 to attenuate an AC component of the switching node voltage. Filter 806 also includes sampling circuitry (not shown) in some embodiments. In alternate embodiments, an analog to digital converter circuit generates digital signals representing samples of an average value of a voltage across inputs 802, 804. The output of filter 806, or inputs 802, 804 if filter 806 is not present, are received by control signal generator 808. Control signal generator 808 generates a signal 810 to turn on and off one or more switching devices (e.g., first switching device 532) to maximize an average value of a switching circuit output voltage (e.g., Vo5_avg). In some embodiments, signal 810 includes two or more separate signals, where each signal corresponds to a respective switching device. Driver circuitry 812 drives one or more switching devices in response to signal 810. For example, in the case of switching circuit 504 (FIG. 5) where first and second switching devices 532, 534 are field effect transistors, driver circuitry 812 drives the gates of the transistors in response to signal 810.

Controller 800 further includes one or more bias power ports for receiving power to operate controller 800. In certain embodiments, controller 800 includes a bias power port 814 for receiving electric power from electric power source 502. In such embodiments, controller 800 is at least partially powered from electric power source 502 such that another power source may not be required. Controller 800 could also be configured to include a second bias power port 816 to receive electric power from the output of one of more switching circuits 504 (e.g., from between nodes 546, 548 across load 528). In such embodiments, for example, driver circuitry 812 is initially powered from electric power source 502, and is subsequently powered from outputs of switching circuit 504 once switching circuit 504 are operational. Powering controller 800 from a voltage across a string of series-connected switching circuits 504 may be desirable because such voltage is typically higher than that of electric power source 502, and a high voltage may facilitate controlling switching devices (e.g., first and second switching devices 532, 534). In certain embodiments, controller 800 includes a bias power port 818 in addition to or in place of bias power ports 814, 816. Bias power port 818 is for receiving electric power from another power source 820, such as an energy storage device (e.g., a battery) or an auxiliary power supply. For example, power source 820 may be a battery (e.g., a rechargeable battery) that operates controller 800 when a voltage of electric power source 502 is too low to operate controller 800. In some embodiments, one power source 820 powers a number of controllers 800. In still other embodiments, controller 800 may be powered by a series stack of two or more electric power sources 502 to provide enough voltage even though each controller tracks the MPP of only a single source.

In certain embodiments, controller 800 further includes a controller power supply 822 for converting or regulating electric power received by one or more bias power ports (e.g., ports 814, 816, 818) for use by components of controller 800, such as driver circuitry 812 and/or control signal generator 808. For example, controller power supply 822 may include a switched capacitor converter or linear regulator for boosting or reducing the voltage from electric power source 502 for use by driver circuitry 812 to drive a gate of an n-channel field effect transistor. As another example, controller power supply 822 may include a regulator for providing a well-regulated power source to control signal generator 808.

Some embodiments of controller 800 further include a SYNCH terminal 822 to synchronize operation of two or more instances of controller 800. For example, SYNCH terminal 822 could be used to synchronize and phase shift gate drive signal generation among instances of controller 800. As another example, SYNCH terminal 822 could be used to synchronize start-up of switching circuits such that a number of switching circuit control switches simultaneously conduct at start-up to increase system output voltage to a level required by the system's load. In certain embodiments, SYNCH terminal 822 is coupled to one or more terminals of another switching circuit driven by another power source.

Figure 9:
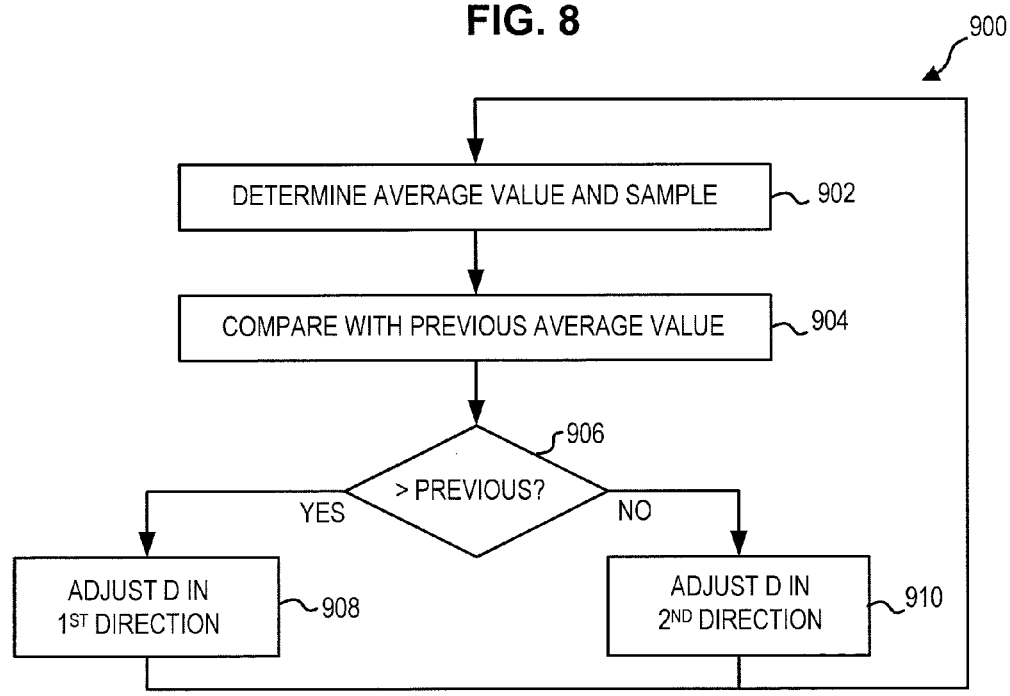
FIG. 9 shows one method for extracting power from an electric power source using a switching circuit, according to an embodiment.
Figure 10:
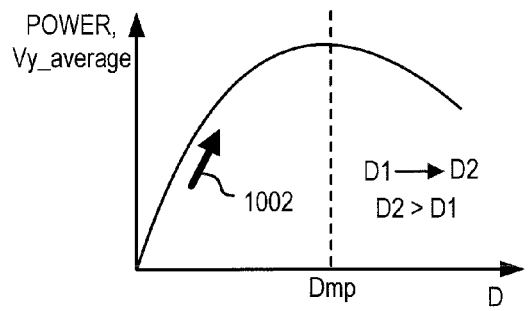
FIGS. 10-14 each show a graph of average value of switching node voltage versus duty cycle for a switching circuit coupled to an electric power source, according to an embodiment.
Figure 11:
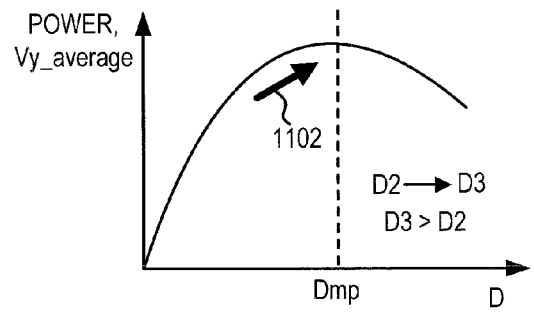
Figure 12:
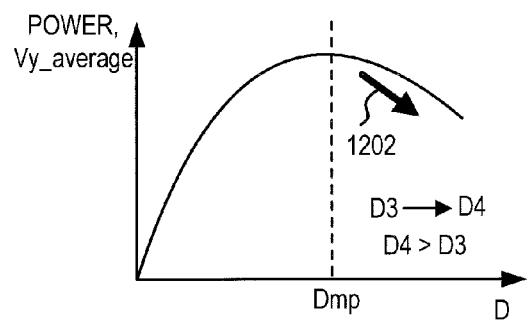
Figure 13:
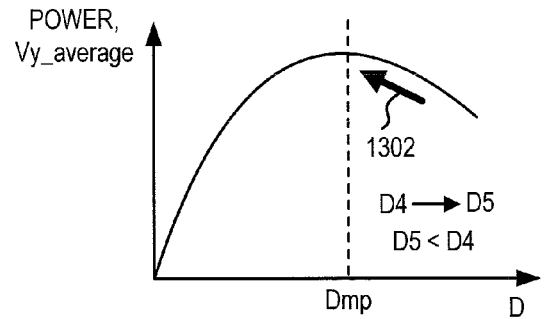
Figure 14:
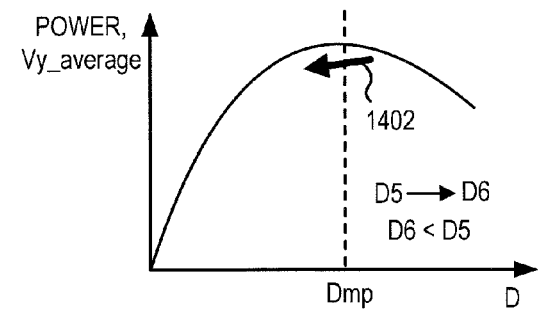

Certain embodiments of the switching circuit controllers discussed herein (e.g., controllers 422, 536, 638, or 722 of FIGS. 4-7, respectively) can adjust the switching device duty cycle in response to a change in an average value of switching node voltage sampled at successive instances in time. In such embodiments, duty cycle is changed, for example, based on a mathematical combination of two or more successively sampled average switching node voltage values, such as based on the sign and/or magnitude of a difference between two successively sampled average switching node voltage values. For example, FIG. 9 shows one method 900 for extracting power from an electric power source using a switching circuit based on changes in successive sampled values of an average value of a switching node voltage. Although method 900 is discussed with respect to electric power system 500 of FIG. 5 and controller 800 of FIG. 8, method 900 is not limited to such embodiments.

In step 902, an average value of a voltage between a converter intermediate switching node and a reference node is sampled. An example of such step is filter circuit 806 (FIG. 8) determining an average value of switching node voltage Vy5 and sampling the average value (FIG. 5). In step 904, the sampled average value determined in step 902 is compared to a previously determined sampled average value. For example, control signal generator 808 may compare a most recent sampled average value from filter 806 to a previous sampled average value from filter 806. In decision step 906, the result of step 904 is evaluated. If the most recent sampled average value is greater than the previous sampled average value, duty cycle of a control switch is changed in a first direction in step 908, where the first direction is the same direction that duty cycle was previously changed. Otherwise duty cycle of the control switch is changed in a second direction in step 910, where the second direction is opposite a direction that duty cycle was previously changed. As an example of steps 906-910, control signal generator 808 increases duty cycle of first switching device 534 if duty cycle was previously increased between two most recent sampled average values, and a most recent sampled average value of Vy5 is greater than a previous sampled average value of Vy5. Conversely, control signal generator 808 decreases duty cycle of first switching device 534 if duty cycle was previously increased between two most recent sampled average values, and the most recent sampled average value of Vy5 is less than the previous sampled average value of Vy5. In some embodiments, the size of the change in duty cycle is always substantially the same. In some other embodiments, the size of the change in duty cycle can be configured to be a function of at least a difference in magnitude between two or more successive samples. In still other embodiments, a longer history of sampled average values is used to determine the size of the change in duty cycle.

FIGS. 10-14 show one example of method 900 in use with an embodiment of switching circuit 504 to at least substantially maximize an amount of electric power extracted from an electric power source 502. Each of FIGS. 10-14 is a graph of average value of Vy (which is representative of output power) versus duty cycle of an embodiment of switching circuit 504 electrically coupled to an exemplary electric power source 502, such as a photovoltaic device. Each switching circuit 504 has a duty cycle Dmp corresponding to a maximum output power of the switching circuit under a given set of operating conditions. As previously discussed, maximizing a switching circuit's output power will also at least substantially maximize power extracted from an electric power source electrically coupled to the switching circuit's input port. In the discussion of FIGS. 10-14, duty cycle refers to duty cycle of first switching device 532.

Assume control signal generator 808 increases duty cycle from D1 to D2, and control signal generator 808 determines that an average value of Vy5 (Vy5_average) has increased as a result by comparing successive samples of average values of Vy5. Such increase in Vy5_average indicates that switching circuit 504's operating point moved rightward up its output power curve, as indicated by arrow 1002 in FIG. 10. Due to the last change in duty cycle (from D1 to D2) resulting in an increase in output power, control signal generator 808 again changes duty cycle in the same direction to attempt to further increase output power. Specifically, control signal generator 808 increments duty cycle from D2 to D3 and determines that such change resulted in switching circuit 504's operating point moving further up its output power curve, as indicated by arrow 1102 in FIG. 11. Therefore, control signal generator 808 increments duty cycle yet again, this time from D3 to D4, to try to further increase output power.

After incrementing duty cycle from D3 to D4, control signal generator 808 determines that Vy5_average decreased. Therefore, switching circuit 504's operating point moved down its output power curve due to duty cycle changing from D3 to D4, as indicated by arrow 1202 in FIG. 12. Control signal generator 808 therefore next changes duty cycle in the opposite direction, i.e., decreases duty cycle, to try to move back up the output power curve. Specifically, control signal generator 808 decrements duty cycle from D4 to D5, and determines that Vy5_average increased as a result. Therefore, the decrease in duty cycle from D4 to D5 resulted in switching circuit 504's operating point moving back up its output power curve, as arrow 1302 of FIG. 13 indicates. Control signal generator 808 thus decrements duty cycle again, from D5 to D6, and determines that Vy5_average and output power decreased as a result, as indicated by arrow 1402 in FIG. 14.

Control signal generator 808 next increments duty cycle to try to move back up the output power curve. Control signal generator 808 continues to adjust duty cycle in increments to try to maximize Vy5_average and thereby maximize output power. Once control signal generator 808 determines that output power changes by less than a specified amount due to a change in duty cycle, it can be concluded that switching circuit 504 is operating at least near the maximum of its output power curve. Control signal generator 808 may then stop adjusting duty cycle and allow switching circuit 504 to operate in its present operating condition. However, control signal generator 808 can perturb duty cycle from time to time and evaluate a resulting change in Vy5_average to determine whether switching circuit 504 is still operating near its maximum output power point. If switching circuit 504 is no longer operating near its maximum output power point, control signal generator 808 will again adjust duty cycle in increments to try to maximize Vy5_average. In certain other embodiments, control signal generator 808 may continue to adjust duty cycle even when duty cycle is near Dmp, such that duty cycle cycles near Dmp with little loss in efficiency.

The use of method 900 with switching circuits 404 may eliminate the need for global MPPT. As for example illustrated with respect to FIGS. 10-14, each switching circuit's power versus voltage curve and power versus current curve are typically well behaved with a single local maximum power point that is also the switching circuit's global maximum power point. Accordingly, a system including switching circuits 404 that implement method 900 will typically have a single maximum power point, thereby eliminating the need for global MPPT and promoting simplicity and low cost. Also, the lack of multiple maximum power points eliminates the possibility of a MPPT system getting stuck at a local maximum power point that is smaller than a global maximum power point.

In method 900, duty cycle need not necessarily be changed by the same amount during each step. For example, in certain embodiments, duty cycle is changed by a relatively large amount when switching circuit 504 is operating at a relatively low point on its output power curve, and duty cycle is changed by a relatively small amount when switching circuit 504 is operating at a relatively high point on its output power curve. In certain embodiments, control signal generator 808 estimates where control circuit 504 is operating on its output power curve from a magnitude of change in Vy5_average. A large change in Vy5_average typically means that switching circuit 504 is operating on a sharp region of its output power curve, thereby indicating low output power, and a small change in Vy5 average typically means that switching circuit 504 is operating on a relatively flat region of its output power curve, thereby indicating a relatively high output power. It is also anticipated that some embodiments use previously determined maximum power point operating conditions to more quickly find a present maximum power point operating condition. For example, control signal generator 808 could be configured to initially set duty cycle, after a power up procedure, to a value that previously corresponded to maximum power operation.

Additionally, in some embodiments, controller starting time, which is the time at which controller 800 begins to control duty cycle after switching circuit power up, is loosely controlled such that each switching circuit will likely adjust its duty cycle at a different time. Such effective randomization of duty cycle adjustment among switching circuit instances helps reduce the likelihood of large transients resulting from a number of switching circuits adjusting their duty cycle at the same time. For example, in some embodiments, controller starting time is allowed to vary by at least ten percent among instances of controller 800, such as by using components with loose tolerance values.

In some embodiments of controller 800 that support sampling, the rate at which the voltage at the intermediate switching node is sampled is sufficiently fast such that $\Delta I/I_R$ is less than $\Delta D/D_R$, where (1) $\Delta I$ is a change in current out of the output port (e.g., change in Io5 of FIG. 5) between first and second successive samples of the average value of the voltage at the intermediate switching node (e.g., successive samples of Vy5_average), where the second sample occurs after the first sample, (2) $I_R = I_{max} - I_{min}$, (3) $I_{max}$ is a maximum expected value of current out of the output port (e.g., maximum expected value of Io5), (4) $I_{min}$ is a minimum expected value of current out of the output port (e.g., minimum expected value of Io5), (5) $\Delta D$ is a change in duty cycle of a control switching device (e.g., switching device 532) between the first and second successive samples of the average value of the voltage at the intermediate switching node, and (6) $D_R$ is a difference between a maximum expected duty cycle and a minimum expected duty cycle of the control switching device.

Figure 15:
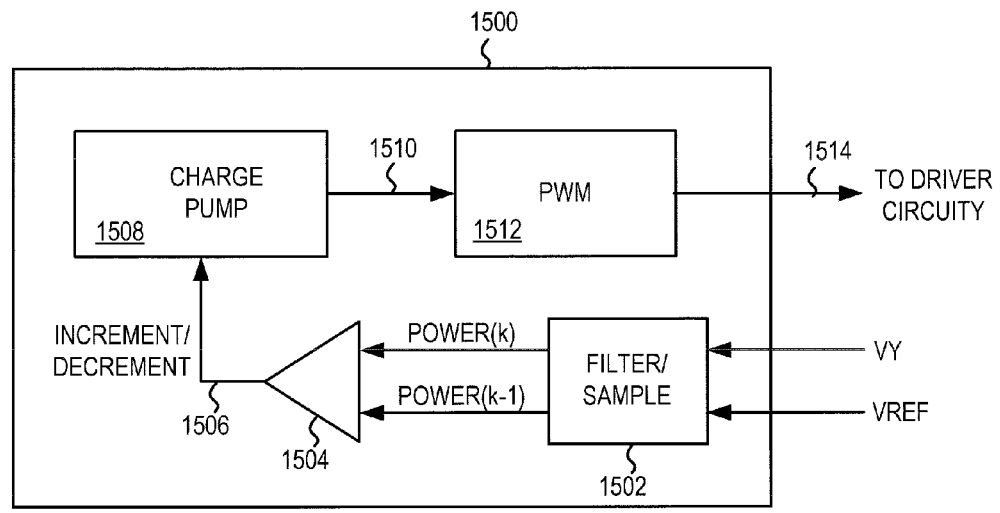
FIG. 15 shows another controller for a switching circuit, according to an embodiment.

As discussed above, certain embodiments of the switching circuit controllers discussed herein adjust switching device duty cycle in response to a change in successive samples of an average value of a switching node voltage. FIG. 15 shows a control signal generator 1500, which is an embodiment of control signal generator 808 (FIG. 8) configured to operate in such manner. Although control signal generator 1500 is discussed only with respect to electric power system 500 for simplicity, control signal generator 1500 could be adapted for use in other switching circuit embodiments.

Control signal generator 1500 includes a filter and sampling subsystem 1502 which periodically filters and samples switching node voltage Vy5. Thus, subsystem 1502 takes the place of optional filter 806 in FIG. 8. Subsystem 1502 outputs values POWER(k) and POWER(k−1), each of which are filtered and sampled values of Vy5. Such values are designated "POWER" because they represent relative switching circuit output power as switching circuit output current Io5 remains essentially unchanged between successive samplings of Vy5. POWER(k) represents a most recent filtered and sampled value of Vy5, and POWER(k−1) represents an immediately preceding filtered and sampled value of Vy5. As discussed above, in certain embodiments, the beginning of each sampling period is loosely controlled to effectively randomize duty cycle adjustment among switching circuit instances.

Figure 16:
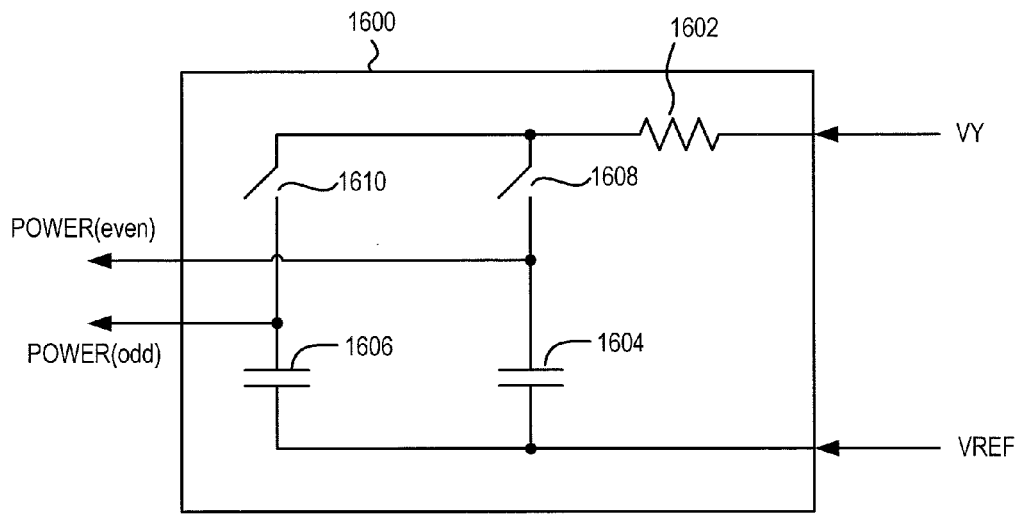
FIG. 16 shows one sampling circuit, according to an embodiment.

In some embodiments, subsystem 1502 includes an analog to digital converter and POWER(k) and POWER(k−1) are digital signals. However, it is anticipated that in many embodiments POWER(k) and POWER(k−1) will be analog signals to reduce subsystem complexity. For example, FIG. 16 shows filter and sampling subsystem 1600, which is one possible embodiment of subsystem 1502 with analog output signals. Subsystem 1600 generates two outputs POWER (even) and POWER(odd), which are successive samples of filtered Vy5. For example, in a given cycle, POWER(even) could represent POWER(k), while POWER(odd) could represent POWER(k−1). In this case, during the next cycle, POWER(even) would represent POWER(k−1) while POWER(odd) would represent the newest sample, POWER(k).

In certain embodiments, subsystem 1600 includes two RC filters to filter Vy5. A first filter includes a resistor 1602 and a capacitor 1604 to filter Vy5 for output POWER(even). A second filter includes resistor 1602 and a capacitor 1606 to filter Vy5 for output POWER(odd). Thus, each of the two filters share resistor 1602, but each filter includes a respective capacitor 1604, 1606 to enable the filtering and sampling functions with a common capacitor. Each filter, for example, has a time constant that is greater than a period of first switching device 532. Typically, each filter has a time constant that is on the order of a few switching circuit switching cycles (e.g., a few cycles of first and second switching devices 532, 534). Subsystem 1600 further includes switches 1608, 1610 that operate in a complementary manner to sample the filtered values of Vy5. Switches 1608, 1610 typically switch at a much slower rate (e.g., less than one tenth) a switching frequency of switching circuit 504. Capacitor 1604 stores sampled and filtered Vy5 for output POWER(even), and capacitor 1606 stores sampled and filtered Vy5 for output POWER(odd). Thus, Power(even) and Power(odd) are alternately sampled from capacitors 1604 and 1606.

Control signal generator 1500 (FIG. 15) further includes a comparing circuit 1504 configured to compare POWER(k) and POWER(k−1), determine whether to increment or decrement duty cycle, and to provide an output signal 1506 indicating whether to increment or decrement duty cycle. Specifically, if POWER(k) is greater than POWER(k−1), the last change in duty cycle resulted in an increase in output power, and comparing circuit 1504 therefore provides output signal 1506 indicating that duty cycle should be changed in the same manner. For example, if POWER(k) is greater than POWER(k−1) and duty cycle was incremented from cycles k−1 to k, signal 1506 indicates that duty cycle should be further incremented. Conversely, if POWER(k) is less than POWER(k−1), the last change in duty cycle resulted in a decrease in output power, and comparing circuit 1504 therefore provides output signal 1506 indicating that duty cycle should be changed in the opposite manner. For example, if POWER(k) is less than POWER(k−1) and duty cycle was incremented from cycles k−1 to k, signal 1506 indicates that duty cycle should be decremented.

Signal 1506 is coupled into a charge pump circuit 1508, which generates an output signal 1510 indicating a desired duty cycle. Charge pump circuit 1508 increments or decrements the duty cycle in response to signal 1506, and is typically configured such that duty cycle is changed in equal increments in response to signal 1506. However, the size of each increment or decrement in duty cycle need not necessarily be equal. For example, a passive switched capacitor integrator could alternately be used in place of charge pump 1508. Signal 1510 is coupled to PWM circuit 1512, which generates PWM signals 1514 in response to signal 1510. In certain embodiments, signal 1510 is filtered so that duty cycle changes gradually rather than abruptly to help minimize ringing in power stage inductive and capacitive elements resulting from a change in duty cycle. PWM signals 1514 are coupled to driver circuitry, such as driver circuitry 812 of FIG. 8.

In alternate embodiments, some or all of the components of control signal generator 1500 are replaced with a microcontroller executing instructions in the form of software and/or firmware stored on a computer readable medium. Furthermore, in certain embodiments, a common controller (e.g., a microcontroller) is used to control a number of switching circuits. The common controller may facilitate synchronized operation of multiple switching circuits. For example, a common controller could be configured such that turn on or turn off of each switching circuit's control switch is phase shifted from each other control switch to reduce ripple current magnitude. As another example, the common controller may be used to synchronize start-up of a number of switching circuits such that a number of control switches simultaneously conduct at start up. The common controller is optionally electrically isolated from the switching circuits it controls, such as via optical isolators.

Figure 53:
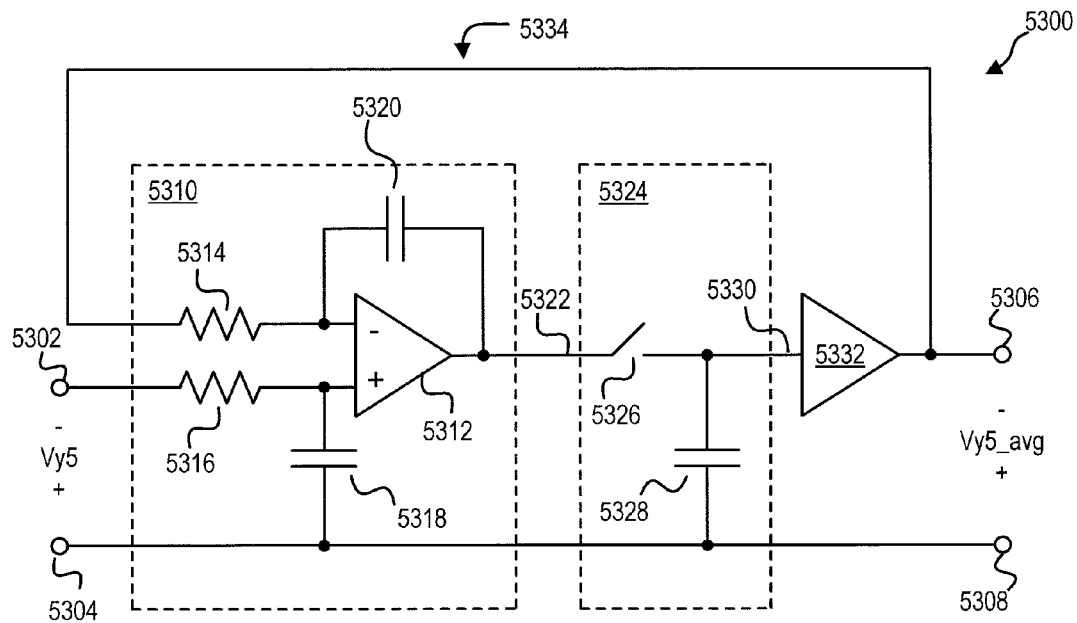
FIG. 53 shows one switching node voltage filtering subsystem, according to an embodiment.

FIG. 53 shows a filtering subsystem 5300, which is another example of a filtering subsystem that could be used to generate an average value of a switching node voltage. Although filtering subsystem 5300 is discussed in the context of only switching circuit 504 (FIG. 5) for simplicity, filtering subsystem 5300 could be adapted for use with other switching circuits disclosed herein.

Filtering subsystem 5300 includes a set of input terminals 5302, 5304 for receiving switching node voltage Vy5 from across nodes 520, 526 of switching circuit 504. Filtering subsystem 5300 also includes a set of output terminals 5306, 5308 for outputting an average value (Vy5_avg) of switching node voltage Vy5. An integrator circuit 5310 including an operational amplifier (op-amp) 5312, resistors 5314, 5316, and capacitors 5318, 5320, integrates a difference between Vy5 and Vy5_avg. An output 5322 of integration circuit 5310 is coupled to a sample and hold circuit 5324 including a switch 5326 and a capacitor 5328. Switch 5326 is typically switched at the same switching frequency as switching circuit 504. Output 5330 of sample and hold circuit 5324 is optionally buffered by unity gain buffer 5332 to generate Vy5_avg.

Integrator circuit 5310 forces Vy5_avg to be equal to the average value of Vy5, and sample and hold circuit 5324 filters output 5322 of integration circuit 5310. Sample and hold circuit 5324 has a sinc function frequency response with zeroes at its sampling frequency and harmonics thereof. Any aliasing of the switching harmonics is removed by the negative feedback loop 5334 around filtering subsystem 5300. Filtering subsystem 5300 typically settles quickly, and in some cases, may settle as quickly as a single sampling cycle. Quick settling time is generally desirable as it allows switching circuit 504 to sample Vy5_avg at a high frequency, thereby potentially allowing duty cycle to be changed at a correspondingly high frequency to promote faster MPPT.

Figure 17:
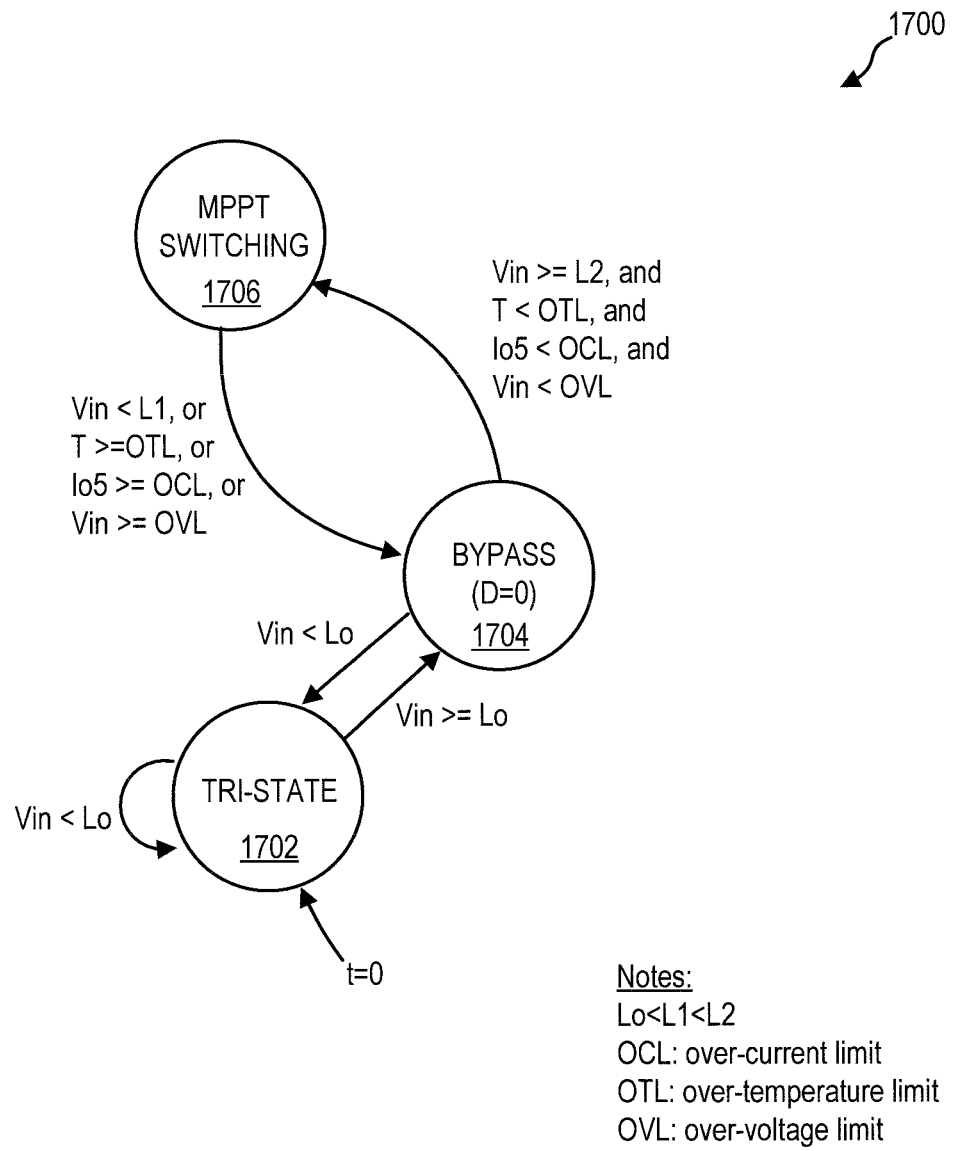
FIG. 17 shows a state diagram of operating modes of one embodiment of the switching circuit of FIG. 5.

As discussed above, certain embodiments of the switching circuits disclosed herein have a number of operating modes. Some of such embodiments change operating modes based at least in part on an output voltage of an electric power source electrically coupled thereto (e.g., an output voltage of electric power source 402). For example, FIG. 17 shows a state diagram 1700 of operating states or modes of one embodiment of switching circuits 504 intended for operation primarily or completely from respective electric power sources 502 electrically coupled to their input ports 506. Such embodiments switch operating modes as a function of input voltage Vin, which is a voltage between positive and negative input nodes 520, 518, output current, and temperature.

Upon power up, the switching circuit enters a tri-state mode 1702 and remains in tri-state mode 1702 as long as Vin is less than a threshold value Lo. When Vin is less than Lo, Vin is too low for controller 536 to reliably operate. In tri-state mode 1702, first and second switching devices 532, 534 are turned off. Second switching device 534 may nevertheless conduct current in the tri-state mode, such as via a body diode in the case the switching device is a MOSFET, to provide a bypass path for output current Io5. Thus, the switching circuit can potentially take the place of a bypass diode in parallel with a photovoltaic device, thereby helping reduce overall system parts count and cost. Alternately, a diode may be placed in parallel with switching circuit's output port to provide redundancy in case of switching circuit failure.

If Vin is greater than or equal to Lo, the switching circuit transitions from tri-state mode 1702 to a bypass mode 1704. In the range of input voltages encompassed by bypass mode 1704, Vin is sufficiently large to reliably operate switching circuit 504's controller 536, but Vin is not sufficiently large to enable meaningful power transfer between electric power source 502 and load 528. Therefore, first and second switching devices 532, 534 are operated in the bypass mode such that duty cycle is zero, resulting in first switching device 532 remaining off, and second switching device 534 remaining on and thereby shunting output port 508. Therefore, current in output circuit 530 bypasses the switching circuit via second switching device 534. In the case where first and second switching devices 532, 534 are MOSFETs, operating in bypass mode is typically more efficient than relying on a MOSFET body diode, or an external diode, to conduct current as a MOSFET on-state forward voltage drop is typically less than a body diode forward voltage drop. In some embodiments, the switching circuit also operates in bypass mode 1704 when output current Io5 exceeds an over-current limit threshold (OCL), when Vin exceeds an over-voltage limit (OVL), and/or when switching circuit temperature (T) exceeds an over-temperature limit (OTL).

When Vin is greater than or equal to L2, the switching circuit transitions to MPPT switching mode 1706. MPPT switching mode 1706 is characterized by controller 536 adjusting duty cycle of first switching device 532 to at least substantially maximize switching circuit output power, as discussed above, such as with respect to FIGS. 10-14. In some embodiments, it may be necessary to include a soft-start mode between bypass mode 1704 and MPPT switching mode 1706 to avoid output voltage and/or output current overshoot. If Vin falls below L1, which is greater than Lo but less than L2, while in MPPT switching mode 1706, the switching circuit transitions to bypass mode 1704. The switching circuit will also transition from MPPT switching mode 1706 to bypass mode 1704 if T reaches OTL or if Io5 reaches OCL.

In some embodiments, if Vin falls below L2 while in MPPT switching mode 1706, duty cycle is optionally slowly reduced until either Vin recovers to rise above L2 and normal MPPT switching resumes, or Vin continues to fall and drops below L1 such that the switching circuit transitions to bypass mode 1704. When duty cycle is slowly reduced in such manner, switching circuit output power and current drawn from the input power source typically decrease. However, such optional fault handling procedure may advantageously offer faster fault recovery.

Although state diagram 1700 is discussed in context of switching circuit 504, it should be realized that other switching circuits discussed herein could be configured to operate in a similar manner. Additionally, it should be realized that the switching circuit 504, as well as the other switching circuits discussed herein, could be configured to operate in manners different than that shown by state diagram 1700. For example, some alternate embodiments do not include over-current or over-temperature protection.

Figure 39:
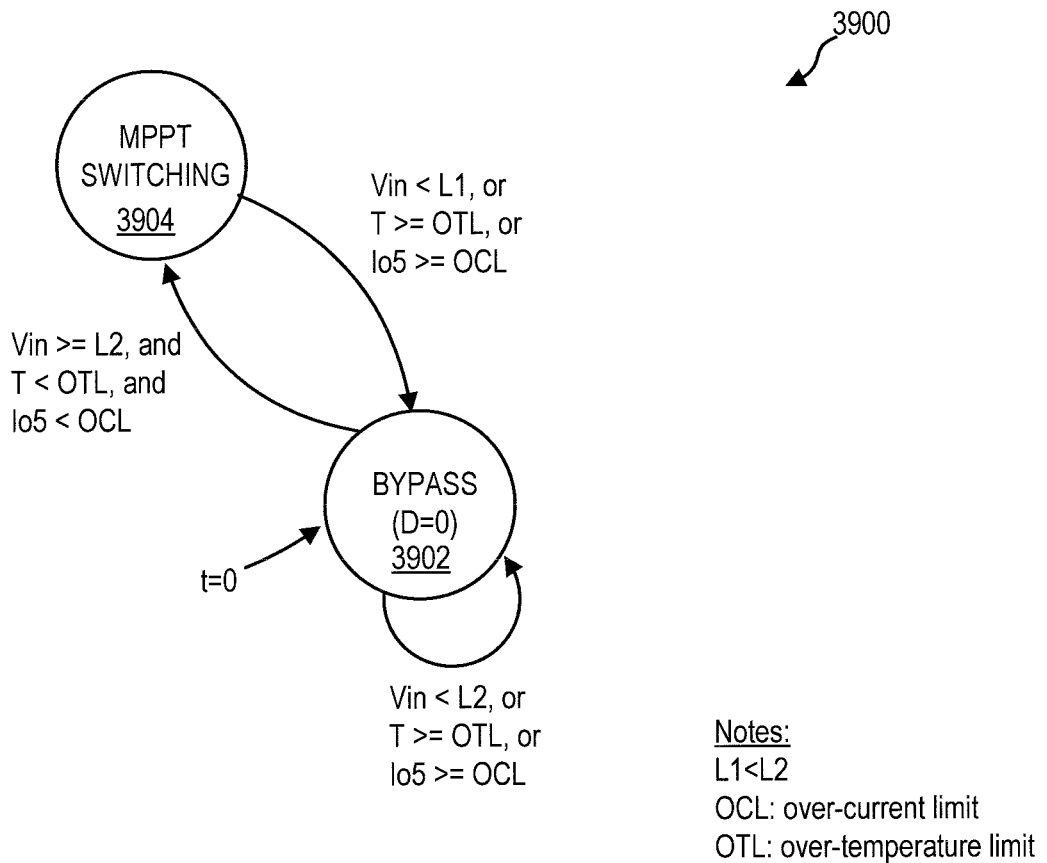
FIG. 39 shows a state diagram of operating modes of another embodiment of the switching circuit of FIG. 5.
Figure 40:
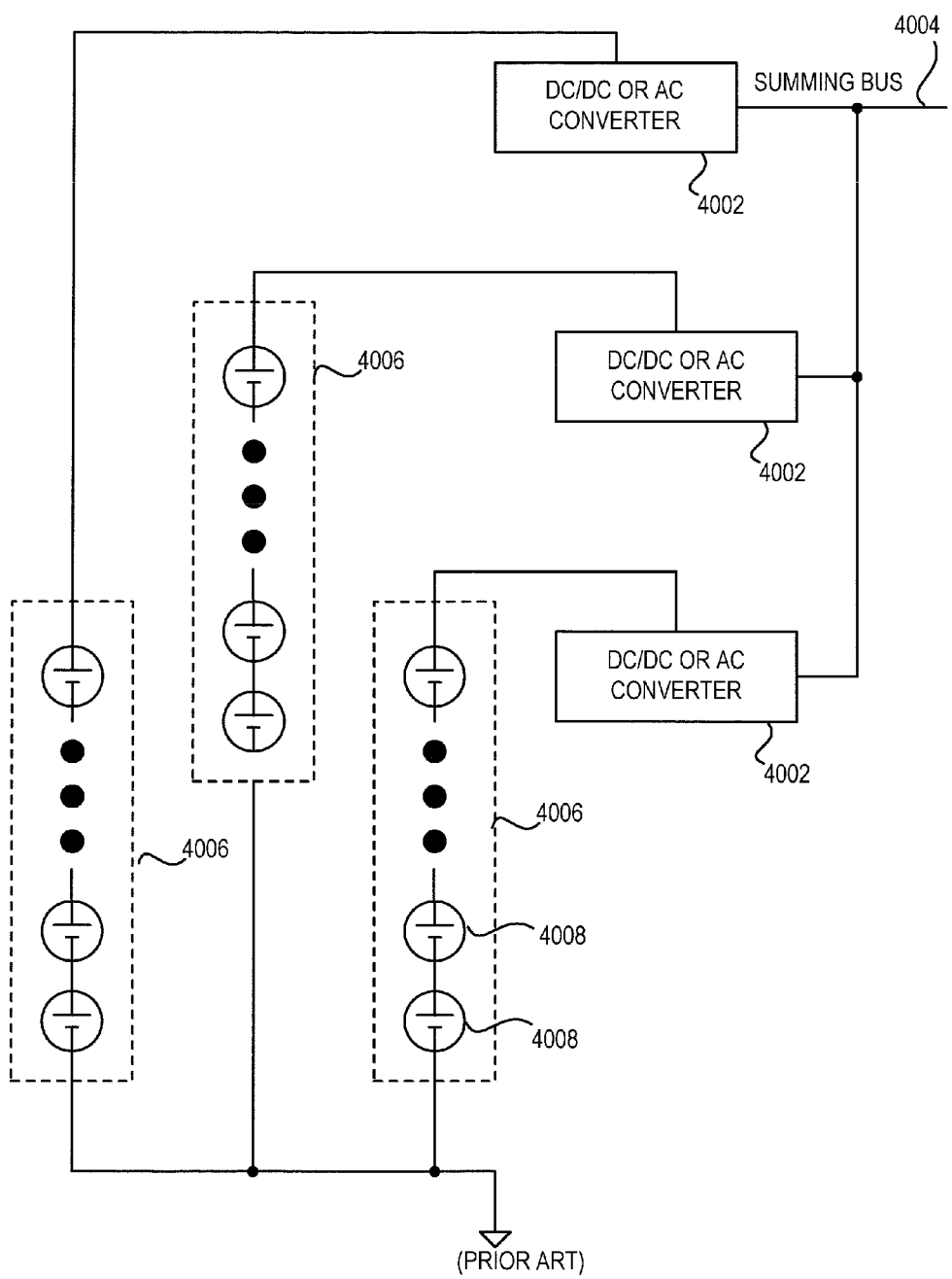
FIG. 40 shows a prior art photovoltaic system.

As discussed above, in certain embodiments of the switching circuits disclosed herein, a switching device that is nominally on with zero voltage, such as a depletion mode transistor, can replace or be connected in parallel with a switching device to provide a current bypass or shunt path, thereby rendering a tri-state mode unnecessary. For example, in certain embodiments of switching circuit 504, second switching device 534 is a depletion mode transistor that conducts current and provides a bypass path for output current Io5 when Vin is too low for meaningful power extraction. FIG. 39 shows a state diagram 3900 for one of such embodiments. As shown in state diagram 3900, such an embodiment does not have a tri-state mode, but rather operates in a bypass mode 3902 at power up and until Vin reaches L2. Otherwise, this embodiment operates in a manner similar to that shown by state diagram 1700 of FIG. 17.

Figure 18:
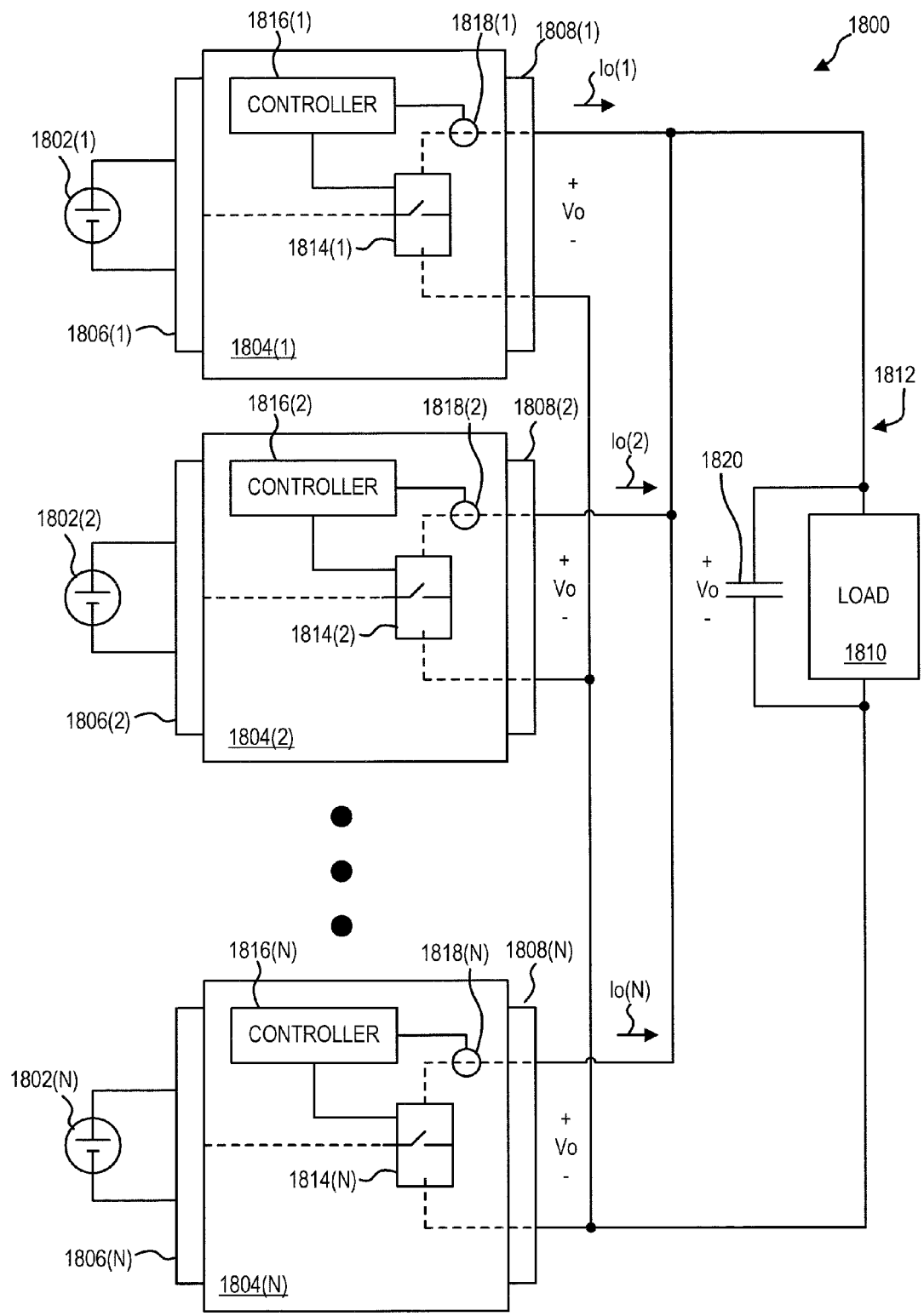
FIG. 18 shows another electric power system including switching circuits for extracting power from electric power sources, according to an embodiment.

The electric power systems discussed above include a number of switching circuits with output ports electrically coupled in series with a load. In such systems, output current remains essentially constant during successive changes in duty cycle, thereby enabling MPPT to be achieved by maximizing an average value of switching circuit output voltage. Alternately, MPPT can be realized in electric power systems including a number of switching circuits electrically coupled together in parallel. For example, FIG. 18 shows one electric power system 1800, which includes N electric power sources 1802, where N is an integer greater than one. Electric power sources 1802, for example, are photovoltaic devices, such as individual photovoltaic cells, individual junctions of a multi-junction photovoltaic cell, or sub-modules or panels including a number of electrically coupled photovoltaic cells (e.g., series and/or parallel electrically coupled photovoltaic cells). Other examples of electric power sources 1802 include fuel cells and batteries.

System 1800 further includes N switching circuits 1804. Each switching circuit includes an input port 1806 coupled to a respective electric power source 1802, and an output port 1808 electrically coupled to a load. As discussed further below, each switching circuit 1804 is configured to at least substantially maximize an amount of power extracted from its respective electric power source 1802 and delivered to a load. Thus, switching circuits 1804 are configured to operate their respective electric power sources 1802 at least substantially at their maximum power points. Output ports 1808 are electrically coupled in parallel with a load 1810, such as an inverter, to form a closed circuit, hereinafter referred to as output circuit 1812. Each output port 1808, as well as load 1810, has the same output voltage Vo due to their parallel connection.

Each switching circuit 1804 includes a respective first switching device 1814 configured to switch between its conductive state and its non-conductive state to transfer power from input port 1806 to output port 1808. First switching device 1814 typically switches at a frequency of at least 20 kHz for the reasons discussed above with respect to FIG. 4. Additionally, for reasons similar to those discussed above with respect to FIG. 4, maximum power transfer to load 1810 may result when the first switching device 1814 switches at a frequency an order of magnitude or more higher than 20 kHz.

First switching device 1814 is controlled by a controller 1816, which has, for example PWM and/or PFM operating modes. Additionally, in certain embodiments where switching circuits 1804 are controlled by PWM, switching transitions of each first switching device 1814 are displaced in phase from switching transitions of each other first switching device 1814 so that ripple current generated by each switching circuit 1804 at least partially cancels ripple current generated by each other switching circuit 1804. For example, in certain embodiment including two switching circuits 1804 each controlled by PWM, turn-on of each first switching device 1814 is displaced by 180 degrees from turn-on of each other first switching device 1814. Alternately, in some embodiments, switching frequency is purposefully loosely controlled such that switching frequency will likely vary among instances of switching circuits 1804, thereby helping to reduce ripple and transients resulting from multiple switching circuits 1804 simultaneously switching.

Each switching circuit 1804 further includes a current monitoring subsystem 1818 configured to measure a magnitude of current flowing out of its output port 1808. Although current monitoring subsystem 1818 is symbolically shown as a discrete element, it may optionally be integrated with or cooperate with another element of switching circuit 1804. For example, in certain embodiments, current monitoring subsystem 1818 determines magnitude of current flowing out of output port 1808 by sensing a voltage drop across first switching device 1814 when the switching device is conducting current.

Although output voltage Vo may vary over time due to a variety of factors, such as a change in load 1810, controller 1816 operates much faster than voltage Vo can change. Therefore, output voltage Vo can be considered constant between successive changes in duty cycle of first switching device 1814, and any change in switching circuit output power therefore results only from a change in Io_avg, as output power is the product of current Io_avg and Vo. Controller 1816 adjusts duty cycle of first switching device 1814 to at least substantially maximize an amount of power extracted from electric power source 1802 by at least substantially maximizing an average value of switching circuit output current Io (Io_avg). By maximizing Io_avg, switching circuit output power, as well as power extracted from electric power source 1802, is at least substantially maximized. Power extracted from electric power source 1802 will be the same as switching circuit output power, minus losses in switching circuit 1804. Therefore, controller 1816 at least substantially maximizes power extracted from electric power source 1802 by maximizing Io_avg. It should be appreciated that no power calculations are required for such MPPT function, thereby potentially freeing switching circuits 1804 from requiring power calculating hardware and/or software. Certain embodiments of switching circuits 1804 may therefore be simpler and/or lower cost than typical prior MPPT controllers. However, in certain alternate embodiments, switching circuits 1804 determine power delivered from their respective output ports 1808, such as to achieve more accurate MPPT and/or to achieve MPPT in applications where load 1810 cause Vo to rapidly change.

As discussed above, controller 1816 operates much faster than output voltage Vo changes. In particular, as duty cycle changes by a given percentage, Vo changes by a smaller percentage relative to the magnitude of its normal operating range, ideally by a much smaller percentage. Such relationship is promoted by use of a relatively large value of output circuit capacitance 1820 and/or by changing duty cycle at a relatively fast rate so that Vo has limited opportunity to change between successive changes in duty cycle. However, to most accurately track the MPP of electric power source 1802, duty cycle should not change more quickly than transients settle after a change in duty cycle. In particular, a change in duty cycle results in ringing with a time constant dependent on effective resistance of electric power source 1802 and bypass capacitance (not shown) of electric power source 1802.

In certain embodiments, controller 1816 has a configuration similar to that of controller 800 (FIG. 8), except that its control signal generator receives as its input a switching circuit current value, such as an output current value (e.g., Io in FIG. 18), instead of a switching node voltage or an output voltage. Furthermore, certain embodiments of controller 1816 execute a method similar to method 900 of FIG. 9 but where samples of average output current, instead of a switching node voltage, are compared, and average output current, instead of average output voltage, is maximized.

Although output circuit capacitance 1820 is shown as a single discrete capacitor in parallel with load 1810, output circuit capacitance 1820 may include capacitance within switching circuits 1804 and/or within load 1810. In certain embodiments, output capacitance 1820 is internal to switching circuits 1804 and/or load 1810.

Figure 19:
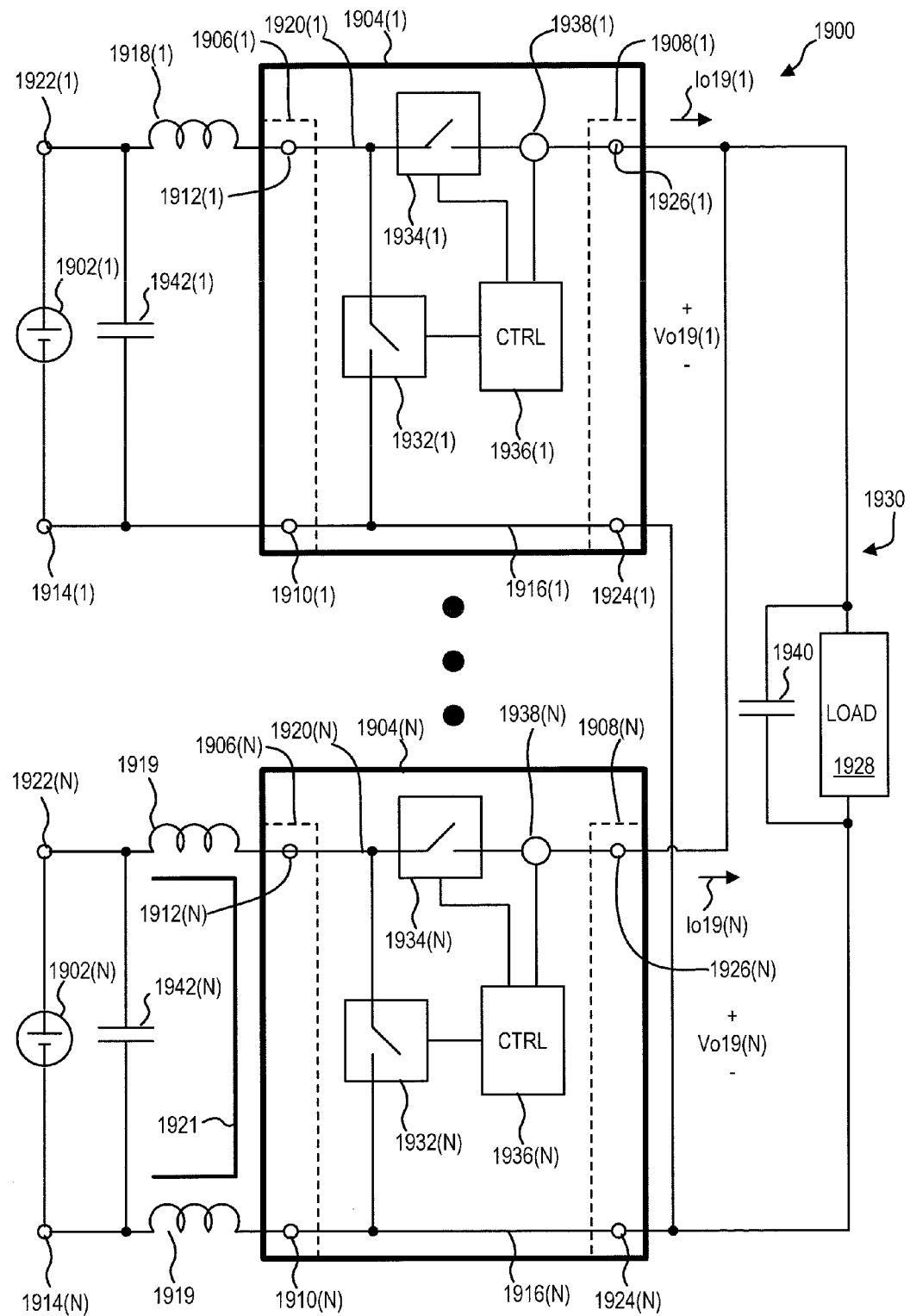
FIG. 19 shows one electric power system including boost-type switching circuits for extracting power from electric power sources, according to an embodiment.

FIG. 19 shows an electric power system 1900, which is an embodiment of electric power system 1800 where the switching circuits have a boost-type topology and are coupled to the load in parallel. System 1900 includes N electric power sources 1902, such as photovoltaic devices or fuel cells, and N electric switching circuits 1904, where N is an integer greater than one. Switching circuits 1904 are an embodiment of switching circuits 1804 of FIG. 18, and each switching circuit 1904 includes an input port 1906 and an output port 1908. Each input port 1906 includes a first and second input terminal 1910, 1912. First input terminal 1910 is electrically coupled to a negative terminal 1914 of electric power source 1902, and first input terminal 1910 and negative input terminal 1914 form part of a negative input node 1916.

System 1900 further includes inductance 1918, which serves as an energy storage inductor for the boost-type converter of switching circuit 1904. In the example of FIG. 19, an inductance 1918 is external to switching circuit 1904. Second input terminal 1912 is electrically coupled to an intermediate switching node 1920, and inductance 1918 is electrically coupled between a positive terminal 1922 of electric power source 1902 and second terminal 1912. Alternately, inductance 1918 may be electrically coupled between negative terminal 1914 of electric power source 1902 and first input terminal 1910. Additionally, inductance 1918 could optionally be split into two or more inductors, such as a first inductor electrically coupled between terminals 1922 and 1912, and a second inductor electrically coupled between terminals 1914 and 1910. In embodiments where inductance 1918 is split into two or more inductors, at least some of such inductors are optionally magnetically coupled to increase total inductance. For example, FIG. 19 shows inductance associated with switching circuit 1904(N) being split into two inductors 1919 that are magnetically coupled by a magnetic core 1921.

In alternate embodiments, inductance 1918 is internal to switching circuit 1904, and electric power source 1902 is directly coupled to input port 1906. For example, inductance 1918 may be electrically coupled between second input terminal 1912 and intermediate switching node 1920. As another example, inductance 1918 may be electrically coupled between first input terminal 1910 and negative input node 1916. Additionally, inductance 1918 could optionally be split into two or more inductors internal to switching circuit 1904, such as a first inductor electrically coupled between second input terminal 1912 and intermediate switching node 1920, and a second inductor electrically coupled between first input terminal 1910 and negative input node 1916. In embodiments where inductance 1918 is split into two or more inductors internal to switching circuit 1904, at least some of such multiple inductors are optionally magnetically coupled to increase total inductance.

Figure 46:
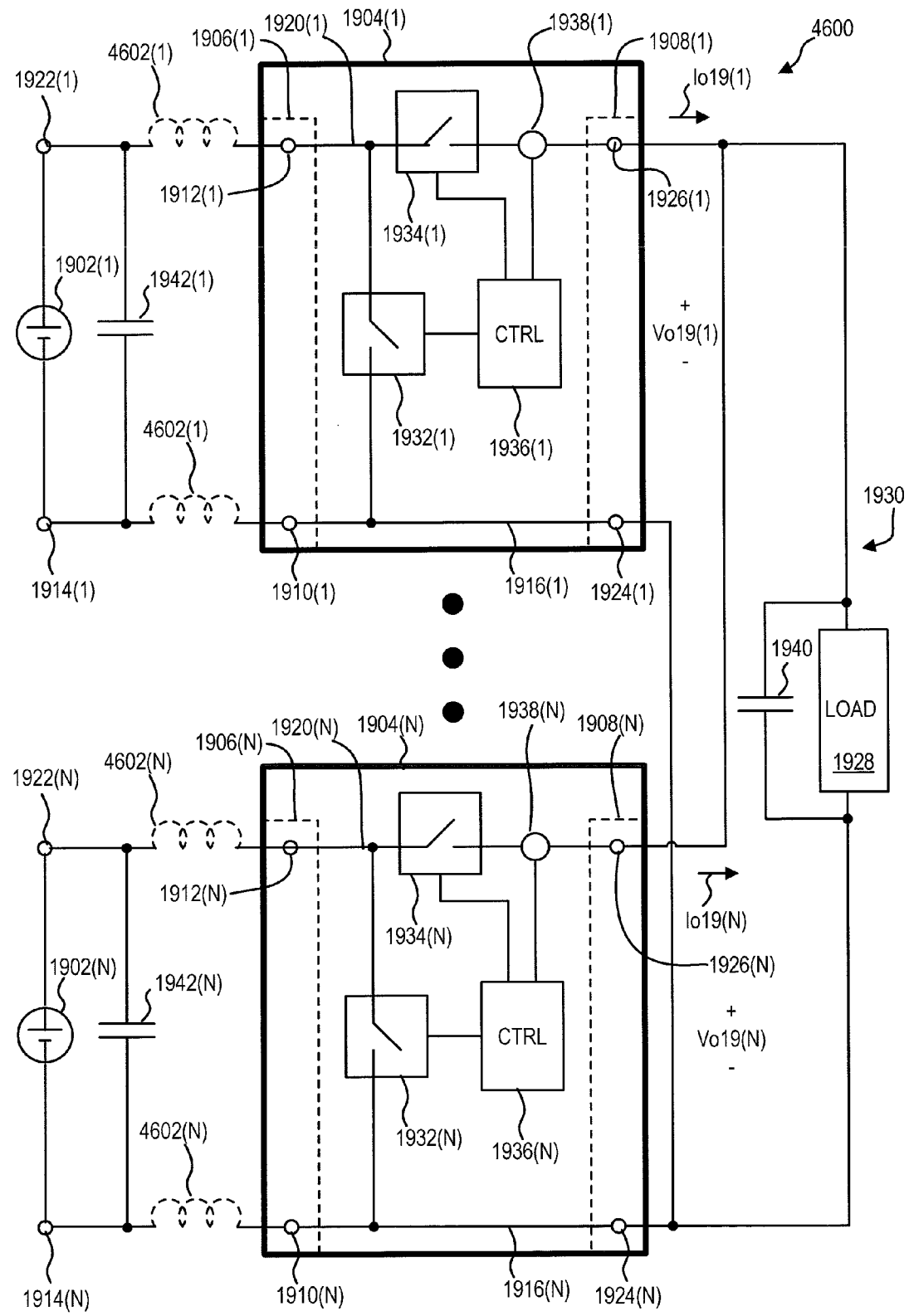
FIG. 46 shows an embodiment of the electric power system of FIG. 19 including interconnection inductance.

In certain embodiments, inductance 1918 is at least partially interconnection inductance of a circuit connecting electric power source 1902 to input port 1906. For example, FIG. 46 shows electric power system 4600, which is an embodiment of electric power system 1900 where inductance 1918 includes interconnection inductance 4602. In some embodiments, switching circuit 1904 uses interconnection inductance as its primary energy storage inductance. Such interconnection inductance can be purposefully optimized. For example, interconnect wires can be shaped in a spiral form to increase interconnection inductance such that current flows in the same direction in each wire, and respective magnetic fluxes generated by current flowing in each wire add together. Such summing of magnetic fluxes increases inductance by the square of a number of turns formed by the wires. Thus, such arrangement can be especially beneficial in embodiments where inductance 1918 does not include a magnetic core, as the arrangement increases inductance without use of a core. Omitting a magnetic core from inductance 1918 typically reduces cost and eliminates potential issues with magnetic core saturation at high current magnitudes.

Each output port 1908 includes a first and second output terminal 1924, 1926. First output terminal 1924 is electrically coupled to negative input node 1916. Each output port 1908 is electrically coupled in parallel with a load 1928 (e.g., an inverter) to form a closed circuit, hereinafter referred to as output circuit 1930.

Each switching circuit 1904 further includes a first switching device 1932 (analogous to first switching device 1814 of FIG. 18) electrically coupled between intermediate switching node 1920 and first input terminal 1910, and a second switching device 1934 electrically coupled between intermediate switching node 1920 and second output terminal 1926. A controller 1936 controls operation of first and second switching devices 1932, 1934, which cooperate to transfer power from input port 1906 to output port 1908. Each switching circuit 1904 additionally includes a current measuring subsystem 1938, analogous to current measurement subsystems 1818 of FIG. 18. Although current measuring subsystem 1938 is symbolically shown as a discrete element, it may be part of or cooperate with another element of switching circuit 1904. Additionally, although current measuring subsystem 1938 is shown as measuring output current Io19, current measuring subsystem 1938 could alternately be configured to measure current into switching circuit 1904, such as current into input terminal 1912. Controller 1936 adjusts duty cycle of first switching device 1932 to at least substantially maximize an average value of switching circuit output current Io19 (Io19_avg). Switching circuit output voltage (Vo19) remains essentially constant between successive changes in duty cycle, and therefore, switching circuit output power is maximized by maximizing Io19_avg.

Second switching device 1934 performs a freewheeling function in that it conducts current flowing through inductance 1918 when first switching device 1932 is off. Stated differently, second switching device 1934 provides a path for current to flow from second input terminal 1912 to second output terminal 1926 when first switching device 1932 turns off. Second switching device 1934 is alternately replaced with a diode, where current flows through the diode from intermediate switching node 1920 to second output terminal 1908 when forward biased.

In the example of FIG. 19, switching circuits 1904 share a common output capacitance 1940, which represents one or more capacitors in parallel with load 1928. Use of common output capacitance 1940 instead of individual output filter capacitors in switching circuits 1904 may reduce size and cost of the total output capacitance as ripple currents may cancel in a common bank of capacitance. However, switching circuits 1904 are not precluded from including output capacitors, and such capacitors may be required if parasitic inductance in output circuit 1930 is significant. For example, each switching circuit 1904 may include a respective output capacitor to minimize possible voltage spikes across second switching device 1934.

A capacitor 1942 across electric power source 1902 may be required, depending on the characteristics of electric power source 1902. For example, if electric power source 1902 is a photovoltaic device, capacitor 1942 is generally required to prevent ripple current from switching circuit 1904 from degrading photovoltaic device performance despite the junction capacitance of the photovoltaic device. Although capacitor 1942 is shown external to switching circuit 1904, the capacitor could alternately be integrated in switching circuit 1904.

Figure 54:
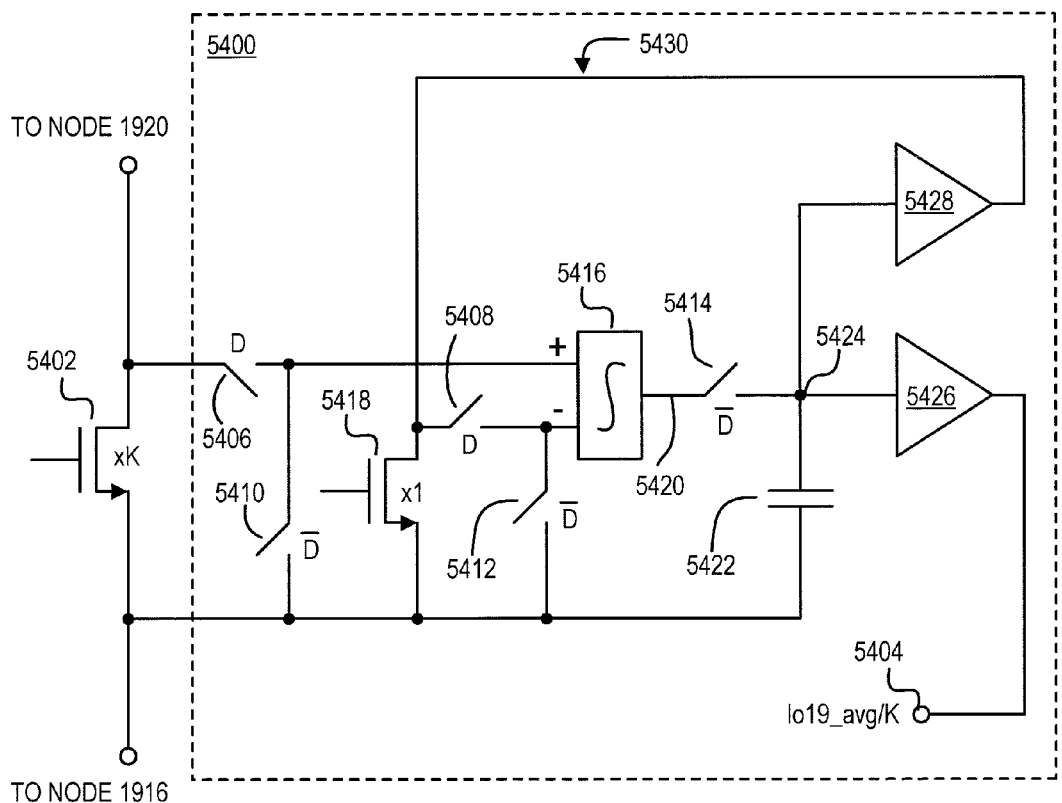
FIG. 54 shows one current measuring subsystem, according to an embodiment.

FIG. 54 shows one current measuring subsystem 5400, which is used to implement current measurement subsystem 1938 in some embodiments of switching circuit 1904 where first switching device 1932 is implemented by a power transistor 5402. In particular, subsystem 5400 generates a current signal on output terminal 5404 proportional to an average value (Io19_avg) of output current Io19 from a voltage across transistor 5402.

Current measurement subsystem 5400 includes a first set of switches 5406, 5408 that operate in a complementary manner with a second set of switches 5410, 5412, 5414. Thus, when switches 5406, 5408 are closed, switches 5410, 5412, 5414 are open, and vice versa. An integrator 5416 integrates a difference between a voltage across power transistor 5402 and a voltage across a reference transistor 5418 when transistor 5402 is turned on. Switches 5406, 5408 connect integrator 5416's inputs to transistors 5402, 5418 when transistor 5402 is turned on, and switches 5410, 5412 cause integrator 5416's differential input to be zeroed when transistor 5402 is turned off.

An output 5420 of integrator 5416 is coupled to a sample and hold circuit including switch 5414 and capacitor 5422. An output 5424 of the sample and hold circuit is coupled to matching transconductance stages 5426, 5428. Transconductance stage 5428 drives reference transistor 5418, and transconductance stage 5426 drives output terminal 5404. The output current flowing from terminal 5404 is equal to Io19_avg/K, where K is equal to the ratio of conductivity of power transistor 5402 to conductivity of reference transistor 5418 when both transistors are turned on.

By integrating the difference between the voltage across power transistor 5402 and the voltage across reference transistor 5418, subsystem 5400 takes into account variations in duty cycle of switching circuit 1904. If switches 5408 and 5412 were not used (i.e., switch 5408 was continuously on and switch 5412 was continuously off), subsystem 5400 would measure an average value of current through power transistor 5402, as opposed to an average value of Io19_avg. The sample and hold circuit filters output 5420 of integrator 5416. In particular, the sample and hold circuit has a sinc function frequency response with zeroes at its sampling frequency and harmonics thereof. Any aliasing of the switching harmonics is removed by negative feedback loop 5430 around integrator 5416.

Current measurement subsystem 5400 typically settles quickly, and in some cases, may settle as quickly as a single sampling cycle. Quick settling time is generally desirable as it allows switching circuit 1904 to sample Io19_avg at a high frequency, thereby potentially allowing duty cycle to be changed at a correspondingly high frequency to promote faster MPPT.

Switching circuits 1804 (FIG. 18) can have topologies other than a boost-type topology. For example, switching circuits 1804 can have a buck-type topology, such as similar to those of FIGS. 5 and 6, a buck-boost-type topology, or an isolated topology, such as similar to that of FIG. 7.

Figure 20:
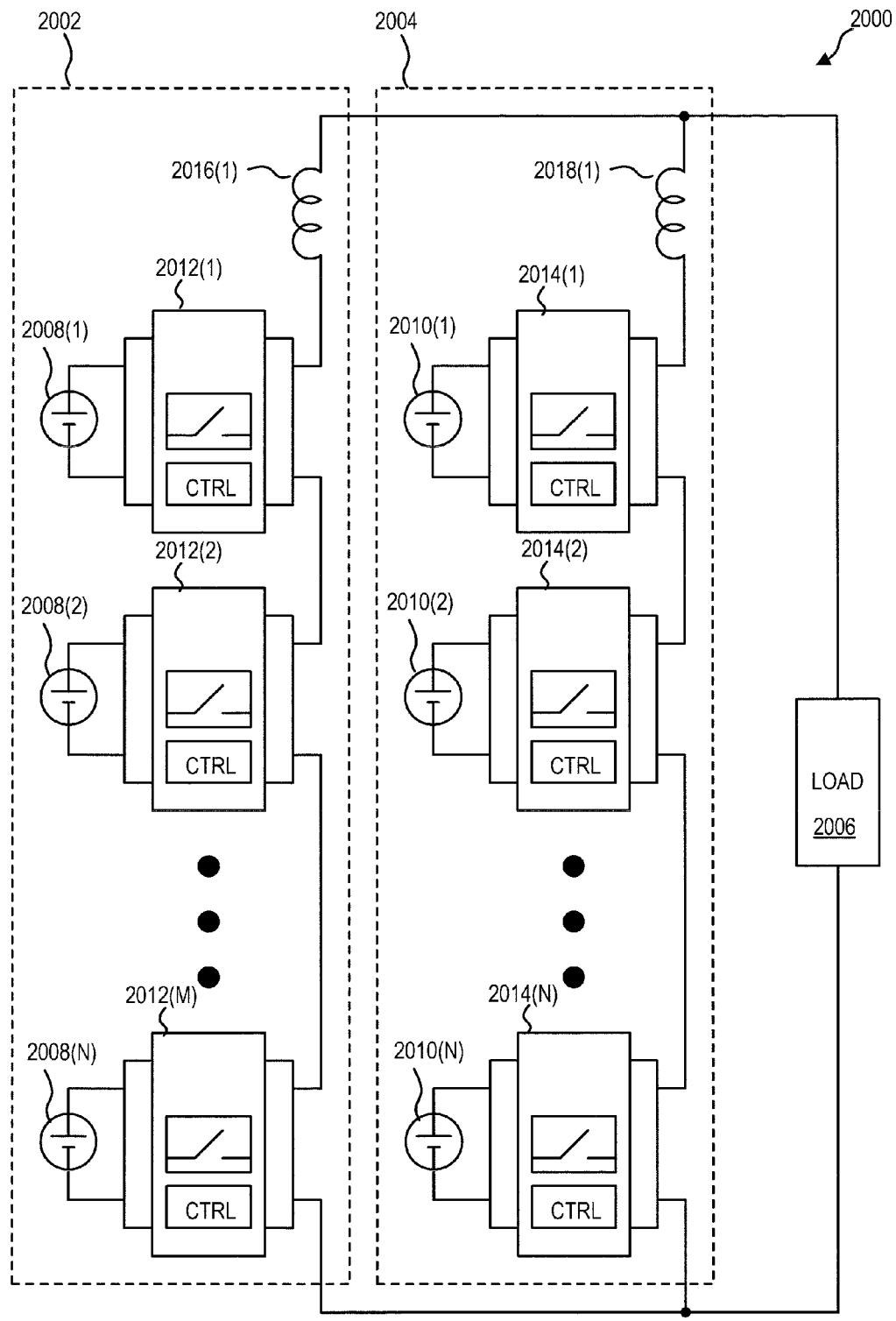
FIG. 20 shows an electric power system including parallel-connected strings of series-connected switching circuits for extracting power from electric power sources, according to an embodiment.

In electric power system 400 of FIG. 4, switching circuits are electrically coupled together in series, and in electric power system 1800 of FIG. 18, switching circuits are electrically coupled together in parallel. It is also possible to construct electric power systems using embodiments of the switching circuits disclosed herein with both series and parallel connections. For example, FIG. 20 shows an electric power system 2000 including two strings 2002 and 2004 electrically coupled in parallel to a load 2006. In alternate embodiments, system 2000 includes additional strings electrically coupled in parallel with load 2006. String 2002 includes M electric power sources 2008 and a respective switching circuit 2012 electrically coupled thereto, where M is an integer greater than one. The output ports of switching circuits 2012 are electrically coupled together in series. Similarly, string 2004 includes N electric power sources 2010 and a respective switching circuit 2014 electrically coupled thereto, where N is an integer greater than one. The output ports of switching circuits 2014 are electrically coupled together in series. M and N may or may not be the same.

Figure 47:
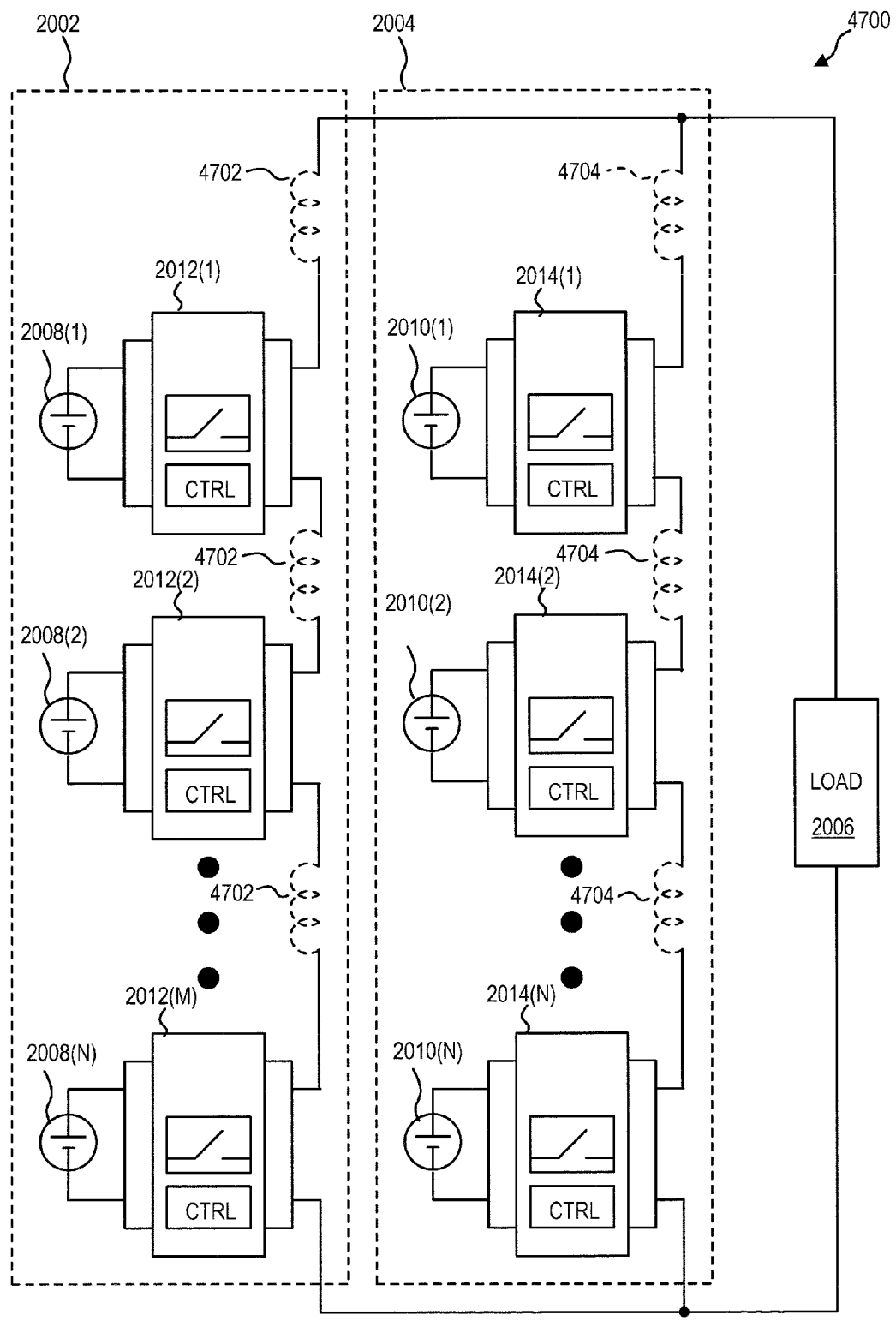
FIG. 47 shows an embodiment of the electric power system of FIG. 20 including interconnection inductance.

Each of switching circuits 2012, 2014 is an embodiment of switching circuit 404 of FIG. 4, and each of switching circuits 2012, 2014 at least substantially maximizes an amount of electric power extracted from its respective electric power source 2008, 2010 by maximizing an average value of the switching circuit's output voltage. String 2002 includes an inductance 2016 in series that is shared among each switching circuit 2012, and string 2004 includes an inductance 2018 in series that is shared among each switching circuit 2014. Although inductances 2016, 2018 are symbolically shown as single inductors, such inductors may include a number of discrete inductors and/or interconnection inductances of connectors (e.g., wires or bus bars) forming the circuits of strings 2002, 2004, respectively. For example, FIG. 47 shows an electric power system 4700, which is an embodiment of electric power system 2000 where inductances 2016, 2018 include interconnection inductances 4702, 4704.

Electric power sources 2008, 2010 are, for example, photovoltaic cells, and each string 2002, 2004 represents one or more modules or panels of photovoltaic cells in some embodiments. As another example, each of electric power sources 2008 could represent a single junction of one multi-junction photovoltaic cell, and each of electric power sources 2010 would represent a single junction of another multi-junction photovoltaic cell.

Figure 21:
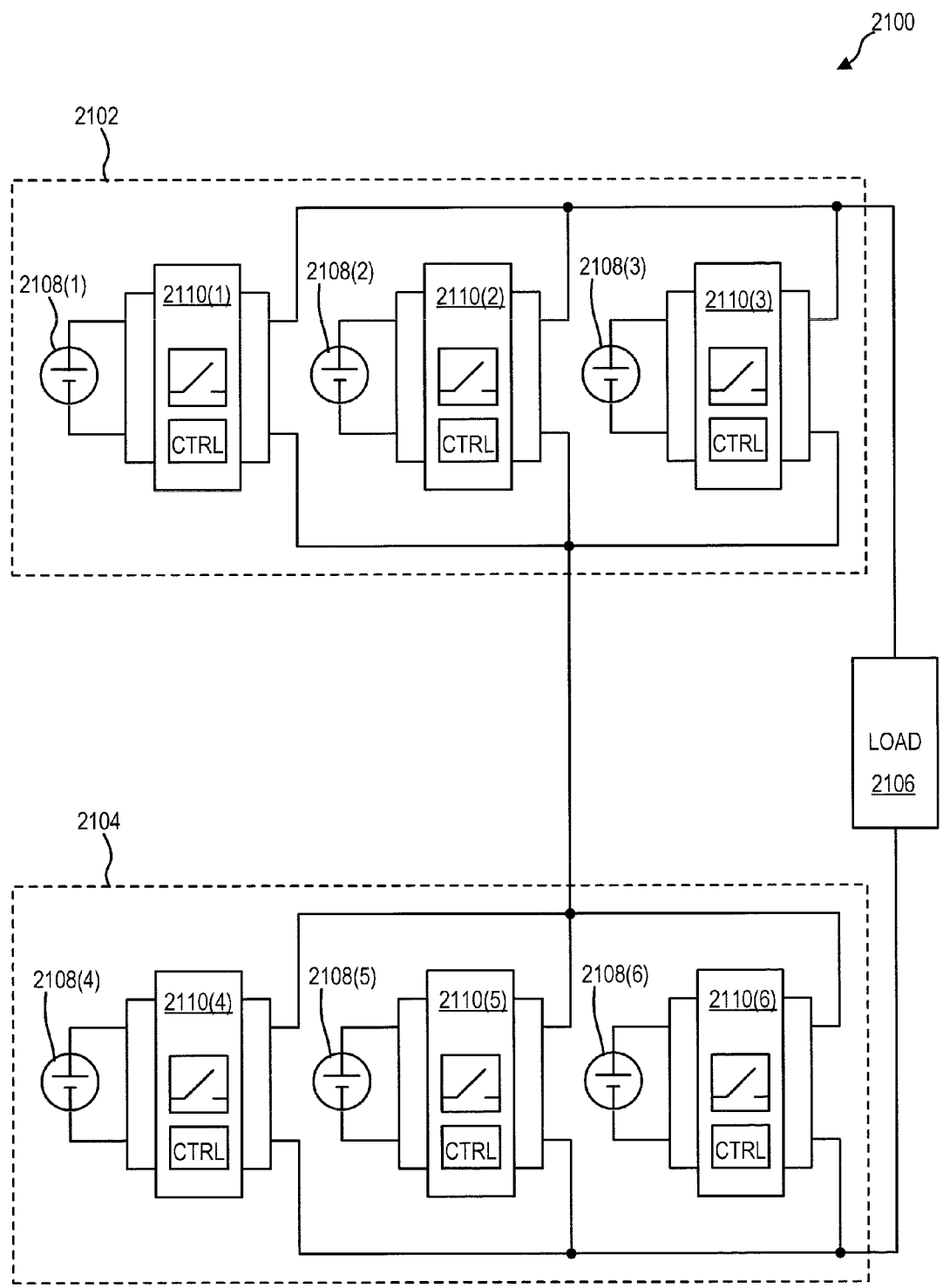
FIG. 21 shows an electric power system including series-connected strings of parallel-connected switching circuits for extracting power from electric power sources, according to an embodiment.

FIG. 21 shows an electric power system 2100 including two strings 2102 and 2104 electrically coupled in series to a load 2106. Each of strings 2102, 2104 includes three electric power sources 2108, and a respective switching circuit 2110 electrically coupled thereto. The number of electric power sources in a string, as well as the number of strings connected in series, could be varied. The output ports of each switching circuit 2110 in a given string 2102, 2104 are electrically coupled together in parallel. Each of switching circuits 2110 is an embodiment of switching circuit 1804 of FIG. 18 configured to at least substantially maximize an amount of electric power extracted from its electric power source by maximizing average switching circuit output current. In one embodiment, each electric power source 2108 is an individual photovoltaic cell forming a module or panel of photovoltaic cells.

Figure 57:
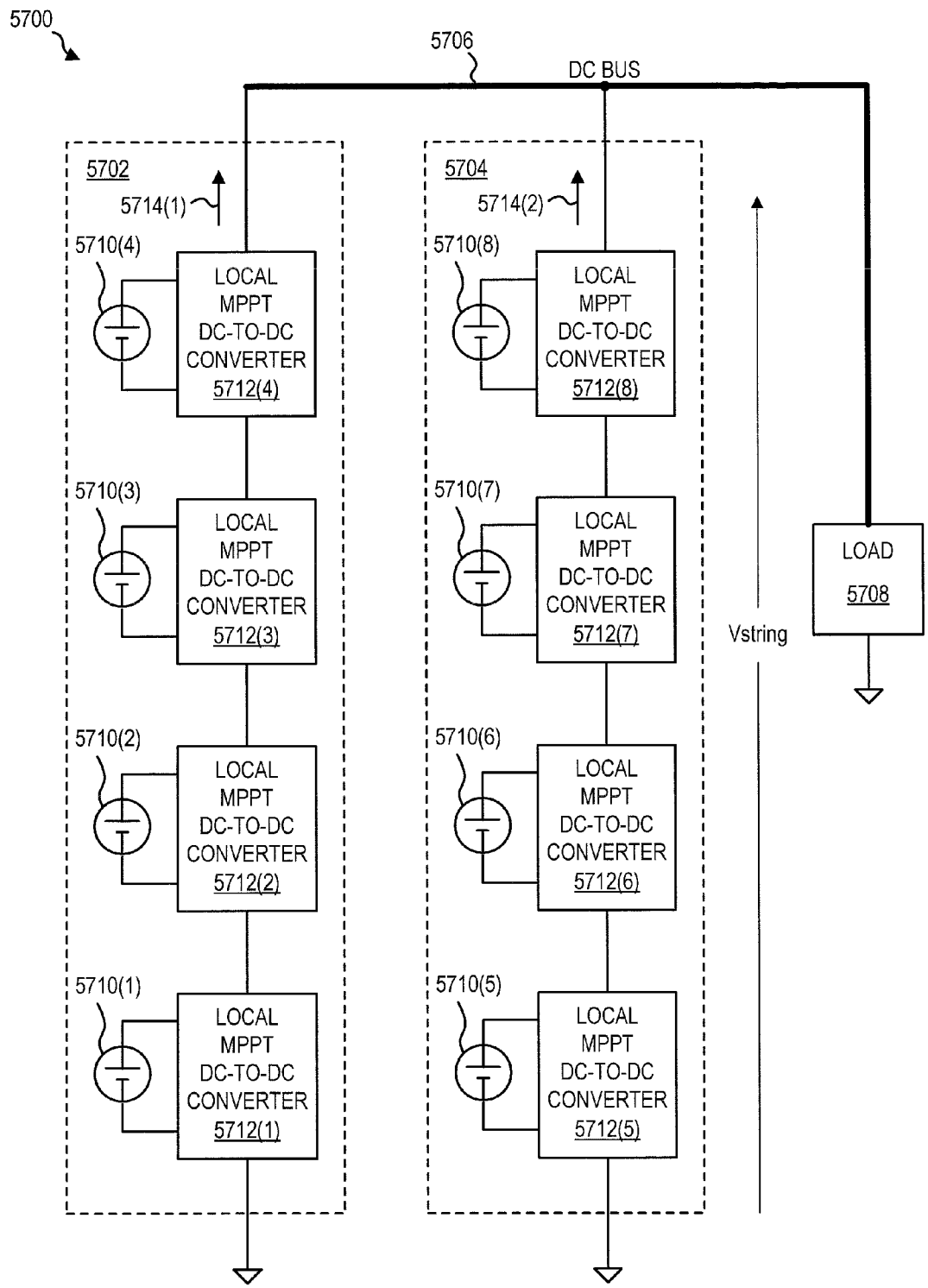
FIG. 57 shows an electric power system including parallel strings of buck-type MPPT converters, according to an embodiment.

In embodiments where a number of strings of buck-type switching circuits are electrically coupled in parallel, less than optimal operation of one string can negatively affect operation of parallel connected strings. For example, consider FIG. 57 which shows an electric power system 5700 including two strings 5702, 5704 electrically coupled in parallel to a DC bus 5706 which powers a load 5708. Each string 5702, 5704 includes a number of photovoltaic devices 5710, and each photovoltaic device 5710 is electrically coupled to a respective buck-type MPPT converter 5712. Output ports of each MPPT converter 5712 in a string are electrically coupled in series. Each string 5702, 5704 must have the same string voltage Vstring because the strings are electrically coupled in parallel.

Under ideal conditions, and with each photovoltaic device 5710 ideally matched with cell voltage equal to Vmp at cell current Imp at the maximum power point, each MPPT converter 5712 has an output voltage of V<Vmp at a string current 5714 of I>Imp when operating its respective photovoltaic device 5710 at its MPP. Under such conditions, each string has a string voltage Vstring of 4*V at a respective string current 5714 of I, such that each string 5702, 5704 delivers equal power to load 5708. Now assume photovoltaic devices 5710(1), 5710(2) are producing little or no output power, while remaining photovoltaic devices 5710(3)-5710(8) are producing full output power. Such disparate power production occurs, for example, due to differential shading or soiling of photovoltaic devices 5710.

Under such conditions, buck-type MPPT converters 5712 (1), 5712(2) cannot generate a significant output voltage at string current I because their respective photovoltaic devices 5710(1), 5710(2) are generating little to no power. Consequently, MPPT converters 5712(1), 5712(2) generate an output voltage of approximately zero volts, while remaining MPPT converters 5712(3), 5712(4) of string 5702 continue to generate an output voltage V. Thus, to extract the maximum available power from string 5702, Vstring will be approximately 2*V.

String 5704 will also need to operate at a string voltage of 2*V instead of 4*V because string 5704 is electrically coupled in parallel with string 5702, which has a string voltage of 2*V. Thus, although MPPT converters 5712(5)-(8) of string 5704 will continue to operate their respective photovoltaic devices 5710 at their MPPs, string current 5714(2) must be approximately equal to 2*I instead of I, thereby increasing losses in MPPT converters 5712(5)-(8) and in many of the conductors connecting components of system 5700. Thus, low power operation of string 5702 not only reduces power generated by the string but also reduces efficiency of the remainder of system 5700. Furthermore, load 5708 typically requires a minimum input voltage, and if voltage of string 5702 drops too low, the string may need to be disconnected from system 5700 and will not provide any power.

Figure 48:
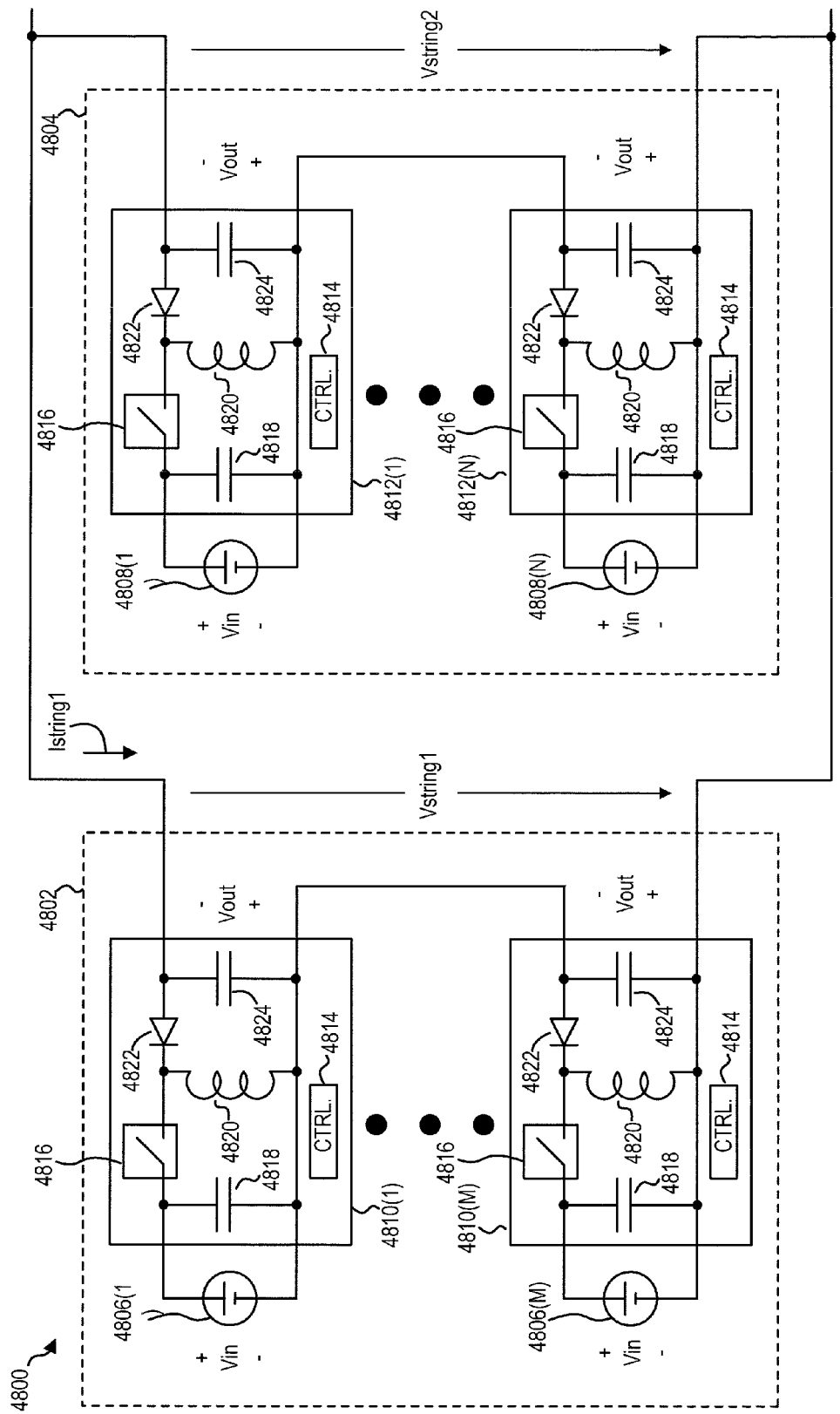
FIG. 48 shows an electric power system including parallel-connected strings of series-connected buck-boost-type switching circuits for extracting power from electric power sources, according to an embodiment.

Such potential problems with disparate power production in parallel strings of buck-type MPPT converters can be at least partially alleviated by replacing buck-type MPPT converters with MPPT converters having a buck-boost-type topology. For example, FIG. 48 shows an electric power system 4800, including two strings 4802, 4804 electrically coupled in parallel. System 4800 could be modified to include additional strings. String 4802 includes M electric power sources 4806, and string 4804 includes N electric power sources 4808. M and N are each integers greater than one, and M and N may or may not be the same.

A respective switching circuit 4810, 4812 is electrically coupled to each electric power source 4806, 4808. Each switching circuit 4810, 4812 has a buck-boost-type topology, such that its output voltage Vout is inverted in polarity, and can have magnitude greater than, equal to, or less than its input voltage Vin. Each switching circuit 4810, 4812 includes a controller 4814 that controls a switching device 4816 so that power extracted from each electric power source 4806, 4808 is at least substantially maximized. Each switching circuit further includes an input capacitor 4818, an inductor 4820, a diode 4822 (which could be replaced by another switching device to increase efficiency), and an output capacitor 4824. The output of strings 4802, 4804 power a load, such as an inverter. The fact that each switching circuit 4810, 4812 has a respective output capacitor 4824 may be advantageous in the case where the load is an inverter, as output capacitors 4824 may reduce the need for failure prone inverter input capacitance. In particular, inverters typically have high voltage, failure prone electrolytic input capacitors, which could be at least partially replaced by switching circuit output capacitors 4824, which in some embodiments, are relatively low voltage, high reliability ceramic capacitors.

In some embodiments, switching frequency of switching circuits 4810, 4812 is loosely controlled so that switching frequency is effectively randomized among many instances of switching circuits 4810, 4812, thereby helping to reduce ripple. Furthermore, controller 4814 starting time is optionally loosely controlled to effectively randomize MPPT operating changes among many instances of switching circuits 4810, 4812, thereby helping to reduce magnitude of MPPT induced transients.

The buck-boost topology beneficially has an enhanced dynamic range compared to buck or boost topologies, such as the buck topology discussed above with respect to FIG. 57. For a given string current below the MPP current of the highest-performing cells, high-performing cells are boosted in voltage while low-performing cells are bucked in voltage. Such characteristics can help alleviate problems resulting from disparate power production by electric power sources 4806, 4808. For example, if electric power source 4806(1) drops in output power, string current Istring1 may be reduced and switching circuit 4810(1) may increase its voltage gain to compensate for such drop, so that Vstring1 remains steady. Thus, string voltages can remain steady despite a change in electric power source 4806, 4808 output power, such that a change in power of one string does not affect operation of other parallel strings. Additionally, the fact that string voltages may be maintained at a desired level prevents the possibility that a string will need to be disconnected from system 4800 for having a voltage that is too low for a load powered by the strings.

Figure 58:
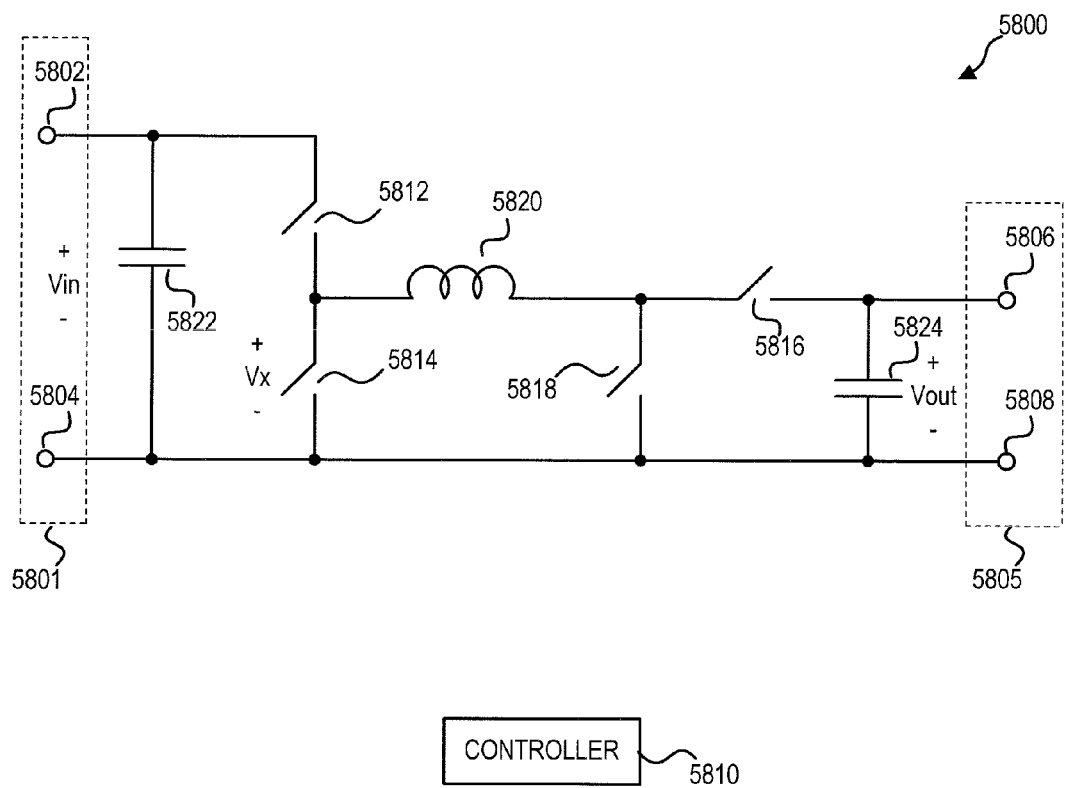
FIG. 58 shows a buck and boost MPPT converter, according to an embodiment.

Although the buck-boost-type MPPT converters of FIG. 48 advantageously have an increased dynamic range relative to buck-type MPPT converters, their switching devices require a relatively high voltage rating of at least the converter input voltage plus the converter output voltage. Additionally, buck-boost-type converters have both discontinuous input and output current waveforms, thereby requiring significant input and output capacitance to filter ripple current. Such potential disadvantages can be mitigated by replacing buck-boost-type MPPT converters with MPPT converters having a buck and boost topology, such as shown in FIG. 58. In particular, FIG. 58 shows a buck and boost type MPPT converter 5800 including an input port 5801 including input terminals 5802, 5804 for electrically coupling to a respective electric power source.

Converter 5800 further includes an output port 5805 including output terminals 5806, 5808 for electrically coupling to a load, such as through other MPPT converters in a string. A controller 5810 controls switching devices 5812, 5814, 5816, 5818 to at least substantially maximize an amount of electric power extracted from an electric power source electrically coupled to input terminals 5802, 5804. MPPT converter 5800 also includes an energy storage inductor 5820 and typically further includes input capacitance 5822 and output capacitance 5824.

MPPT converter 5800 can operate in either a buck mode or a boost mode such that an output voltage Vout may be greater than, equal to, or less than an input voltage Vin. Specifically, when Vout needs to be less than Vin, controller 5810 operates converter 5800 in the buck mode by controlling switching devices 5812, 5814 to regulate Vout while switching device 5816 is continuously closed and switching device 5818 is continuously open. In some embodiments, controller 5810 is operable to control switching to at least substantially maximize a voltage, such as output voltage Vout, or an average value of a switching node voltage Vx, while in buck mode. Conversely, when Vout needs to be greater than Vin, controller 5810 operates converter 5800 in the boost mode by controlling switching devices 5816, 5818 to regulate Vout while switching device 5812 is continuously closed and switching device 5814 is continuously open. In some embodiments, controller 5810 is operable to control switching to at least substantially maximize a current, such as average current flowing through switch 5816, while in boost mode.

In some embodiments, switching frequency of converter 5800 is loosely controlled so that switching frequency is effectively randomized among many instances of converter 5800, thereby helping to reduce ripple. Furthermore, controller 5810 starting time is optionally loosely controlled to effectively randomize MPPT operating changes among many instances of converter 5800, thereby helping to reduce magnitude of MPPT induced transients.

In contrast to the buck-boost-type converter, such as discussed above with respect to FIG. 48, switching devices 5812, 5814, 5816, 5818 need only have a voltage rating greater than the maximum of Vin and Vout, and Vout is not a polarity reversal of Vin. Furthermore, in contrast to the buck-boost-type converter, input current is continuous in the boost mode, and output current is continuous in the buck mode, in the buck and boost converter of FIG. 58. However, the current path through the buck and boost converter of FIG. 58 always runs through two series switches.

Buck-boost-type MPPT converters, such as discussed with respect to FIG. 48, and buck and boost type MPPT converters, such as discussed with respect to FIG. 58, each have the disadvantage of requiring a respective energy storage inductor. Thus, such MPPT converters cannot utilize string interconnection inductance as their energy storage inductors. In addition, both the buck-boost-type MPPT converters and buck and boost type MPPT converters have output voltage ranges determined by the device voltage stress limitations of 5812, 5814, 5816 and 5818. Thus, buck-boost-type and buck and boost type converters typically require over voltage protection (OVP) on their output ports to prevent converter damage from excessive output voltage magnitude. Furthermore, a string voltage may not be regulated to the required value if too many photovoltaic devices within the string are shaded. Under such conditions, similar drawbacks discussed above with respect to the buck-type MPPT converters apply. These disadvantages can be alleviated by using a string optimizer electrically coupled in series with a string of MPPT converters.

Figure 49:
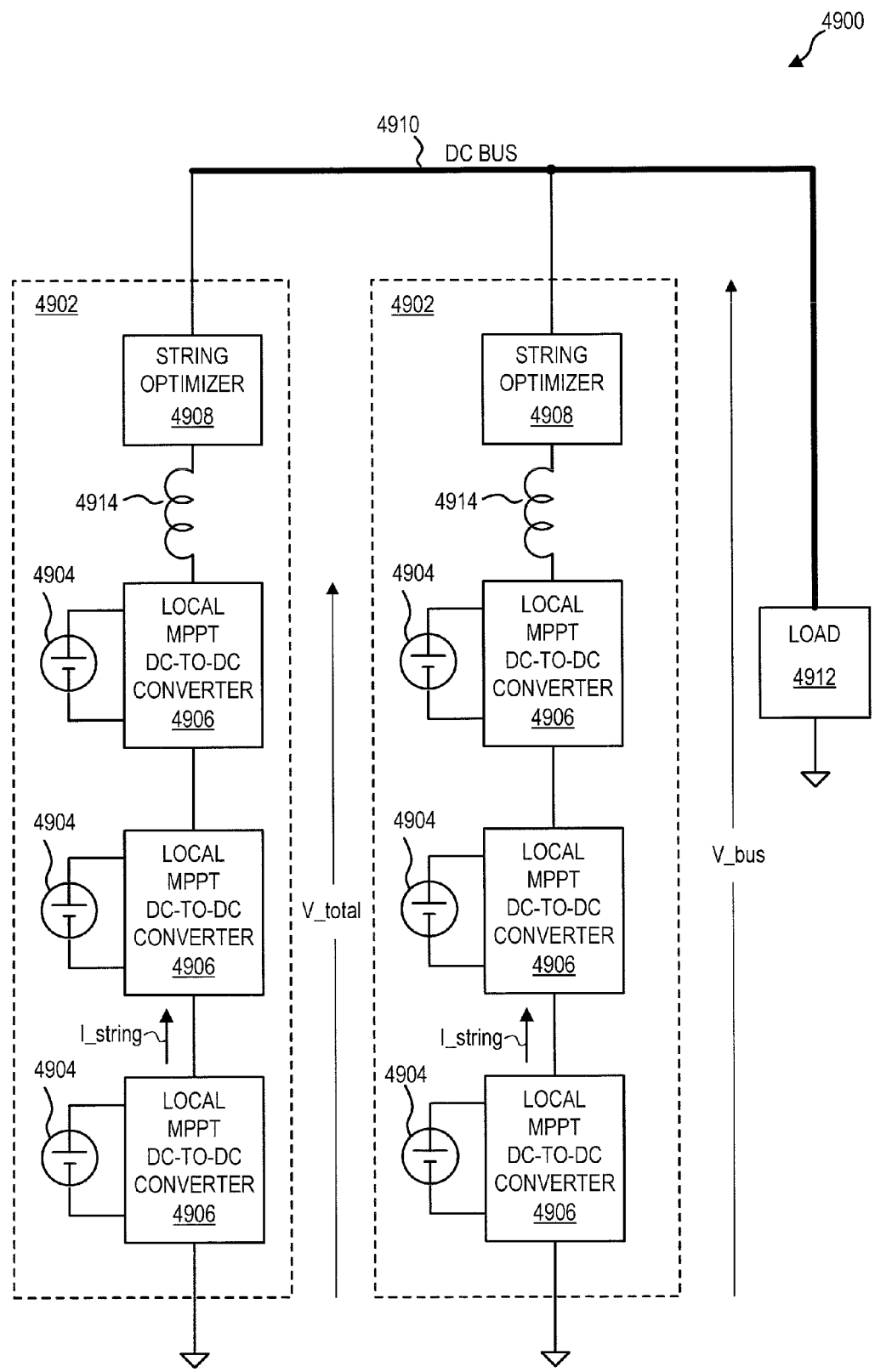
FIG. 49 shows one electric power system including string optimizers, according to an embodiment.

For example, FIG. 49 shows an electric power system 4900 including a number of strings 4902, each including one or more electric power sources 4904 (e.g., photovoltaic devices) and a respective local MPPT DC-to-DC converter 4906 electrically coupled to each electric power source 4904. DC-to-DC converters 4906, which are, for example, an embodiment of switching circuit 404 of FIG. 4, at least substantially maximize an amount of electric power extracted from their respective electric power sources 4904. The output of each DC-to-DC converter 4906 in a string 4902 is electrically coupled in series with a string optimizer 4908, which interfaces its string with a common DC bus 4910. DC bus 4910 is electrically coupled to a load 4912 which, for example, is an inverter. In certain alternate embodiments, each string optimizer 4908 is replaced by a respective inverter, and an output of each inverter is electrically coupled to a common AC power bus.

Although system 4900 is shown as including two strings 4902, system 4900 could include additional strings. Each string 4902 also need not necessarily have the same number of electric power sources 4904, and each electric power source 4904 need not necessarily be identical. For example, one electric power source 4904 could be a single photovoltaic cell, while another electric power source 4904 could be a group of series and/or parallel electrically coupled photovoltaic cells, such as a photovoltaic sub-module of a photovoltaic panel.

Each string optimizer 4908 converts the output voltage across all of its series connected DC-to-DC converters 4906 (V_total) to a voltage of common DC bus 4910 (V_bus). Thus, each string optimizer 4908 enables MPPT DC-to-DC converters 4906 of its string 4902 to operate at their optimal output voltages while nevertheless being coupled to common DC bus 4910. Accordingly, the use of string optimizers 4908 may offer one or more of the following advantages. First, because string optimizers 4908 interface DC-to-DC converters 4906 with DC bus 4910, DC-to-DC converters 4906 do not need to regulate string voltage and can therefore be relatively simple converters, such as buck-type converters. Second, DC bus 4910 voltage can be optimized for load 4912 and/or can be regulated to a high level to help reduce current magnitude in DC bus 4910. Third, in the case where load 4912 is an inverter, the fact that DC bus 4910 voltage may be regulated may allow inverter cost to be reduced and/or inverter efficiency to be increased. Additionally, the inverter need not include MPPT functionality as DC-to-DC converters 4906 perform MPPT. If inverter MPPT functionality is included, it may be reduced in complexity and increased in efficiency as global MPPT is no longer required. Fourth, use of string optimizers 4908 allows each string 4902 to independently deliver its maximum power to DC bus 4910 without being constrained by other strings. In contrast, in systems without string optimizers 4908, one string's operation may be constrained by operating characteristics of a parallel connected string. Fifth, use of string optimizers 4908 may enable certain embodiments of DC-to-DC converters 4906 to draw an essentially constant current from their respective electric power sources 4904, thereby promoting high performance in cases where electric power sources 4904 operate most efficiently when powering a DC load.

In some embodiments, load 4912 regulates bus voltage V_bus, and string optimizers 4908 control another system parameter. For example, some embodiments of string optimizer 4908 regulate string current I_string to interface their respective DC-to-DC converters with DC bus 4910. Maintaining a constant value of I_string may enable use of DC-to-DC converters 4906 that perform MPPT by maximizing converter output voltage or an average value of switching node voltage, such as discussed above with respect to FIG. 4. I_string is set, for example, to a constant value that is greater than the maximum expected short circuit current of any one photovoltaic cell or to a value that varies with irradiance, such as the short circuit current of a reference photovoltaic cell. As another example, certain other embodiments of string optimizer 4908 regulate a parameter such as I_string or V_total to achieve string-level MPPT. Such MPPT may be relatively simple because MPPT DC-to-DC converters 4906 typically have well behaved power transfer curves with only a single local maximum power point, thereby negating the need for global MPPT.

Each string optimizer 4908 is typically a switching DC-to-DC converter, such as a boost-type converter, that utilizes an inductance 4914 of the string. Although inductance 4914 is symbolically shown as a single inductor, inductance 4914 may include a number of discrete inductors and/or interconnection inductance of conductors (e.g., wires and/or bus bars) electrically coupling DC-to-DC converters 4906 and string optimizers 4908. In certain embodiments, inductance 4914 is shared by both string optimizer 4908 and DC-to-DC converters 4906 in a given string. In such embodiments, DC-to-DC converters 4906 advantageously need not have their own energy storage inductance. In some embodiments, the switching frequency of each string optimizer 4908 is loosely controlled so that its switching frequency is effectively randomized. As discussed above, randomization of switching frequency helps reduce ripple current magnitude. A reduction in ripple current magnitude may be particularly desirable in embodiments where load 4912 is an inverter, as such ripple current reduction may enable inverter input capacitance to be reduced. Additionally, in certain embodiments, two or more string optimizers 4908 are synchronized such that they switch out of phase to help reduce ripple on DC bus 4910.

Some embodiments of string optimizer 4908 include additional functionality, such as the ability to disconnect its respective string 4902 from DC bus 4910 in response to an external signal, such as for maintenance and/or safety purposes. Certain embodiments may also include over-current protection, reverse current blocking, and/or the ability to monitor characteristics of its respective string 4902 such as string temperature, string voltage, and/or string current.

Figure 50:
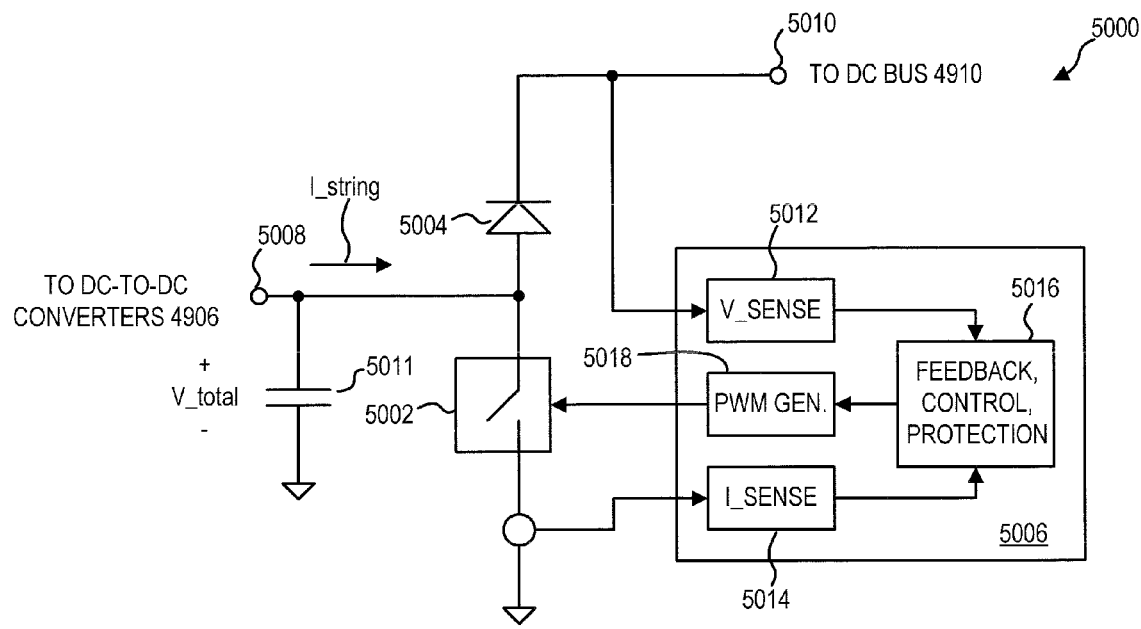
FIG. 50 shows one embodiment of the string optimizers of FIG. 49.

FIG. 50 shows a string optimizer 5000, which is an embodiment of string optimizer 4908. String optimizer 5000 has a boost-type topology and includes a switching device 5002, a diode 5004, and a controller 5006. In some embodiments, diode 5004 is replaced with or supplemented by another switching device. String optimizer 5000 further includes an input terminal 5008 for connecting to a string of DC-to-DC converters 4906. String optimizer 5000 utilizes inductance 4914 for its energy storage inductance, which as discussed above, may be one or more discrete inductors and/or interconnection inductance. String optimizer 5000 further includes an output terminal 5010 for connecting to DC bus 4910. Some embodiments also include input capacitance 5011.

Controller 5006 controls switching device 5002 to regulate voltage V_bus of DC bus 4910. In particular, controller 5006 includes a voltage sense section 5012 for sensing voltage of DC bus 4910 and an optional current sense section 5014 for sensing current processed by string optimizer 5000. In some embodiments, current sense section 5014 senses current by sensing a voltage across switching device 5002 when the switching device is conducting current. Feedback, control, and protection section 5016 controls a PWM generator 5018 in response to signals from voltage sense section 5012 and current sense section 5014. PWM generator 5018, in turn, drives switching device 5002 to regulate voltage on DC bus 4910. In some alternate embodiments, controller 5006 is modified to operate switching device 5002 to regulate a parameter other than output voltage V_bus, such as input current I_string, or input voltage V_total.

In some embodiments, string optimizer 5000 operates in continuous conduction mode to reduce magnitude of input ripple current. In such embodiments, input capacitance 5011 may not be needed. Certain embodiments are adapted to change operating modes as a function of string current magnitude. For example, in one embodiment, string optimizer 5000 operates in continuous conduction mode at large values of string current magnitude and in discontinuous conduction mode at small values of string current magnitude, to promote high efficiency over a wide range of string current magnitude. Hysteresis may be used to prevent oscillation between continuous and discontinuous conduction modes. Continuous conduction mode operation is typically more efficient than discontinuous conduction mode operation at large values of string current magnitude, and the opposite is typically true at small values of string current magnitude. For example, use of a SiC diode, a GaN diode, or a fast recovery diode as diode 5004 promotes high efficiency continuous conduction mode operation. Similarly, supplementing diode 5004 with a switching device operating as a synchronous rectifier with an adaptive or another well-controlled dead-time scheme may minimize or even avoid diode 5004 reverse recovery losses, thereby promoting high efficiency continuous conduction mode operation.

Figure 51:
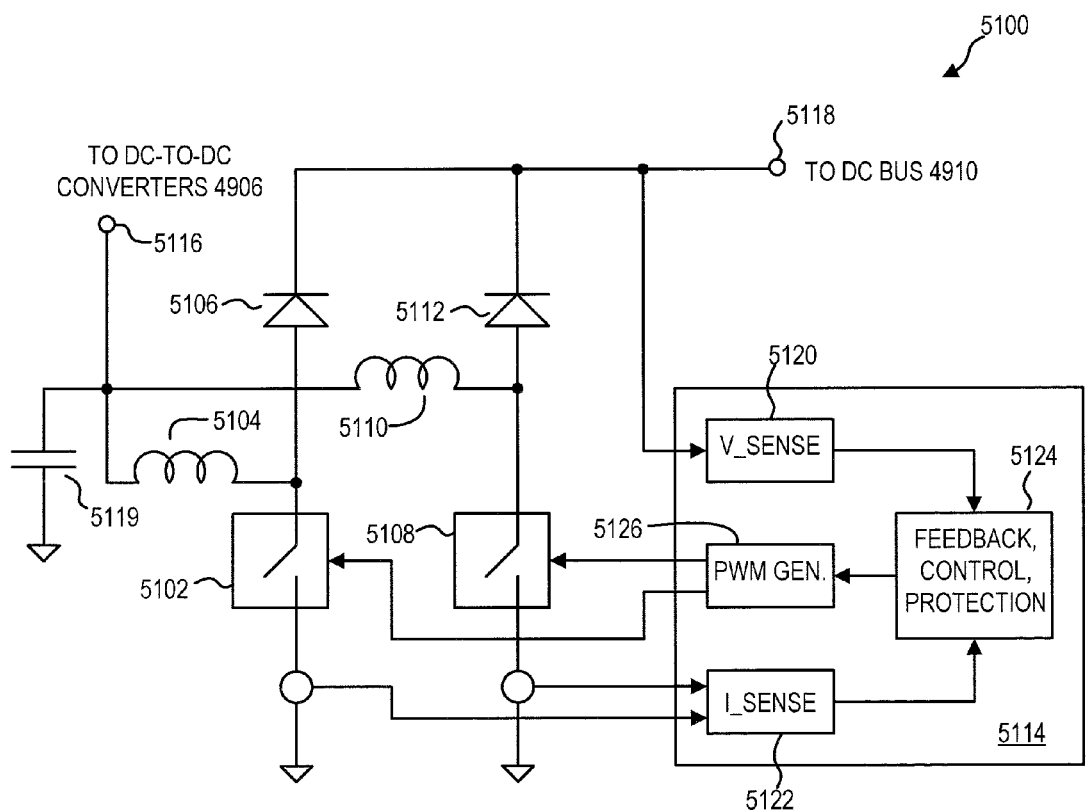
FIG. 51 shows another embodiment of the string optimizers of FIG. 49.

FIG. 51 shows a string optimizer 5100, which is another embodiment of string optimizer 4908. String optimizer 5100 is similar to string optimizer 5000 (FIG. 50), but string optimizer 5100 includes two power stages that operate out of phase to help reduce ripple on DC bus 4910. In particular, string optimizer 5100 includes a first power stage including a switching device 5102, an inductor 5104, and a diode 5106, as well as a second power stage including a switching device 5108, an inductor 5110, and a diode 5112. A controller 5114 controls switching devices 5102, 5108 such that they operate out of phase to regulate voltage on DC bus 4910. For example, in certain embodiments, switching transitions of switching devices 5102, 5108 are displaced in phase by 180 degrees from each other to reduce ripple on DC bus 4910, as well as to reduce input current ripple, thereby possibly reducing or eliminating the need for input capacitance 5119 and/or output capacitance (not shown). String optimizer 5100 electrically couples to DC-to-DC converters 4906 of its respective string via input terminal 5116, and string optimizer 5100 electrically couples to DC bus 4910 via output terminal 5118. String optimizer 5110 optionally includes input capacitance 5119. Similar to controller 5006 of FIG. 50, controller 5114 includes a voltage sense section 5120, an optional current sense section 5122, a feedback, control, and protection section 5124, and a PWM generator 5126. Although a single controller 5114 controls both power stages in the FIG. 51 embodiment, each power stage is controlled by a separate controller in certain alternate embodiments. Additionally, controller 5114 could be modified to regulate a different parameter, such as input voltage or input current, instead of voltage V_bus on DC bus 4910.

In some embodiments, inductor windings 5104 and 5110 are magnetically coupled by a common magnetic core as taught in U.S. Pat. No. 6,362,986 to Schultz et al., which is incorporated herein by reference, so as to reduce ripple current. In alternate embodiments, string optimizer 5100 is modified so that each power stage connects to a different string 4902 (i.e., inductor 5104 connects to a first string and inductor 5110 connects to a second string), and string optimizer 5100 serve as a string optimizer for two different strings 4902.

Some alternate embodiments of string optimizer 5100 are multi-phase converters including three or more power stages, where some or all of the power stages operate out of phase, and some or all of the inductors are optionally magnetically coupled. For example, one particular alternate embodiment includes four power stages, where each power stage serves as a string optimizer for a respective string. As another example, another particular alternate embodiment includes four power stages, where a first and a second of the power stages serve as string optimizers for a first string, and a third and a fourth of the power stages serve as string optimizers for a second string.

Figure 59:
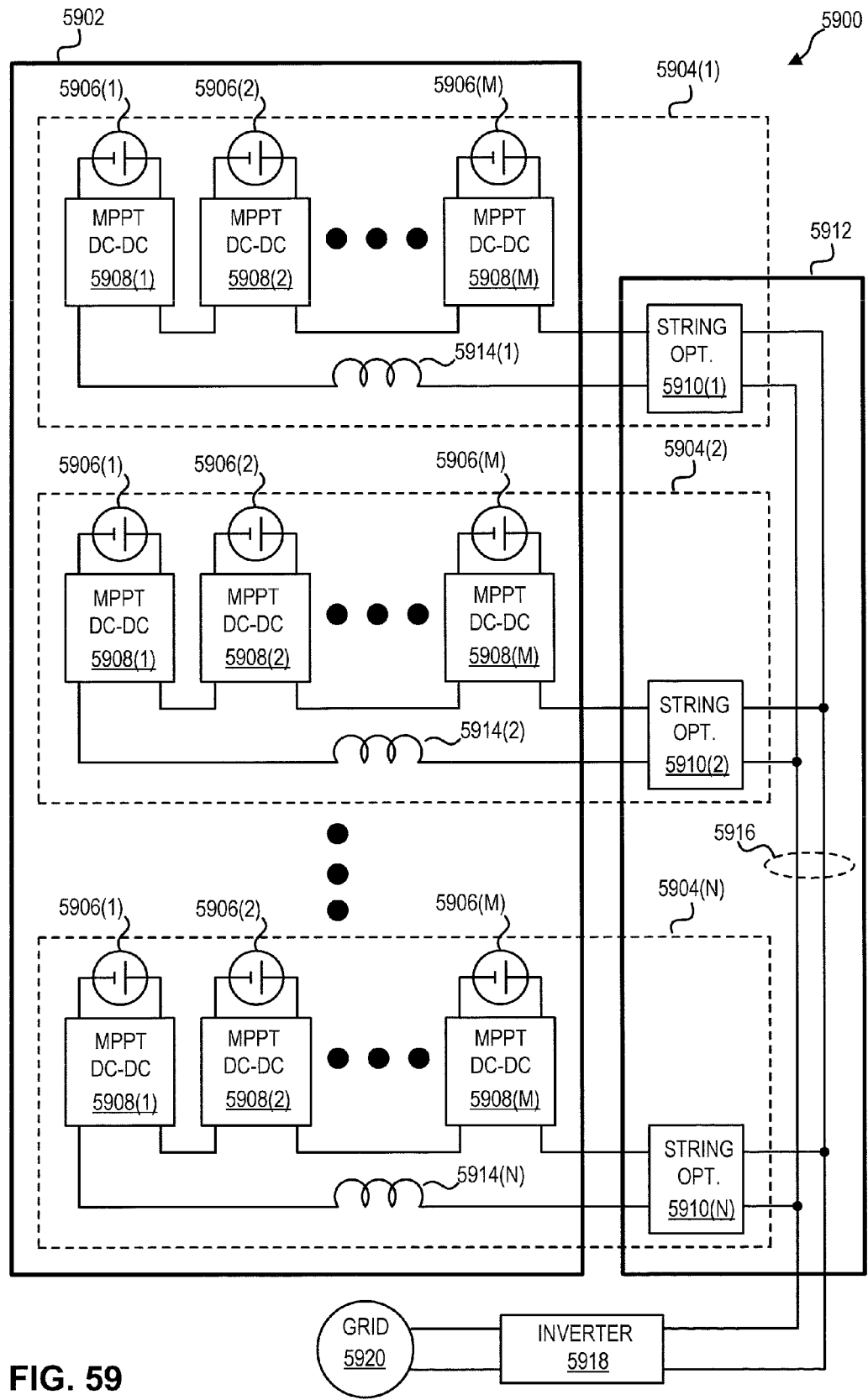
FIG. 59 shows a photovoltaic system including string optimizers, according to an embodiment.

FIG. 59 shows another possible application of string optimizers in a photovoltaic system. Specifically, FIG. 59 shows a photovoltaic system 5900 including an assembly 5902 of N strings 5904, each string 5904 having M photovoltaic devices 5906, where N and M are each integers greater than one. In certain embodiments, photovoltaic devices 5906 are part of one or more photovoltaic panels. Assembly 5902 is, for example, housed on a single tracking device that tracks movement of the sun so that photovoltaic devices 5906 are pointed toward the sun. In some embodiments, photovoltaic devices 5906 are one or more single or multi-junction photovoltaic cells with light concentrating optics. Although each string 5904 is shown as having the same number and type of photovoltaic devices 5906, the number of photovoltaic devices 5906 may vary among strings 5904, and each photovoltaic device 5906 need not necessarily have the same configuration.

Each photovoltaic device 5906 of a given string 5904 is electrically coupled to a respective local MPPT DC-to-DC converter 5908. In some embodiments, DC-to-DC converters 5908 are switching circuits 404 (FIG. 4). Outputs of DC-to-DC converters 5908 of a given string 5904 are electrically coupled in series with a string optimizer 5910, where string optimizers 5910 are similar to string optimizers 4908 of FIG. 49. In some embodiments, string optimizers 5910 are single phase boost topology string optimizers, such as string optimizers 5000 (FIG. 50). In some other embodiments, string optimizers 5910 are multi-phase boost topology string optimizers with or without magnetic coupling of energy storage inductors, such as string optimizers 5100 (FIG. 51). String optimizers 5910 are typically housed in a common enclosure 5912 disposed at or near assembly 5902, and some or all of string optimizers 5910 may even be part of a common integrated circuit chip (not shown). In embodiments where assembly 5902 is housed on a tracking device, enclosure 5912 is typically disposed near, but not on, the tracking device, such as on a pole or foundation, to minimize weight on the tracking device. String optimizers 5910 are optionally controlled by a common controller (not shown), and string optimizers 5910 operate out of phase with each other in certain embodiments to reduce ripple on DC bus 5916. In some embodiments, each local MPPT DC-to-DC converter 5908 and each string optimizer 5910 of a given string 5904 share a common energy storage inductance 5914, which in some embodiments, consists partially or completely of string interconnection inductance. String optimizers 5910 optionally include MPPT capability.

Outputs of string optimizers 5910 collectively feed a common high voltage DC bus 5916. High voltage DC bus 5916 feeds an inverter 5918, which provides power to a load, such as an AC power grid 5920. Inverter 5918 need not necessarily have MPPT capability since DC-to-DC converters 5908, and optionally string optimizers 5910, have MPPT capability. In some embodiments, DC bus 5916 is maintained at an essentially fixed voltage level, thereby simplifying the inverter's construction. In some alternate embodiments, string optimizers 5910 are combined with inverter 5918 in a single enclosure, or even in a single integrated circuit chip. System 5900 could be modified to include a number of assemblies 5902 each including a number of strings 5904, where each string includes a respective string optimizer 5910. In such embodiments, string optimizers 5910 for a given assembly 5902 will typically be disposed close to the assembly, such as in an enclosure 5912 associated with the assembly.

Figure 60:
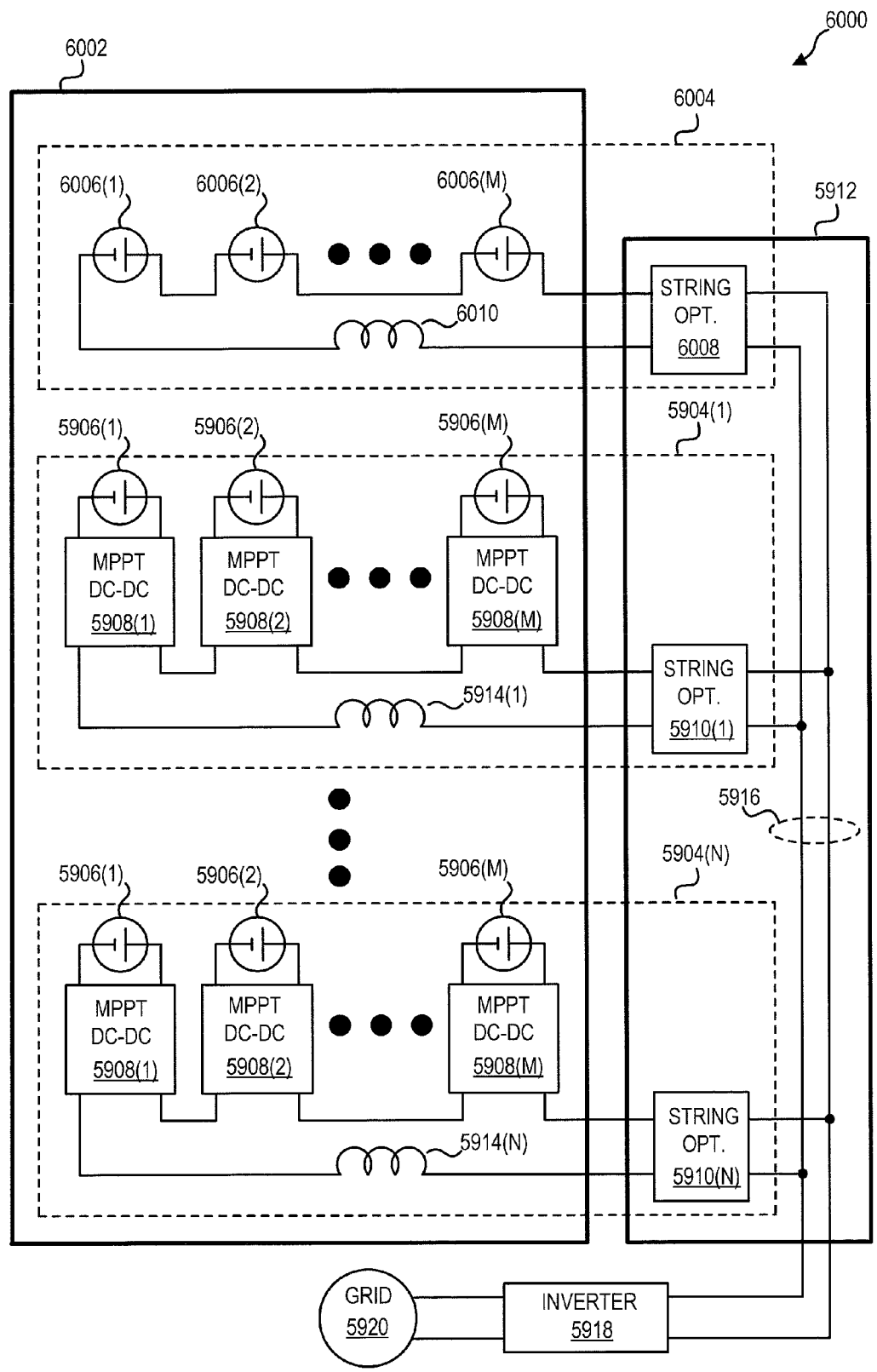
FIG. 60 shows another photovoltaic system similar to that of FIG. 59 but including one or more strings without local MPPT DC-to-DC converters, according to an embodiment.

FIG. 60 shows a photovoltaic system 6000, which is similar to system 5900, but includes an assembly 6002 having at least some strings without local MPPT DC-to-DC converters, such as for use in applications where local MPPT is not needed for all strings. Assembly 6002 includes both strings 5904 with local MPPT DC-to-DC converters and strings 6004 without local MPPT DC-to-DC converters. Photovoltaic devices 6006 in each string 6004 are electrically coupled to a string optimizer 6008, which typically has MPPT capability. Some embodiments include inductance 6010 for use by string optimizers 6008 for energy storage inductance, and inductance 6010 optionally consists partially or entirely of string interconnection inductance. In some alternate embodiments, photovoltaic devices 6006 of a given string 6004 connect directly to DC bus 5916 without use of a string optimizer 6008. Although system 6000 is shown with only a single string 6004 for simplicity, other embodiments include additional strings 6004. Additionally, the number of strings 5904 can be varied, and some alternate embodiments of system 6000 do not include any strings 5904.

Some embodiments of the switching circuits and/or the string optimizers disclosed herein are operable to communicate with other system components. For example, some embodiments of string optimizer 4908 are operable to transmit to some or all of DC-to-DC converters 4906 information such as commands to start-up, shut down, and/or enter a bypass mode. It may be desirable to shut down DC-to-DC converters 4906, or have them enter their bypass modes, to promote safety in the event of an emergency such as a fire, or to de-energize one or more strings 4902 to facilitate maintenance or string installation. It may similarly be desirable for DC-to-DC converters to nominally be shut-down or in bypass mode such that all system voltages are maintained below some safety level, unless otherwise commanded.

As another example, certain embodiments of the switching circuits disclosed herein are operable to communicate with other switching circuits and/or with a string optimizer to exchange information such as status information, fault information, and/or operating mode commands. For example, some embodiments of local DC-to-DC converters 4906 (FIG. 49) are operable to transmit to another DC-to-DC converter 4906 and/or to a string optimizer 4908 status and/or fault information. Examples of such fault and status information include, but are not limited to, converter input voltage, converter output voltage, converter input current, converter output current, converter input power, converter output power, converter component temperature, electric power source 4904 temperature and/or converter fault information. In some embodiments, a string optimizer 4908 receiving a fault signal from a DC-to-DC converter 4906 responds to the signal by taking an action such as disconnecting its string from DC Bus 4910 and/or instructing DC-to-DC converters 4906 of the string 4902 to shut down or enter their bypass modes.

Communication signals between switching circuits and other devices optionally include information identifying the transmitting device and/or the intended recipient device. For example, a fault signal generated by a switching circuit may include a code identifying the switching circuit. As another example, a command from a string optimizer to shut down several switching circuits may include codes identifying the intended recipient switching circuits.

One possible method of transmitting information between devices is to modulate current flowing through the string. For example, some embodiments of switching circuit 404 (FIG. 4) are operable to modulate current flowing through output port 408 to generate a communication signal on the current and thereby transfer information to another component, such as to another switching circuit or to a string optimizer. As another example, some embodiments of string optimizer 5000 (FIG. 50) are operable to control switching device 5002 to generate a communication signal on string current I_string and thereby transmit information to local DC-to-DC converters 4906. Certain embodiments of the switching circuits and string optimizers disclosed herein, in turn, are operable to demodulate or decode a communication signal on current flowing therethrough and thereby receive information from an external device. For example, some embodiments of DC-to-DC converters 4906 are operable to decode or demodulate a communication signal on string current I_string and thereby receive commands from a string optimizer 4908 or another device.

Other methods of communicating between devices such as string optimizers and switching circuits are possible. For example, in some alternate embodiments of system 4900, DC-to-DC converters 4906, and optionally, string optimizers 4908, are communicatively coupled in a daisy chain fashion. In still other alternate embodiments, DC-to-DC converters 4906, and optionally, string optimizers 4908, communicate via a single bus, which is electrically isolated from some or all of the DC-to-DC converters. Electrical isolation is achieved, for example, by use of capacitive, optical, or magnetic isolating devices. Other possible communication methods include, but are not limited to, optical and wireless communication methods.

Figure 22:
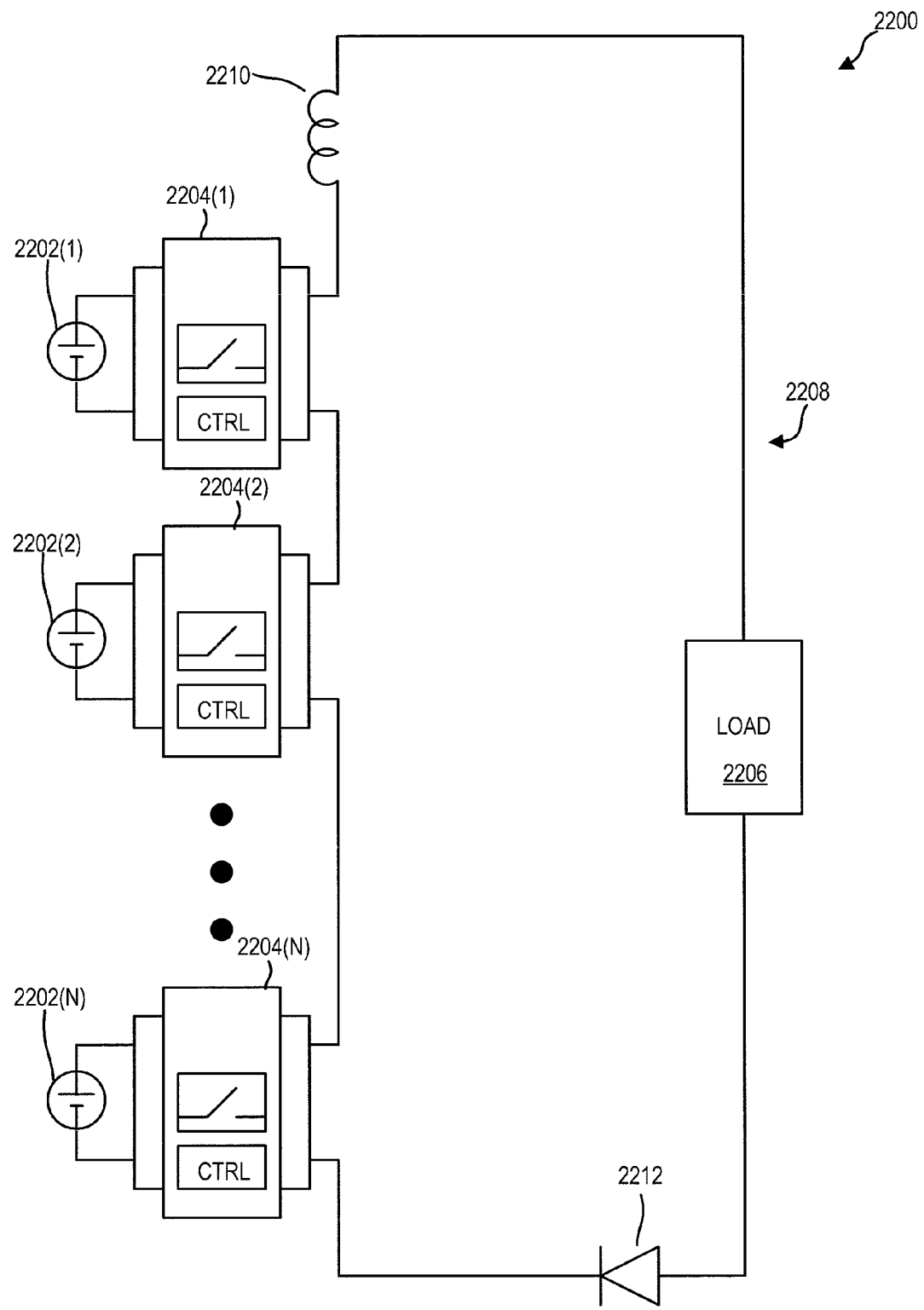
FIG. 22 shows an electric power system including a diode and switching circuits for extracting power from electric power sources, according to an embodiment.

In certain embodiments of the switching circuits disclosed herein, there is a danger of damage to the switching circuit and/or an electric power source (e.g., photovoltaic device) coupled thereto if current were to flow though the switching circuits' output ports in a direction opposite of normal current flow. To prevent such dangers, switching devices can be configured such that current can flow through their output ports in only a single direction, such that the switching devices emulate a diode. For example, in certain embodiments of switching circuits 504, 604 (FIGS. 5 and 6, respectively), controllers 536, 638 are configured to respectively control switching devices 534, 634 such that output current flows through output ports 508, 620 in only one direction. Alternately or in addition, a diode can be inserted in series with a switching circuit's output port to prevent reverse current flow. When a number of switching circuits are interconnected such that their output ports are electrically coupled in series to form a string, a single diode can be used anywhere in the series string to prevent reverse current flow. For example, FIG. 22 shows an embodiment of electric power system 2200, which is similar to electric power system 400 of FIG. 4. System 2200 includes N electric power sources 2202, such as photovoltaic devices or photovoltaic panels including multiple photovoltaic devices, where N is an integer greater than one. A respective switching circuit 2204, which is an embodiment of switching circuits 404 of FIG. 4, is electrically coupled to each electric power source. The output ports of switching circuits 2204 are electrically coupled in series to a load 2206 to form a closed circuit, hereinafter referred to as output circuit 2208, which typically includes an inductance 2210. Although inductance 2210 is symbolically shown as a single inductor, inductance 2210 could include a number of discrete inductors and/or interconnection inductance of output circuit 2208. Output circuit 2208 also includes a single diode 2212 to prevent reverse current flow through the output ports of switching circuits 2204.

Figure 23:
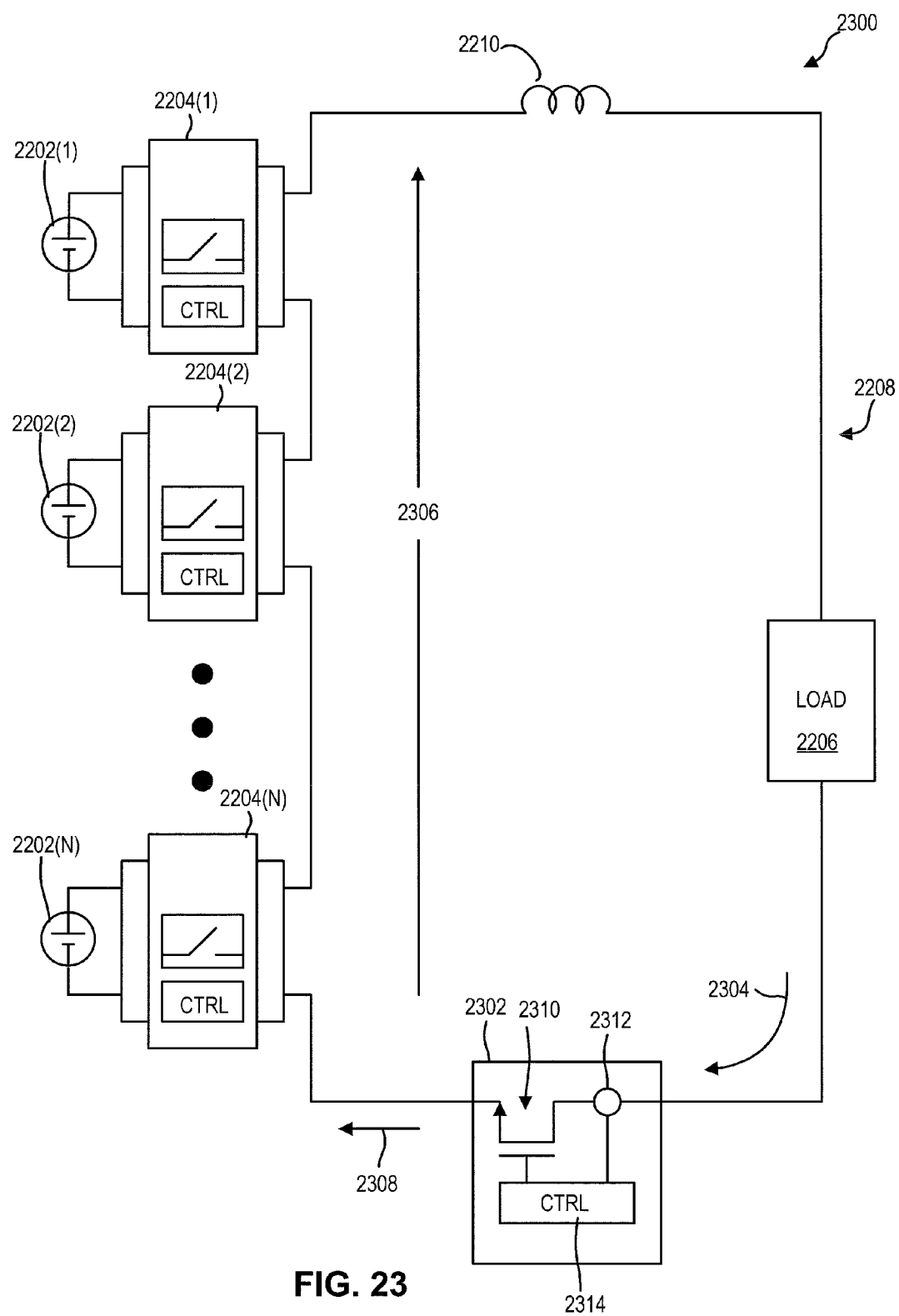
FIG. 23 shows an electric power system including a system control device and switching circuits for extracting power from electric power sources, according to an embodiment.

A system control device can be used as an alternative to a diode to prevent reverse current flow. For example, FIG. 23 shows an electric power system 2300, which is the same as electric power system 2200 (FIG. 22), but with diode 2212 replaced with a system control device 2302. System control device 2302, which is electrically coupled in series with output circuit 2208, is operable to emulate a diode, or in other words, restrict the flow of current to the direction indicted by arrow 2304. However, system control device 2302 typically includes one or more additional features, such as (1) the ability to act as a switch and open output circuit 2208 upon demand, (2) provide short circuit protection, and/or (3) report the status of one or more aspects of electric power system 2300. For example, in the case electric power sources 2202 are photovoltaic devices of a photovoltaic module, an embodiment of system control device 2302 might be configured to report information such as temperature of the photovoltaic module, module output voltage (e.g., a voltage 2306 across the series-connected output ports of switching circuits 2204), and or magnitude of a current 2308 through the module). Additionally, in a manner similar to that discussed above with respect to the string optimizers, some embodiments of system control device 2302 are operable to communicate with switching circuits 2204, such as to command switching circuits 2204 to start up, shut down, or enter their bypass modes, and/or to receive status or fault information from switching circuits 2204.

System control device 2302 can include a switchable device 2310, such as a transistor, a current measuring subsystem 2312 configured to measure current 2308, and a control subsystem 2314. Control subsystem 2314 controls operation of switchable device 2310 at least in part based on information from current measuring subsystem 2312. For example, control subsystem 2314 uses current flow information from current measuring subsystem 2312 to cause switchable device 2310 to emulate a diode, thereby blocking reverse current flow.

Figure 24:
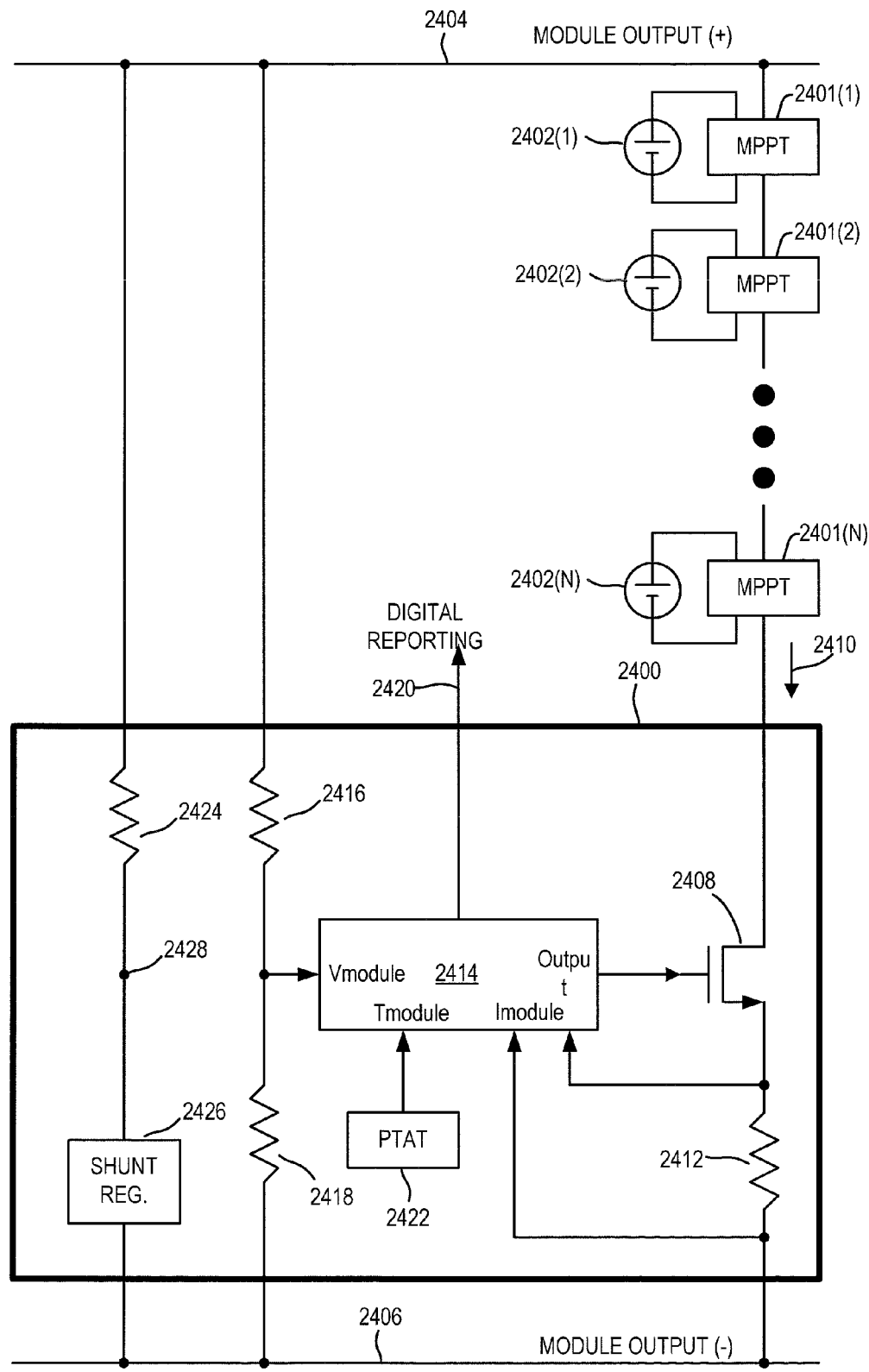
FIG. 24 shows one system control device, according to an embodiment.

FIG. 24 shows system control device 2400, which is one embodiment of system control device 2302, in a photovoltaic module application. System control device 2400 is electrically coupled in series with a string of N MPPT devices 2401 (e.g., switching circuits 404), where N is an integer greater than one. Each MPPT device 2401 is electrically coupled to a respective photovoltaic device 2402. MPPT devices 2401 and photovoltaic devices 2402 form a photovoltaic module having a positive output 2404 and a negative output 2406. In alternate embodiments, MPPT devices 2401 are omitted from the photovoltaic module, and photovoltaic devices 2402 are directly electrically coupled in series with system control device 2400.

System control device 2400 includes a transistor 2408 for limiting current 2410 through the string and a current measuring subsystem 2412 for measuring current 2410. Current measurement subsystem 2412, for example, is a current sense resistor as shown in FIG. 24. However, in alternate embodiments, current measuring subsystem 2412 achieves higher efficiency by measuring current without use of dissipative devices, such by using systems and methods disclosed in U.S. Pat. Nos. 6,160,441 and 6,445,244 to Stratakos et al., each of which is incorporated herein by reference. For example, in some embodiments, current measuring subsystem 2412 measures current 2410 by sensing a voltage across transistor 2408.

System control device 2400 further includes a control subsystem 2414 which controls operation of transistor 2408 based at least partially on information from current measuring subsystem 2412. For example, control subsystem 2414 controls transistor 2408 to emulate a diode based on information from current measuring subsystem 2412, thereby blocking reverse current flow. As another example, in certain embodiments, system control device 2400 acts as a circuit breaker where controller 2414 causes transistor 2408 to prevent flow of current 2410 if the current's magnitude exceeds a predetermined value, such as due to a short circuit. In some embodiments, system control device 2400 is further operable to act as a switch where controller 2414 causes transistor 2408 to prevent the flow of current 2410 in response to a signal to open the switch. Such feature advantageously promotes safety by enabling the string to effectively be turned off during maintenance procedures and/or during emergency situations. Prior photovoltaic panels, in contrast, typically cannot be turned off, and therefore will undesirably continue to provide power during an emergency situation such as a fire or a short in a system connected to the panel.

Certain embodiments of system control device 2400 are operable to monitor and report module voltage, where module voltage is the voltage between positive and negative outputs 2404, 2406. For example, one embodiment includes a voltage divider of resistors 2416, 2418 to reduce module voltage to a level suitable for input to controller 2414. Controller 2414, for example, reports the module voltage to an external system via a digital reporting output 2420 or via serial communication over a dedicated serial bus (not shown). Digital reporting output 2420 communicates with an external system by methods such as wireless communication, power line communication, or modulating transistor 2408 to generate a small communication signal on current 2410. Controller 2414, for example, is also configured to report module current magnitude to an external system via digital reporting output 2420 or via serial communication over a dedicated serial bus (not shown).

Some embodiments of system control device 2400 are operable to report module temperature to an external system via digital reporting 2420. Such embodiments include a temperature sensor 2422, such as a sensor that provides a signal proportional to absolute temperature (PTAT), which provides temperature information to controller 2414. Such PTAT device, for example, is integrated on a common integrated circuit chip with controller 2414. Alternately, temperature sensor 2422 is external to controller 2414 or even external to system control device 2400.

System control device 2400 typically includes a power supply to power its circuitry. In the embodiment of FIG. 24, system control device 2400 includes a linear regulator powered from panel outputs 2404, 2406. Specifically, the linear regulator includes a dropping resistor 2424 and a shunt regulator 2426 to regulate current through resistor 2424 and thereby regulate a voltage between node 2428 and module output 2406.

In some embodiments, transistor 2408 is integrated in a common integrated circuit chip with controller 2414. However, it is anticipated that in many embodiments transistor 2408 will be a discrete device to provide flexibility in selecting transistor 2408 to achieve a desired voltage rating and to eliminate potential issues with heat generated by transistor 2408 negatively affecting controller 2414.

Some embodiments of the switching circuits discussed above are formed of a number of discrete parts. However, in certain embodiments of the switching circuits, a number of the switching circuit components are integrated into a single integrated circuit package or on a single integrated circuit. Such integration, for example, reduces switching circuit size, reduces switching circuit cost, and/or improves switching circuit performance by reducing parasitic impedance of connections between components. It should be noted that the fact that some embodiments of the switching circuits disclosed herein do not include an explicit energy storage inductor and/or an output capacitor facilitates such integration.

Figure 25:
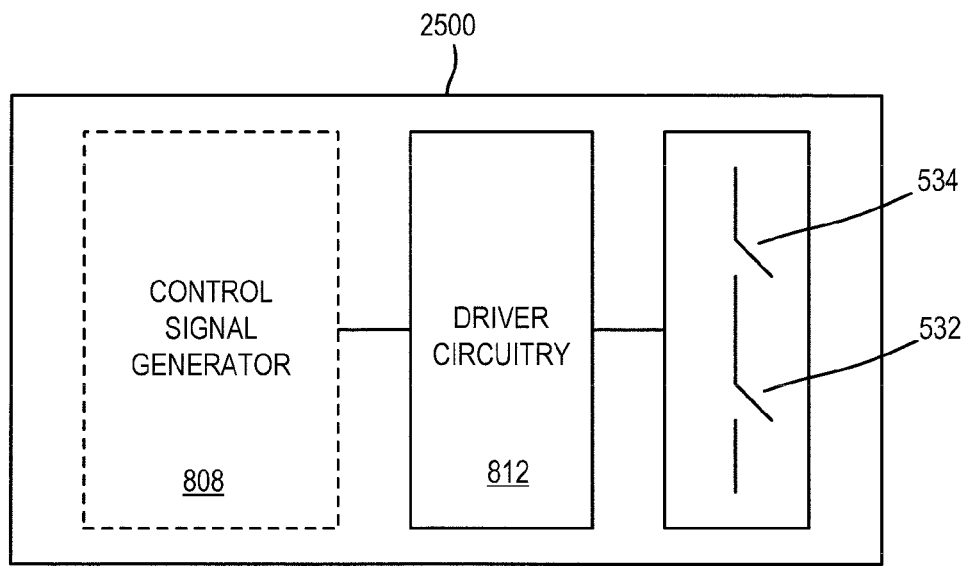
FIG. 25 shows one integrated circuit chip, according to an embodiment.

For example, FIG. 25 shows one integrated circuit chip 2500, which includes at least some components to form an embodiment of switching circuit 500 (FIG. 5) using controller 800 (FIG. 8). Specifically, first and second switching devices 532, 534, as well as driver circuitry 812, are integrated into integrated circuit chip 2500. Control signal generator 808 is optionally also integrated into integrated circuit 2500 such that the entire switching circuit is embodied in a single integrated circuit chip. The other switching circuits discussed above could also be integrated in a similar manner.

In certain embodiments including control signal generator 808, control signal generator 808 monitors Vy internal to integrated circuit chip 2500. Thus, in such embodiments, it is not necessary for integrated circuit chip 2500 to include a feedback interface terminal, and integrated circuit chip 2500 can have as few as three interface terminals, thereby promoting low cost and small package size.

Figure 26:
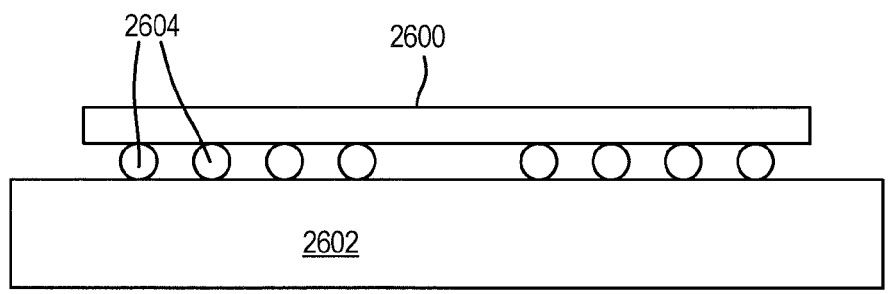
FIG. 26 shows one flip chip integrated circuit, according to an embodiment.

Some embodiments of integrated circuit chip 2500 are a flip chip integrated circuit. As known in the art, in a flip chip integrated circuit, pads on the chip are directly connected to corresponding pads on an adjacent interposer via solder balls. Such configuration typically results in a lower impedance connection between the chip and an adjacent interposer than configurations using bond wires for connectors. Examples of flip chip integrated circuits may be found in U.S. Pat. Nos. 6,278,264 and 6,462,522 to Burstein et al., each of which is incorporated herein by reference. FIG. 26 shows a flip chip integrated circuit 2600, which is an embodiment of flip chip integrated circuit 2500 of FIG. 25. Flip chip integrated circuit 2600 includes, for example, first and second switching devices 532, 534 (not shown) and driver circuitry 812 (not shown). Flip chip integrated circuit 2600 is electrically coupled to an interposer 2602, such as a printed circuit board (PCB), by solder balls 2604, only some of which are labeled for illustrative clarity. Although solder balls 2604 also physically couple integrated circuit chip 2600 to interposer 2602, an underfill material (not shown) may also be disposed between chip 2600 and interposer 2602 to provide stronger mechanical coupling. It should be appreciated that integrated circuit 2500 can be implemented in forms other than a flip chip integrated circuit, such as in the form of an integrated circuit including wire bond connections.

A number of the switching circuits disclosed above may also be integrated into a single integrated circuit chip. For example, two or three of switching circuits 404 (FIG. 4) or switching circuits 1804 (FIG. 18) can be integrated into a single integrated circuit chip. A chip including three switching circuits, for example, could be used to provide single chip MPPT for a three photovoltaic device module. As another example, a chip including two switching circuits could be used to provide single chip junction level MPPT for a two junction photovoltaic cell.

Such chips with multiple switching circuits may offer advantages over a number of discrete switching circuits. A chip with a number of switching circuits will typically occupy less space than a corresponding number of separate switching circuits, thereby reducing system size, reducing system cost, and/or freeing up space for other components, relative to a system with multiple discrete switching circuits. A system including a chip with a number of switching circuits will also typically be easier, faster, and/or cheaper to assemble than a system with a corresponding number of discrete switching circuits. Integrating a number of switching circuits into an integrated circuit chip also typically results in switching circuit components being located closer together than with multiple discrete switching circuits. Placing components closer together advantageously generally reduces impedance of component interconnections, thereby improving system efficiency and/or performance.

Figure 27:
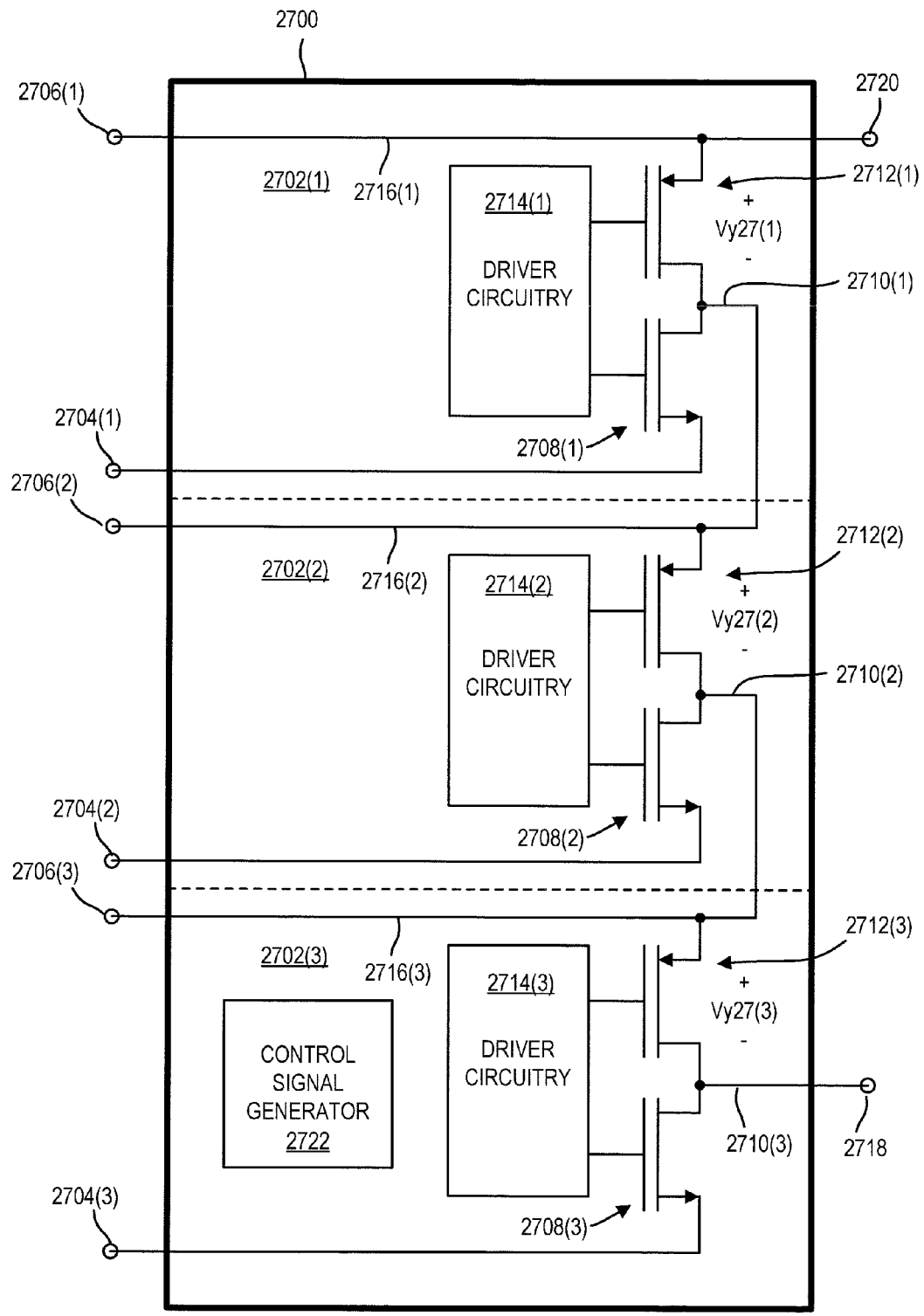
FIG. 27 shows one integrated circuit chip including a number of buck-type switching circuits, according to an embodiment.

FIG. 27 shows one example where multiple switching circuits are integrated in a single integrated circuit chip. Specifically, FIG. 27 shows one integrated circuit chip 2700 (e.g., a flip chip integrated circuit) including three switching circuits 2702, each of which is an embodiment of switching circuit 504 (FIG. 5) and are delineated by dashed lines in FIG. 27. Although integrated circuit chip 2700 is shown including three switching circuit circuits 2702, chip 2700 could include any number of switching circuits 2702 greater than one. Additionally, it should be appreciated that one or more of the other switching circuits, such as switching circuits 604 of FIG. 6, could be integrated in a single integrated chip in a similar manner.

Each switching circuit 2702 includes respective first and second input terminals 2704, 2706 for connecting to a respective electric power source (e.g., a photovoltaic device). A first switching device 2708 (analogous to first switching device 532) is electrically coupled between first input terminal 2704 and an intermediate switching node 2710, and a second switching device 2712 (analogous to second switching device 534) is electrically coupled between intermediate switching node 2710 and second input terminal 2706. In the embodiment of FIG. 27, first switching device 2708 is an n-channel MOSFET, and each second switching device 2712 is a p-channel MOSFET. In alternate embodiments, some or all of first and second switching devices 2708, 2712 are n-channel LDMOS devices or other types of transistors. Each switching circuit 2702 further includes driver circuitry 2714 (analogous to driver circuitry 812) for driving first and second switching devices 2708, 2712. Successive switching circuits 2702 are electrically coupled by a connection between a positive input node 2716 of one switching circuit 2702 to an intermediate switching node 2710 of the next switching circuit 2702. The connection is made, for example, entirely in chip metal or in a relatively conductive redistribution layer of the chip to reduce external interconnections. For example, in some embodiments, one or more connections are at least partially implemented in an under-bump-metallization (UBM) stack formed over a semiconductor substrate. Some examples of UBM stacks and associated methods are disclosed in U.S. Pat. No. 7,989,953 to Jergovic et al., which is incorporated herein by reference. As another example, the connection is made through solder balls and high conductivity conductors of an underlying interposer, such as a substrate or lead frame, to reduce overall resistance. First and second output terminals 2718, 2720 are respectively electrically coupled between an intermediate switching node 2710 of a bottom switching circuit 2702 and a positive input node 2716 of a top switching circuit 2702.

Control signal generator 2722 (analogous to control signal generator 808) optionally is also integrated within integrated circuit chip 2700. Although control signal generator 2722 is shown as part of bottom switching circuit 2702(3), control signal generator 2722 could be part of a different switching circuit 2702, spread across multiple switching circuits 2702, or separate from each switching circuit 2702. Control signal generator 2722 varies duty cycle of each first switching device 2708 to maximize an average value of switching node voltage Vy27 of each switching circuit 2702.

Figure 28:
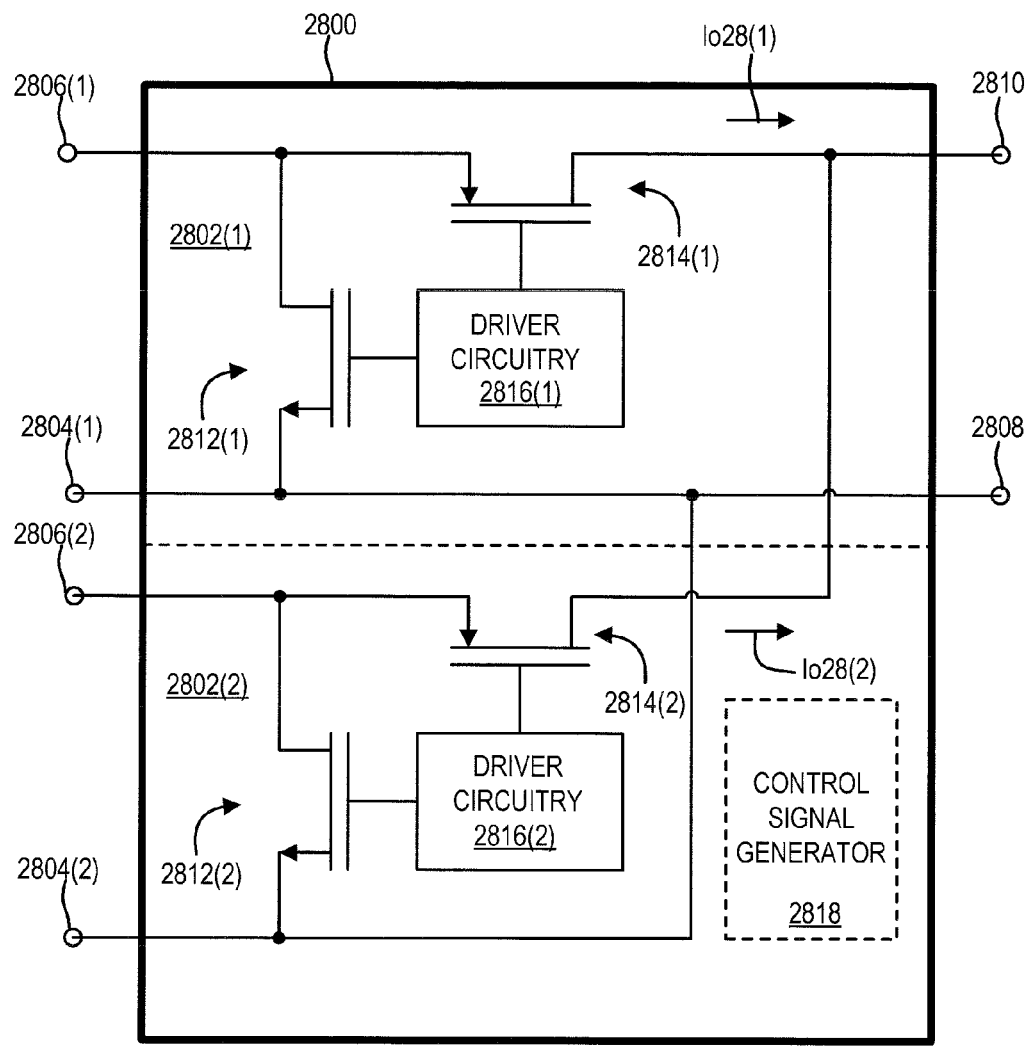
FIG. 28 shows one integrated circuit chip including a number of boost-type switching circuits, according to an embodiment.

FIG. 28 shows another example of multiple switching circuits integrated in a single integrated circuit chip. Specifically, FIG. 28 shows integrated circuit chip 2800, which includes two switching circuits 2802, each of which is an embodiment of switching circuit 1904 of FIG. 19. Switching circuits 2802 are delineated by dashed lines in FIG. 28. In alternate embodiments, integrated circuit chip 2800 includes three or more switching circuits 2802.

Each switching circuit 2802 includes a first and second input terminal 2804, 2806. First terminal 2804 is for electrically coupling to a negative terminal of a respective electric power source, while second input terminal 2806 is for electrically coupling to a positive terminal of the respective electric power source through an inductor. Integrated circuit chip 2800 further includes first and second output terminals 2808, 2810 for electrically coupling to a load. Each switching circuit 2802 further includes a first switching device 2812 (analogous to first switching device 1932 of FIG. 19) electrically coupled between first and second input terminals 2804, 2806 and a second switching device 2814 (analogous to second switching device 1934 of FIG. 19) electrically coupled between second input terminal 2806 and second output terminal 2810. In the embodiment of FIG. 28, first switching device 2812 is an n-channel MOSFET, and second switching device 2814 is a p-channel MOSFET. In alternate embodiments, each of first and second switching devices 2812, 2814 are n-channel LDMOS transistors or other types of transistors. Driver circuitry 2816 of each switching circuit 2802 controls first and second switching devices 2812, 2814 of the switching circuit.

Control signal generator 2818 optionally is also integrated within integrated circuit chip 2800. Although control signal generator 2818 is shown as part of bottom switching circuit 2802(2), control signal generator 2818 could be part of a different switching circuit 2802, spread across multiple switching circuits 2802, or separate from each switching circuit 2802. Control signal generator 2818 varies duty cycle of each first switching device 2812 to maximize a DC component of output current Io28 of each switching circuit 2802.

Figure 29:
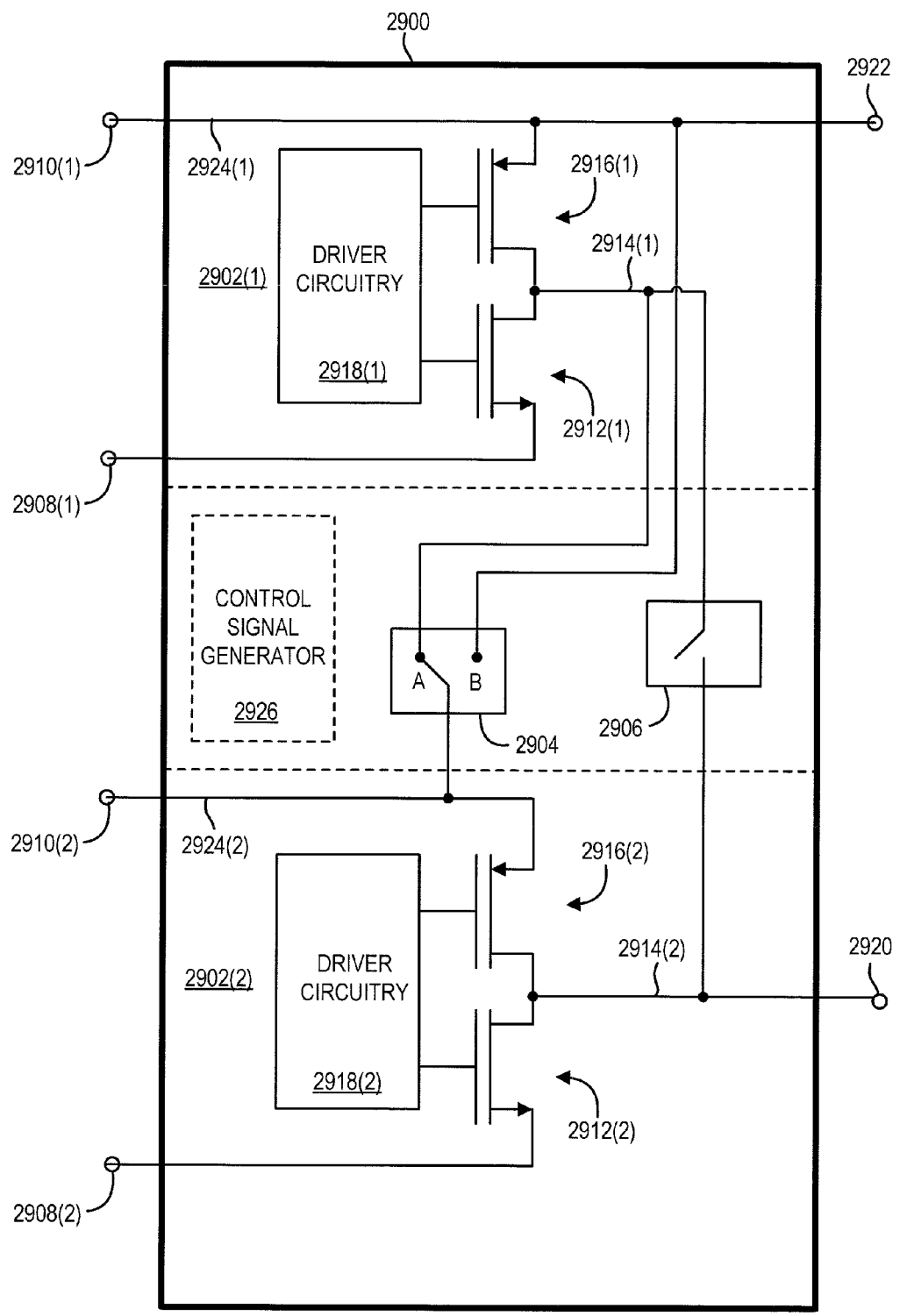
FIG. 29 shows one configurable integrated circuit chip including a number of buck-type switching circuits, according to an embodiment.

FIG. 29 shows yet another example of a number of switching circuits integrated into a common integrated circuit. Specifically, FIG. 29 shows integrated circuit chip 2900, which includes two switching circuits 2902 delineated by dashed lines. Integrated circuit chip 2900 could be modified to include additional switching circuits 2902. Integrated circuit chip 2900 further includes switches 2904, 2906 to electrically couple switching circuits 2902 either in series or parallel. For example, when switch 2904 is in its A position (shown in FIG. 29) and switch 2906 is open, the outputs of switching circuits 2902 are electrically coupled in series. Conversely, when switch 2904 is in its B position and switch 2906 is closed, the output of switching circuits 2902 are electrically coupled in parallel. Interconnection of switching circuits 2902 can be changed between series and parallel, for example, as needed to optimize the combined output voltage of the switching circuits. The fact that integrated circuit chip 2900 can be changed between series and parallel interconnection may also allow certain embodiments of chip 2900 to be interchangeably used in parallel and series applications.

Each switching circuit 2902 includes respective first and second input terminals 2908, 2910 for connecting to a respective electric power source (e.g., a photovoltaic device). A first switching device 2912 (analogous to first switching device 532) is electrically coupled between first input terminal 2908 and an intermediate switching node 2914, and a second switching device 2916 (analogous to second switching device 534) is electrically coupled between intermediate switching node 2914 and second input terminal 2910. In the embodiment of FIG. 29, first switching device 2912 is an n-channel MOSFET, and each second switching device 2916 is a p-channel MOSFET. In an alternate embodiment, each of first and second switching devices 2912, 2916 are n-channel LDMOS transistors or other types of transistors. Each switching circuit 2902 further includes driver circuitry 2918 for driving first and second switching devices 2912, 2916. First and second output terminals 2920, 2922 are respectively electrically coupled between an intermediate switching node 2914 of a bottom switching circuit 2902 and a positive input node 2924 of a top switching circuit 2902.

Control signal generator 2926 (analogous to control signal generator 808) optionally is also integrated within integrated circuit chip 2900. Although control signal generator 2926 is shown as being separate from switching circuits 2902, control signal generator 2926 could be part of one or more switching circuits 2902. Control signal generator 2926 varies duty cycle of each first switching device 2912 to maximize an output power of its respective switching circuit 2902.

As discussed above, in the switching circuits disclosed herein, duty cycle of a switching device is varied to maximize switching circuit output power. Thus, although an expected range of duty cycle might be known in some applications, a given switching circuit generally cannot be optimized for a specific value of duty cycle, as duty cycle will vary during circuit operation. Therefore, certain embodiments of the switching circuits disclosed herein include one or more switching devices that are dynamically sized field effect transistors (FETs). Such dynamically sized FETs each include a number of individually controllable elements in the form of constituent FETs electrically coupled in parallel, where the number of such constituent FETs that are active can be varied to dynamically size the FET. The FET's properties can be varied by changing its size, i.e., the number of its constituent FETs that are active. For example, overall FET channel resistance can be decreased by increasing FET size, i.e., increasing the number of constituent FETs that are active. However, the more constituent FETs that are active, the greater the gate capacitance and associated switching loss (assuming each constituent FET is driven by a common driver). For each duty cycle, there is typically an optimal FET size that minimizes the sum of resistance-related and gate-capacitance-related losses.

In embodiments including a dynamically sized FET, FET size is adjusted, for example, as a function of FET duty cycle. For example, when duty cycle is large, FET size is increased to reduce channel resistance, as channel resistance is generally a significant source of loss when duty cycle is large. Conversely, when duty cycle is small, such embodiments may reduce FET size to reduce FET gate capacitance and associated switching losses, as switching losses commonly are more significant than channel losses at low duty cycle. It is anticipated that in some embodiments FET size will also be adjusted at least partially based on other switching circuit operating characteristics, such as magnitude of current handled by the dynamically sized FET or switching circuit output power.

Figure 30:
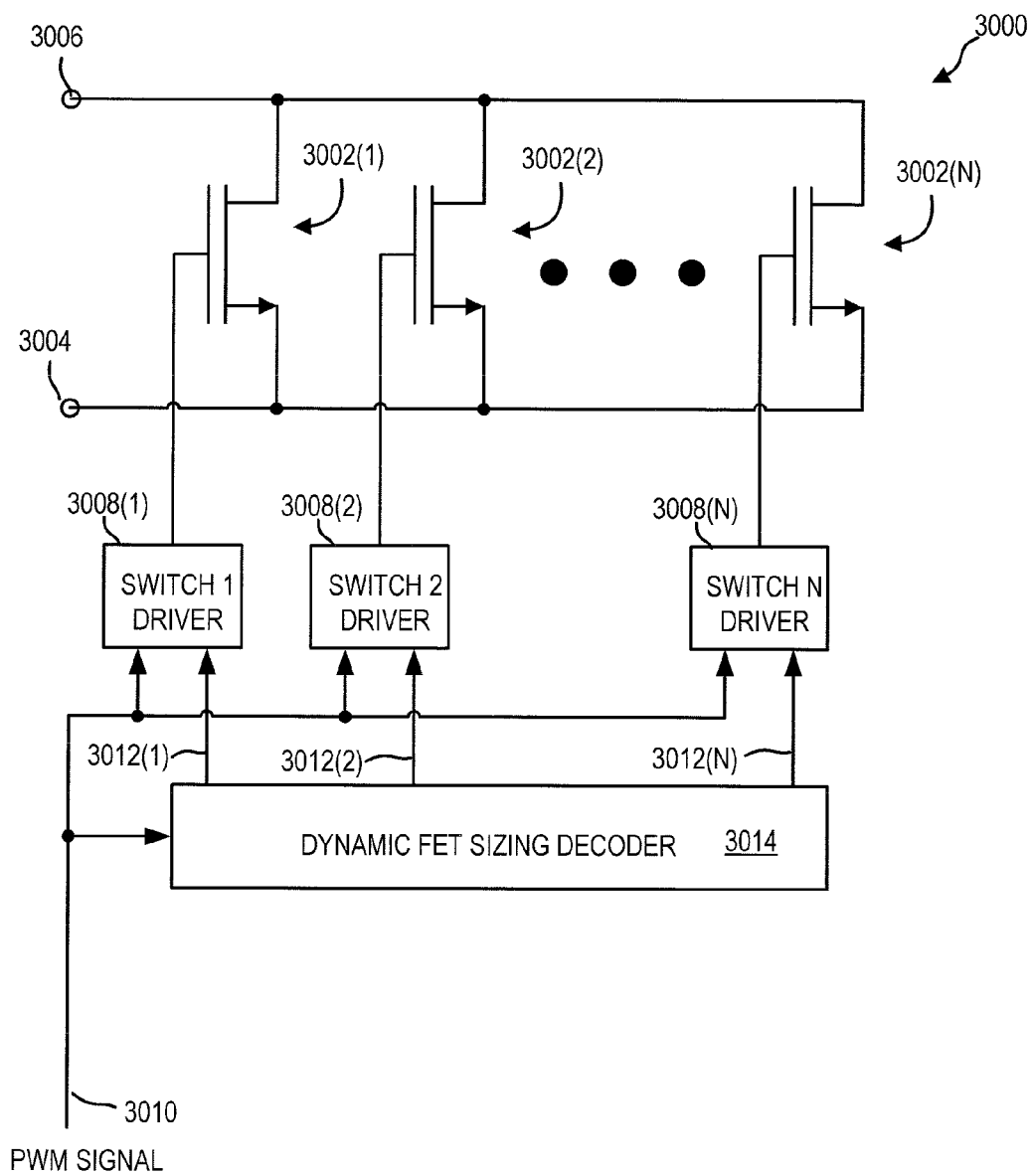
FIG. 30 shows one dynamically sized field effect transistor, according to an embodiment.

FIG. 30 shows one dynamically sized FET 3000, which is one example of a dynamically sized FET that could be used in the switching circuits disclosed herein. For example, dynamically sized FET 3000 could be used as first switching device 418 or 1814, of switching circuits 404 and 1804 respectively (FIGS. 4 and 18). Dynamically sized FET 3000 includes N individually controllable elements or constituent FETs 3002 coupled in parallel between terminals 3004, 3006, where N is an integer greater than one. Constituent FETs 3002 are n-channel MOSFETS in the FIG. 30 embodiment due to the relatively low channel resistance of such MOSFETs. However, constituent FETs 3002 could take other forms, such as p-channel MOSFETs.

Each constituent FET 3002's gate is driven by a respective driver 3008. Each driver 3008 receives a PWM signal 3010 as an input as well as an activation signal 3012 from a dynamic FET sizing decoder 3014. Dynamic FET sizing decoder 3014 determines a number of FETs to activate based on duty cycle of dynamically sized FET 3000 from PWM signal 3010. In one embodiment, a number of constituent FETs 3002 activated by FET sizing decoder 3014 is linearly proportional to duty cycle. In another embodiment, dynamic FET sizing decoder 3014 activates constituent FETs 3002 according to a piecewise linear transfer function—e.g., a first number of constituent FETs 3002 are activated when duty cycle is within a first range of values, a second number of constituent FETs 3002 are activated when duty cycle is within a second range of values, and so on.

As previously discussed, one application of the switching circuits disclosed herein is to provide MPPT for photovoltaic devices. Certain embodiments of such switching circuits may be housed in a common package with one or more photovoltaic devices. In the context of this document, "housed in a common package" means that one or more switching circuits and one or more photovoltaic devices are part of a common assembly, such as a photovoltaic module or photovoltaic panel. Such co-packaging of a photovoltaic device and its MPPT circuit may offer benefits such as (1) reduced photovoltaic system parts count resulting in simplified system installation and lower system installation cost, (2) reduced system size, and/or (3) improved system performance due to close proximity of the MPPT circuit to its respective photovoltaic device.

Figure 31:
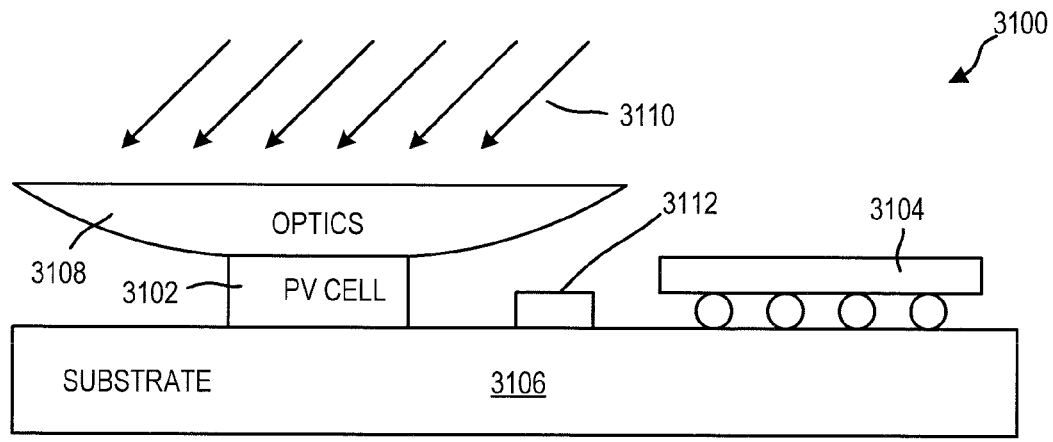
FIG. 31 shows one photovoltaic system including a photovoltaic cell and an integrated circuit chip disposed on a common substrate, according to an embodiment.

For example, FIG. 31 shows one photovoltaic system 3100 including a photovoltaic cell 3102 and an integrated circuit chip 3104 mounted on a common substrate 3106. Substrate 3106, for example, is a printed circuit board, a ceramic substrate, or a polyimide substrate. Integrated circuit chip 3104, which is electrically coupled to photovoltaic cell 3102, includes one or more of the switching circuits, such as the switching circuits disclosed herein, to provide MPPT for photovoltaic cell 3102. Integrated circuit chip 3104, for example, is an embodiment of integrated circuit chip 2500 (FIG. 25) and may be a flip chip integrated circuit, as shown in FIG. 31. However, integrated circuit chip 3104 can have other package configurations. For example, in certain alternate embodiments, integrated circuit chip 3104 is wire bonded to one or more components of system 3100, such as to photovoltaic cell 3102. In certain embodiments, integrated circuit chip 3104 includes multiple switching circuits to provide MPPT for multiple instances of photovoltaic cell 3102 on substrate 3106, or multiple junctions of photovoltaic cell 3102 in the event photovoltaic cell 3102 is a multi-junction device. In such embodiments, integrated circuit chip 3104 is one of integrated circuit chips 2700, 2800, or 2900 (FIGS. 27-29), for example.

An input capacitor 3112 electrically coupled in parallel with the output terminals of photovoltaic cell 3102 is optionally included in system 3100. Some embodiments may also include an output inductor and one or more output capacitors.

Such capacitors, if present, are typically disposed on substrate 3106. It is anticipated that many embodiments of photovoltaic system 3100 will utilize either interconnection inductance or discrete inductors external to system 3100 as energy storage inductance. However, a discrete energy storage inductor can be disposed on substrate 3106 if required. Some embodiments further include optics 3108 to concentrate incident light 3110 onto photovoltaic cell 3102. In certain embodiments, some or all of system 3100 is encapsulated in a passivation material (e.g., epoxy or other potting material) to protect the system from environmental elements, such as moisture.

Figure 32:
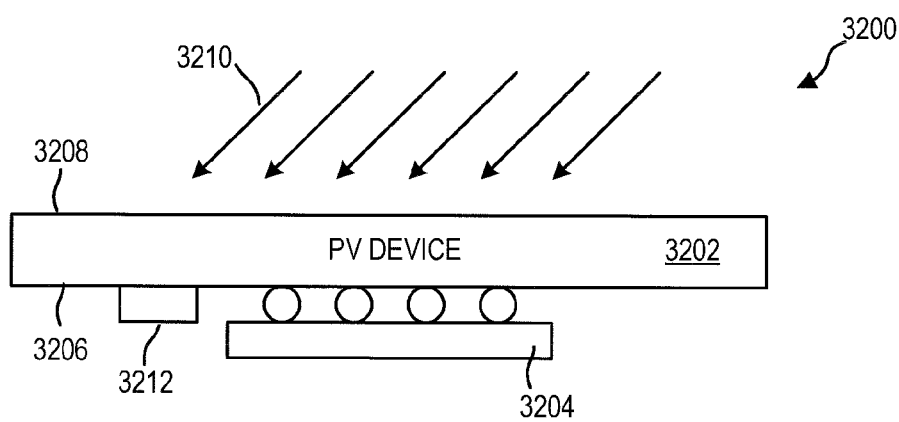
FIG. 32 shows one photovoltaic system including a photovoltaic device and an integrated circuit chip disposed on the photovoltaic device, according to an embodiment.

FIG. 32 shows another example of a photovoltaic system including a photovoltaic device and a switching circuit in a common assembly. Photovoltaic system 3200 includes a photovoltaic device 3202 and an integrated circuit chip 3204 mounted on a back surface 3206 of photovoltaic cell 3202 opposite of a front surface 3208 which receives incident light 3210. Integrated circuit chip 3204, which is electrically coupled to photovoltaic device 3202, includes one or more of the switching circuits, such as the switching circuits disclosed herein, to provide MPPT for photovoltaic device 3202. Integrated circuit chip 3204 may be a flip chip integrated circuit, as shown in FIG. 32. However, integrated circuit chip 3204 can have other package configurations. For example, in some alternate embodiments, integrated circuit chip 3204 is wire bonded to photovoltaic device 3202 and/or an optional input capacitor 3212. Photovoltaic device 3202 for example, is a single crystalline silicon photovoltaic cell or a group of crystalline silicon photovoltaic cells. In some embodiments, integrated circuit chip 3204 includes multiple switching circuits to provide individual MPPT for each photovoltaic cell of photovoltaic device 3202. Similar to assembly 3100 of FIG. 31, input capacitor 3212, an output capacitor (not shown), and/or an energy storage inductor (not shown) are optionally mounted on back surface 3206.

Figure 33:
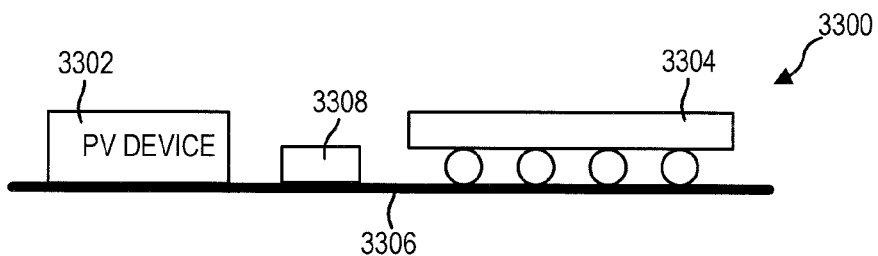
FIG. 33 shows one photovoltaic system including a photovoltaic device and an integrated circuit chip disposed on a common lead frame, according to an embodiment.
Figure 61:
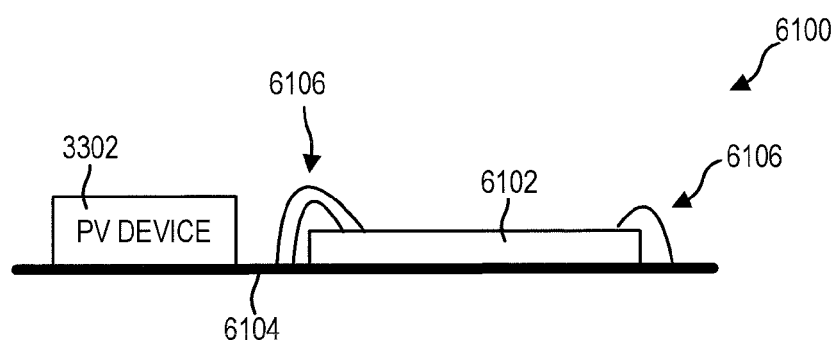
FIG. 61 shows a photovoltaic system, according to an embodiment.

FIG. 33 shows another photovoltaic system including a photovoltaic device and a switching circuit in a common assembly. Specifically, system 3300 includes a photovoltaic device 3302, an integrated circuit chip 3304, and an optional input capacitor 3308 mounted on a common lead frame 3306. Integrated circuit chip 3304, which is electrically coupled to photovoltaic device 3302, includes one or more of the switching circuits, such as the switching circuits disclosed herein, to provide MPPT for photovoltaic device 3302. Integrated circuit chip 3304 may be a flip chip integrated circuit, as shown in FIG. 33. However, integrated circuit chip 3304 can have other package configurations. For example, FIG. 61 shows a photovoltaic system 6100, which is similar to system 3300 of FIG. 33, but includes an integrated circuit 6102 electrically coupled to a lead frame 6104 via wire bonds 6106. Integrated circuit 6102 includes one or more of the switching circuits, such as those disclosed herein, to provide MPPT for photovoltaic device 3302. In some embodiments, at least some of wire bonds 6106 directly electrically couple integrated circuit 6102 to photovoltaic device 3302. In certain alternate embodiments, integrated circuit 6102 is electrically coupled to lead 6104 by a tape-automated bonding process. Lead frame 6104 is replaced with a substrate, such as a ceramic or polyimide substrate, in some other embodiments.

Figure 62:
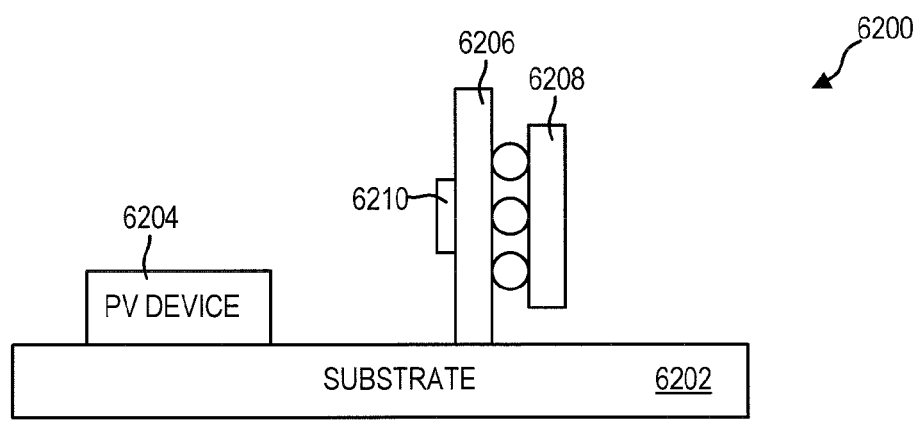
FIG. 62 shows another photovoltaic system, according to an embodiment.

FIG. 62 shows a photovoltaic system 6200 including a substrate 6202, a photovoltaic device 6204 mounted thereon, and a daughter card 6206 electrically coupled to substrate 6202. In some embodiments, daughter card 6206 is mechanically attached to substrate 6202, as shown in FIG. 62, such as by solder joints and/or through-hole pins. Alternately, daughter card 6206 is disposed adjacent to substrate 6202 and electrically coupled to substrate 6202 and/or photovoltaic device 6204 by wires or other conductors. Daughter card 6206 includes an integrated circuit chip 6208 which includes one or more switching circuits, such as the switching circuits disclosed herein, to provide MPPT for photovoltaic device 6204. Although integrated circuit chip 6208 is shown as having a flip chip package, chip 6208 could alternately have other package types. Daughter card 6206 optionally includes an input capacitor 6210 electrically coupled in parallel with the output terminals of photovoltaic device 6204. In embodiments where daughter card 6206 is separated from substrate 6202, optional input capacitor 6210 is typically located on the same side of daughter card 6206 as integrated circuit chip 6208.

Figure 34:
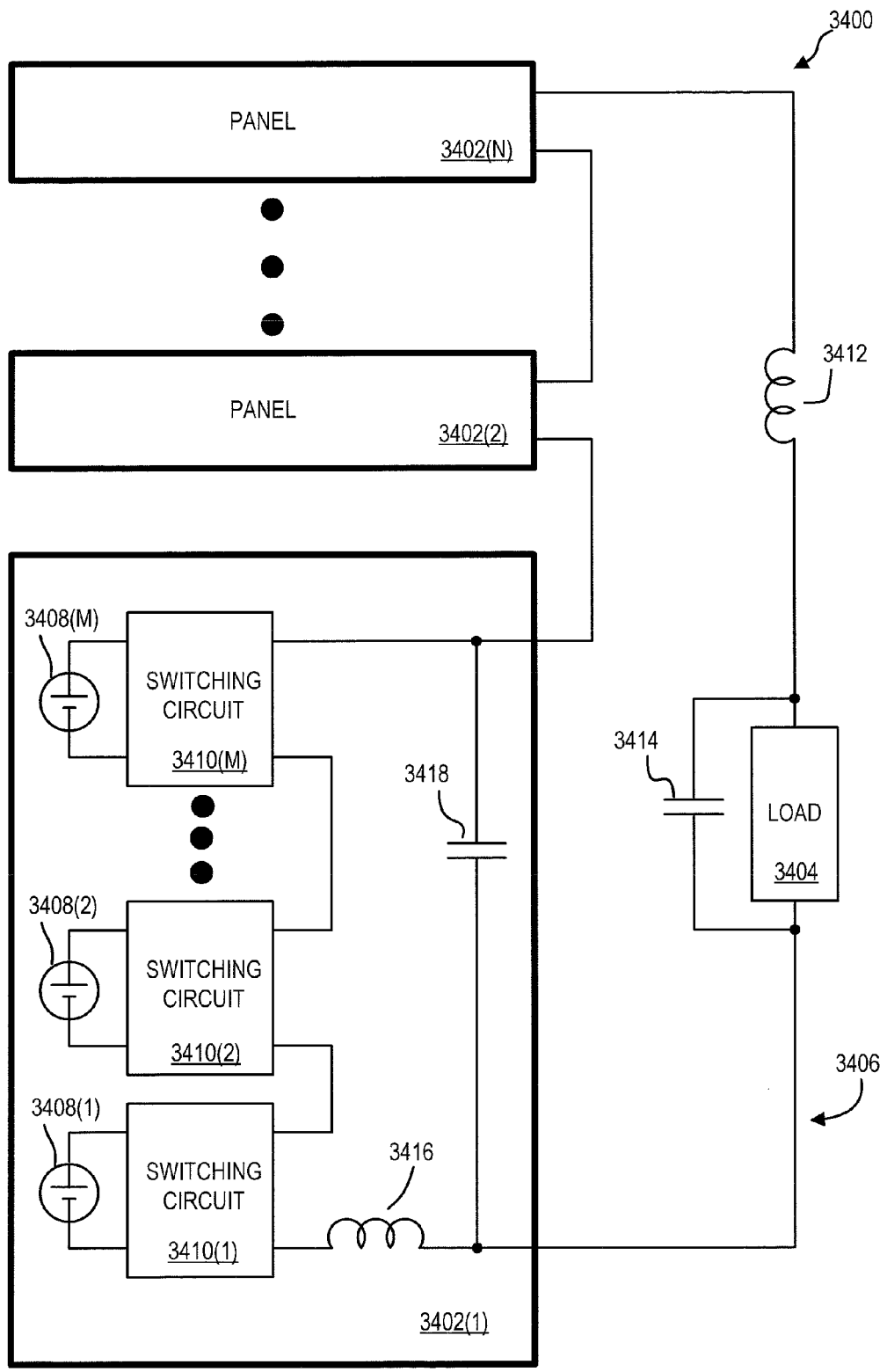
FIG. 34 shows one electric power system including a number of photovoltaic panels where each panel includes a number of switching circuits for extracting power from photovoltaic devices of the panels, according to an embodiment.

FIG. 34 shows an electric power system 3400 including N photovoltaic panels 3402, where N is an integer greater than or equal to one. Outputs of photovoltaic panels 3402 are electrically coupled in series with a load 3404 (e.g., an inverter) to form a closed circuit, hereinafter referred to as output circuit 3406. Details of only one photovoltaic panel 3402(1) are shown in FIG. 34 to promote illustrative clarity.

Each photovoltaic panel 3402 includes M photovoltaic devices 3408, where M is an integer greater than one and can vary among instances of photovoltaic panel 3402. In some embodiments, each photovoltaic device 3408 is a photovoltaic sub-module of a panel 3402, where each sub-module includes a plurality of photovoltaic cells electrically coupled in series and/or parallel. Each sub-module includes, for example, one or more rows or columns of series coupled photovoltaic cells in panel 3402. In some other embodiments, photovoltaic devices 3408 take different forms, such as single or multi-junction photovoltaic cells. A respective switching circuit 3410 is electrically coupled to each photovoltaic device 3408 to provide MPPT. Switching circuits 3410 are, for example, embodiments of switching circuits 404 (FIG. 4), and their output ports are electrically coupled together in series. However, system 3400 is not limited to use with embodiments of switching circuits 404, and system 3400 could be modified to use other types of switching circuits, such as conventional buck converters with or without MPPT capability.

Figure 52:
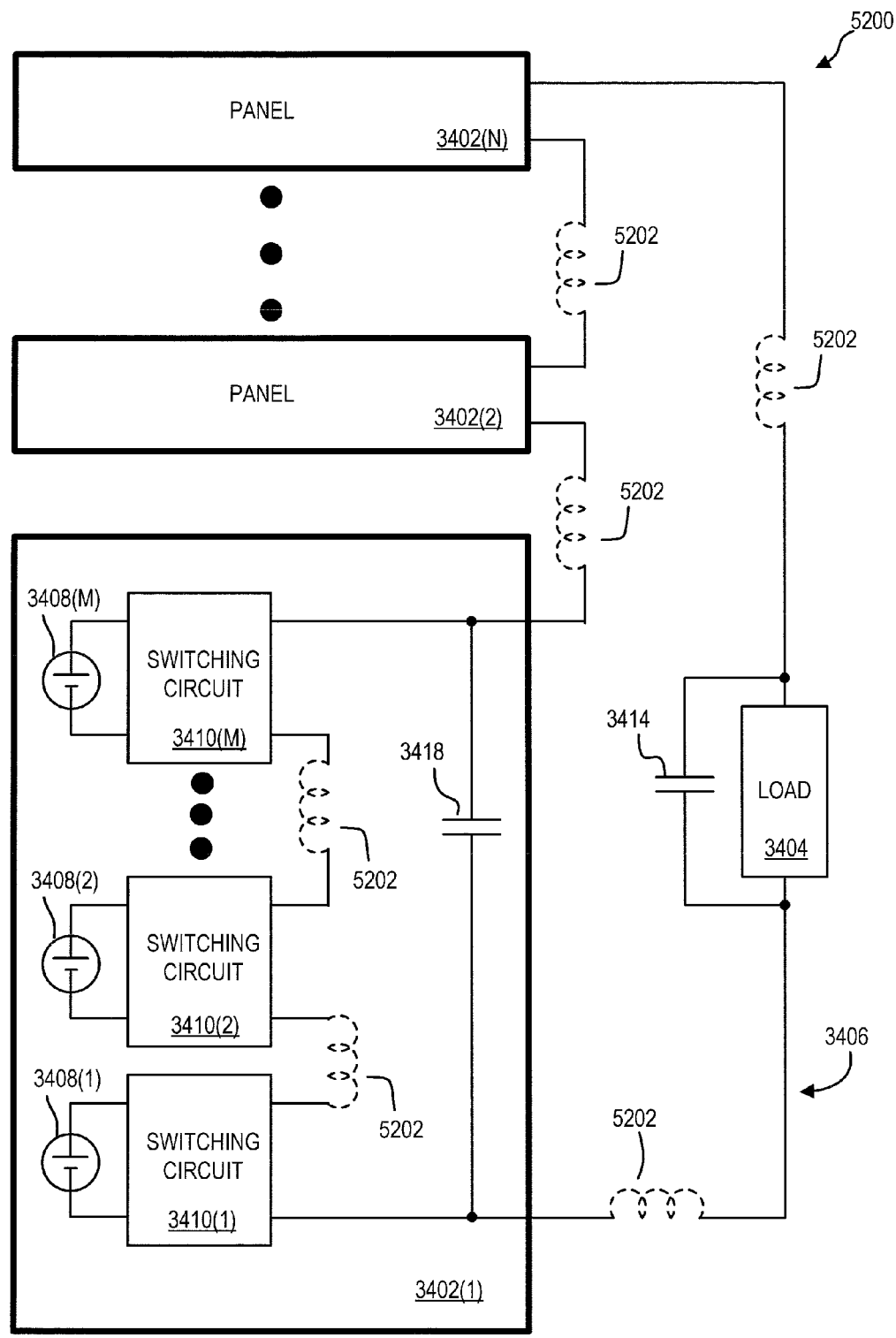
FIG. 52 shows an embodiment of the electric power system of FIG. 34 utilizing interconnection inductance.

Switching circuits 3410 primarily utilize inductance 3412 in output circuit 3406 as their energy storage inductance. Although inductance 3412 is symbolically shown as a single inductor, inductance 3412 can include a number of discrete inductors and/or interconnection inductance from wiring or other conductors connecting components to form output circuit 3406. However, one or more panels 3402 may optionally include additional inductance 3416 in the panel to improve switching circuit 3410 performance, such as when inductance 3412 is lower than optimal. Additionally inductance 3416, for example, is a single discrete inductor in the panel, as shown in FIG. 34. Alternately, additional inductance 3416 could be a number of discrete inductors in a panel, such as in series with connections between successive switching circuits 3410. FIG. 52 shows an electric power system 5200, which is an embodiment of electric power system 3400 where switching circuits 3410 utilize interconnection inductance 5202 as at least their primary energy storage inductance.

Switching circuits 3410 also utilize output circuit capacitance 3414 as their primary output capacitance. However, in some embodiments, one or more panels 3402 additionally includes output capacitance 3418, such as to reduce ripple voltage.

System 3400 could be modified such that some or all of photovoltaic devices 3408 are replaced with other electric power sources, such as fuel cells or batteries. In such embodiments, the electric power sources and switching circuits 3410 would not necessarily be part of a panel. Furthermore, in some alternate embodiments, switching circuits 3410 and photovoltaic devices 3408 are not integrated into panels.

Figure 35:
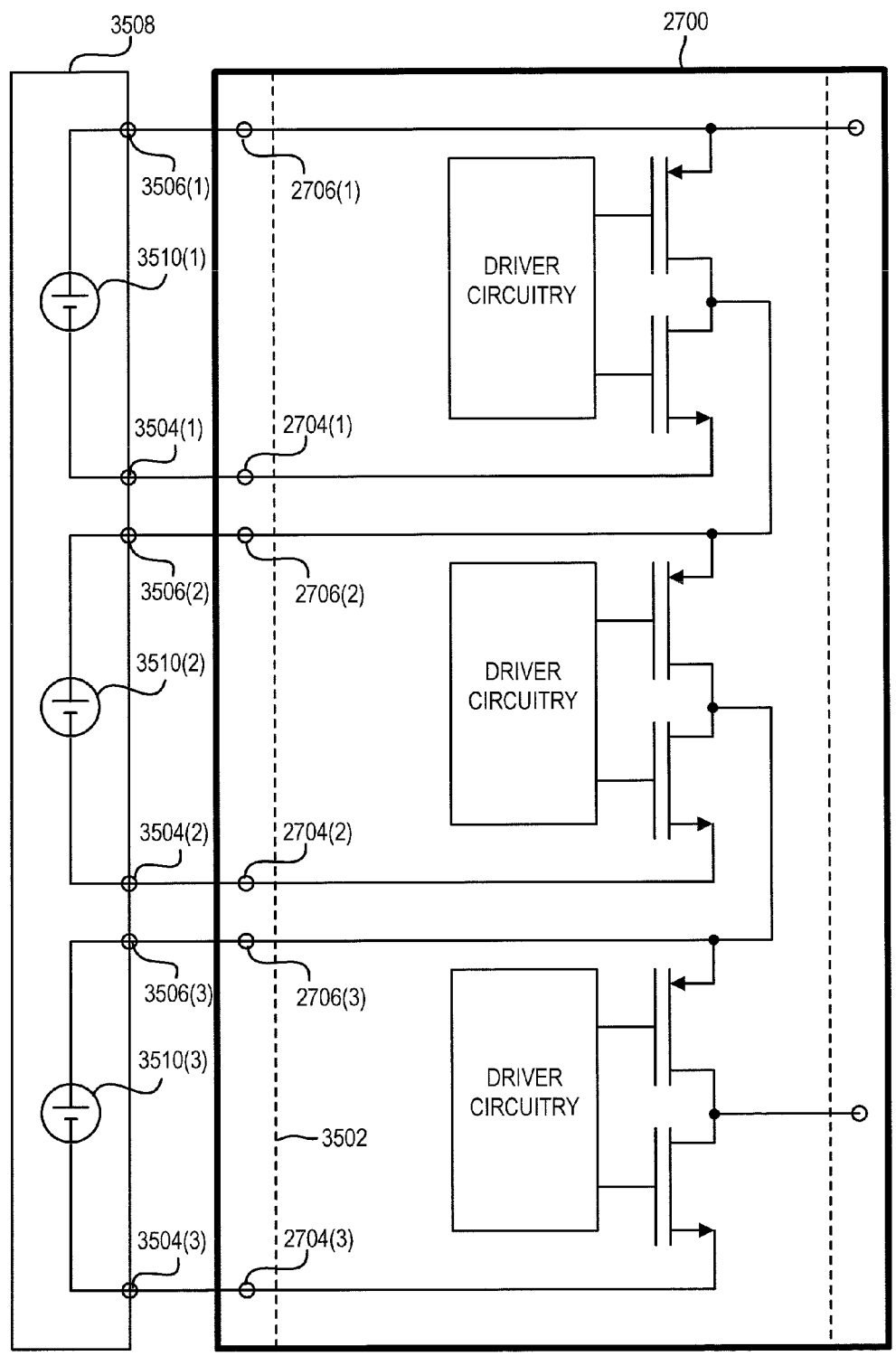
FIG. 35 shows an embodiment of the integrated circuit chip of FIG. 27 in a multi-junction photovoltaic cell application.

FIG. 35 shows one application of integrated circuit chip 2700 of FIG. 27 in a photovoltaic application. Specifically, each of first and second input terminals 2704, 2706 of input port 3502 of chip 2700 are electrically coupled to respective first and second photovoltaic terminals 3504, 3506 of multi-junction photovoltaic cell 3508. In multi-junction photovoltaic cell 3508, terminals 3504, 3506 for each junction 3510 are brought out of the cell, so that each junction 3510 is electrically isolated in the cell. Thus, integrated circuit chip 2700 provides individual MPPT for each junction 3510.

Figure 70:
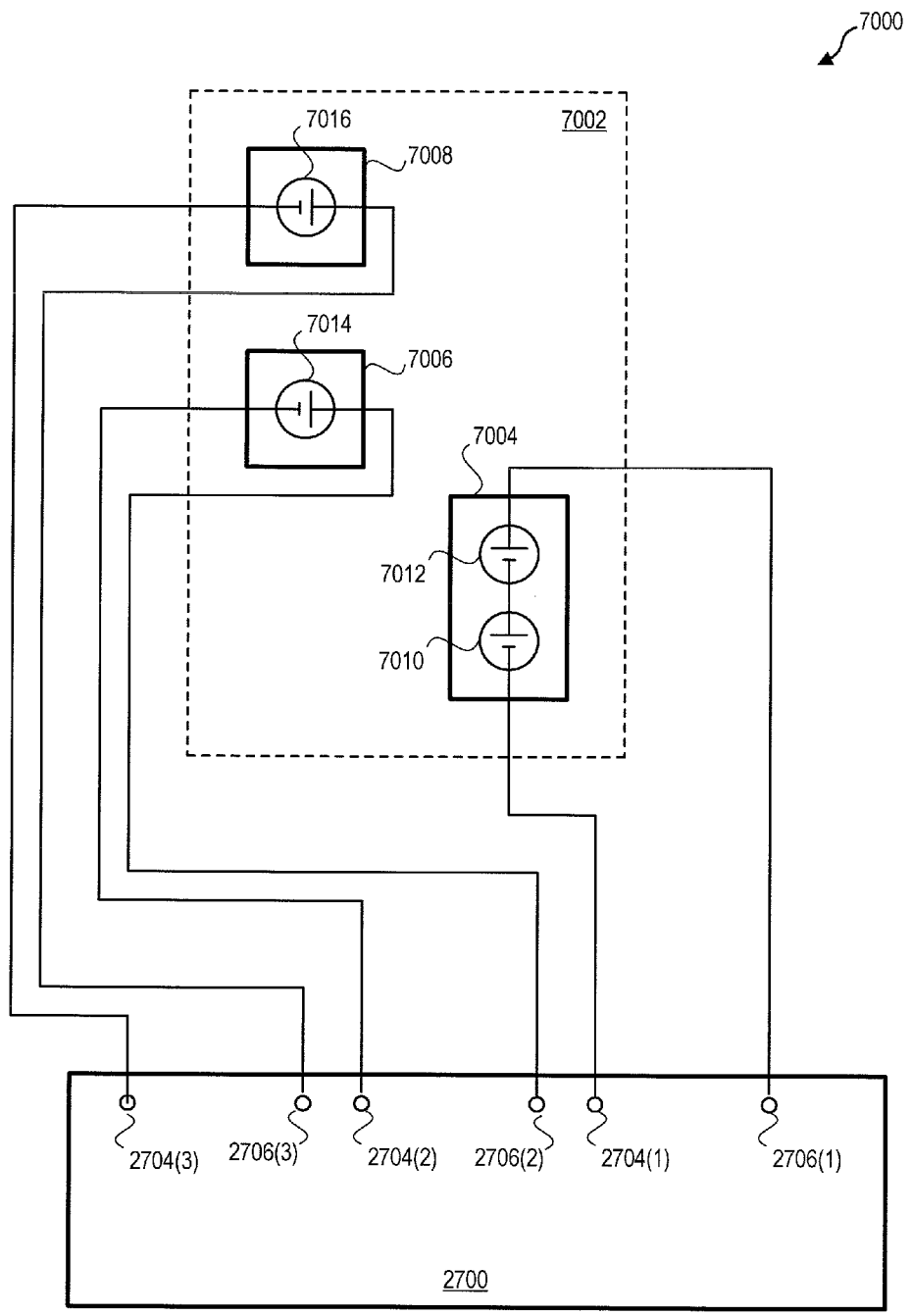
FIG. 70 shows a photovoltaic system including a split spectrum photovoltaic device, according to an embodiment.

In certain alternative embodiments, multi-junction photovoltaic cell 3508 is replaced with a split spectrum photovoltaic device including two or more discrete photovoltaic devices and optics directing light of appropriate wavelength to at least some of the photovoltaic devices. Each photovoltaic device, in turn, includes one or more stacked photovoltaic junctions each optimized for light of a particular wavelength. For example, FIG. 70 shows a photovoltaic system 7000 including a split spectrum photovoltaic device 7002 electrically coupled to integrated circuit chip 2700. Split spectrum photovoltaic device 7002 includes first, second, and third discrete photovoltaic devices 7004, 7006, 7008 electrically coupled to a respective input port of integrated circuit chip 2700. First photovoltaic device 7004 includes two stacked photovoltaic junctions 7010, 7012, and second and third photovoltaic devices 7006, 7008 each include a single respective photovoltaic junction 7014, 7016. Each of photovoltaic junctions 7010, 7012, 7014, 7016 is optimized for light of a different wavelength. Optics (not shown) in split spectrum photovoltaic device 7002 help direct light of appropriate wavelength to the various photovoltaic junctions.

Figure 55:
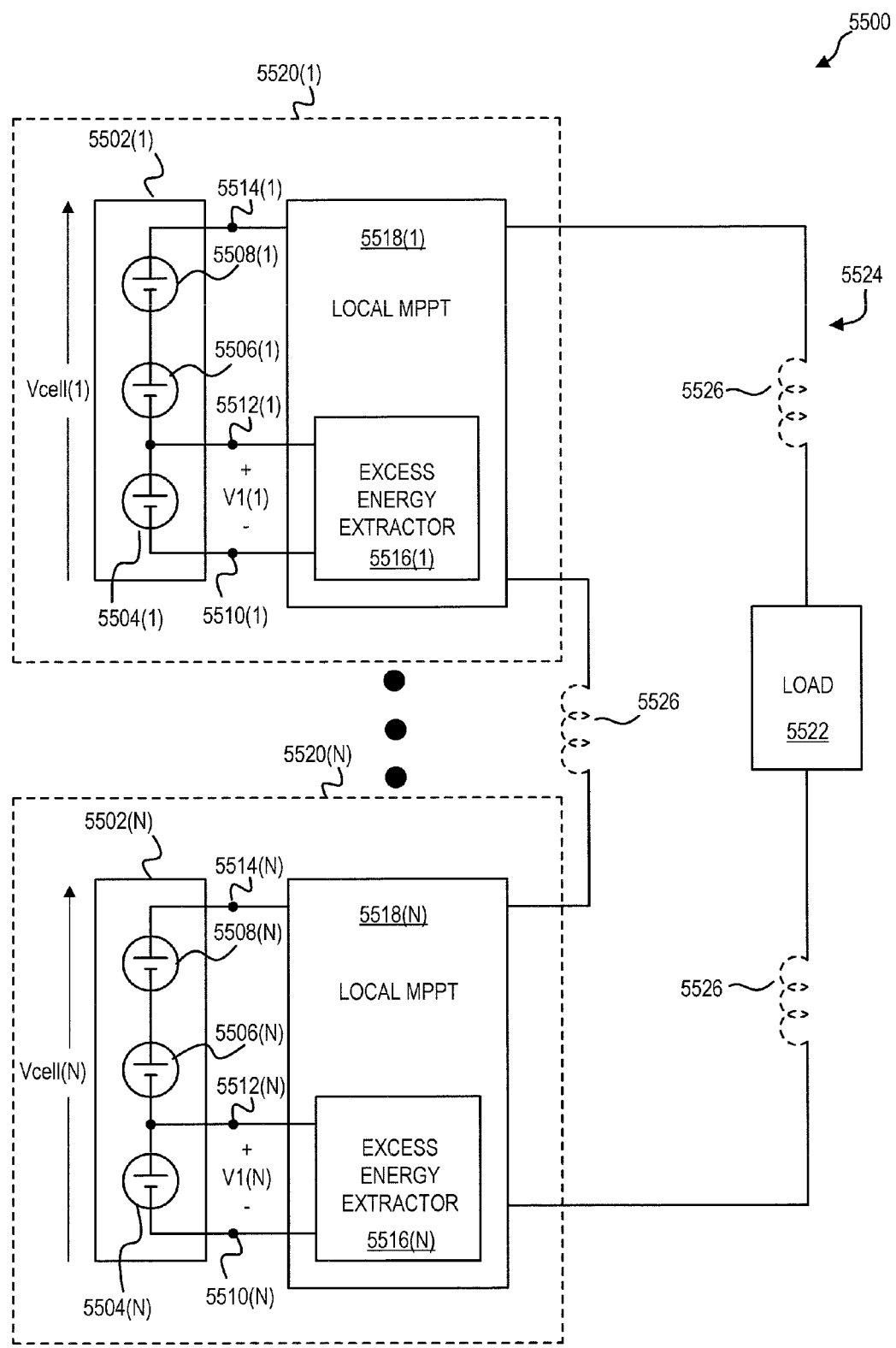
FIG. 55 shows an electric power system configured to help maximize power extracted from a multi-junction photovoltaic cell, according to an embodiment.

FIG. 55 shows an electric power system 5500 that is configured to help maximize power extracted from a multi-junction photovoltaic cell. System 5500 includes N multi-junction photovoltaic cells 5502, where N is an integer greater than one. Each photovoltaic cell 5502 includes a first, second, and third junction 5504, 5506, 5508 electrically coupled in series, as well as three terminals 5510, 5512, 5514 for electrical access to the junctions. Terminals 5510, 5514 provide electrical access to the series stack of all three junctions, while terminal 5512 provides electrical access to a node between first and second junctions 5504, 5506.

First junction 5504, which in some embodiments is a Germanium based junction, is capable of producing greater current than second and third junctions 5506, 5508. Thus, if all three junctions were simply connected in series without additional circuitry, current through first junction 5504 would be constrained by the current capabilities of the second and third junctions 5506, 5508, and the bottom junction would not be fully utilized (i.e., it would not be operated at its MPP). The circuitry of system 5500, however, partially or completely alleviates such issue.

In particular, each first junction 5504 is electrically coupled to a respective first subcircuit or excess energy extractor 5516 which extracts additional energy from the first junction that would not be obtained if junctions 5504, 5506, 5508 were simply operated in series without additional circuitry. Specifically, each excess energy extractor 5516 operates its respective first junction at its MPP by boosting a voltage V1 across first junction 5504 and applying the boosted voltage in parallel with a voltage Vcell across all three junctions. A respective second subcircuit or local MPPT converter 5518 is electrically coupled across terminals 5510, 5514 of each photovoltaic cell 5502. Each excess energy extractor 5516 at least substantially maximizes power extracted from its respective first junction 5504, and each local MPPT converter 5518 at least substantially maximizes power extracted from the remaining junctions 5506, 5508 of its respective photovoltaic cell 5502.

Each set of corresponding photovoltaic cell 5502, excess energy extractor 5516, and local MPPT converter 5518 may be considered a unit cell 5520. In some embodiments, each component of a unit cell 5520 is mounted on a common substrate, such as in manner similar that shown in one of FIGS. 31-33. Additionally, in some embodiments, an excess energy extractor 5516 and corresponding local MPPT converter 5518 are integrated on a common integrated circuit chip.

Local MPPT converters 5518 may be embodiments of switching circuit 404 (FIG. 4) with their output ports connected in series with a load 5522 to form a closed circuit, hereinafter referred to as output circuit 5524, as shown in FIG. 55. In some embodiments, local MPPT converters 5518 utilize interconnection inductance 5526 of output circuit 5524 as their primary energy storage inductance, as shown in FIG. 55. Alternately or in addition, local MPPT converters 5518 may utilize one or more discrete inductors (not shown) as energy storage inductance. In certain alternate embodiments, local MPPT converters are embodiments of switching circuits 1804 (FIG. 18) with their output ports connected in parallel.

Figure 56:
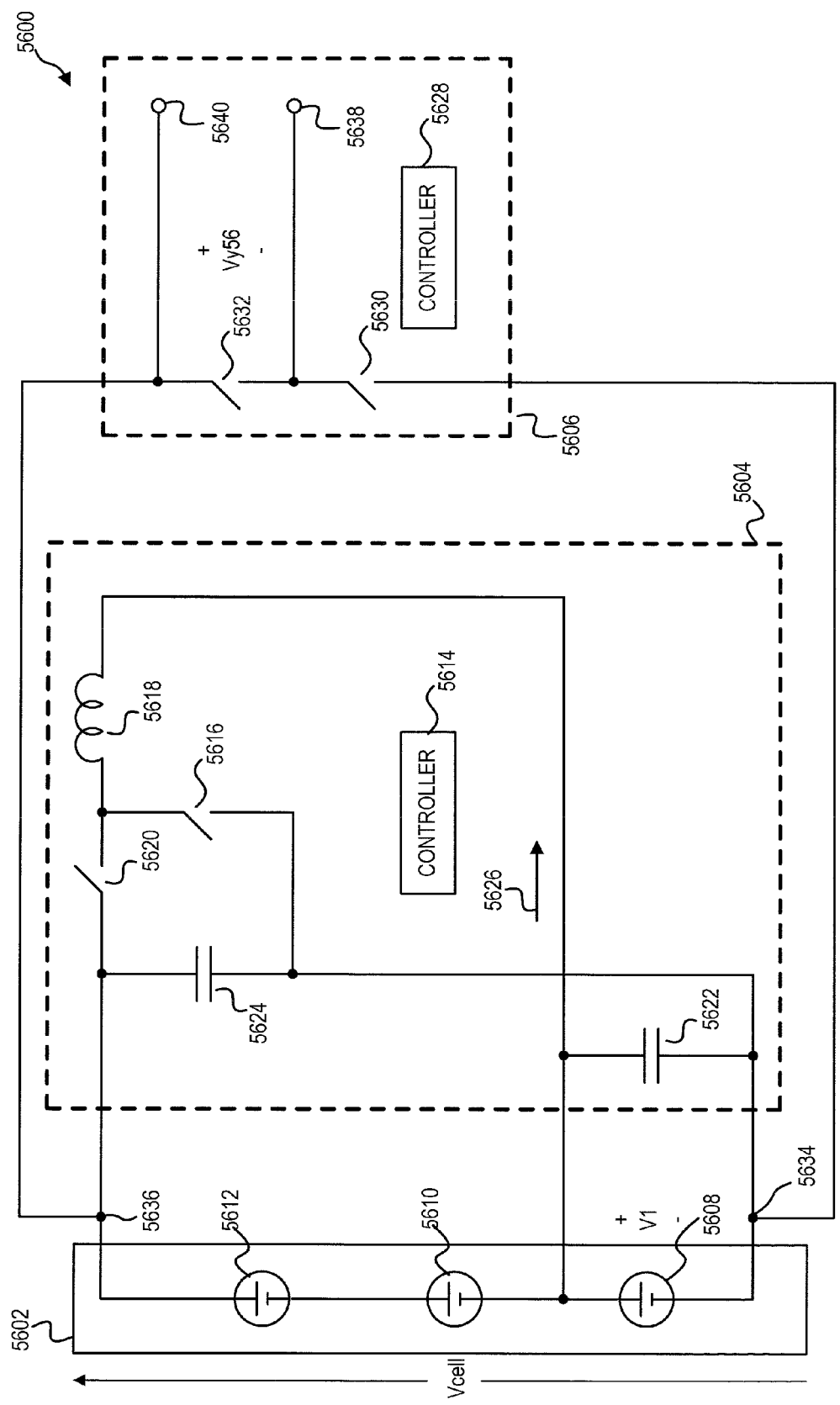
FIG. 56 shows one embodiment of a unit cell of the electric power system of FIG. 55.

FIG. 56 shows a unit cell 5600, which is an embodiment of unit cell 5520 of FIG. 55. Unit cell 5600 includes a three junction photovoltaic cell 5602 analogous to photovoltaic cell 5502 (FIG. 55), an excess energy extractor 5604 (sometimes referred to as an energy exchanger), and a local MPPT converter 5606. Excess energy extractor 5604 operates as a boost-type converter with an input port electrically coupled across first junction 5608 and an output port electrically coupled across the series string of all three junctions 5608, 5610, 5612. Excess energy extractor 5604 boosts voltage V1 across a first junction 5608 to be the same as a voltage Vcell across the series string of first junction 5608, a second junction 5610, and a third junction 5612. In particular, excess energy extractor 5604 includes a controller 5614, a first switching device 5616, inductance 5618, a second switching device 5620, an input capacitor 5622, and an output capacitor 5624. Inductance 5618 is typically one or more low resistance discrete inductors, although in some embodiments, inductance 5618 is at least partially interconnection inductance of a closed circuit including first junction 5608 and excess energy extractor 5604. Second switching device 5620, which serves as a freewheeling device, is replaced with or supplemented by a diode in some embodiments.

Controller 5614 controls duty cycle of first switching device 5616 to at least substantially maximize power extracted from first junction 5608. In some embodiments, first switching device 5616 is implemented by a transistor, and current 5626 is sensed by measuring a voltage drop across the transistor using a circuit similar to that discussed with respect to FIG. 54.

Local MPPT converter 5606 is similar to switching circuit 504 (FIG. 5). In particular, local MPPT converter 5606 includes a controller 5628, a first switching device 5630, and a second switching device 5632, which is optionally replaced by a diode. Local MPPT converter 5606 includes an input port electrically coupled in parallel across terminals 5634, 5636 of photovoltaic cell 5602, and local MPPT converter 5606 is electrically coupled to a load or other unit cells via an output port including output terminals 5638, 5640. In a manner similar to that discussed above with respect to FIG. 5, controller 5628 controls duty cycle of first switching device 5630 to at least substantially maximizes power extracted from photovoltaic cell 5602 by at least substantially maximizing an average value of a switching node voltage Vy56 across output terminals 5638, 5640. In some embodiments of unit cell 5500, each of controllers 5614 and 5628 are replaced with a common controller that controls both excess energy extractor 5604 and local MPPT converter 5606. In some embodiments, switching device 5616 is switched out of phase with respect to switching device 5630 to reduce ripple.

The excess energy extractor and local MPPT converter architectures discussed above with respect to FIGS. 55-56 could be adapted for use with photovoltaic cells with a different number of junctions. For example, in the case of a four junction photovoltaic cell, two excess energy extractors could be used to maximize power extracted from respective bottom two junctions, and a local MPPT converter could be used to maximize power extracted from the remaining top two junctions. Additionally, in the case where two or more excess energy extractors are used with a string of successive junctions, it is possible to configure the energy extractor voltage gains such that either a first or last energy extractor in the string has a gain of one and can therefore be eliminated while still maximizing power extracted from its respective junction.

Figure 63:
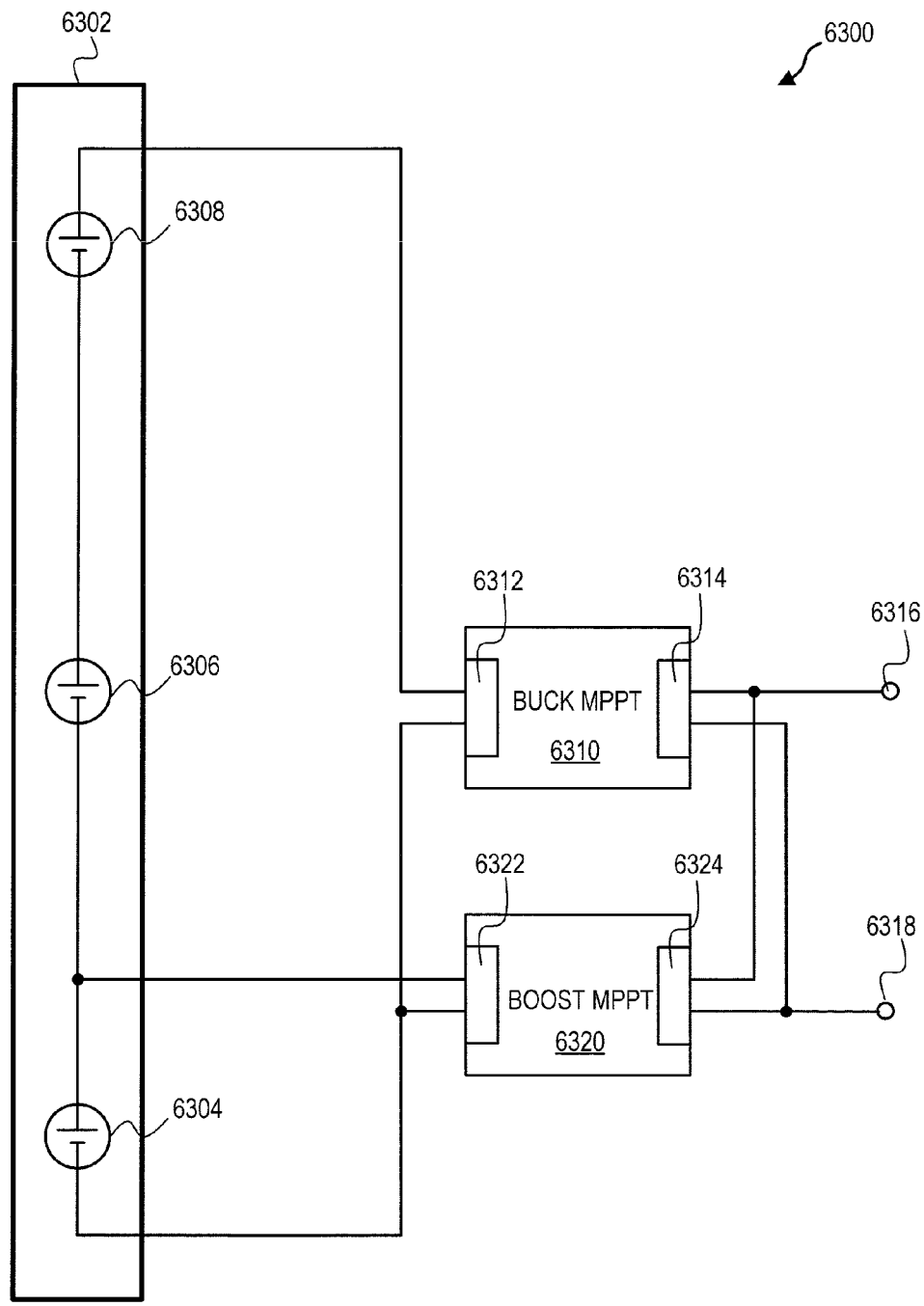
FIG. 63 shows an alternative unit cell, according to an embodiment.

Variations of the electric power systems of FIGS. 55 and 56 are possible. For example, FIG. 63 shows a unit cell 6300, which is similar to unit cell 5600 (FIG. 56), but where additional energy extracted from a bottom photovoltaic junction is transferred to the unit cell output, instead of to a MPPT converter input. Unit cell 6300 includes a three junction photovoltaic cell 6302 analogous to photovoltaic cell 5502 (FIG. 55) and including first, second, and third series coupled photovoltaic junctions 6304, 6306, 6308. Unit cell 6300 further includes a buck-type MPPT converter 6310 having an input port 6312 and an output port 6314. In some embodiments, buck-type MPPT converter 6310 is an embodiment of switching circuit 504 (FIG. 5) or switching circuit 604 (FIG. 6) including a discrete energy storage inductor. Input port 6312 is electrically coupled across the series combination of all three photovoltaic junctions 6304, 6306, 6308, and output port 6314 is electrically coupled across unit cell 6300 output terminals 6316, 6318. Output terminals 6316, 6318 are, for example, electrically coupled in series with other instances of unit cell 6300 and with a load.

Unit cell 6300 further includes a boost-type MPPT converter 6320 including an input port 6322 and an output port 6324. Input port 6322 is electrically coupled across first photovoltaic junction 6304, and output port 6324 is electrically coupled in parallel with buck-type MPPT converter 6310 output port 6314. Each of MPPT converters 6310 and 6320 are operable to at least substantially maximize an amount of electric power extracted from the photovoltaic junctions electrically coupled across their respective input ports, thereby providing effective MPPT for each of (1) the series combination of top two photovoltaic junctions 6306, 6308, and (2) bottom photovoltaic junction 6304. In some embodiments, each of buck-type and boost-type MPPT converters 6310, 6320 switch out of phase with respect to each other to minimize ripple. Converter 6310, 6320 optionally share one or more common components, such as a common controller, and could be integrated into a single integrated circuit chip.

Boost-type MPPT converter 6320 typically operates with a smaller voltage conversion ratio that boost-type converter 5604 (FIG. 56), and boost-type MPPT converter 6320 is therefore expected to have a higher efficiency and lower component voltage stresses than boost-type converter 5604, assuming all else is equal. However, unit cell 6300's architecture necessitates that buck-type MPPT converter 6310 include a local energy storage inductor (not shown).

Figure 64:
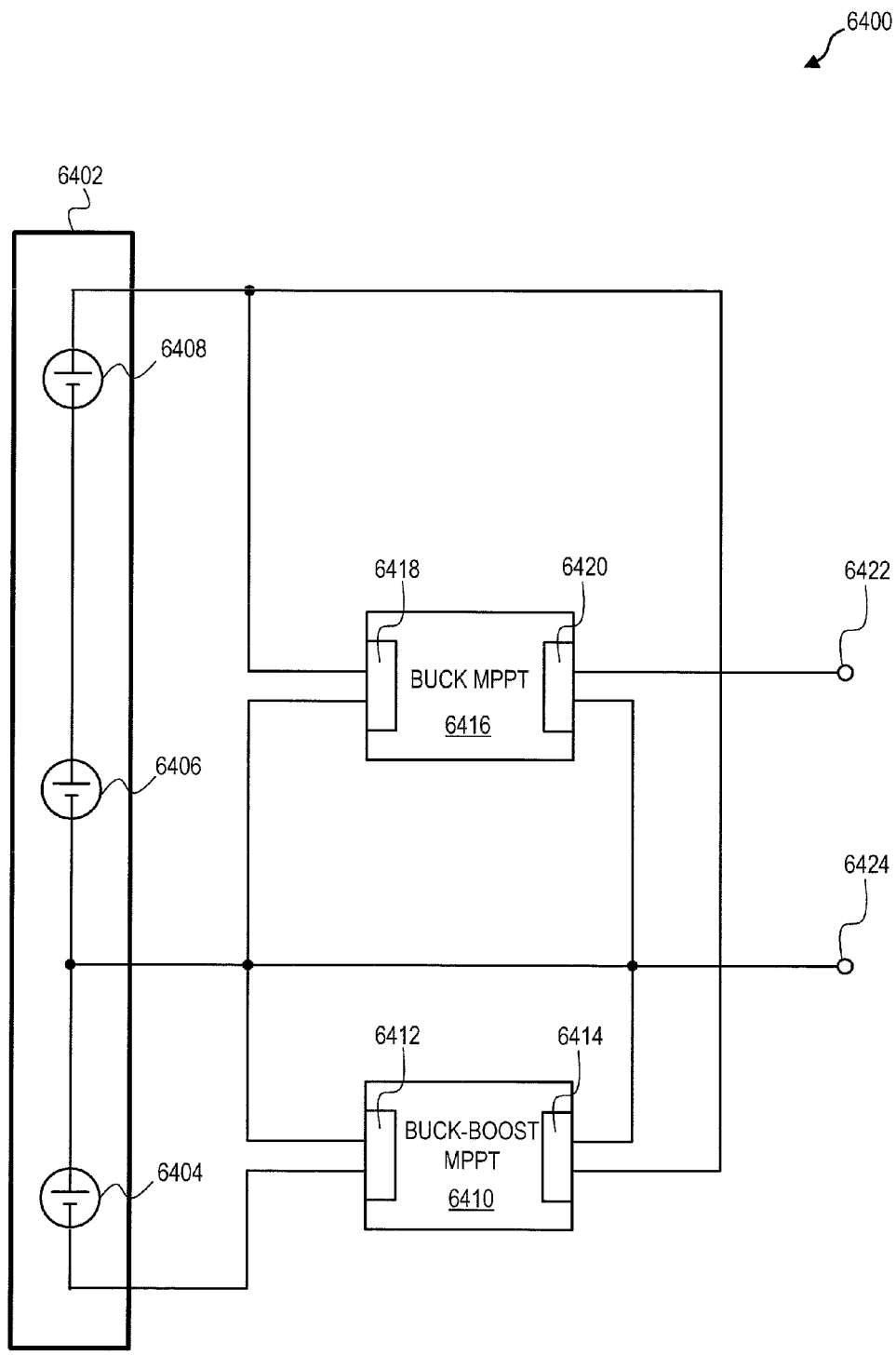
FIG. 64 shows a unit cell including a buck-boost type converter, according to an embodiment.

FIG. 64 shows another unit cell 6400 providing MPPT for a multi-junction photovoltaic cell 6402 including series coupled first, second, and third photovoltaic junctions 6404, 6406, 6408. Unit cell 6400 includes a buck-boost-type MPPT converter 6410 including an input port 6412 and an output port 6414. Input port 6412 is electrically coupled across first photovoltaic junction 6404, and output port 6414 is electrically coupled across the series combination of second and third photovoltaic junctions 6406, 6408.

Unit cell 6400 further includes buck-type MPPT converter 6416 including an input port 6418 and an output port 6420. Input port 6418 is electrically coupled across the second and third photovoltaic junctions 6406, 6408, and output port 6420 is electrically coupled across unit cell output terminals 6422, 6424. In some embodiments, output terminals 6422, 6424 are electrically coupled in series with other instances of unit cell 6400 and with a load. Buck-type MPPT converter 6416 is, for example, an embodiment of switching circuit 504 (FIG. 5) or switching circuit 604 (FIG. 6). Although buck-type MPPT converter 6416 is symbolically shown as a discrete device, certain embodiments of converter 6416 use interconnection inductance of an output circuit including output port 6420 as their primary energy storage inductance.

Buck-boost type and buck-type MPPT converters 6410 and 6416 are each operable to at least substantially maximize an amount of electric power extracted from the photovoltaic junctions electrically coupled across their respective input ports, thereby providing effective MPPT for each of (1) the series combination of top two photovoltaic junctions 6406, 6408, and (2) bottom photovoltaic junction 6404. Converters 6410, 6416 are optionally switched out of phase with respect to each other to reduce ripple, and converters 6410, 6416 optionally share one or more common components, such as a common controller. Converters 6410, 6416 are part of a common integrated circuit chip in some embodiments.

A potential advantage of unit cell 6400 over unit cells 5600 and 6300 (FIGS. 56 and 63) is that input voltage to buck-type MPPT converter 6416 is typically lower than input voltage to the analogous converters of FIGS. 56 and 63. Such relatively low input voltage promotes efficient converter 6416 operation and may enable use of components with relatively low voltage ratings. On the flip-side, input current into buck-type MPPT converter 6416 will typically be higher than the input current to the analogous converters of FIGS. 56 and 63 due to converter 6416's relatively low input voltage.

Figure 65:
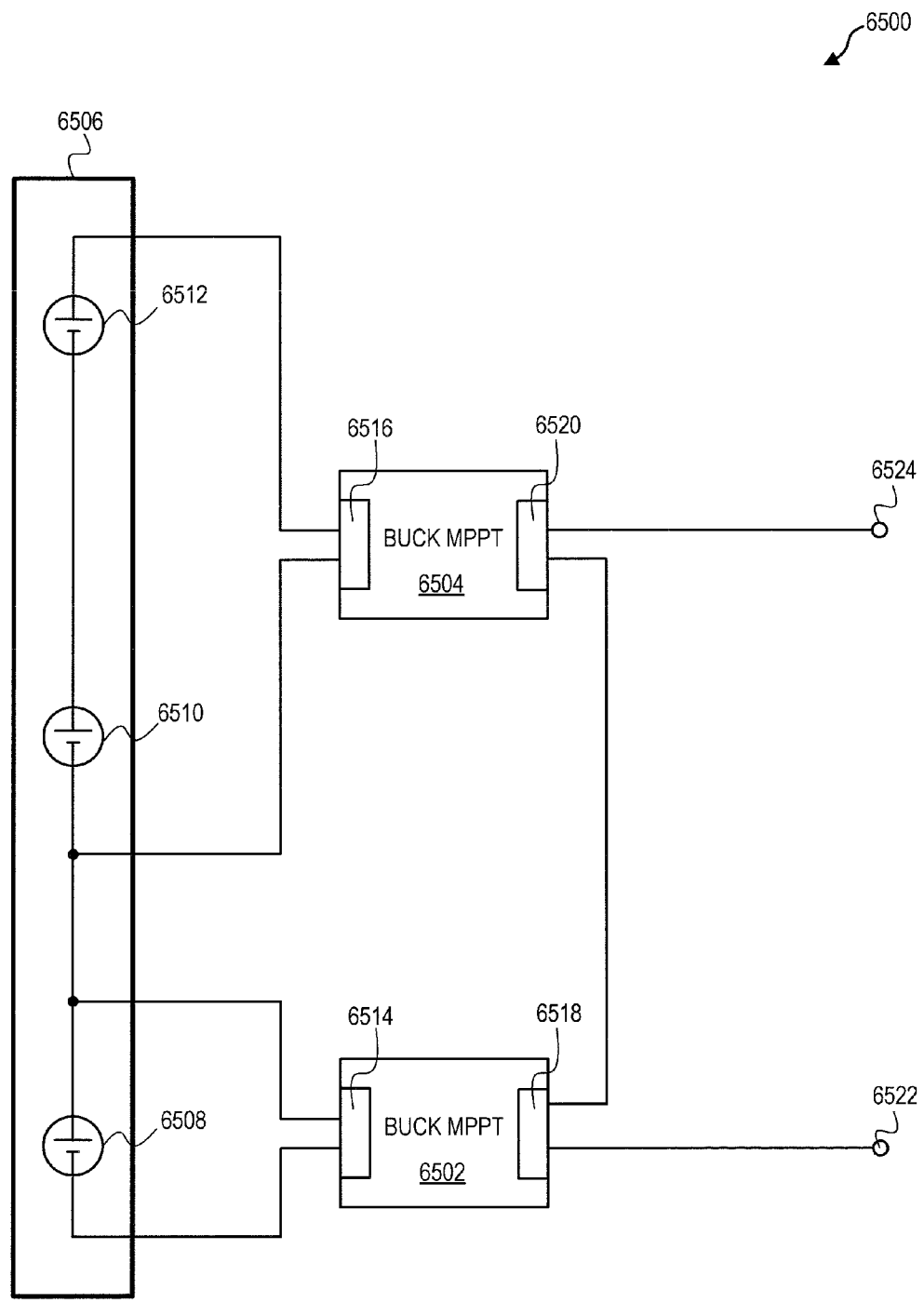
FIG. 65 shows a unit cell including two MPPT DC-to-DC converters with their output ports electrically coupled in series, according to an embodiment.

FIG. 65 shows a unit cell 6500 including two buck-type MPPT converters 6502, 6504 for providing MPPT for a multi-junction photovoltaic cell 6506. Photovoltaic cell 6506 includes three photovoltaic junctions 6508, 6510, 6512 electrically coupled in series. An input port 6514 of buck-type MPPT converter 6502 is electrically coupled across first photovoltaic junction 6508, and an input port 6516 of buck-type MPPT converter 6504 is electrically coupled across both of second and third photovoltaic junctions 6510, 6512. Output ports 6518, 6520 of buck-type MPPT converters 6502, 6504 are electrically coupled in series with unit cell 6500 output terminals 6522, 6524. Output terminals 6522, 6524 are, for example, electrically coupled in series with additional instances of unit cell 6500 and with a load.

MPPT converters 6502 and 6504 are each operable to at least substantially maximize an amount of electric power extracted from the photovoltaic junctions electrically coupled across their respective input ports, thereby providing effective MPPT for each of (1) the series combination of top two photovoltaic junctions 6510, 6512, and (2) bottom photovoltaic junction 6508. Although each of buck-type MPPT converters 6502, 6504 is symbolically shown as a discrete converter, in some embodiments, converters 6502, 6504 each use interconnection inductance of a closed circuit including output ports 6518, 6520 as their energy storage inductance. Converters 6502, 6504 are each, for example, an embodiment of switching circuit 504 (FIG. 5) or switching circuit 604 (FIG. 6) using interconnection inductance as energy storage inductance. Converters 6502, 6504 are optionally switched out of phase with respect to each other to reduce ripple, and converters 6502, 6504 may share one or more common components, such as a common controller. In some embodiments, converters 6502, 6504 are part of a common integrated circuit chip.

In typical embodiments, magnitude of current through first photovoltaic junction 6508 is typically significantly larger than magnitude of current through top two photovoltaic junctions 6510, 6512. However, because output ports 6518, 6520 are electrically coupled in series, each of buck-type MPPT converter 6502, 6504 must have the same output current magnitude, which is typically a function of current through first junction 6508, due to junction 6508's relatively large current magnitude generation. As a result, current though converter 6504's output port 6520 is typically higher than optimum, thereby causing converter 6504 to operate with a duty cycle below fifty percent and degrading the converter's efficiency.

Figure 66:
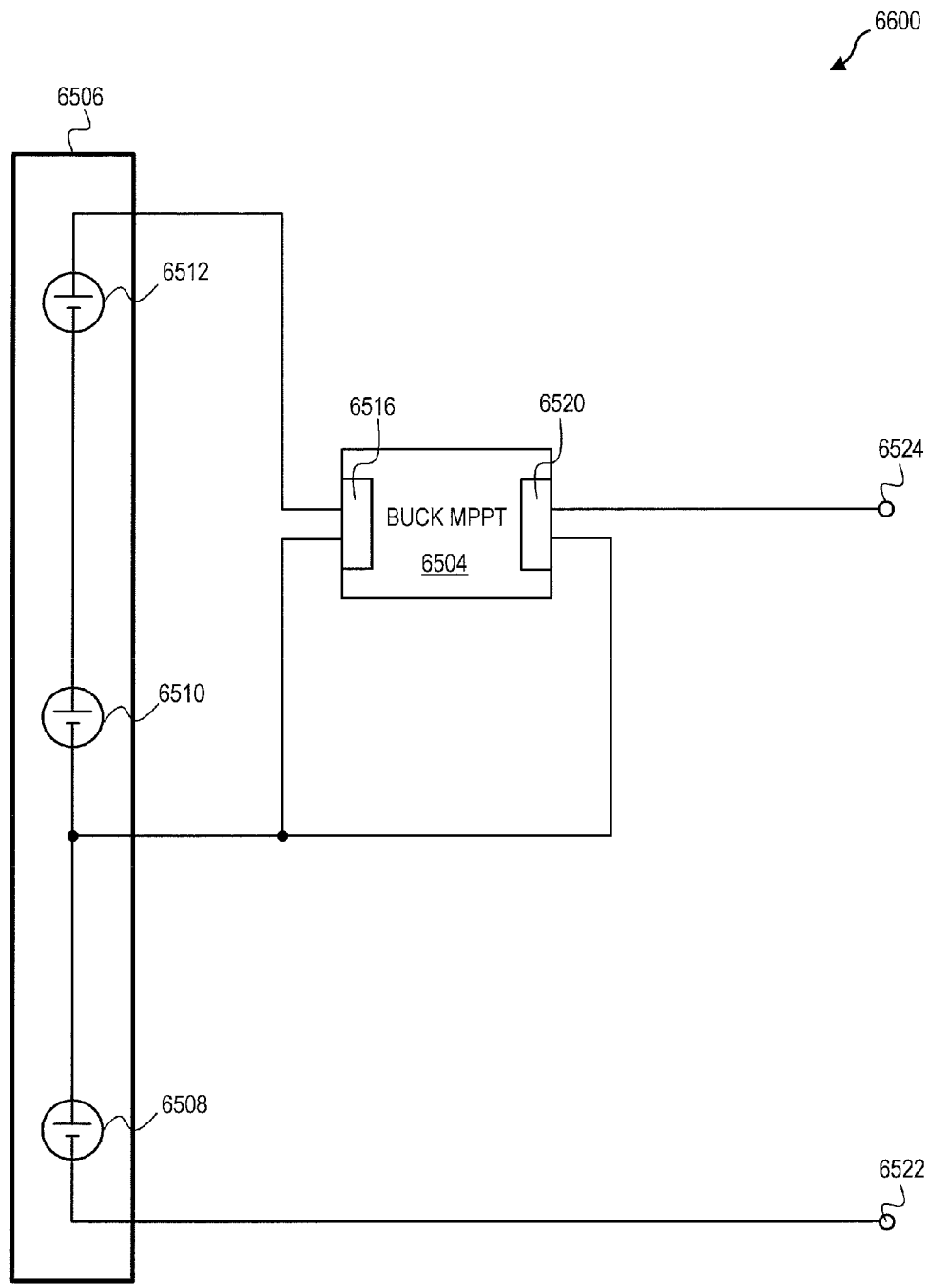
FIG. 66 shows an alternate embodiment of the unit cell of FIG. 65.

Alternate embodiments of unit cell 6500 include only a single buck-type MPPT converter. For example, FIG. 66 shows unit cell 6600, which is similar to unit cell 6500 (FIG. 65) but with buck-type MPPT converter 6502 omitted. Remaining buck-type MPPT converter 6504 matches current flowing through first photovoltaic junction 6508. As discussed above, although buck-type MPPT converter 6504 is symbolically shown as a discrete device, converter 6504 uses interconnection inductance as its primary energy storage inductance in some embodiments. Unit cell 6600 has the advantage of being lower cost and simpler than unit cell 6500. However, unit cell 6600 may not perform as well as unit cell 6500 because first photovoltaic junction 6508 may limit magnitude of current through the unit cell.

Figure 67:
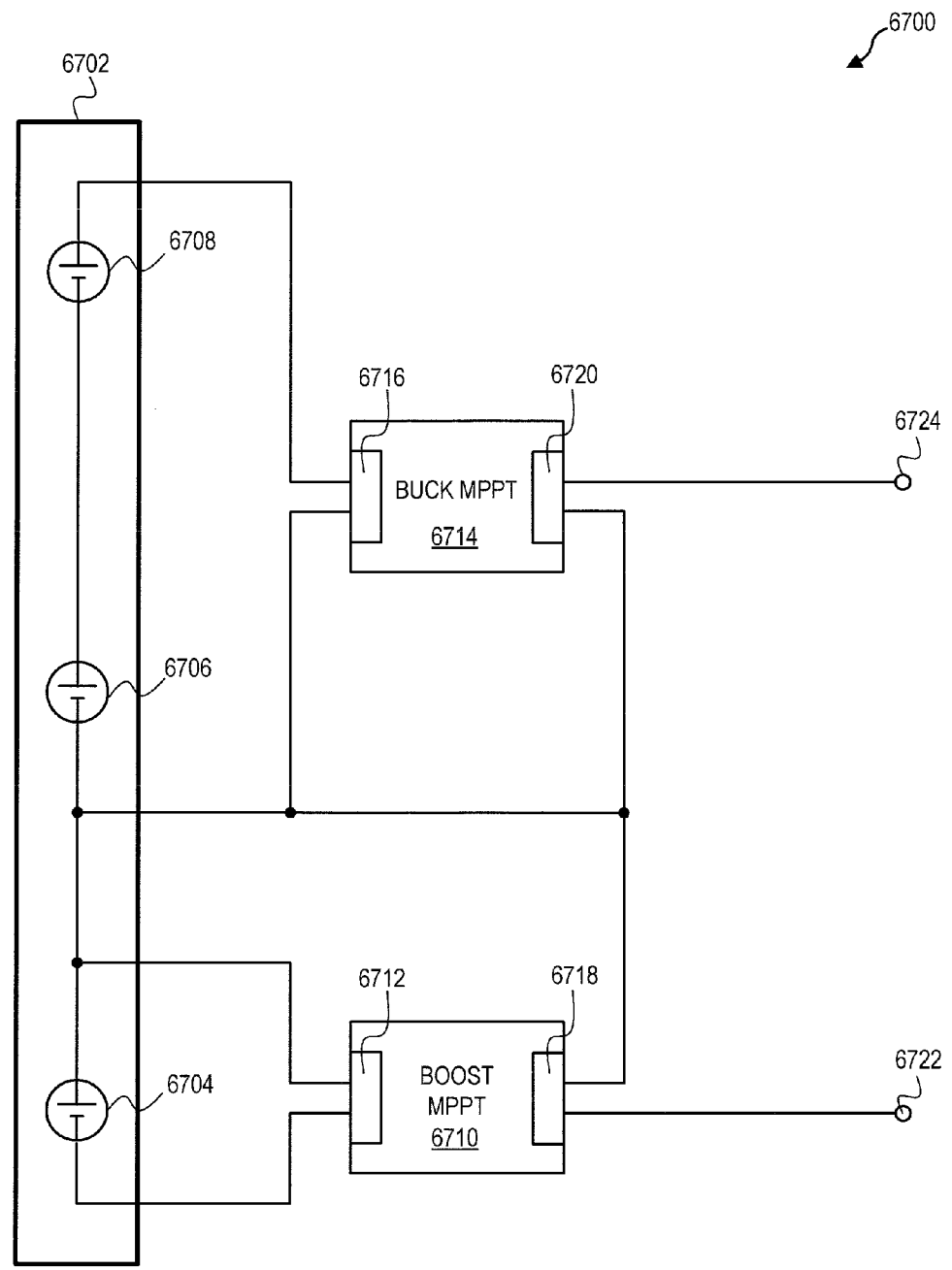
FIG. 67 shows a unit cell including a boost-type and a buck-type MPPT converter, according to an embodiment.

FIG. 67 shows a unit cell 6700 which is similar to unit cell 6500 (FIG. 65) but with the bottom buck-type MPPT converter replaced with a boost-type MPPT converter. In particular, unit cell 6700 includes a multi-junction photovoltaic cell 6702 including first, second, and third photovoltaic junctions 6704, 6706, 6708 electrically coupled in series. Unit cell 6700 includes a boost type MPPT converter 6710 with an input port 6712 electrically coupled across first photovoltaic junction 6704, and a buck-type MPPT converter 6714 with an input port 6716 electrically coupled across second and third photovoltaic junctions 6706, 6708. Boost-type converter 6710's output port 6718 and buck-type converter 6714's output port 6720 are electrically coupled in series with unit cell output terminals 6722, 6724. Unit cell 6700's topology necessitates that buck-type MPPT converter 6714 include a discrete energy storage inductor (not shown). Buck-type MPPT converter 6714 is, for example, an embodiment of switching circuit 604 (FIG. 6) including a discrete energy storage inductor. In some embodiments, output terminals 6722, 6724 are electrically coupled in series with additional instances of unit cell 6700 and with a load. MPPT converters 6714 and 6710 are each operable to at least substantially maximize an amount of electric power extracted from the photovoltaic junctions electrically coupled across their respective input ports, thereby providing effective MPPT for each of (1) the series combination of top two photovoltaic junctions 6706, 6708, and (2) bottom photovoltaic junction 6704. Converters 6710, 6714 are optionally switched out of phase with each other to reduce ripple, and converters 6710, 6714 optionally share one or more components, such as a common controller. Converters 6710, 6714 are part of a common integrated circuit chip in some embodiments.

Figure 68:
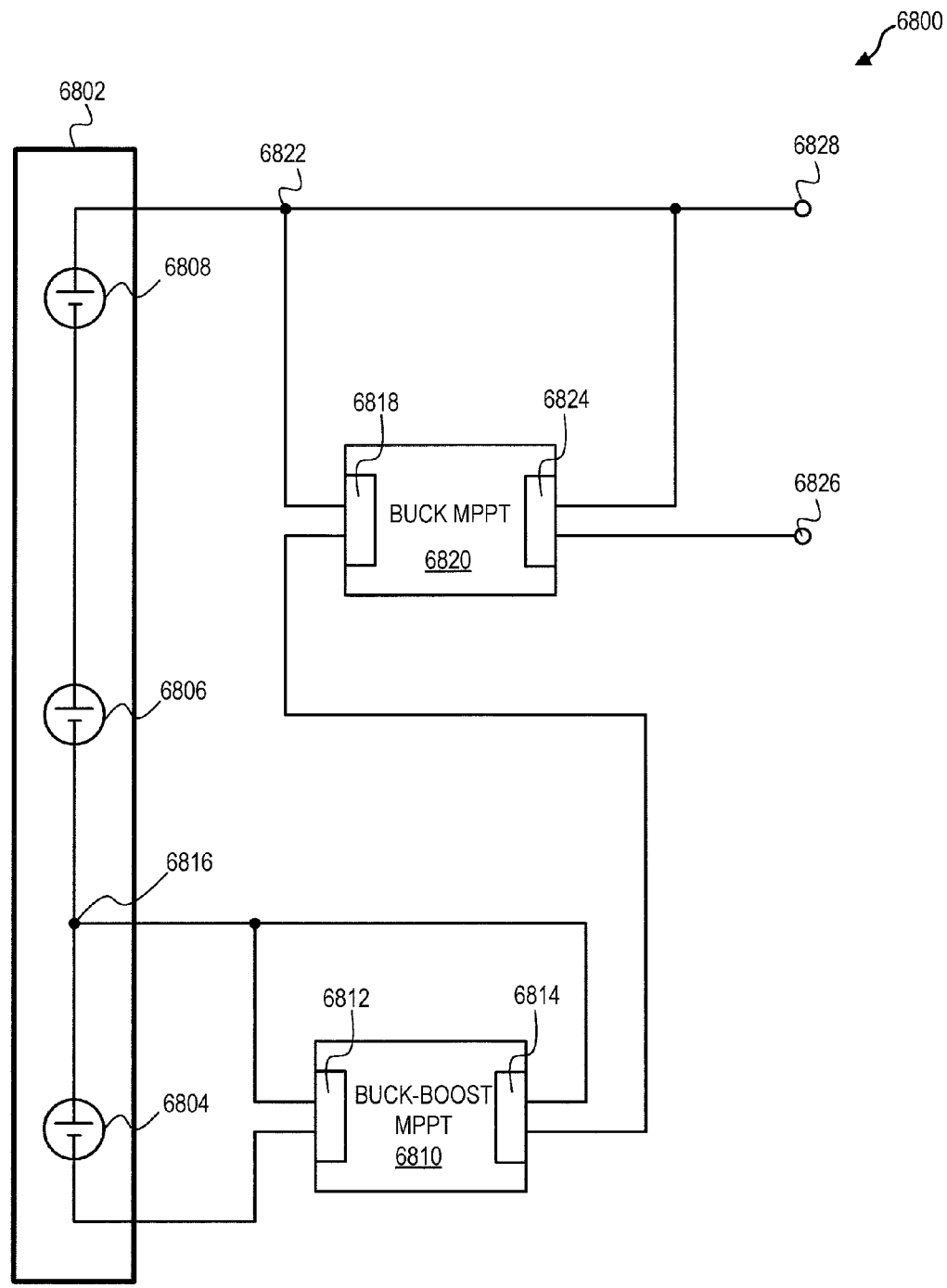
FIG. 68 shows a unit cell including two stacked MPPT DC-to-DC converters, according to an embodiment.

FIG. 68 shows a unit cell 6800 including two stacked MPPT DC-to-DC converters. Unit cell 6800 includes a multi-junction photovoltaic cell 6802 including first, second, and third electrically coupled photovoltaic junctions 6804, 6806, 6808. A buck-boost-type MPPT converter 6810 has an input port 6812 electrically coupled across first photovoltaic junction 6804. An output port 6814 of buck-boost-type MPPT converter is electrically coupled between a node 6816 where first and second junctions 6804, 6806 are electrically coupled, and an input port 6818 of a buck-type MPPT converter 6820. The other end of input port 6818 is electrically coupled to a top node 6822 of the series stack of photovoltaic junctions 6804, 6806, 6808. Thus, input port 6818 is electrically coupled across the series combination of second and third photovoltaic junctions 6806, 6808 and buck-boosted first photovoltaic junction 6804. Buck-type MPPT converter 6820 includes an output port 6824 electrically coupled across unit cell output terminals 6826, 6828, where output terminal 6828 is also electrically coupled to top node 6822. In some embodiments, output terminals 6826, 6828 are electrically coupled in series with additional instances of unit cell 6800 and with a load. Although buck-type MPPT converter 6820 is symbolically shown as a discrete converter, in some embodiments, the converter uses interconnection inductance of a closed circuit including output port 6824 as its primary energy storage inductance. In some embodiments, buck-type MPPT converter 6820 is an embodiment of switching circuit 504 (FIG. 5) using interconnection inductance as its energy storage inductance.

Buck-boost-type MPPT converter 6810 at least substantially maximizes power extracted from first photovoltaic junction 6804, and buck-type MPPT converter 6820 at least substantially maximizes power extracted from top two photovoltaic junctions 6806, 6808 and buck-boosted first photovoltaic junction 6804. Accordingly, converters 6810, 6820 collectively effectively provide MPPT for each of (1) the series combination of top two photovoltaic junctions 6806, 6808, and (2) bottom photovoltaic junction 6804. One potential advantage of unit cell 6800 over unit cells 5600, 6300, 6400, and 6500 (FIGS. 56 and 63-65) is that voltage across output terminals 6826, 6828 is typically greater than the output voltage of the other unit cells, thereby potentially decreasing overall system current. Converters 6810, 6820 are optionally switched out of phase with respect to each other, and converters 6810, 6820 optionally share one or more components, such as a common controller. In some embodiments, converters 6810, 6820 are part of a common integrated circuit chip.

Figure 69:
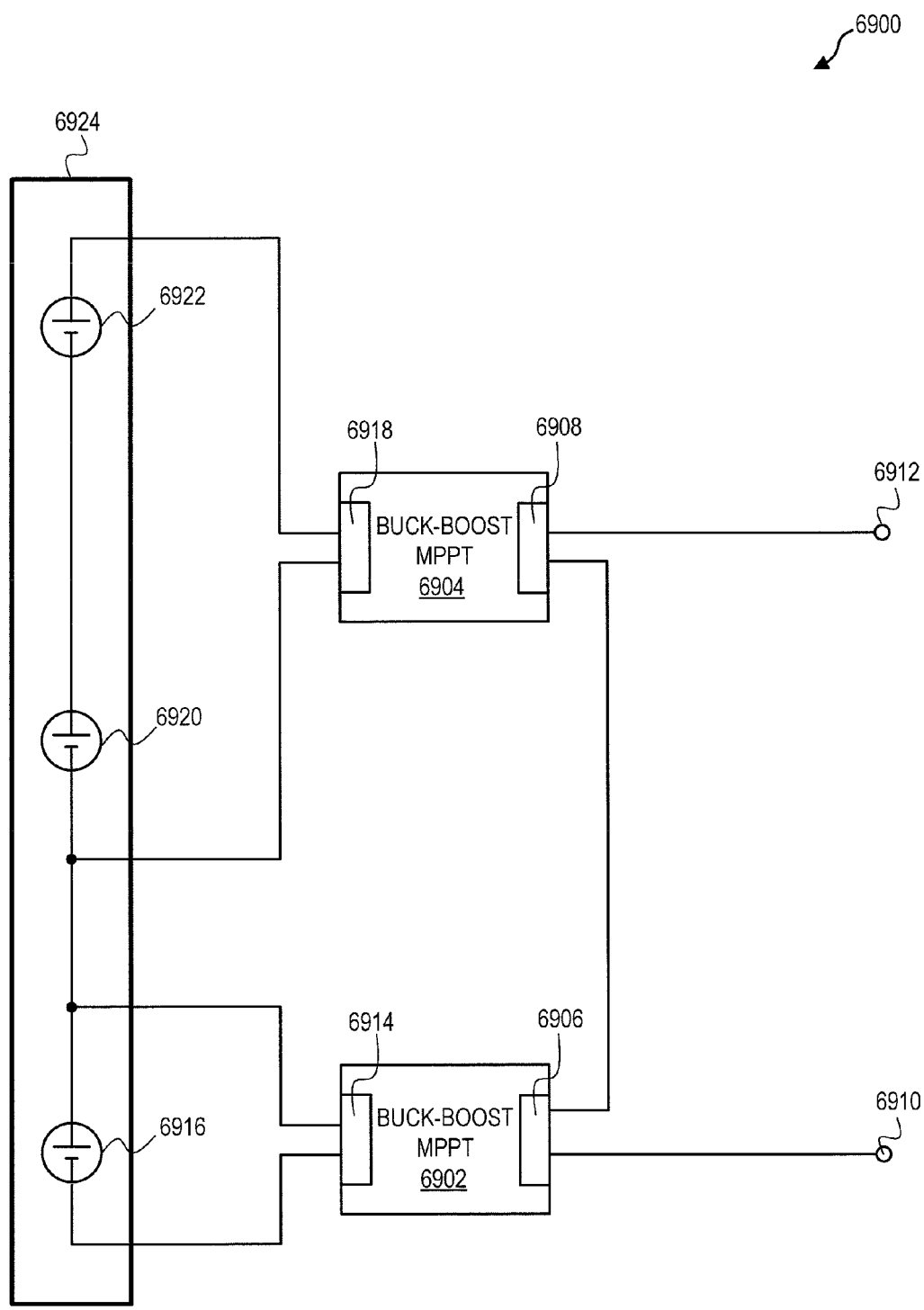
FIG. 69 shows a unit cell including buck-boost-type MPPT DC-to-DC converters, according to an embodiment.

FIG. 69 shows a unit cell 6900 including two buck-boost-type converters 6902, 6904 with their output ports 6906, 6908 electrically coupled in series with unit cell output terminals 6910, 6912. An input port 6914 of buck-boost-type MPPT converter 6902 is electrically coupled across a first photovoltaic junction 6916, and an input port 6918 of buck-boost-type MPPT converter 6904 is electrically coupled across both of second and third photovoltaic junctions 6920, 6922. First, second, and third photovoltaic junctions 6916, 6920, 6922 are electrically coupled in series and are part of a common multi-junction photovoltaic cell 6924.

Buck-boost-type MPPT converter 6902 is operable to at least substantially maximize power extracted from first photovoltaic junction 6916, and buck-boost-type MPPT converter 6904 is operable to at least substantially maximize power extracted from the series combination of second and third photovoltaic junctions 6920, 6922. In certain embodiments, buck-boost-type MPPT converters 6902, 6904 are operable to perform MPPT while cooperatively maintaining a constant voltage across unit cell output terminals 6910, 6912. Accordingly, voltage across a series coupled string of unit cells 6900 can be controlled without use of additional circuitry, which can be particularly advantageous when a number of such series string are to be electrically coupled in parallel.

Although not required, it is anticipated that in many embodiments, each of buck-boost type converters 6902, 6904 will be switched out of phase with respect to each other to minimize ripple and/or will share at least some common components. Additionally, in some embodiments, converters 6902, 6904 are part of a common integrated circuit chip.

The systems discussed above with respect to FIGS. 63-69 could be adapted for use with photovoltaic cells having a different number of junctions. For example, unit cell 6900 (FIG. 69) could be modified to incorporate a four junction photovoltaic cell, where input ports 6914, 6916 are each electrically coupled across a respective pair of series coupled photovoltaic junctions.

The systems discussed above with respect to FIGS. 55, 56, and 63-69 could be adapted for use with a split spectrum photovoltaic device including two or more discrete photovoltaic devices and optics to direct light of appropriate wavelength to the discrete photovoltaic devices. For example, in an alternate embodiment of electric power system 5500 (FIG. 55), multi-junction photovoltaic cell 5502 is replaced with first and second discrete photovoltaic devices and optics to direct light of appropriate wavelength to the first and second photovoltaic devices. In this alternate embodiment, the first discrete photovoltaic device includes two junctions analogous to second and third junctions 5506, 5508 of multi-junction photovoltaic cell 5502, and the second discrete photovoltaic device includes a single junction analogous to first junction 5504 of cell 5502.

Figure 36:
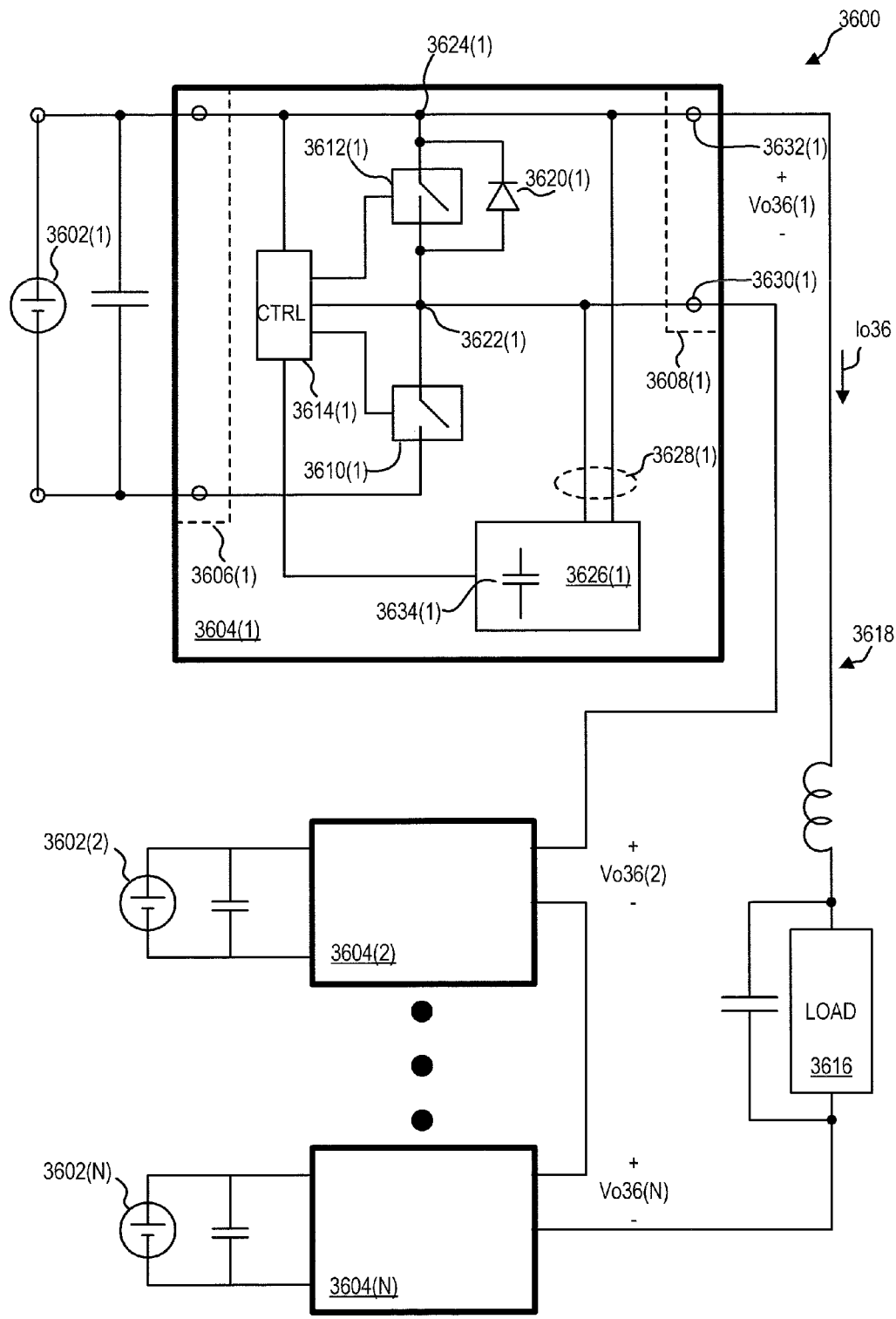
FIG. 36 shows an electric power system including switching circuits powered from respective electric power sources during normal operation, according to an embodiment.

As previously discussed, some embodiments of the switching circuits discussed herein are configured to be powered from a respective electric power source (e.g., a photovoltaic device) electrically coupled thereto. For example, FIG. 36 shows an electric power system 3600 including N electric power sources 3602, where N is an integer greater than one. Electric power sources 3602, for example, are photovoltaic devices, such as photovoltaic arrays, individual photovoltaic cells, or individual junctions of a multi-junction photovoltaic cell. Each electric power source 3602 is electrically coupled to a respective switching circuit 3604, which is configured to at least substantially maximize an amount of electric power extracted from the electric power source 3602. Each switching circuit 3604 is powered from its respective electric power source 3602 during normal operating conditions. Details of only switching circuit 3604(1) are shown to promote illustrative clarity.

Switching circuits 3604 are similar to switching circuits 504 (FIG. 5). In particular, each switching circuit 3604 includes an input port 3606, an output port 3608, a first switching device 3610, a second switching device 3612, and a controller 3614. Each input port 3606 is electrically coupled to a respective electric power source 3602, and each output port 3608 electrically coupled in series with a load 3616 to form a closed circuit, hereinafter referred to as output circuit 3618. In each switching circuit 3604, controller 3614 controls duty cycle of first switching device 3610 to at least substantially maximize an average value of output voltage Vo36, and second switching device 3612 provides a path for output current Io36 when first switching device 3610 turns off.

In each switching circuit, a diode 3620 is electrically coupled in parallel with second switching device 3612. An anode of diode 3620 is electrically coupled to an intermediate switching node 3622, and a cathode of diode 3620 is electrically coupled to a positive input node 3624. Diode 3620 provides a bypass path for output circuit current Io36 when neither first nor second switching devices 3610, 3612 are turned on, such as in situations where electric power source 3602 provides little or no power. In certain embodiments, diode 3620 is integrated in second switching device 3612. For example, in embodiments where second switching device 3612 is a MOSFET, diode 3620 could be a body diode of the MOSFET.

Each switching circuit 3604 further includes an energy storage device 3626, such as a charge pump circuit, that stores energy from output circuit 3618. In each switching circuit 3604, energy storage device 3626 at least partially powers controller 3614 when power source 3602 provides insufficient power to operate controller 3614. In the embodiment of FIG. 36, energy storage device 3626 receives power from output circuit 3618 via inputs 3628 that are electrically coupled across output terminals 3630, 3632 of output port 3608. Thus, in such embodiment, a voltage drop across diode 3620 is effectively up-converted by energy storage device 3626 to a voltage that is high enough to at least partially power controller 3614 and to operate second switching device 3612. However, in alternate embodiments, inputs 3628 electrically couple to output circuit 3618 in other ways, such as across load 3616.

In certain embodiments, controller 3614 is configured to operate second switching device 3612 in its conductive state when electric power source 3602 provides insufficient power to operate controller 3614. Thus, under such conditions, output current Io36 flows through second switching device 3612, instead of through diode 3620, thereby promoting high efficiency as a forward voltage drop across second switching device 3612 is typically much smaller than a forward voltage drop across diode 3620. Energy storage device 3626 provides the requisite energy to enable controller 3614 to operate second switching device 3612 when electric power source 3602 provides little or no electric power. Controller 3614 is configured, for example, to operate second switching device 3612 in its conductive state when a voltage across diode 3620 exceeds a predetermined threshold value for a predetermined amount of time, indicating bypassing of electric power source 3602.

In some embodiments energy storage device 3626 periodically charges a capacitor, an inductor, or a battery, from energy of output circuit 3618 and powers the controller 3614 from energy stored in the capacitor, inductor, or battery. For example, in the embodiment of FIG. 36, a capacitor 3634 is periodically charged from energy available from output terminals 3630, 3632, and during such charging time, diode 3620, and not second switching device 3612, is in its conductive state. Thus, diode 3620 and second switching device 3612 alternately conduct current to provide a bypass path for output current Io36 when electric power source 3602 provides little or no more power.

Figure 37:
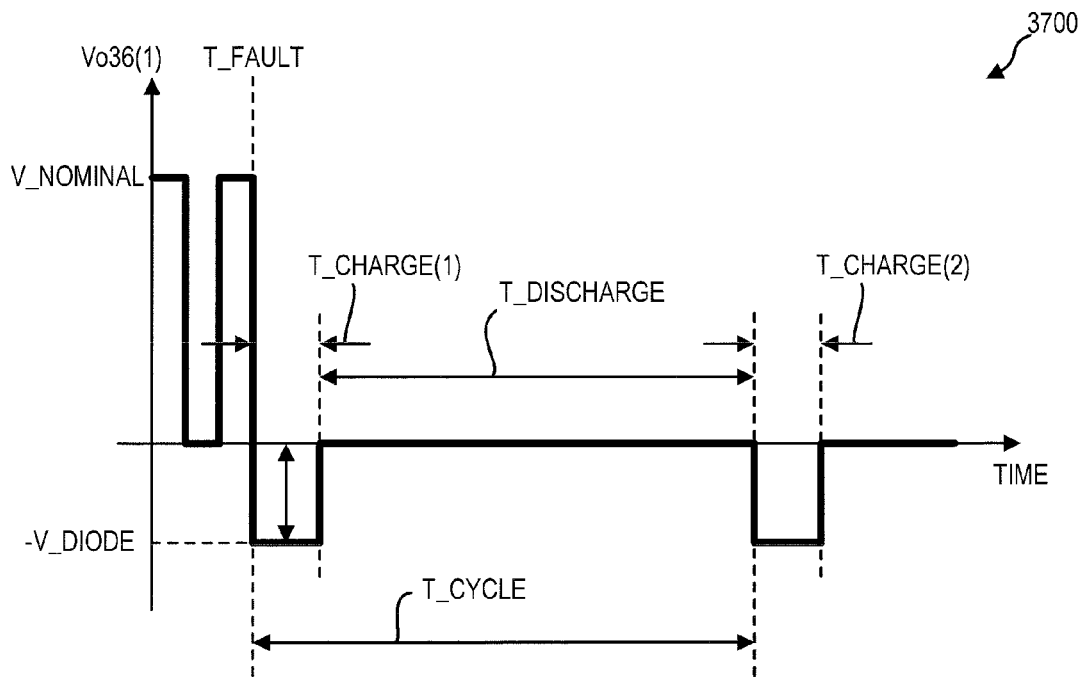
FIG. 37 shows a graph of output voltage of a switching circuit of the electric power system of FIG. 36.

For example, FIG. 37 shows a graph 3700 of output voltage Vo36(1) of switching circuit 3604(1) versus time. Prior to time T_FAULT, electric power source 3602(1) is operating normally, and switching circuit 3604(1) generates a square wave output having a peak value of V_NOMINAL. At T_FAULT, electric power source 3602(1) stops providing power (e.g., due to its failure or due to shading if it is a photovoltaic device). Controller 3614(1) is no longer powered, and diode 3620(1) conducts load current Io36 generated by other electric power sources 3602 in system 3600, resulting in an output voltage equal to −V_DIODE. During period T_CHARGE(1), energy storage device 3626(1) is charged— that is, it stores energy from output circuit 3618 via output terminals 3630(1), 3632(1) while diode 3620(1) conducts. At the end of T_CHARGE(1), energy storage device 3626(1) enables controller 3614(1) to operate second switching device 3612(1) in its conductive state during a period T_DISCHARGE, such that output voltage Vo36(1) is close to zero due to the second switching device's low forward voltage drop. At the expiration of period T_DISCHARGE, energy storage device 3626(1) is charged again during period T_CHARGE(2) while diode 3620(1) again conducts. Charge/discharge cycle T_CYCLE repeats until electric power source 3602(1) resumes providing power or output current Io36 drops to zero. T_DISCHARGE is typically significantly greater than T_CHARGE, and second switching device 3612(1) therefore typically conducts the majority of cycle T_CYCLE, promoting efficient bypassing. In particular, use of energy storage device 3626(1) to enable operation of second switching device 3612(1) when electric power source 3602(1) is not providing power reduces losses by approximately T_CHARGE/T_CYCLE when bypassing output current Io36.

It should be appreciated that switching circuits 3604 provide both MPPT functionality as well as active bypassing of electric power sources 3602. Thus, an electric power system incorporating switching circuits 3604 advantageously need not require additional bypass devices to achieve efficient bypassing, thereby potentially reducing overall system cost, size, and/or complexity. It should also be appreciated that switching circuit 3604 achieves active bypassing without requiring an additional switching device—in particular, second switching device 3612 serves to provide both a low voltage drop bypass path as well as to transfer power during normal MPPT operation.

Combinations of Features

Features described above as well as those claimed below may be combined in various ways without departing from the scope hereof. The following examples illustrate some possible combinations:

(A1) A switching circuit for extracting power from an electric power source may include (1) an input port for electrically coupling to the electric power source, (2) an output port for electrically coupling to a load, (3) a first switching device configured to switch between its conductive state and its non-conductive state to transfer power from the input port to the output port, (4) an intermediate switching node that transitions between at least two different voltage levels at least in part due to the first switching device switching between its conductive state and its non-conductive state, and (5) a controller for controlling the first switching device to maximize an average value of a voltage at the intermediate switching node.

(A2) In the switching circuit of denoted as (A1), the controller may be adapted to repeatedly sample the average value of the voltage at the intermediate switching node and control switching of the first switching device at least partly based on at least two successive samples of the average value of the voltage at the intermediate switching node.

(A3) In either of the switching circuits denoted as (A1) or (A2), the controller may be adapted to control switching of the first switching device in response to a difference between two successive samples of the average value of the voltage at the intermediate switching node.

(A4) In any of the switching circuits denoted as (A1) through (A3), the controller may be adapted to control switching of the first switching device in response to a sign of the difference between two successive samples of the average value of the voltage at the intermediate switching node.

(A5) In any of the switching circuits denoted as (A1) through (A4), the controller may be adapted to control switching of the first switching device in response to a magnitude of the difference between two successive samples of the average value of the voltage at the intermediate switching node.

(A6) In any of the switching circuits denoted as (A1) through (A3), the controller may be configured to control switching of the first switching device in response to both a sign and a magnitude of the difference between two successive samples of the average value of the voltage at the intermediate switching node.

(A7) In any of the switching circuits denoted as (A1) through (A6), the controller may include a sampling circuit configured to generate at least two successive samples of the average value of the voltage at the intermediate switching node.

(A8) In the switching circuit denoted as (A7), the sampling circuit may include a first and a second sampling circuit, and the first sampling circuit may be configured to sample the average value of the voltage at the intermediate switching node at a different time than the second sampling circuit.

(A9) In any of the switching circuits denoted as (A1) through (A8), the controller may include a first and a second low pass filter, the first low pass filter may be configured to generate an average value of the voltage at the intermediate switching node for a first sampling circuit, and the second low pass filter may be configured to generate an average value of the voltage at the intermediate switching node for a second sampling circuit.

(A10) In the switching circuit denoted as (A9), each of the first and second low pass filters may have a respective time constant greater than a switching period of the first switching device.

(A11) In either of the switching circuits denoted as (A9) or (A10), the first and second low pass filters may share at least one component.

(A12) In any of the switching circuits denoted as (A1) through (A11), a starting time of the switching circuit controller may be loosely controlled.

(A13) In any of the switching circuits denoted as (A1) through (A12), the controller may be configured to repeatedly sample the average value of the voltage at the intermediate switching node at a sampling rate that is sufficiently fast such that a percentage change in current out of the output port is less than a percentage change in duty cycle of the first switching device between successive samples of the average value of the voltage at the intermediate switching node.

(A14) In any of the switching circuits denoted as (A1) through (A13), the controller may be configured to repeatedly sample the average value of the voltage at the intermediate switching node at a sampling rate that is sufficiently fast such that $\Delta I/I_R$ is less than $\Delta D/D_R$, wherein:

$\Delta I$ is a change in current out of the output port between first and second successive samples of the average value of the voltage at the intermediate switching node, the second sample occurring after the first sample;

$I_R = I_{max} - I_{min}$;

$I_{max}$ is a maximum expected value of current out of the output port;

$I_{min}$ is a minimum expected value of current out of the output port;

$\Delta D$ is a change in duty cycle of the first switching device between the first and second successive samples of the average value of the voltage at the intermediate switching node; and $D_R$ is a difference between a maximum expected duty cycle and a minimum expected duty cycle of the first switching device.

(A15) In any of the switching circuits denoted as (A1) through (A14), the controller may be adapted to repeatedly sample the average value of the voltage at the intermediate switching node at a frequency that is less than a frequency at which the first switching device switches between its conductive and non-conductive states.

(A16) In any of the switching circuits denoted as (A1) through (A15), the controller may be adapted to repeatedly sample the average value of the voltage at the intermediate switching node at a frequency that is less than one tenth of a frequency at which the first switching device switches between its conductive and non-conductive states.

(A17) In any of the switching circuits denoted as (A1) through (A16), the input port may include a first and a second input terminal, the output port may include a first and a second output terminal, the first switching device may be electrically coupled between the first input terminal and the intermediate switching node, the switching circuit may further include a device selected from the group consisting of a second switching device and a diode electrically coupled between the second input terminal and the intermediate switching node, and the device may be configured to provide a path for current between the first and second output terminals when the first switching device is in its non-conductive state.

(A18) In the switching circuit denoted as (A17), the first output terminal may be electrically coupled to the intermediate switching node, and the second output terminal may be electrically coupled to the second input terminal.

(A19) In any of the switching circuits denoted as (A1) through (A16), the input port may include a first and a second input terminal, the output port may include a first and a second output terminal, the first switching device may be electrically coupled between the first input terminal and the intermediate switching node, the switching circuit may further include a second switching device and a diode each electrically coupled between the second input terminal and the intermediate switching node, and the second switching device and the diode may be configured to provide a path for current between the first and second output terminals when the first switching device is in its non-conductive state.

(A20) In any of the switching circuits denoted as (A1) through (A16), the controller may be adapted to control the first switching device to maximize the average value of the voltage at the intermediate switching node in a first operating mode of the switching circuit, the controller may be further adapted to continuously operate the first switching device in its non-conductive state in a second operating mode of the switching circuit, the output port may include a first and a second output terminal, and the switching circuit may further include a device electrically coupled between the first and second output terminals and adapted to provide a path for current between the first and second output terminals when the first switching device is in its non-conductive state.

(A21) In the switching circuits denoted as (A20), the controller may be further configured to operate the switching circuit in the second operating mode if a magnitude of a voltage of an electric power source powering the controller is less than or equal to a threshold voltage.

(A22) In either of the switching circuits denoted as (A20) and (A21), the device electrically coupled between the first and second output terminals may include a diode.

(A23) In any of the switching circuits denoted as (A20) through (A23), the device electrically coupled between the first and second output terminals may include a depletion mode transistor.

(A24) In any of the switching circuits denoted as (A1) through (A16), the output port may include a first and a second output terminal, the switching circuit may further include a second switching device electrically coupled between the first and second output terminals, the controller may be adapted to control the first switching device to maximize the average value of the voltage at the intermediate switching node in a first operating mode of the switching circuit, and the controller may be adapted to continuously operate the second switching device in its conductive state in a second operating mode of the switching circuit.

(A25) In the switching circuits denoted as (A24), the controller may be further adapted to operate the switching circuit in the second operating mode if a magnitude of a voltage of an electric power source powering the controller is greater than a first threshold value and less than or equal to a second threshold value.

(A26) In either of the switching circuits denoted as (A24) and (A25), the controller may be further adapted to operate the switching circuit in the second operating mode upon occurrence of an event selected from the group consisting of (1) power transferred from the input port to the output port being below a threshold value, (2) a magnitude of current through the input port being below a threshold value, (3) current flowing between the first and second output terminals exceeding a threshold value, and (4) a temperature of the switching circuit exceeding a threshold value.

(A27) In any of the switching circuits denoted as (A1) through (A26), the switching circuit may further include a bias power supply port, and the controller may be configured to be at least partially powered from an electric power source electrically coupled to the bias power supply port when a magnitude of a voltage across the input port is below a threshold value.

(A28) In any of the switching circuits denoted as (A1) through (A27), the first switching device may include a transistor including a plurality of individually controllable transistor elements, at least some of the individually controllable transistor elements may be operable to be individually switched between their conductive and non-conductive states, and the controller may be configured to control an active number of the plurality of individually controllable transistor elements at least partially based on a duty cycle of the first switching device.

(A29) In any of the switching circuits denoted as (A1) through (A28), the switching circuit may further include an additional switching device configured to switch between its conductive and non-conductive states and to cooperate with the first switching device to transfer power from the input port to the output port, the additional switching device may include a transistor including a plurality of individually controllable transistor elements, where at least some of the individually controllable transistor elements may be operable to be individually switched between their conductive and non-conductive states, and the controller may be configured to control an active number of the plurality of individually controllable transistor elements at least partially based on a duty cycle of the second switching device.

(A30) In any of the switching circuits denoted as (A1) through (A29), the controller may be configured to control operation of the switching circuit such that current flows through the output port in only a single direction.

(A31) In any of the switching circuits denoted as (A1) through (A30), a frequency at which the first switching device switches between its conductive and non-conductive states may be loosely controlled.

(A32) At least two components of any of the switching circuits denoted as (A1) through (A31) may be part of a common integrated circuit chip.

(A33) Output ports of any two or more of the switching circuits denoted as (A1) through (A32) may be electrically coupled in series and/or in parallel.

(A34) A photovoltaic device may be electrically coupled to the input port of any one of the switching circuits denoted as (A1) through (A32).

(B1) A switching circuit for extracting power from an electric power source may include: (1) an input port for electrically coupling to the electric power source, (2) an output port for electrically coupling to a load, where the output port includes a first and a second output terminal, (3) a first switching device configured to switch between its conductive state and its non-conductive state to transfer power from the input port to the output port, (4) an energy storage device, and (5) a controller configured to control switching of the first switching device to at least substantially maximize an amount of power extracted from the electric power source. The switching circuit may be configured such that when an electric power source electrically coupled to the input port provides insufficient power to operate the controller and electric power is available at the output port, (1) the energy storage device is repeatedly charged from energy available via the first and second output terminals, and (2) the controller is at least partially powered from energy stored in the energy storage device.

(B2) The switching circuit denoted as (B1) may further include a second switching device configured to provide a path for current between the first and second output terminals when the first switching device is in its non-conductive state, and the controller may be adapted to cause the second switching device to operate in its conductive state when the controller is powered from the energy storage device.

(B3) The switching circuit denoted as (B2) may further include a diode electrically coupled in parallel with the second switching device.

(B4) In the switching circuit denoted as (B3), the second switching device and the diode may be part of a transistor.

(B5) In either of the switching circuits denoted as (B3) and (B4), the switching circuit may be configured such that when the electric power source electrically coupled to the input port provides insufficient power to operate the controller and electric power is available at the output port, the second switching device and the diode alternate conduction of current between the first and second output terminals.

(B6) In the switching circuit denoted as (B5), the second switching device may conduct current for a greater portion of time than the diode.

(B7) In any of the switching circuits denoted as (B1) through (B6), the input port may include a first and a second input terminal, the switching circuit may further include an intermediate switching node, the first switching device may be electrically coupled between the first input terminal and the intermediate switching node, the switching circuit may further include a second switching device electrically coupled between the second input terminal and the intermediate switching node, and the controller may be further adapted to control switching of the first switching device to maximize an average value of the voltage across the second switching device.

(B8) At least two components of any of the switching circuits denoted as (B1) through (B7) may be part of a common integrated circuit chip.

(B9) Output ports of any two or more of the switching circuits denoted as (B1) through (B8) may be electrically coupled in series and/or in parallel.

(B10) A photovoltaic device may be electrically coupled to the input port of any one of the switching circuits denoted as (B1) through (B8).

(C1) A switching circuit for extracting power from at least two electric power sources may include (1) first and second input ports and an output port, (2) a first subcircuit including a first switching device adapted to switch between its conductive and non-conductive states to transfer power from the first input port to the second input port, (3) a second subcircuit including a second switching device configured to switch between its conductive and non-conductive states to transfer power from the second input port to the output port, and (4) a controller adapted to control switching of at least the first and second switching devices to at least substantially maximize transfer of power from an electric power source electrically coupled across the first input port and an electric power source electrically coupled across the second input port to a load electrically coupled to the output port.

(C2) In the switching circuit denoted as (C1), the first subcircuit may include a switching circuit having a boost topology.

(C3) In the switching circuit denoted as (C1), the first subcircuit may include a switching circuit having a buck-boost topology.

(C4) In any of the switching circuits denoted as (C1) through (C3), the second switching device and a third switching device may be electrically coupled in series across the second input port, the third switching device also may be electrically coupled across the output port, and the third switching device may provide a path for current through the output port when the second switching device is in its non-conductive state.

(C5) In any of the switching circuits denoted as (C1) through (C4), the controller may be adapted to switch the first and second switching devices out of phase with respect to each other.

(C6) In any of the switching circuits denoted as (C1) through (C5), the controller may be configured to at least substantially maximize an average value of a voltage at a switching node of the second subcircuit.

(C7) At least two components of any of the switching circuits denoted as (C1) through (C6) may be part of a common integrated circuit chip.

(C8) Output ports of any two or more of the switching circuits denoted as (C1) through (C7) may be electrically coupled in series and/or in parallel.

(C9) A respective photovoltaic device may be electrically coupled to the first and second input port of any one of the switching circuits denoted as (C1) through (C7).

(D1) A switching circuit for extracting power from an electric power source may include (1) an input port for electrically coupling to the electric power source and an output port for electrically coupling to a load, (2) first and second switching devices electrically coupled in series across the input port, (3) third and fourth switching devices electrically coupled in series across the output port, (4) an energy storage inductor electrically coupled in series between first and second switching nodes, the first switching node being a node where the first and second switching devices are electrically coupled, the second switching node being a node where the third and fourth switching devices are electrically coupled, and (5) a controller for controlling operation of the first, second, third, and fourth switching devices. The controller may be adapted to control the switching devices such that (1) in a first operating mode of the switching circuit, the first and second switching devices and the energy storage inductor collectively operate as a buck converter to at least substantially maximize transfer of power from the electric power source to the load, and (2) in a second operating mode of the switching circuit, the third and fourth switching devices and the energy storage inductor collectively operate as a boost converter to at least substantially maximize transfer of power from the electric power source to the load.

(D2) In the switching circuit denoted as (D1), the controller may be adapted to (1) continuously operate the third switching device in its conductive state and the fourth switching device in its non-conductive state in the first operating mode of the switching circuit, and (2) continuously operate the first switching device in its conductive state and the second switching device in its non-conductive state in the second operating mode of the switching circuit.

(D3) In either of the switching circuits denoted as (D1) or (D2), the controller may be adapted to cause the first and second switching devices to switch between their conductive and non-conductive states of a frequency of at least 200 kilohertz in the first operating mode of the switching circuit, the controller may be adapted to cause the third and fourth switching devices to switch between their conductive and non-conductive states at a frequency of at least 200 kilohertz in the second operating mode of the switching circuit, and the switching circuit may further include a multi-layer ceramic capacitor electrically coupled across the input port.

(D4) In any of the switching circuits denoted as (D1) through (D3), the controller may be adapted to at least substantially maximize an average value of a voltage across the output port in at least one of the first and second operating modes of the switching circuit.

(D5) In any of the switching circuits denoted as (D1) through (D4), the controller may be adapted to decrease a magnitude of current drawn by the switching circuit from the electric power source if a voltage across the input port drops below a threshold value.

(D6) At least two components of any of the switching circuits denoted as (D1) through (D5) may be part of a common integrated circuit chip.

(D7) Output ports of any two or more of the switching circuits denoted as (D1) through (D6) may be electrically coupled in series and/or in parallel.

(D8) A photovoltaic device may be electrically coupled to the input port of any one of the switching circuits denoted as (D1) through (D6).

(E1) A method for operating a switching circuit coupled to an electric power source such that an amount of electric power extracted from the electric power source is at least substantially maximized may include the steps of (1) repeatedly determining an average value of a voltage at an intermediate switching node of the switching circuit, (2) comparing a most recent average value of the voltage at the intermediate switching node with a previous average value of the voltage at the intermediate switching node, (3) adjusting a duty cycle of a switching device of the switching circuit in a first direction if the most recent average value is greater than the previous average value, and (4) adjusting the duty cycle of the switching device in a second direction opposite of the first direction if the most recent average value is smaller than the previous average value.

(E2) The method denoted as (E1) may further include adjusting switching of the switching device to decrease an output power of the switching circuit if an output voltage of the electric power source drops below a first threshold value.

(E3) Either of the methods denoted as (E1) or (E2) may further include deactivating switching of the switching device if an output voltage of the electric power source is below a second threshold value.

(E4) Any of the methods denoted as (E1) through (E3) may further include continuously operating at least one switching device of the switching circuit in its conductive state if an output voltage of the electric power source is below a third threshold value.

(E5) Any of the methods denoted as (E1) through (E4) may further include decreasing a magnitude of current drawn by the switching circuit from the electric power source if an output voltage of the electric power source drops below a fourth threshold value.

(E6) Any of the methods denoted as (E1) through (E5) may further include repeatedly determining the average value of the voltage at the intermediate switching node at a frequency that is less than a frequency at which the switching device switches between its conductive and its non-conductive states.

(E7) Any of the methods denoted as (E1) through (E6) may further include repeatedly determining the average value of the voltage at the intermediate switching node at a frequency that is less than one tenth of a frequency at which the switching device switches between its conductive and its non-conductive states.

(F1) A method for operating a switching circuit for interfacing an electric power source with a load may include the steps of (1) in a first operating mode of the switching circuit, controlling switching of a first switching device of the switching circuit to at least substantially maximize an amount of power transferred from the electric power source to the load, and (2) in a second operating mode of the switching circuit, providing a shunt path for current flowing through the load to flow through the switching circuit.

(F2) The method denoted as (F1) may further include transitioning from the first operating mode to the second operating mode if an output voltage of the electric power source drops below a first threshold value.

(F3) Either of the methods denoted as (F1) or (F2) may further include transitioning from the first operating mode to the second operating mode if a magnitude of current flowing between the electric power source and the switching circuit drops below a second threshold value.

(F4) Any of the methods denoted as (F1) through (F3) may further include transitioning from the first operating mode to the second operating mode if a magnitude of power transferred from the electric power source to the load drops below a third threshold value.

(F5) In any of the methods denoted as (F1) through (F4), the switching circuit may include a first and second output terminal for electrically coupling to the load, and the method may further include shunting the first and second output terminals in the second operating mode.

(F6) In the method denoted as (F5), the step of shunting may include operating a second switching device electrically coupled across the first and second output terminals in its conductive state.

(F7) The method denoted as (F6) may further include continuously operating the second switching device in its conductive state in the second operating mode.

(F8) Any of the methods denoted as (F1) through (F7) may further include extracting power from a circuit including the load to at least partially power the switching circuit in the second operating mode.

(G1) A method for operating a switching circuit coupled to an electric power source such that an amount of electric power extracted from the electric power source is at least substantially maximized may include (1) repeatedly determining an operating characteristic of the switching circuit, (2) comparing a most recent value of the operating characteristic with a previous value of the operating characteristic, (3) making a maximum power point tracking adjustment to the switching circuit in a first direction if the most recent value of the operating characteristic is greater than the previous value of the operating characteristic, and (4) making a maximum power point tracking adjustment to the switching circuit in a second direction opposite of the first direction if the most recent value of the operating characteristic is smaller than the previous value of the operating characteristic.

(G2) In the method denoted as (G2), the operating characteristic of the switching circuit may be an average value of a voltage at an intermediate switching node of the switching circuit.

(G3) In either of the methods denoted as (G1) or (G2), the step of making a maximum power point tracking adjustment to the switching circuit in the first direction may include adjusting an operating parameter of the switching circuit by a first predetermined amount, and the step of making a maximum power point tracking adjustment to the switching circuit in the second direction may include adjusting an operating parameter of the switching circuit by a second predetermined amount.

(G4) In any of the methods denoted as (G1) through (G3), the step of making a maximum power point tracking adjustment to the switching circuit in the first direction may include adjusting an operating parameter of the switching circuit by a first amount that is a function of a difference between the most recent value of the operating characteristic and the previous value of the operating characteristic, and the step of making a maximum power point tracking adjustment to the switching circuit in the second direction may include adjusting an operating parameter of the switching circuit by a second amount that is a function of the difference between the most recent value of the operating characteristic and the previous value of the operating characteristic.

(G5) In any of the methods denoted as (G1) through (G4), the step of making a maximum power point tracking adjustment to the switching circuit in the first direction may further include adjusting an operating parameter of the switching circuit by a first amount at least partially determined from one or more historical values of the operating characteristic of the switching circuit, and the step of making a maximum power point tracking adjustment to the switching circuit in the second direction may include adjusting an operating parameter of the switching circuit by a second amount at least partially determined from the one or more historical values of the operating characteristic of the switching circuit.

(G6) Any of the methods denoted as (G1) through (G5) may further include performing either step of making a maximum power point tracking adjustment to the switching circuit only if a magnitude of a difference between the most recent value of the operating characteristic of the switching circuit and the previous value of the operating characteristic of the switching circuit exceeds a threshold value.

(G7) Any of the methods denoted as (G1) through (G6) may further include initially setting an operating parameter of the switching circuit to a value that previously at least substantially corresponded to a maximum power point of the electric power source.

(G8) Any of the methods denoted as (G1) through (G7) may further include decreasing a magnitude of current drawn by the switching circuit from the electric power source if an output voltage of the electric power source drops below a threshold value.

(H1) A method for operating a switching circuit including an input port, an output port, an energy storage device, a first switching device, and a second switching device electrically coupled across the output port may include (1) in a first operating mode of the switching circuit, controlling switching of the first switching device between its conductive and non-conductive states to transfer power from the input port to the output port, and (2) in a second operating mode of the switching circuit, (i) charging the energy storage device with energy extracted from a circuit including the output port, and (ii) using energy stored in the energy storage device to cause the second switching device to operate in its conductive state.

(H2) The method denoted as (H1) may further include alternating the steps of charging and using, in the second operating mode of the switching circuit.

(H3) Either of the methods denoted as (H1) or (H2) may further include controlling switching of the first switching device to at least substantially maximize an amount of electric power extracted from an electric power source electrically coupled to the input port, in the first operating mode of the switching circuit.

(I1) An electric power system may include (1) N electric power sources, N being an integer greater than one, and (2) N switching circuits. Each switching circuit may include an input port electrically coupled to a respective one of the N electric power sources, an output port, and a first switching device adapted to switch between its conductive and non-conductive states to transfer power from the input port to the output port. The output ports of the N switching circuits may be electrically coupled in series and to a load to establish an output circuit. Each of the N switching circuits may use an interconnection inductance of the output circuit as a primary energy storage inductance of the switching circuit.

(I2) In the electric power system denoted as (I1), each of the N electric power sources may be a photovoltaic device.

(I3) In the electric power system denoted as (I2), at least one of the photovoltaic devices may be a plurality of electrically coupled photovoltaic cells.

(I4) In either of the electric power systems denoted as (I2) or (I3), at least one of the photovoltaic devices may be a junction of a multi-junction photovoltaic cell.

(I5) In any of the electric power systems denoted as (I1) through (I4), each of the N switching circuits may further include a controller adapted to control switching of the first switching device of the switching circuit to at least substantially maximize an amount of electric power extracted from a respective photovoltaic device electrically coupled to the input port of the switching circuit.

(I6) In any of the electric power systems denoted as (I1) through (I5), for each of the N switching circuits: (1) the input port may include a first and second input terminal, (2) the first switching device may be electrically coupled between the first input terminal and an intermediate switching node, and (3) the switching circuit may further include a device selected from the group consisting of a diode and a second switching device electrically coupled between the second input terminal and the intermediate switching node, and the device may be adapted to provide a path for current through the output circuit when the first switching device is in its non-conductive state.

(I7) In either of the electric power systems denoted as (I5) or (I6), the controller of each of the N switching circuits may be adapted to at least substantially maximize an average value of a voltage at the intermediate switching node of the switching circuit.

(I8) In any of the electric power systems denoted as (I5) through (I7), the controller of each of the N switching circuits may be adapted to repeatedly sample an average value of a voltage at the intermediate switching node of the switching circuit and control switching of the first switching device of the switching circuit at least partly based on at least two successive samples of the average value of the voltage at the intermediate switching node.

(I9) In any of the electric power systems denoted as (I5) through (I8), a starting time of the controller of each of the N switching circuits may be loosely controlled.

(I10) In any of the electric power systems denoted as (I5) through (I9), a starting time of the controller of at least one of the N switching circuits may vary from a starting time of the controller of the other N−1 switching circuits.

(I11) In any of the electric power systems denoted as (I5) through (I10), the controller of at least one of the N switching circuits may be adapted to sample the average value of the voltage at the switching node of the switching circuit at a different rate than the controller of the other N−1 switching circuits.

(I12) In any of the electric power systems denoted as (I5) through (I11), the controller of each of the N switching circuits may be adapted to repeatedly sample the average value of the voltage at the intermediate switching node at a frequency that is less than a frequency at which the first switching device switches between its conductive and non-conductive states.

(I13) In any of the electric power systems denoted as (I5) through (I12), the controller of each of the N switching circuits may be adapted to repeatedly sample the average value of the voltage at the intermediate switching node at a frequency that is less than one tenth of the frequency at which the first switching device switches between its conductive and non-conductive states.

(I14) In any of the electric power systems denoted as (I5) through (I13), the controller of each of the N switching circuits may be adapted to repeatedly sample the average value of the voltage at the intermediate switching node at a frequency that is sufficiently slow such that transient voltage excursions on the output port settle between successive samples of the average value of the voltage at the intermediate switching node.

(I15) In any of the electric power systems denoted as (I5) through (I14), the controller of each of the N switching circuits may be configured to repeatedly sample the average value of the voltage at the intermediate switching node at a sampling rate that is sufficiently fast such that $\Delta I/I_R$ is less than $\Delta D/D_R$, wherein:

$\Delta I$ is a change in current out of the output port between first and second successive samples of the average value of the voltage at the intermediate switching node, the second sample occurring after the first sample;

$I_R = I_{max} - I_{min}$;

$I_{max}$ is a maximum expected value of current out of the output port;

$I_{min}$ is a minimum expected value of current out of the output port;

$\Delta D$ is a change in duty cycle of the first switching device between the first and second successive samples of the average value of the voltage at the intermediate switching node; and $D_R$ is a difference between a maximum expected duty cycle and a minimum expected duty cycle of the first switching device.

(I16) In any of the electric power systems denoted as (I5) through (I15), the controller of each of the N switching circuits may be configured to repeatedly sample the average value of the voltage at the intermediate switching node at a sampling rate that is sufficiently fast such that a percentage change in current out of the output port is less than a percentage change in duty cycle of the first switching device between successive samples of the average value of the voltage at the intermediate switching node.

(I17) In any of the electric power systems denoted as (I2) through (I16), at least one of the electric power sources may include a plurality of photovoltaic cells electrically coupled in series.

(I18) In any of the electric power systems denoted as (I2) through (I17), at least one of the electric power sources may be a photovoltaic sub-module of a photovoltaic panel, and each photovoltaic sub-module may include a plurality of photovoltaic cells electrically coupled in series.

(I19) In any of the electric power systems denoted as (I1) through (I18), a frequency at which the first switching device of each of the N switching circuit switches between its conductive and non-conductive states may be loosely controlled.

(I20) In any of the electric power systems denoted as (I1) through (I19), a switching frequency of each first switching device may vary from a switching frequency of each other first switching device.

(I21) In any of the electric power systems denoted as (I1) through (I20), each of the N switching circuits may be configured such that each first switching device switches out of phase with each other first switching device.

(I22) Any of the electric power systems denoted as (I1) through (I21) may further include a diode electrically coupled in series with the output circuit.

(I23) In any of the electric power systems denoted as (I1) through (I22), each output port may include a first and a second output terminal, and each switching circuit may be operable to allow current to flow between the first and second output terminals in only a single direction.

(I24) In any of the electric power systems denoted as (I1) through (I23), each of the N switching circuits may be configured such that its first switching device switches between its conductive and non-conductive states at a frequency of at least 200 kilohertz.

(I25) Any of the electric power systems denoted as (I1) through (I24) may further include at least one multi-layer ceramic capacitor electrically coupled across the input port of each of the N switching circuits, and wherein ripple current flowing through the input port of each of the N switching circuits may be filtered primarily by the at least one multi-layer ceramic capacitors electrically coupled across each switching circuit's input port.

(I26) At least two components of any one of the N switching circuits in the electric power systems denoted as (I1) through (I25) may be part of a common integrated circuit chip.

(I27) At least some components of any two of the N switching circuits in the electric power systems denoted as (I1) through (I25) may be part of a common integrated circuit chip.

(J1) An electric power system may include N electric power sources and N switching circuits, where N is an integer greater than one. Each switching circuit may include (1) an input port electrically coupled to a respective one of the N electric power sources, (2) an output port, and (3) a first switching device adapted to switch between its conductive and non-conductive states to transfer power from the input port to the output port. Each of the N switching circuits may use an interconnection inductance of a respective input circuit formed from a series connection of at least its input port and its respective one of the N electric power sources as a primary energy storage inductance of the switching circuit.

(J2) In the electric power system denoted as (J1), each of the N electric power sources may be a photovoltaic device.

(J3) In either of the electric power systems denoted as (J1) or (J2), each of the N switching circuits may further include a controller adapted to control switching of the first switching device of the switching circuit to at least substantially maximize an amount of electric power extracted from a photovoltaic device electrically coupled to the input port of the switching circuit.

(J4) In any of the electric power systems denoted as (J1) through (J3), at least one of the N electric power sources may be a junction of a multi-junction photovoltaic cell.

(J5) In any of the electric power systems denoted as (J1) through (J4), at least one of the N electric power sources may be a plurality of electrically coupled photovoltaic cells.

(J6) In any of the electric power systems denoted as (J1) through (J5), at least one of the N electric power sources may be a plurality of photovoltaic cells electrically coupled in parallel.

(J7) In any of the electric power systems denoted as (J1) through (J6), at least one of the N electric power sources may be a photovoltaic sub-module of a photovoltaic panel, and each photovoltaic sub-module may include a plurality of photovoltaic cells electrically coupled in series.

(J8) In any of the electric power systems denoted as (J1) through (J7), for each of the N switching circuits: (1) the first switching device may be electrically coupled across the input port; and (2) the switching circuit may further include a device selected from the group consisting of a diode and a second switching device electrically coupled between the input and output ports, and the device may be adapted to provide a path for current between the input and output ports when the first switching device is in its non-conductive state.

(J9) In any of the electric power systems denoted as (J1) through (J8), each of the N switching circuits may be adapted to control switching of the first switching device of the switching circuit to at least substantially maximize an average value of current flowing through the output port of the switching circuit.

(J10) In any of the electric power systems denoted as (J2) through (J9), each of the N switching circuits may be operable to repeatedly sample an average value of current flowing through the output port of the switching circuit and control switching of the first switching device of the switching circuit at least partly based on at least two successive samples of the average value of current flowing through the output port.

(J11) In any of the electric power systems denoted as (J1) through (J10), a starting time of a controller of each of the N switching circuits may be loosely controlled.

(J12) In any of the electric power systems denoted as (J1) through (J11), a starting time of the controller of at least one of the N switching circuits may vary from a starting time of a controller of the other N−1 switching circuits.

(J13) In any of the electric power systems denoted as (J1) through (J12), for each of the N switching circuits, a controller may be adapted to repeatedly sample the average value of current flowing through the output port at a frequency that is less than a frequency at which the first switching device switches between its conductive and non-conductive states.

(J14) In any of the electric power systems denoted as (J1) through (J13), a controller may be adapted to repeatedly sample the average value of current flowing through the output port at a frequency that is less than one tenth of the frequency at which the first switching device switches between its conductive and non-conductive states.

(J15) In any of the electric power systems denoted as (J1) through (J14), a controller may be adapted to repeatedly sample the average value of current flowing through the output port at a frequency that is sufficiently slow such that transient current excursions on the output port settle between successive samples of the average value of current flowing through the output port.

(J16) In any of the electric power systems denoted as (J1) through (J15), a frequency at which the first switching device of each of the N switching circuit switches between its conductive and non-conductive states may be loosely controlled.

(J17) In any of the electric power systems denoted as (J1) through (J16), a switching frequency of each first switching device may vary from a switching frequency of each other first switching device.

(J18) At least two components of any one of the N switching circuits in the electric power systems denoted as (I1) through (J17) may be part of a common integrated circuit chip.

(J19) At least some components of any two of the N switching circuits in the electric power systems denoted as (J1) through (J17) may be part of a common integrated circuit chip.

(K1) An electric power system may include N photovoltaic devices and N switching circuits, where N is an integer greater than one. Each switching circuit may include an input port electrically coupled to a respective one of the N photovoltaic devices, an output port, and a first switching device adapted to switch between its conductive and non-conductive states to transfer power from the input port to the output port. The output ports of the N switching circuits may be electrically coupled in series and to a load to establish an output circuit. The system may further include a system control device including (1) a transistor electrically coupled in series with the output circuit, (2) a current sense subsystem configured to generate a current sense signal representing a magnitude of current flowing through the output circuit, and (3) a control subsystem in communication with the transistor and the current sense subsystem, the control subsystem configured to control the transistor based at least in part on the current sense signal to control current through the output circuit.

(K2) In the electric power system denoted as (K1), the control subsystem may be operable to control the transistor such that current is allowed to flow through the output circuit in only a single direction.

(K3) In either of the electric power systems denoted as (K1) or (K2), the control subsystem may be further configured to control the transistor at least in part based on the current sense signal to interrupt current flowing through the output circuit if the magnitude of current flowing through the output circuit exceeds a threshold value.

(K4) In any of the electric power systems denoted as (K1) through (K3), the control subsystem may be further configured to monitor and transmit to an external system a characteristic of the electric power system.

(K5) In the electric power system denoted as (K4), the characteristic of the electric power system may include a voltage across at least the output ports of the N switching circuits electrically coupled in series.

(K6) In either of the electric power system denoted as (K4) or (K5), the characteristic of the electric power system may include the magnitude of current flowing through the output circuit.

(K7) In any of the electric power system denoted as (K4) through (K6), the characteristic of the electric power system may include a temperature of one or more components of the electric power system.

(K8) In any of the electric power systems denoted as (K4) through (K7), the control subsystem may be operable to modulate the transistor to generate a communication signal including the characteristic of the electric power system.

(K9) In any of the electric power systems denoted as (K1) through (K8), each of the N switching circuits may further include a controller adapted to control switching of the first switching device of the switching circuit to at least substantially maximize an amount of electric power extracted from the respective one of the N photovoltaic devices electrically coupled to the input port of the switching circuit.

(K10) In any of the electric power systems denoted as (K1) through (K9), at least one of the N electric power sources may be a junction of a multi-junction photovoltaic cell.

(L1) An electric power system may include (1) first and second electric power sources electrically coupled in series, the first electric power source capable of generating a maximum current having a first value, the second electric power source capable of generating a maximum current having a second value that is smaller than the first value, and (2) first and second switching circuits operable to perform maximum power point tracking. The first and second electric power sources and the first and second switching circuits may be electrically coupled such that the first and second switching circuits are collectively operable to at least substantially maximize an amount of electric power extracted from both of the first and second electric power sources.

(L2) In the electric power system denoted as (L1), each of the first and second electric power sources may include at least one photovoltaic device.

(L3) In either of the electric power systems denoted as (L1) or (L2), the first electric power source may include a first photovoltaic junction, and the second electric power source may include a second and third photovoltaic junction electrically coupled in series.

(L4) In the electric power system denoted as (L3), the first, second, and third photovoltaic junctions may be part of a common multi-junction photovoltaic cell.

(L5) In any of the electric power systems denoted as (L1) through (L4), each of the first and second switching circuits may include (1) a switching device and (2) a controller adapted to control switching of the switching device to perform maximum power point tracking. The switching device of the first switching circuit may switch out of phase with respect to the switching device of the second switching circuit.

(L6) In the electric power system denoted as (L5), a starting time of the controller of each of the first and second switching circuits may be loosely controlled.

(L7) In either of the electric power systems denoted as (L5) or (L6), a switching frequency of the switching device of each of the first and second switching circuits may be loosely controlled.

(L8) In any of the electric power systems denoted as (L1) through (L7), the first switching circuit may include a circuit having a boost-type topology and an input port electrically coupled across the first electric power source.

(L9) In the electric power system denoted as (L8), the first switching circuit may further include an output port electrically coupled across the series combination of the first and second electric power sources, and the second switching circuit may include an input port electrically coupled across the series combination of the first and second electric power sources.

(L10) In the electric power system denoted as (L9), the second switching circuit may further include (1) first and second switching devices electrically coupled in series across the input port of the second switching circuit, and (2) an output port. The second switching device may also be electrically coupled across the output port and adapted to provide a path for current through the output port of the second switching circuit when the first switching device is in its non-conductive state. The second switching circuit may use an interconnection inductance of a circuit including its output port as a primary energy storage inductance of the second switching circuit.

(L11) In the electric power system denoted as (L8), the second switching circuit may include a circuit having a buck-type topology, an input port, and an output port, and the input port of the second switching circuit may be electrically coupled across the series combination of the first and second electric power sources. The first switching circuit may further include an output port electrically coupled in parallel with the output port of the second switching circuit.

(L12) In the electric power system denoted as (L8), the second switching circuit may include a circuit having a buck-type topology, an input port, and an output port, and the input port of the second switching circuit may be electrically coupled across the second electric power source. The first switching circuit may further include an output port electrically coupled in series with the output port of the second switching circuit.

(L13) In any of the electric power systems denoted as (L1) through (L7), the first switching circuit may include a circuit having a buck-boost topology including an input port electrically coupled across the first electric power source.

(L14) In the electric power system denoted as (L13), the first switching circuit may further include an output port electrically coupled across the second electric power source, and the second switching circuit may include an input port electrically coupled across the second electric power source.

(L15) In the electric power system denoted as (L14), the second switching circuit may further include (1) first and second switching devices electrically coupled in series across the input port of the second switching circuit, and an output port. The second switching device may also be electrically coupled across the output port of the second switching circuit and adapted to provide a path for current through the output port when the first switching device is in its non-conductive state. The second switching circuit may use an interconnection inductance of a circuit including its output port as a primary energy storage inductance of the second switching circuit.

(L16) In the electric power system denoted as (L13), the first switching circuit may further include an output port, and the second switching circuit may include an output port and an input port electrically coupled in series with the second electric power source and the output port of the first switching circuit.

(L17) In the electric power system denoted as (L16), the second switching circuit may further include (1) first and second switching devices electrically coupled in series across the input port of the second switching circuit, and an output port. The second switching device may also be electrically coupled across the output port of the second switching circuit and adapted to provide a path for current through the output port when the first switching device is in its non-conductive state. The second switching circuit may use an interconnection inductance of a circuit including its output port as a primary energy storage inductance of the second switching circuit.

(L18) In the electric power system denoted as (L13), the first switching circuit may include an output port, and the second switching circuit may include a circuit having a buck-boost type topology, an output port electrically coupled in series with the output port of the first switching circuit, and an input port electrically coupled across the second electric power source.

(L19) In any of the electric power systems denoted as (L1) through (L7), each of the first and second switching circuit may include (1) an input port, (2) an output port, and (3) a first and second switching device electrically coupled in series across the input port. The second switching device may also be electrically coupled across the output port and provide a path for current through the output port when the first switching device is in its non-conductive state. The input port of the first switching circuit may be electrically coupled across the first electric power source, the input port of the second switching circuit may be electrically coupled across the second electric power source, and the output port of the first switching circuit may be electrically coupled in series with the output port of the second switching circuit.

(L20) In the electric power system denoted as (L19), each of the first and second switching circuits may use an inductance of a circuit including the output ports of the first and second switching circuit as a primary energy storage inductance.

(L21) In any of the electric power systems denoted as (L1) through (L20), at least some components of both of the first and second switching circuits may be part of a common integrated circuit chip.

(M1) An electric power system may include N photovoltaic strings, where N is an integer greater than one. Each photovoltaic string may include a plurality of photovoltaic devices and a plurality of DC-to-DC converters with output ports electrically coupled in series with a string optimizer. Each DC-to-DC converter may be adapted to at least substantially maximize power extracted from a respective one of the plurality of photovoltaic devices, and each string optimizer may be adapted to interface its respective string with a common bus.

(M2) In the electric power system denoted as (M1), each string optimizer may include a boost converter adapted to interface its respective string with the common bus.

(M3) In the electric power system denoted as (M2), each boost converter may be adapted to operate in a continuous conduction operating mode.

(M4) In the electric power system denoted as (M2), each boost converter may be adapted to operate in a discontinuous conduction operating mode.

(M5) In the electric power system denoted as (M2), the boost converter of each string optimizer may be adapted to (1) operate in a continuous conduction operating mode in a first operating mode of the string optimizer, and (2) operate in a discontinuous conduction operating mode in a second operating mode of the string optimizer.

(M6) In any of the electric power systems denoted as (M2) through (M5), each boost converter may use an interconnection inductance of a circuit of its respective photovoltaic string as a primary energy storage inductance of the boost converter.

(M7) In any of the electric power systems denoted as (M2) through (M6), at least one of the boost converters may be a multi-phase boost converter.

(M8) In any of the electric power systems denoted as (M2) through (M6), at least one of the boost converters may be a multi-phase boost converter where energy storage inductors of two or more phases of the boost converter are magnetically coupled.

(M9) In any of the electric power systems denoted as (M2) through (M8), energy storage inductors of at least two of the boost converters may be magnetically coupled.

(M10) In any of the electric power systems denoted as (M2) through (M9), each string optimizer may include a first switching device adapted to switch between its conductive and non-conductive states to interface its respective string with the common bus, and each first switching device may switch out of phase with respect to each other first switching device.

(M11) Any of the electric power systems denoted as (M1) through (M10) may further include an inverter electrically coupled to the common bus.

(M12) In the electric power system denoted as (M11), the inverter may lack maximum power point tracking capability.

(M13) In the electric power systems denoted as (M11), the inverter may lack global maximum power point tracking capability.

(M14) In any of the electric power systems denoted as (M1) through (M13), the N photovoltaic strings may be disposed on a tracking device operable to track movement of the sun.

(M15) In the electric power system denoted as (M14), each of the string optimizers may be housed in a common enclosure separate from the tracking device.

(M16) In any of the electric power systems denoted as (M1) through (M15), each of the plurality of photovoltaic devices may be a single photovoltaic cell.

(M17) In any of the electric power systems denoted as (M1) through (M16), the N photovoltaic strings may be distributed among at least two tracking devices, each tracking device operable to track movement of the sun.

(M18) In any of the electric power systems denoted as (M1) through (M16), each of the plurality of photovoltaic devices may be part of a common photovoltaic panel.

(M19) Any of the electric power systems denoted as (M1) through (M18) may further include an additional photovoltaic string electrically coupled to the common bus, the additional photovoltaic string may include a plurality of photovoltaic devices electrically coupled in series with an additional string optimizer, the additional string optimizer may be adapted to interface the additional photovoltaic string with the common bus.

(M20) In any of the electric power systems denoted as (M1) through (M19), each string optimizer may be operable to regulate a voltage on the common bus.

(M21) In any of the electric power systems denoted as (M1) through (M20), at least one of the string optimizers may be adapted to regulate a current through its respective string.

(M22) In the electric power system denoted as (M21), at least one of the string optimizers may be adapted to regulate a current through its respective string to a current greater than a photogenerated current of a strongest photovoltaic device of the string.

(M23) In the electric power system denoted as (M21), at least one of the string optimizers may be adapted to regulate a current through its respective string to a current that is adjusted at least partially according to the irradiance of the sun.

(M24) In the electric power system denoted as (M21), at least one of the string optimizers may be adapted to regulate a current through its respective string to a current that is adjusted according to a photogenerated current of a reference photovoltaic device of the string.

(M25) In the electric power system denoted as (M21), at least one of the string optimizers may be adapted to regulate a current through its respective string to a current that at least substantially maximizes an amount of electric power transferred from its respective string to the common bus.

(M26) In any of the electric power systems denoted as (M1) through (M25), at least one of the string optimizers may be adapted to regulate a voltage across the series coupled output ports of the DC-to-DC converters of the string.

(M27) In any of the electric power systems denoted as (M1) through (M26), at least one of the string optimizers may be operable to at least substantially maximize an amount of electric power transferred from its respective string to the common bus.

(M28) In any of the electric power systems denoted as (M1) through (M27), each of the plurality of DC-to-DC converters may include an input port electrically coupled to a respective one of a plurality of photovoltaic devices, and a first and second switching device electrically coupled in series across the input port. The second switching device may also be electrically coupled across the output port of the DC-to-DC converter and may provide a path for current through the output port when the first switching device is in its non-conductive state.

(M29) In any of the electric power systems denoted as (M1) through (M28), each of the plurality of DC-to-DC converters may use an interconnection inductance of a circuit including the output ports of the plurality of DC-to-DC converters as a primary energy storage inductance of the DC-to-DC converter.

(M30) In any of the electric power systems denoted as (M1) through (M29), at least one of the string optimizers and the DC-to-DC converters may be operable to exchange information.

(M31) In the electric power system denoted as (M30), the information may include a command from a string optimizer to a switching circuit.

(M32) In the electric power system denoted as (M31), the command may be selected from the group consisting of a command to start-up the switching circuit, a command to shut-down the switching circuit, and a command for the switching circuit to enter a bypass mode.

(M33) In any of the electric power systems denoted as (M30) through (M32), the information may include information selected from the group consisting of switching circuit status information and switching circuit fault information.

(N1) An electric power system may include N switching circuits, where N is an integer greater than one. Each switching circuit may include an input port, an output port including a first and second output terminal, and a first switching device adapted to switch between its conductive and non-conductive states. The output ports of the N switching circuits may be electrically coupled in series with a load to establish an output circuit. Each switching circuit may be adapted to cause its first switching device to switch between its conductive and non-conductive states to transfer power from the input port to the output port in a first operating mode of the switching circuit, and each switching circuit may be adapted to shunt its first and second output terminals in a second operating mode of the switching circuit.

(N2) In the electric power system denoted as (N1), each of the N switching circuits may further include a controller adapted to control switching of the first switching device of the switching circuit in the first operating mode of the switching circuit to at least substantially maximize an amount of electric power extracted from an electric power source electrically coupled to the input port of the switching circuit.

(N3) In either of the electric power systems denoted as (N1) and (N2), each of the N switching circuits may further include a second switching device electrically coupled between the first and second output terminals of the switching circuit and adapted to operate in its conductive state during the second operating mode of the switching circuit.

(N4) In any of the electric power systems denoted as (N1) through (N3), each of the N switching circuits may be adapted to operate in the second operating mode upon occurrence of an event selected from the group consisting of (1) voltage across the input port of the switching circuit being below a threshold value, (2) voltage across the input port of the switching circuit being above a threshold value, (3) power transferred from the input port to the output port of the switching circuit being below a threshold value, (4) a magnitude of current through the input port of the switching circuit being below a threshold value, (5) a magnitude of current flowing between the first and second output terminals of the switching circuit exceeding a threshold value, and (6) a temperature of the switching circuit exceeding a threshold value.

(O1) An integrated circuit chip may include (1) a first input port and a first output port, (2) first and second transistors electrically coupled in series across the first input port, the second transistor also electrically coupled across the first output port and adapted to provide a path for current flowing through the first output port when the first transistor is in its non-conductive state, (3) first driver circuitry for driving gates of the first and second transistors to cause the transistors to switch between their conductive and non-conductive states, and (4) first controller circuitry for controlling the first driver circuitry such that the first and second transistors switch between their conductive and non-conductive states to at least substantially maximize an amount of electric power extracted from an electric power source electrically coupled to the first input port.

(O2) The integrated circuit chip denoted as (O1) may be a flip chip integrated circuit chip.

(O3) The integrated circuit chips denoted as (O1) or (O2) may further include first, second, and third terminals, where the first and second terminals provide an electrical interface to the first input port, and the second and third terminals provide an electrical interface to the first output port.

(O4) In any of the integrated circuit chips denoted as (O1) through (O3), the first controller circuitry may be operable to (1) control the first driver circuitry such that the first and second transistors cooperate to transfer power from the first input port to the first output port during a first operating mode of the first controller circuitry, and (2) control the first driver circuitry such that the second transistor shunts the first output port during a second operating mode of the first controller circuitry.

(O5) In the integrated circuit chip denoted as (O4), the first controller circuitry may be adapted to operate the first controller circuitry in its second operating mode upon occurrence of an event selected from the group consisting of (1) voltage across the first input port being below a threshold value, (2) voltage across the first input port being above a threshold value, (3) power transferred from the first input port to the first output port being below a threshold value, (4) a magnitude of current flowing through the first input port being below a threshold value, (5) a magnitude of current flowing through the first output port exceeding a threshold value, and (6) a temperature of one or more components of the integrated circuit chip exceeding a threshold value.

(O6) In any of the integrated circuit chips denoted as (O1) through (O5), the first controller circuitry may be operable to shut down switching of at least the first transistor if a temperature of one or more components of the integrated circuit chip exceed a first threshold value.

(O7) In any of the integrated circuit chips denoted as (O1) through (O6), the first controller circuitry may be operable to shut down switching of at least the first transistor if a magnitude of current flowing through the first input port exceeds a second threshold value.

(O8) In any of the integrated circuit chips denoted as (O1) through (O7), the first controller circuitry may be operable to shut down switching of at least the first transistor if voltage across the first input port is below a threshold value.

(O9) In any of the integrated circuit chips denoted as (O1) through (O8), the first controller circuitry may be operable to at least substantially maximize an average value of a voltage at an intermediate switching node where the first and second transistors are electrically coupled.

(O10) In any of the integrated circuit chips denoted as (O1) through (O9), the first controller circuitry may be operable to repeatedly sample an average value of a voltage at an intermediate switching node and control switching of the first transistor at least partly based on at least two successive samples of the average value of the voltage at the intermediate switching node, the intermediate switching node being a node where the first and second transistors are electrically coupled.

(O11) In any of the integrated circuit chips denoted as (O1) through (O10), a starting time of the first controller circuitry may be loosely controlled.

(O12) In any of the integrated circuit chips denoted as (O1) through (O11), a frequency at which the first transistor switches between its conductive and non-conductive states may be loosely controlled.

(O13) Any of the integrated circuit chips denoted as (O1) through (O12) may further include (1) a second input port and a second output port, (2) third and fourth transistors electrically coupled in series across the second input port, the fourth transistor also electrically coupled across the second output port and adapted to provide a path for current flowing through the second output port when the third transistor is in its non-conductive state, (3) second driver circuitry for driving gates of the third and fourth transistors to cause the transistors to switch between their conductive and non-conductive states, and (4) second controller circuitry for controlling the second driver circuitry such that the third and fourth transistors switch between their conductive and non-conductive states to at least substantially maximize an amount of electric power extracted from an electric power source electrically coupled to the second input port.

(O14) In the integrated circuit chip denoted as (O13), the first and second controller circuitry may be part of a common controller.

(O15) In either of the integrated circuit chips denoted as (O13) or (O14), the first and second output ports may be electrically coupled in series within the integrated circuit chip.

(O16) In any of the integrated circuit chips denoted as (O13) through (O15), the second controller circuitry may be operable to (1) control the second driver circuitry such that the third and fourth transistors cooperate to transfer power from the second input port to the second output port during a first operating mode of the second controller circuitry, and (2) control the second driver circuitry such that the fourth transistor shunts the second output port during a second operating mode of the second controller circuitry.

(O17) Output ports of any two or more of the integrated circuit chips denoted as (O1) through (O16) may be electrically coupled in series and/or in parallel.

(O18) A photovoltaic device may be electrically coupled to an input port of any of the integrated circuit chips denoted as (O1) through (O16).

(P1) A photovoltaic system may include N first photovoltaic devices and N integrated circuit chips, where N is an integer greater than one. Each integrated chip may include (1) a first input port and a first output port, (2) first and second transistors electrically coupled in series across the first input port, the second transistor also electrically coupled across the first output port and adapted to provide a path for current flowing through the first output port when the first transistor is in its non-conductive state, (3) first driver circuitry for driving gates of the first and second transistors to cause the transistors to switch between their conductive and non-conductive states, and (4) first controller circuitry for controlling the first driver circuitry such that the first and second transistors switch between their conductive and non-conductive states to at least substantially maximize an amount of power extracted from a respective one of the N first photovoltaic devices.

(P2) In the photovoltaic system denoted as (P1), the first output ports of the N integrated circuit chips may be electrically coupled in series and to a load to establish an output circuit.

(P3) In the photovoltaic system denoted as (P2), each pair of electrically coupled first and second transistors may form part of a switching circuit using interconnection inductance of the output circuit as a primary energy storage inductance of the switching circuit.

(P4) In any of the photovoltaic systems denoted as (P1) through (P3), N may be greater than three, first output ports of at least two of the N integrated circuit chips may be electrically coupled in series, and first output ports of at least two of the N integrated circuit chips may be electrically coupled in parallel.

(P5) In any of the photovoltaic systems denoted as (P1) through (P4), at least two of the N first photovoltaic devices may be part of a common photovoltaic panel.

(P6) In any of the photovoltaic systems denoted as (P1) through (P5), at least two of the N integrated circuit chips may be part of a common photovoltaic panel.

(P7) In any of the photovoltaic systems denoted as (P1) through (P6), each of the N first photovoltaic devices may be part of photovoltaic sub-modules of a photovoltaic panel, and each photovoltaic sub-module may include a plurality of electrically coupled photovoltaic cells.

(P8) In the photovoltaic system denoted as (P7), the photovoltaic cells of each photovoltaic sub-module may be electrically coupled in series.

(P9) In the photovoltaic system denoted as (P7), the photovoltaic panel may include R rows and C columns of photovoltaic cells, R and C each being an integer greater than one, and each photovoltaic sub-module may include R series coupled photovoltaic cells.

(P10) In the photovoltaic system denoted as (P7), the photovoltaic panel may include R rows and C columns of photovoltaic cells, R and C each being an integer greater than one, and each photovoltaic sub-module may include X series coupled photovoltaic cells, X being equal to the product of two and R.

(P11) In the photovoltaic system denoted as (P7), the photovoltaic panel may include R rows and C columns of photovoltaic cells, R and C each being an integer greater than one, and each photovoltaic sub-module may include C series coupled photovoltaic cells.

(P12) In the photovoltaic system denoted as (P7), the photovoltaic panel may include R rows and C columns of photovoltaic cells, R and C each being an integer greater than one, and each photovoltaic sub-module may include X series coupled photovoltaic cells, X being equal to the product of two and C.

(P13) In any of the photovoltaic systems denoted as (P1) through (P6), at least one of the N first photovoltaic devices may be a single photovoltaic cell.

(P14) In any of the photovoltaic systems denoted as (P1) through (P6) or (P13), at least one of the N first photovoltaic devices may include at least two photovoltaic cells electrically coupled in parallel.

(P15) Any of the photovoltaic systems denoted as (P1) through (P14) may further include optics for concentrating light on at least one of the N first photovoltaic devices.

(P16) Any of the photovoltaic systems denoted as (P1) through (P15) may further include light concentrating optics shared by at least two of the N first photovoltaic devices.

(P17) Any of the photovoltaic systems denoted as (P1) through (P16) may further include material encapsulating at least one of the N first photovoltaic devices and at least one of the N integrated circuit chips.

(P18) In any of the photovoltaic systems denoted as (P1) through (P4) or (P13) through (P17), at least one of the N first photovoltaic devices may be a photovoltaic junction of a multi-junction photovoltaic cell.

(P19) In any of the photovoltaic systems denoted as (P1) through (P6) or (P13) through (P18), N may be an integer greater than two, and the N first photovoltaic devices may be spread between at least two photovoltaic panels.

(P20) In any of the photovoltaic systems denoted as (P1) through (P19), at least one of the N integrated circuit chips may further include (1) a second input port and a second output port, (2) third and fourth transistors electrically coupled in series across the second input port, the fourth transistor also electrically coupled across the second output port and adapted to provide a path for current flowing through the second output port when the third transistor is in its non-conductive state, (3) second driver circuitry for driving gates of the third and fourth transistors to cause the transistors to switch between their conductive and non-conductive states, and (4) second controller circuitry for controlling the second driver circuitry such that the third and fourth transistors switch between their conductive and non-conductive states to at least substantially maximize an amount of power extracted from a respective second photovoltaic device electrically coupled to the second input port.

(P21) In any of the photovoltaic systems denoted as (P1) through (P20), each of the N integrated circuit chips may be disposed on a respective one of the N first photovoltaic devices.

(P22) In the photovoltaic system denoted as (P21), each of the N integrated circuit chips may be a flip chip integrated circuit chip electrically coupled to its respective one of the N first photovoltaic devices.

(P23) In the photovoltaic system denoted as (P21), each of the N integrated circuit chips may be electrically coupled to its respective one of the N first photovoltaic devices via a plurality of wire bonds.

(P24) Any of the photovoltaic systems denoted as (P21) through (P23) may further include a respective capacitor disposed on each of the N first photovoltaic devices and electrically coupled across the first photovoltaic device.

(P25) In any of the photovoltaic systems denoted as (P1) through (P20), each of the N integrated circuit chips and the N first photovoltaic devices may be disposed on one or more supporting structures.

(P26) In the photovoltaic system denoted as (P25), each of the one or more supporting structures may be selected from the group consisting of a printed circuit board substrate, a ceramic substrate, a polyimide substrate, and a metal lead frame.

(P27) In the photovoltaic systems denoted as (P25) or (P26), each of the N integrated circuit chips may be a flip chip integrated circuit chip electrically coupled to the one or more supporting structures via a plurality of solder balls.

(P28) In the photovoltaic systems denoted as (P25) or (P26), each of the N integrated circuit chips may be electrically coupled to the one or more supporting structures via a plurality of wire bonds.

(P29) Any of the photovoltaic systems denoted as (P25) through (P28) may further include a capacitor disposed on the one or more supporting structures and electrically coupled across at least one of the N first photovoltaic devices.

(P30) In any of the photovoltaic systems denoted as (P1) through (P29), for each of the N integrated circuit chips, the first controller circuitry may be configured such that the first and second transistors switch between their conductive and non-conductive states at a frequency of at least 200 kilohertz.

(P31) In the photovoltaic system denoted as (P30), for each of the N integrated circuit chips, ripple current flowing through the first input port may be filtered primarily by one or more multi-layer ceramic capacitors.

(R1) A photovoltaic system may include a multi-junction photovoltaic cell including at least a first and second photovoltaic junction and an integrated circuit chip. The integrated circuit chip may include (1) first and second transistors, (2) driver circuitry for driving gates of the first and second transistors to cause the transistors to switch between their conductive and non-conductive states, and (3) controller circuitry for controlling the driver circuitry such that the first and second transistors switch between their conductive and non-conductive states to at least substantially maximize power extracted from both of the first and second photovoltaic junctions.

(R2) In the photovoltaic system denoted as (R1), the first transistor may be part of a first buck-type converter including an input port electrically coupled to the first photovoltaic junction, and the second transistor may be part of a second buck-type converter including an input port electrically coupled to the second photovoltaic junction.

(R3) In the photovoltaic system denoted as (R1), the first and second photovoltaic junctions may be electrically coupled in series, and the first transistor may be part of a boost-type converter including an input port electrically coupled across the first photovoltaic junction and an output port electrically coupled across at least the first and second photovoltaic junctions, and the second transistor may be part of a buck-type converter including an input port electrically coupled across at least both of the first and second photovoltaic junctions.

(R4) In any of the photovoltaic systems denoted as (R1) through (R3), the integrated circuit chip may be disposed on the multi-junction photovoltaic cell.

(R5) In the photovoltaic system denoted as (R4), the integrated circuit chip may be a flip chip integrated circuit chip electrically coupled to the multi-junction photovoltaic cell via a plurality of solder balls.

(R6) In the photovoltaic system denoted as (R4), the integrated circuit chip may be electrically coupled to the multi-junction photovoltaic cell via a plurality of wire bonds.

(R7) Any of the photovoltaic systems denoted as (R4) through (R6) may further include a capacitor disposed on the multi-junction photovoltaic cell and electrically coupled across at least one of the photovoltaic junctions.

(R8) In any of the photovoltaic systems denoted as (R1) through (R3), the integrated circuit chip and the multi-junction photovoltaic cell may be disposed on a supporting structure.

(R9) In the photovoltaic system denoted as (R8), the supporting structure may be selected from the group consisting of a printed circuit board substrate, a ceramic substrate, a polyimide substrate, and a metal lead frame.

(R10) In either of the photovoltaic systems denoted as (R8) or (R9), the integrated circuit chip may be a flip chip integrated circuit chip electrically coupled to the supporting structure via a plurality of solder balls.

(R11) In either of the photovoltaic systems denoted as (R8) or (R9), the integrated circuit chip may be electrically coupled to the supporting structure via a plurality of wire bonds.

(R12) Any of the photovoltaic systems denoted as (R8) through (R11) may further include a first capacitor disposed on the supporting structure and electrically coupled across at least one of the photovoltaic junctions.

(R13) In any of the photovoltaic systems denoted as (R8) through (R12), the integrated circuit chip may include at least one output port for transferring power to a load; and the system may further include a second capacitor and an inductor electrically coupled between the output port and the second capacitor, the second capacitor and the inductor being disposed on the supporting structure.

(R14) Any of the photovoltaic systems denoted as (R1) through (R13) may further include optics for concentrating light on the multi-junction photovoltaic cell.

(R15) Any of the photovoltaic systems denoted as (R1) through (R14) may further include material encapsulating at least the integrated circuit chip and the multi-junction photovoltaic cell.

(R16) In any of the photovoltaic systems denoted as (R1) through (R15), the controller may be configured for controlling the driver circuitry such that the first and second transistors switch between their conductive and non-conductive states at a frequency of at least 200 kilohertz.

(R17) In the photovoltaic system denoted as (R16), the integrated circuit chip may include an input port interfacing the integrated circuit chip with the multi-junction photovoltaic cell, and ripple current flowing through the input port may be filtered primarily by one or more multi-layer ceramic capacitors.

Changes may be made in the above methods and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. An electric power system, comprising:
   N photovoltaic devices, N being an integer greater than one;
   N switching circuits, each switching circuit including an input port electrically coupled to a respective one of the N photovoltaic devices, an output port, and a first switching device adapted to switch between its conductive and non-conductive states to transfer power from the input port to the output port, the output ports of the N switching circuits electrically coupled in series and to a load to establish an output circuit; and
   a system control device including:
      a transistor electrically coupled in series with the output circuit,
      a current sense subsystem configured to generate a current sense signal representing a magnitude of current flowing through the output circuit, and
      a control subsystem in communication with the transistor and the current sense subsystem, the control subsystem configured to control the transistor based at least in part on the current sense signal to control current through the output circuit.

2. The electric power system of claim 1, the control subsystem operable to control the transistor such that current is allowed to flow through the output circuit in only a single direction.

3. The electric power system of claim 1, the control subsystem further configured to control the transistor at least in part based on the current sense signal to interrupt current flowing through the output circuit if the magnitude of current flowing through the output circuit exceeds a threshold value.

4. The electric power system of claim 1, the control subsystem further configured to monitor and transmit to an external system a characteristic of the electric power system.

5. The electric power system of claim 4, the characteristic of the electric power system being a voltage across at least the output ports of the N switching circuits electrically coupled in series.

6. The electric power system of claim 4, the characteristic of the electric power system being the magnitude of current flowing through the output circuit.

7. The electric power system of claim 4, the characteristic of the electric power system being a temperature of one or more components of the electric power system.

8. The electric power system of claim 4, the control subsystem operable to modulate the transistor to generate a communication signal including the characteristic of the electric power system.

9. The electric power system of claim 1, each of the N switching circuits further including a controller adapted to control switching of the first switching device of the switching circuit to at least substantially maximize an amount of electric power extracted from the respective one of the N photovoltaic devices electrically coupled to the input port of the switching circuit.

10. The electric power system of claim 1, at least one of the N electric power sources being a junction of a multi junction photovoltaic cell.

11. An electric power system, comprising N switching circuits, N being an integer greater than one, each switching circuit including an input port, an output port including a first and second output terminal, and a first switching device adapted to switch between its conductive and non-conductive states, the output ports of the N switching circuits being electrically coupled in series with a load to establish an output circuit, wherein:

each switching circuit is adapted to cause its first switching device to switch between its conductive and non-conductive states to transfer power from the input port to the output port in a first operating mode of the switching circuit; and each switching circuit is adapted to shunt its first and second output terminals in a second operating mode of the switching circuit.

12. The electric power system of claim 11, each of the N switching circuits further comprising a controller adapted to control switching of the first switching device of the switching circuit in the first operating mode of the switching circuit to at least substantially maximize an amount of electric power extracted from an electric power source electrically coupled to the input port of the switching circuit.

13. The electric power system of claim 11, each of the N switching circuits further comprising a second switching device electrically coupled between the first and second output terminals of the switching circuit and adapted to operate in its conductive state during the second operating mode of the switching circuit.

14. The electric power system of claim 11, wherein each of the N switching circuits is adapted to operate in the second operating mode upon occurrence of an event selected from the group consisting of (1) voltage across the input port of the switching circuit being below a threshold value, (2) voltage across the input port of the switching circuit being above a threshold value, (3) power transferred from the input port to the output port of the switching circuit being below a threshold value, (4) a magnitude of current through the input port of the switching circuit being below a threshold value, (5) a magnitude of current flowing between the first and second output terminals of the switching circuit exceeding a threshold value, and (6) a temperature of the switching circuit exceeding a threshold value.

* * * * *